(12) United States Patent
Huang

(10) Patent No.: US 11,942,479 B2
(45) Date of Patent: Mar. 26, 2024

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventor: Yu-Lien Huang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 199 days.

(21) Appl. No.: 17/366,530

(22) Filed: Jul. 2, 2021

(65) Prior Publication Data

US 2022/0310603 A1 Sep. 29, 2022

Related U.S. Application Data

(60) Provisional application No. 63/166,682, filed on Mar. 26, 2021.

(51) Int. Cl.
| | | |
|---|---|---|
| H01L 21/76 | (2006.01) | |
| H01L 21/8234 | (2006.01) | |
| H01L 27/092 | (2006.01) | |
| H01L 29/06 | (2006.01) | |
| H01L 29/66 | (2006.01) | |
| H01L 29/78 | (2006.01) | |

(52) U.S. Cl.
CPC .. *H01L 27/0924* (2013.01); *H01L 21/823412* (2013.01); *H01L 21/823418* (2013.01); *H01L 21/823431* (2013.01); *H01L 21/823481* (2013.01); *H01L 29/0653* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2008/0206977 A1* | 8/2008 | Frank | H01L 29/78 438/597 |
| 2021/0408246 A1* | 12/2021 | Ganguly | H01L 21/02532 |

* cited by examiner

*Primary Examiner* — Joseph C. Nicely
*Assistant Examiner* — Lamont B Koo
(74) *Attorney, Agent, or Firm* — Birch, Stewart, Kolasch & Birch, LLP

(57) ABSTRACT

A device includes a channel layer, a gate structure, a source/drain epitaxial structure, and a gate via. The gate structure wraps around the channel layer. The gate structure includes a gate dielectric layer and a gate electrode over the gate dielectric layer. The source/drain epitaxial structure is adjacent the gate structure and is electrically connected to the channel layer. The gate via is under the gate structure and is in contact with a bottom surface of the gate electrode.

20 Claims, 161 Drawing Sheets

100

200

200

200

200

200

200

200

200

200

200

300

400

400

400

400

SEMICONDUCTOR DEVICE AND MANUFACTURING METHOD THEREOF

PRIORITY CLAIM AND CROSS-REFERENCE

This application claims priority to U.S. Provisional Application Ser. No. 63/166,682, filed Mar. 26, 2021, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
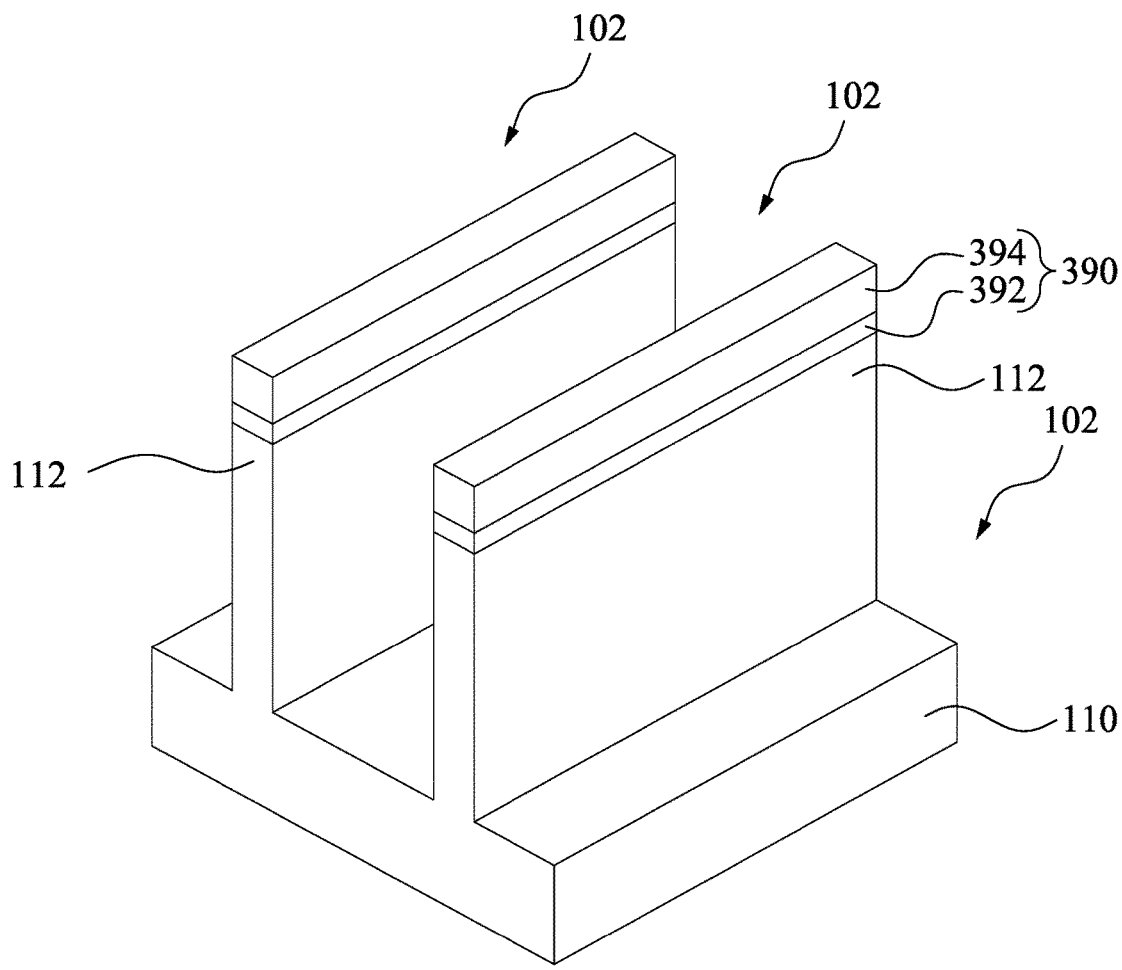
FIGS. 1-20F illustrate a method for manufacturing a semiconductor device at various stages in accordance with some embodiments of the present disclosure.
Figure 1:
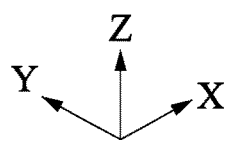

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The present disclosure is related to semiconductor devices and methods of forming the same. More particularly, some embodiments of the present disclosure are related to semiconductor devices including a backside gate via under a gate structure for implementing a small-sized device.

FIGS. 1-20F illustrate a method for manufacturing a semiconductor device (or an integrated circuit structure) 100 at various stages in accordance with some embodiments of the present disclosure. In addition to the semiconductor device 100, FIGS. 1-7A, 12A, 13A, 14, 15A, 16A, 17A, 18A, 19A, and 20A depict X-axis, Y-axis, and Z-axis directions. In some embodiments, the semiconductor device shown in FIGS. 1-20F may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

FIGS. 1-7A, 12A, 13A, 14, 15A, 16A, 17A, 18A, 19A, and 20A are perspective views of some embodiments of the semiconductor device 100 at intermediate stages during fabrication. FIGS. 7B, 8-11, 12B, 13B, 15B, 16B, 17B, 18B, 19B, and 20B are cross-sectional views of some embodiments of the semiconductor device 100 at intermediate stages during fabrication along a first cut (e.g., cut I-I), which is along a lengthwise direction of the channel (semiconductor fin). FIGS. 15C, 17C, 18C, and 20C are cross-sectional views of some embodiments of the semiconductor device 100 at intermediate stages during fabrication along a second cut (e.g., cut which is along a lengthwise direction of another channel (another semiconductor fin). FIGS. 15D, 17D, 18D, and 20D cross-sectional views of some embodiments of the semiconductor device 100 at intermediate stages during fabrication along a third cut (e.g., cut which is in one of the gate regions and perpendicular to the lengthwise direction of the channel. FIGS. 15E, 17E, 18E, and 20E are cross-sectional views of some embodiments of the semiconductor device 100 at intermediate stages during fabrication along a fourth cut (e.g., cut IV-IV), which is in another of the gate regions and perpendicular to the lengthwise direction of the channel. FIGS. 15F, 17F, 18F, and 20F are cross-sectional views of some embodiments of the semiconductor device 100 at intermediate stages during fabrication along a fifth cut (e.g., cut V-V), which is in the isolation region and is parallel to the lengthwise direction of the channel.

Reference is made to FIG. 1. A substrate 110 is provided. In some embodiments, the substrate 110 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 110 may include an epitaxial layer (epi-layer), which may be strained for performance enhancement, and/or may include a silicon-on-insulator (SOI) structure.

One or more semiconductor fins 112 are formed on the substrate 110. The semiconductor fins 112 may be N-type or P-type. For example, one or some of the semiconductor fins 112 are N-type, and one or some of the semiconductor fins 112 are P-type. The semiconductor fins 112 may be formed using, for example, a patterning process to form trenches such that trenches are formed between adjacent semiconductor fins 112. As discussed in greater detail below, the semiconductor fins 112 will be used to form FinFETs. It is understood that two semiconductor fins 112 are illustrated for purposes of illustration, but other embodiments may include any number of semiconductor fins. In some embodiments, one or more dummy semiconductor fins are formed adjacent to the semiconductor fins 112.

The semiconductor fins 112 may be formed by performing an etching process to the substrate 110. Specifically, a patterned hard mask structure 390 is formed over the substrate 110. In some embodiments, the patterned hard mask structure 390 is formed of silicon nitride, silicon oxynitride, silicon carbide, silicon carbon-nitride, or the like. For example, the patterned hard mask structure 390 includes an oxide pad layer 392 and a nitride mask layer 394 over the oxide pad layer 392. The patterned hard mask structure 390 covers a portion of the substrate 110 while leaves another portion of the substrate 110 uncovered. The substrate 110 is then patterned using the patterned hard mask structure 390 as a mask to form trenches 102. Accordingly, the semiconductor fins 112 are formed.

Figure 2:
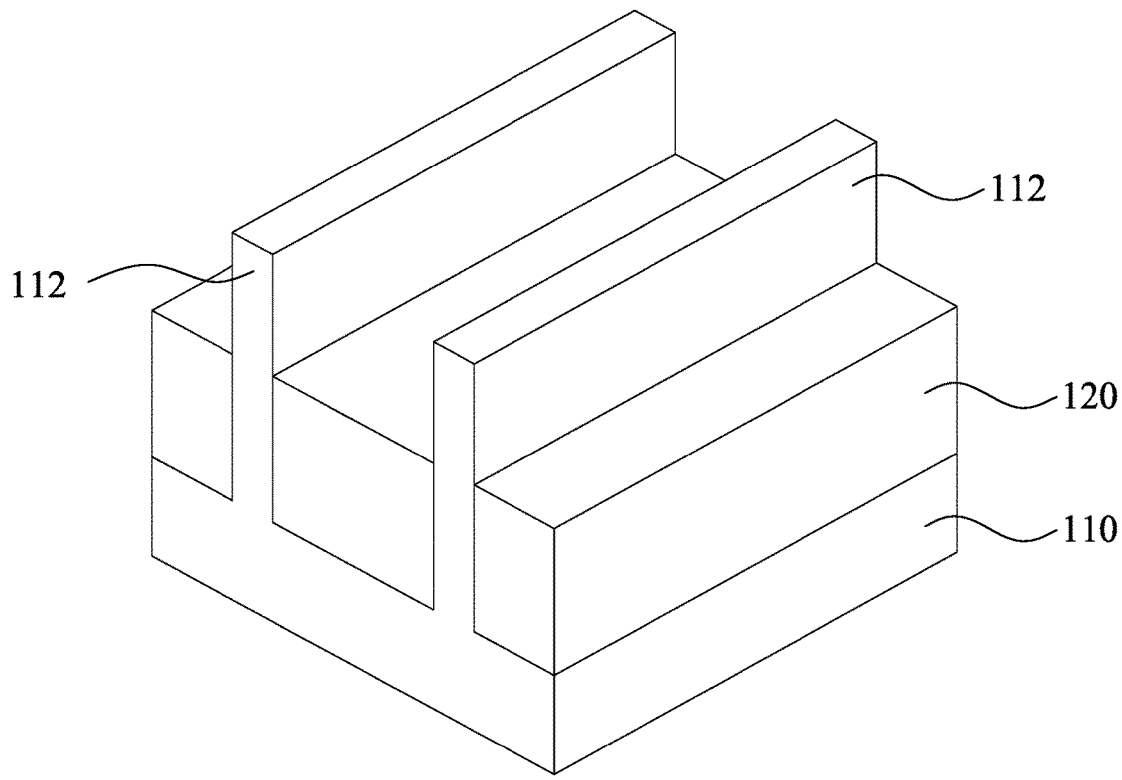

Reference is made to FIG. 2. Isolation structures 120, such as shallow trench isolations (STI), are disposed in trenches 102 (see FIG. 1) and over the substrate 110. The isolation structures 120 can be equivalently referred to as an isolation insulating layer in some embodiments. The isolation structures 120 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation structures 120 are formed through a process such as CVD, flowable CVD (FCVD), or a spin-on-glass process, although any acceptable process may be utilized. Subsequently, portions of the isolation structures 120 extending over the top surfaces of the semiconductor fins 112, are removed using, for example, an etching back process, chemical mechanical polishing (CMP), or the like.

The isolation structures 120 are then recessed to expose an upper portion of the semiconductor fin 112 as illustrated in FIG. 2. In some embodiments, the isolation structures 120 are recessed using a single etch processes, or multiple etch processes. In some embodiments in which the isolation structures 120 is made of silicon oxide, the etch process may be, for example, a dry etch, a chemical etch, or a wet cleaning process. For example, the chemical etch may employ fluorine-containing chemical such as dilute hydrofluoric (dHF) acid.

Figure 3:
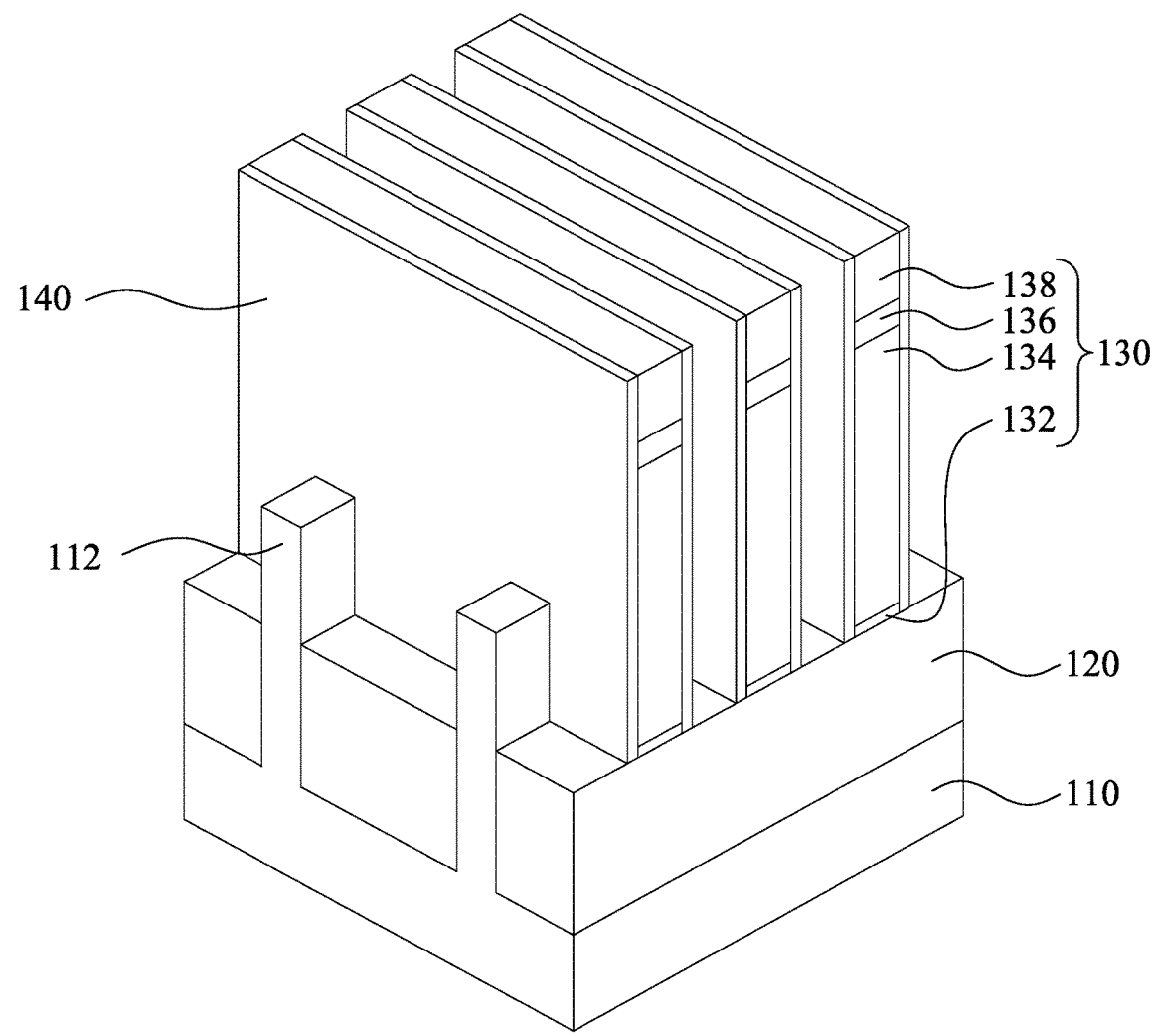

Reference is made to FIG. 3. After the semiconductor fins 112 are formed, dummy gate structures 130 are formed over the substrate 110 and at least partially disposed over the semiconductor fins 112. The portions of the semiconductor fins 112 underlying the dummy gate structures 130 may be referred to as the channel regions, and the semiconductor fins 112 may be referred to as channel layers. The dummy gate structures 130 may also define source/drain (S/D) regions of the semiconductor fins 112, for example, the regions of the semiconductor fins 112 adjacent and on opposing sides of the channel regions.

Dummy gate formation operation first forms a dummy gate dielectric layer over the semiconductor fins 112. Subsequently, a dummy gate electrode layer and a hard mask which may include multiple layers (e.g., an oxide layer and a nitride layer) are formed over the dummy gate dielectric layer. The hard mask is then patterned to be nitride mask layers 138 and oxide mask layers 136, followed by patterning the dummy gate electrode layer to be dummy gate electrodes 134 by using the mask layers 138 and pad layers 136 as etch masks. In some embodiments, after patterning the dummy gate electrode layer, the dummy gate dielectric layer is removed from the S/D regions of the semiconductor fins 112 and to be dummy gate dielectric layers 132. The etch process may include a wet etch, a dry etch, and/or combinations thereof. The etch process is chosen to selectively etch the dummy gate dielectric layer without substantially etching the semiconductor fins 112, the dummy gate electrode layers 134, the oxide mask layers 136 and the nitride mask layers 138.

After formation of the dummy gate structures 130 is completed, gate spacers 140 are formed on sidewalls of the dummy gate structures 130. In some embodiments of the gate spacer formation operations, a spacer material layer is deposited on the substrate 110. The spacer material layer may be a conformal layer that is subsequently etched back to form gate spacers 140. In some embodiments, the spacer material layer includes multiple layers, such as a first spacer layer 142 (see FIG. 7B) and a second spacer layer 144 (see FIG. 7B) formed over the first spacer layer 142. The first and second spacer layers 142 and 144 each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers 142 and 144 may be formed by depositing in sequence two different dielectric materials over the dummy gate structures 130 using processes such as, an ALD process, a PEALD (plasma enhanced ALD) process, a PECVD process, a subatmospheric CVD (SACVD) process, or other suitable process. An anisotropic etching process is then performed on the deposited spacer layers 142 and 144 to expose portions of the semiconductor fins 112 not covered by the dummy gate structures 130 (e.g., in the source/drain regions of the semiconductor fins 112). Portions of the spacer layers 142 and 144 directly above the dummy gate structures 130 may be removed by this anisotropic etching process. Portions of the spacer layer 142 and 144 on sidewalls of the dummy gate structures 130 may remain, forming gate sidewall spacers, which are denoted as the gate spacers 140, for the sake of simplicity. In some embodiments, the first spacer layer 142 is formed of silicon oxide that has a lower dielectric constant than silicon nitride, and the second spacer layer 144 is formed of silicon nitride that has a higher etch resistance against subsequent etching processing (e.g., etching source/drain recesses in the semiconductor fins 112) than silicon oxide. In some embodiments, the gate spacers 140 may be used to offset subsequently formed doped regions, such as source/drain regions. The gate spacers 140 may further be used for designing or modifying the source/drain region profile.

Figure 4:
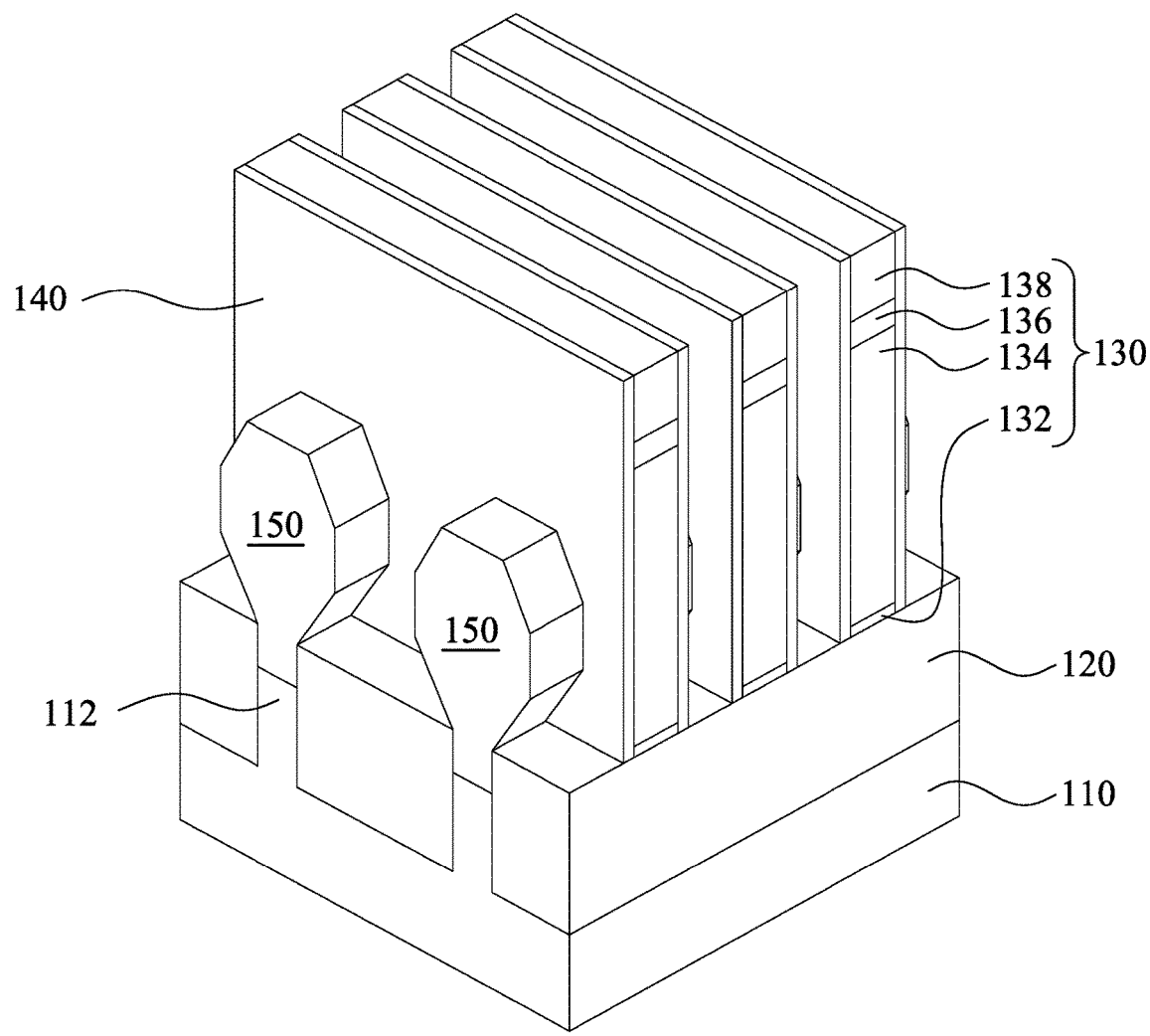

Reference is made to FIG. 4. After the formation of the gate spacers 140 is completed, source/drain epitaxial structures 150 are formed on source/drain regions of the semiconductor fins 112 that are not covered by the dummy gate structures 130 and the gate spacers 140. In some embodiments, formation of the source/drain epitaxial structures 150 includes recessing source/drain regions of the semiconductor fins 112, followed by epitaxially growing semiconductor materials in the recessed source/drain regions of the semiconductor fins 112.

The source/drain regions of the semiconductor fins 112 can be recessed using suitable selective etching processing that attacks the semiconductor fins 112, but barely attacks the gate spacers 140 and the mask layers 138 of the dummy gate structures 130. For example, recessing the semiconductor fins 112 may be performed by a dry chemical etch with a plasma source and an etchant gas. The plasma source may be inductively coupled plasma (ICP) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the semiconductor fins 112 at a faster etch rate than it etches the gate spacers 140 and the mask layers 138 of the dummy gate structures 130. In some other embodiments, recessing the semiconductor fin 112 may be performed by a wet chemical etch, such as ammonium peroxide mixture (APM), $NH_4OH$, tetramethylammonium hydroxide (TMAH), combinations thereof, or the like, which etches the semiconductor fins 112 at a faster etch rate than it etches the gate spacers 140 and the mask layers 138 of the dummy gate structures 130. In some other embodiments, recessing the semiconductor fins 112 may be performed by a combination of a dry chemical etch and a wet chemical etch.

Once recesses are created in the source/drain regions of the semiconductor fins 112, the source/drain epitaxial structures 150 are formed in the source/drain recesses in the semiconductor fins 112 by using one or more epitaxy or epitaxial (epi) processes that provides one or more epitaxial materials on the semiconductor fins 112. During the epitaxial growth process, the gate spacers 140 limit the one or more epitaxial materials to source/drain regions in the semiconductor fins 112. In some embodiments, the lattice constants of the source/drain epitaxial structures 150 are different from the lattice constant of the semiconductor fins 112, so that the channel region in the semiconductor fins 112 and between the source/drain epitaxial structures 150 can be strained or stressed by the source/drain epitaxial structures 150 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 112.

In some embodiments, the source/drain epitaxial structures 150 include Ge, Si, GaAs, AlGaAs, SiGe, GaAsP, SiP, or other suitable material. The source/drain epitaxial structures 150 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 150 are not in-situ doped, an implantation process (i.e., a junction implant process) is performed to dope the source/drain epitaxial structures 150. In some exemplary embodiments, the source/drain epitaxial structures 150 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed semiconductor fins 112 in the p-type device regions. The mask may then be removed. Subsequently, a mask, such as a photoresist, may be formed over the p-type device region while exposing the n-type device regions, and n-type epitaxial structures may be formed on the exposed semiconductor fins 112 in the n-type device region. The mask may then be removed.

Once the source/drain epitaxial structures 150 are formed, an annealing process can be performed to activate the p-type dopants or n-type dopants in the source/drain epitaxial structures 150. The annealing process may be, for example, a rapid thermal anneal (RTA), a laser anneal, a millisecond thermal annealing (MSA) process or the like.

Figure 5:
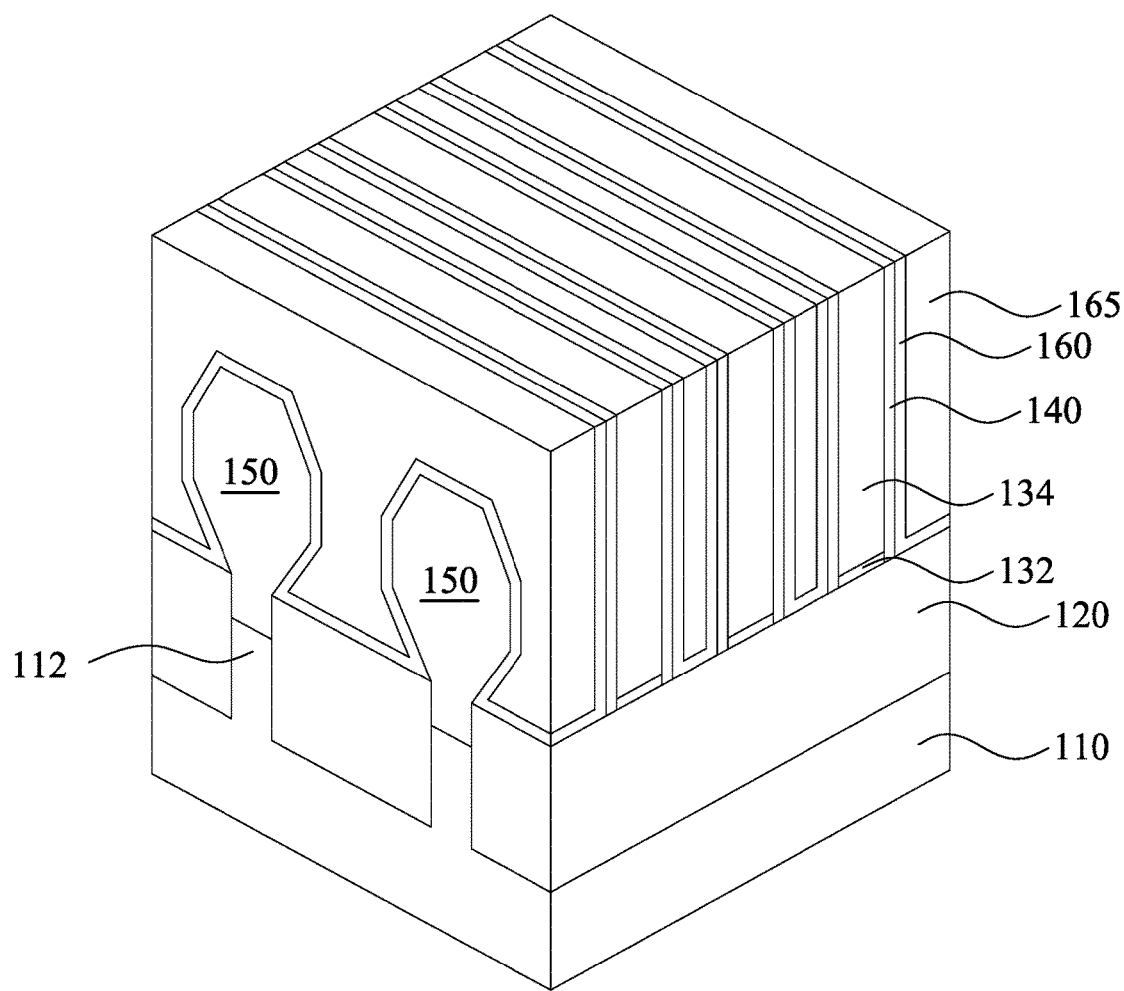

Reference is made to FIG. 5. A first interlayer dielectric (ILD) layer 165 is formed on the substrate 110. In some embodiments, a contact etch stop layer (CESL) 160 is also formed prior to forming the first ILD layer 165. In some embodiments, the CESL 160 includes a silicon nitride layer, a silicon oxynitride layer, and/or other suitable materials having a different etch selectivity than the first ILD layer 165. The CESL 160 may be formed by plasma-enhanced chemical vapor deposition (PECVD) process and/or other suitable deposition or oxidation processes. In some embodiments, the first ILD layer 165 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 160. The first ILD layer 165 may be deposited by a subatmospheric CVD (SACVD) process, a flowable CVD process, or other suitable deposition technique. In some embodiments, after formation of the first ILD layer 165, the wafer may be subject to a high thermal budget process to anneal the first ILD layer 165.

In some examples, after forming the first ILD layer 165, a planarization process may be performed to remove excessive materials of the first ILD layer 165. For example, a planarization process includes a chemical mechanical planarization (CMP) process which removes portions of the first ILD layer 165 (and the CESL 160, if present) overlying the dummy gate structures 130. In some embodiments, the CMP process also removes the oxide mask layers 136 and the nitride mask layers 138 (as shown in FIG. 4) and exposes the dummy gate electrodes 134.

Figure 6:
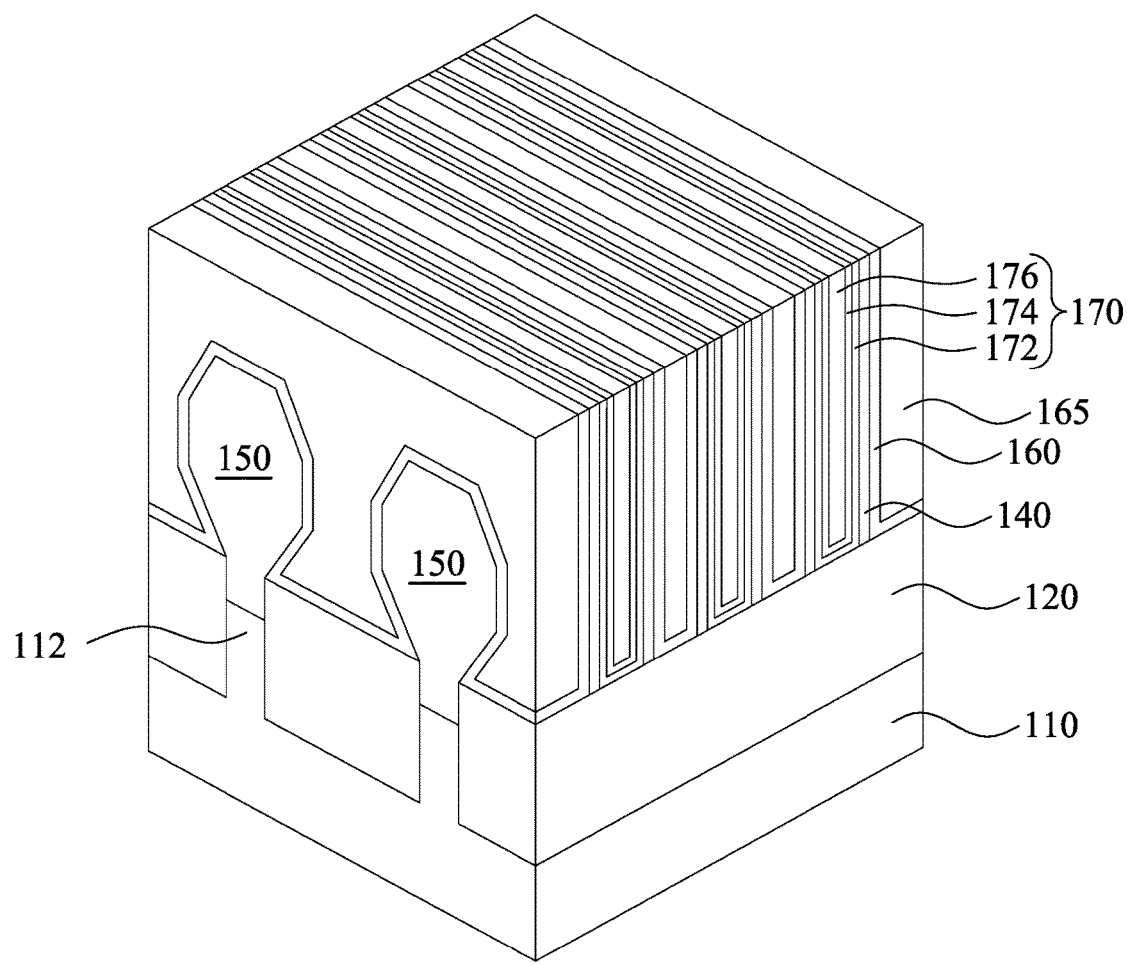

Reference is made to FIG. 6. The dummy gate electrodes 134 and the dummy gate dielectric layers 132 (see FIG. 5) are removed, resulting in gate trenches between corresponding gate spacers 140. The dummy gate electrodes 134 and the dummy gate dielectric layers 132 are removed using a selective etching process (e.g., selective dry etching, selective wet etching, or combinations thereof) that etches materials in the dummy gate electrodes 134 and the dummy gate dielectric layers 132 at a faster etch rate than it etches other materials (e.g., the gate spacers 140, the CESL 160, and/or the first ILD layer 165).

Thereafter, replacement gate structures 170 are respectively formed in the gate trenches. The gate structures 170 may be the final gates of FinFETs. The final gate structures each may be a high-k/metal gate stack, however other compositions are possible. In some embodiments, each of the gate structures 170 forms the gate associated with the three-sides of the channel region provided by the semiconductor fins 112. Stated another way, each of the gate structures 170 wraps around the semiconductor fins 112 on three sides. In various embodiments, the (high-k/metal) gate structure 170 includes a gate dielectric layer 172 lining the gate trench and a gate electrode over the gate dielectric layer 172.

The gate electrode may include a work function metal layer 174 formed over the gate dielectric layer 172 and a fill metal 176 formed over the work function metal layer 174 and filling a remainder of gate trenches. The gate dielectric layer 172 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 174 and/or fill metal 176 used within high-k/metal gate structures 170 may include a metal, metal alloy, or metal silicide. Formation of the high-k/metal gate structures 170 may include multiple deposition processes to form various gate materials, one or more liner layers, and one or more CMP processes to remove excessive gate materials.

In some embodiments, the interfacial layer of the gate dielectric layer 172 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 172 may include hafnium oxide ($HfO_2$). Alternatively, the gate dielectric layer 172 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 174 may include work function metals to provide a suitable work function for the high-k/metal gate structures 170. For an n-type FinFET, the work function metal layer 174 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 174 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 176 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 7A:
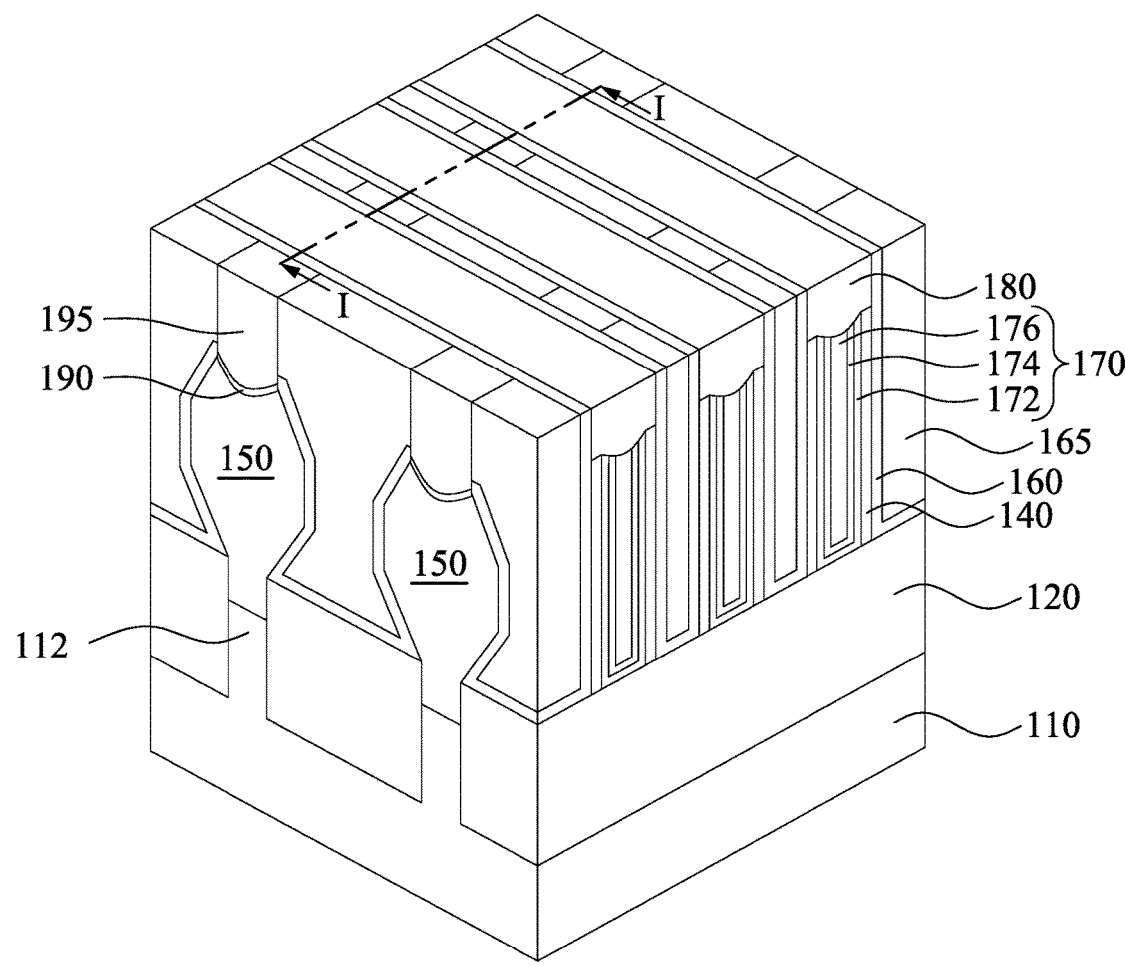
Figure 7B:
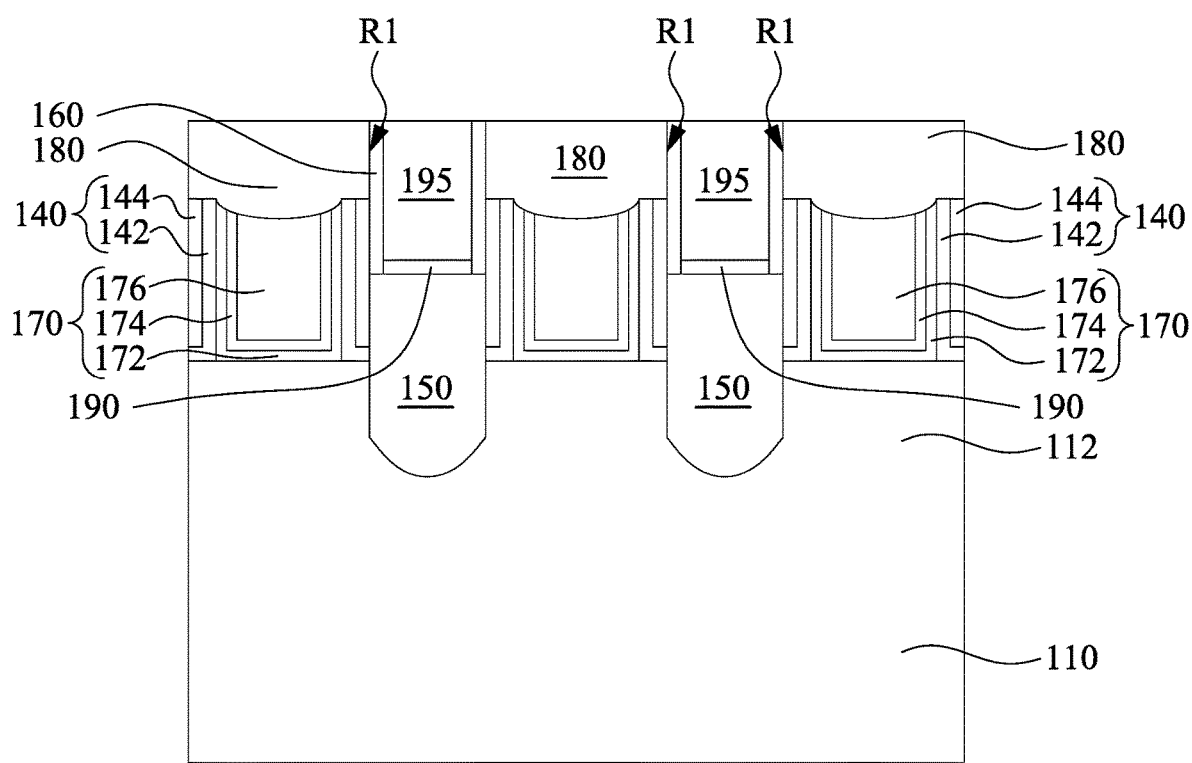

Reference is then made to FIGS. 7A and 7B, where FIG. 7B is a cross-sectional view taken along line I-I of FIG. 7A. An etching back process is performed to etch back the replacement gate structures 170 and the gate spacers 140, resulting in recesses R1 over the etched-back gate structures 170 and the etched-back gate spacers 140. In some embodiments, because the materials of the replacement gate structures 170 have a different etch selectivity than the gate spacers 140, a first selective etching process may be initially performed to etch back the replacement gate structures 170 to lower the replacement gate structures 170. Subsequently, a second selective etching process is performed to lower the gate spacers 140. As a result, the top surfaces of the replacement gate structures 170 may be at a different level than the top surfaces of the gate spacers 140.

Subsequently, dielectric caps 180 are respectively formed in the recesses R1. For example, a dielectric cap layer is deposited over the substrate 110 until the recesses R1 are overfilled. The dielectric cap layer includes SiN, SiC, SiCN, SiON, SiCON, combinations thereof or the like, and is formed by a suitable deposition technique such as CVD, plasma-enhanced CVD (PECVD), ALD, remote plasma ALD (RPALD), plasma-enhanced ALD (PEALD), combinations thereof or the like. A CMP process is then performed to remove the cap layer outside the recesses R1, leaving portions of the dielectric cap layer in the recesses R1 to serve as the dielectric caps 180.

Source/drain contacts 195 are formed extending through the first ILD layer 165. Formation of the source/drain contacts 195 includes, by way of example and not limitation, performing one or more etching processes to form contact openings extending though the first ILD layer 165 to expose the source/drain epitaxial structures 150, depositing one or more metal materials overfilling the contact openings, and then performing a CMP process to remove excessive metal materials outside the contact openings. In some embodiments, the one or more etching processes are selective etching that etches the first ILD layer 165 at a faster etch rate than etching the dielectric caps 180 and the CESL 160. As a result, the selective etching is performed using the dielectric caps 180 and the CESL 160 as an etch mask, such that the contact openings and hence source/drain contacts 195 are formed self-aligned to the source/drain epitaxial structures 150 without using an additional photolithography process. In that case, the dielectric caps 180 allowing for forming the source/drain contacts 195 in a self-aligned manner can be called self-aligned-contact (SAC) caps 180.

In some embodiments, metal alloy layers 190 are respectively formed above the source/drain epitaxial structures 150 prior to forming the source/drain contacts 195. The front-side metal alloy layers 190, which may be silicide layers, are respectively formed in the trenches and over the exposed source/drain epitaxial structures 150 by a self-aligned silicide (salicide) process. The silicide process converts the surface portions of the source/drain epitaxial structures 150 into the silicide contacts. Silicide processing involves deposition of a metal that undergoes a silicidation reaction with silicon (Si). In order to form silicide contacts on the source/drain epitaxial structures 150, a metal material is blanket deposited on the source/drain epitaxial structures 150. After heating the wafer to a temperature at which the metal reacts with the silicon of the source/drain epitaxial structures 150 to form contacts, unreacted metal is removed. The silicide contacts remain over the source/drain epitaxial structures 150, while unreacted metal is removed from other areas. The silicide layer may include a material selected from titanium silicide, cobalt silicide, nickel silicide, platinum silicide, nickel platinum silicide, erbium silicide, palladium silicide, combinations thereof, or other suitable materials. In some embodiments, the metal alloy layer 190 may include germanium.

Figure 8:
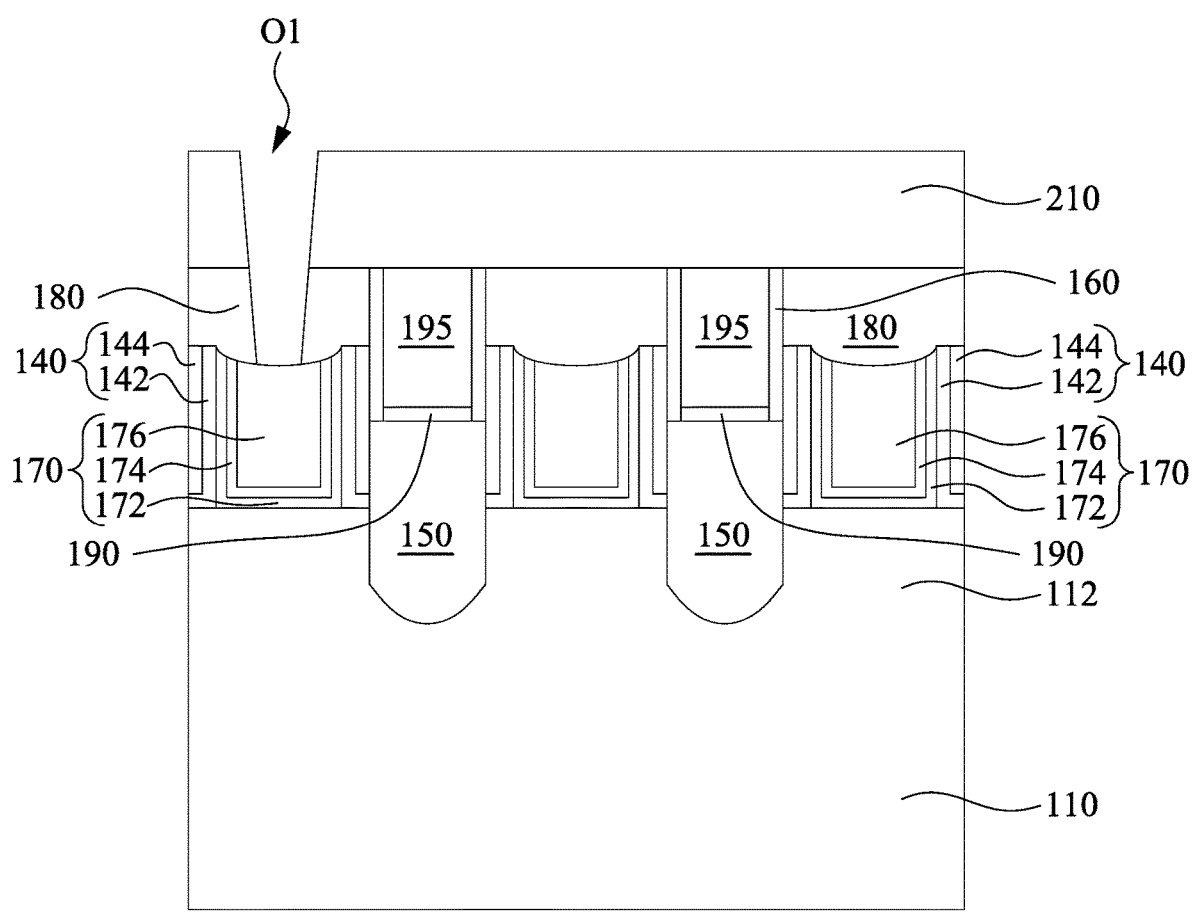

Reference is made to FIG. 8. A second ILD layer 210 is formed over the substrate 110. In some embodiments, the second ILD layer 210 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The second ILD layer 210 may be deposited by a PECVD process or other suitable deposition technique. In some embodiments, after formation of the second ILD layer 210, the wafer may be subject to a high thermal budget process to anneal the second ILD layer 210.

Subsequently, the second ILD layer 210 is patterned to form at least one gate contact opening O1 extending downward through the second ILD layer 210 and the dielectric cap 180 to the gate structure 170. The second ILD layer 210 can be patterned by using suitable photolithography and etching techniques.

Figure 9:
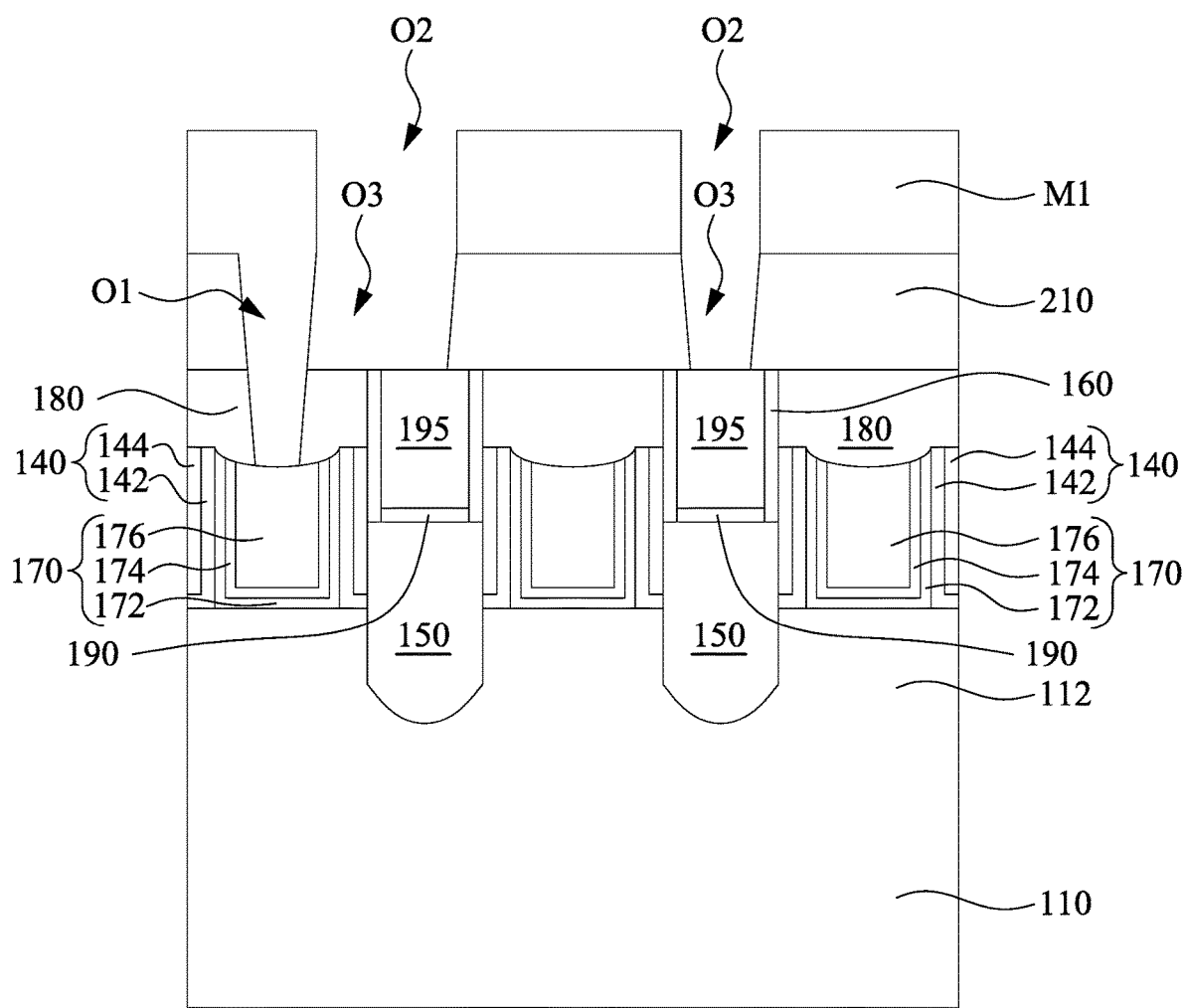

Reference is made to FIG. 9. A patterned mask layer M1 is formed over the substrate 110 to fill the gate contact opening O1. The patterned mask layer M1 has openings O2 vertically above some of the source/drain contacts 210. In some embodiments, the patterned mask layer M1 may be a photoresist mask formed by suitable photolithography process. For example, the photolithography process may include spin-on coating a photoresist layer over the structure as illustrated in FIG. 8, performing post-exposure bake processes, and developing the photoresist layer to form the patterned mask layer M1. In some embodiments, patterning the resist to form the patterned mask element may be performed using an electron beam (e-beam) lithography process or an extreme ultraviolet (EUV) lithography process.

Subsequently, with the patterned mask layer M1 in place, a via etching process is performed to form via openings O3 extending through the second ILD layer 210. As a result of the etching process, the source/drain contacts 195 get exposed at bottoms of the via openings O3.

Figure 10:
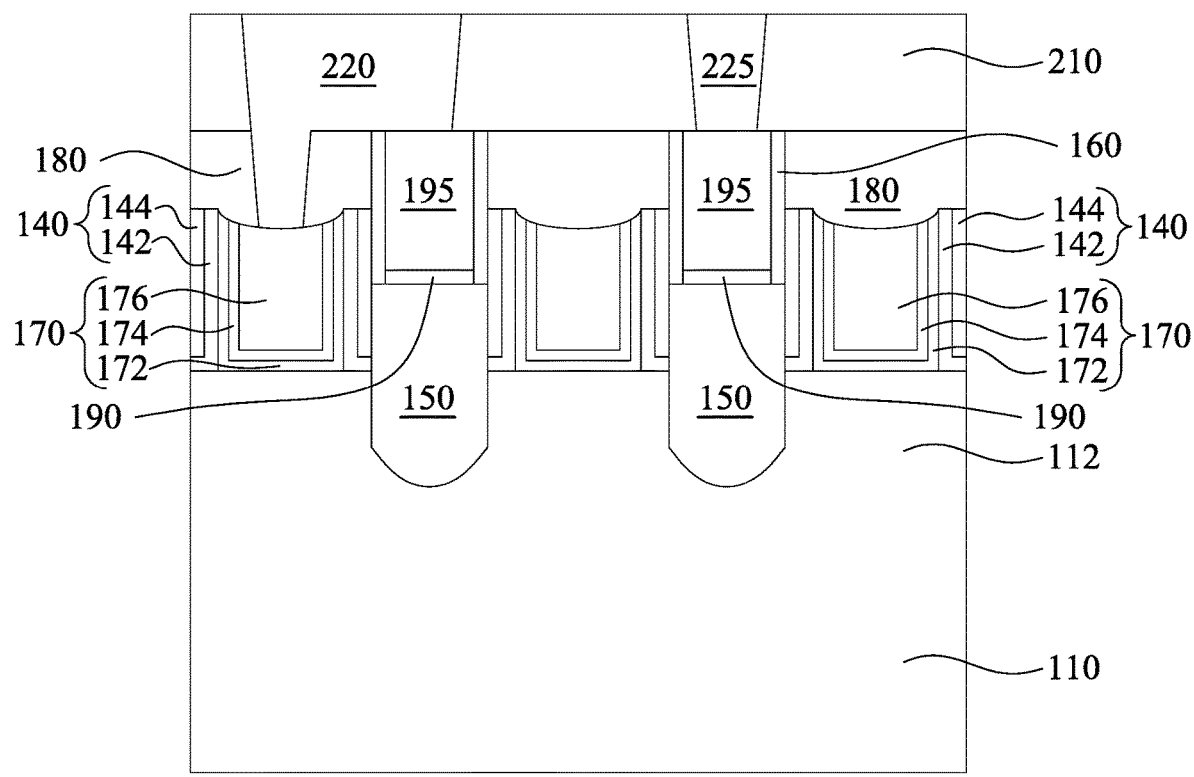

Reference is made to FIG. 10. The patterned mask layer M1 (referring to FIG. 9) is removed from the gate contact opening O1 by ashing and/or wet stripping, and then a front-side butted contact (or butted via) 220 is formed to fill the gate contact opening O1 and one of the via openings O3 and a source/drain via 225 is formed to fill another via opening O3. The butted via 220 and the source/drain via 225 are formed using, by way of example and not limitation, depositing one or more metal materials overfilling the openings O1 and O3, followed by a CMP process to remove excessive metal material(s) outside the openings O1 and O3. As a result of the CMP process, the butted via 220 and the source/drain via 225 have top surfaces substantially coplanar with the second ILD layer 210. The butted via 220 and the source/drain via 225 may include metal materials such as copper, aluminum, tungsten, combinations thereof, or the like, and may be formed using PVD, CVD, ALD, or the like. In some embodiments, the butted via 220 and the source/drain via 225 may further include one or more barrier/adhesion layers (not shown) to protect the second ILD layer 210 from metal diffusion (e.g., copper diffusion). The one or more barrier/adhesion layers may include titanium, titanium nitride, tantalum, tantalum nitride, or the like, and may be formed using PVD, CVD, ALD, or the like.

Figure 11:
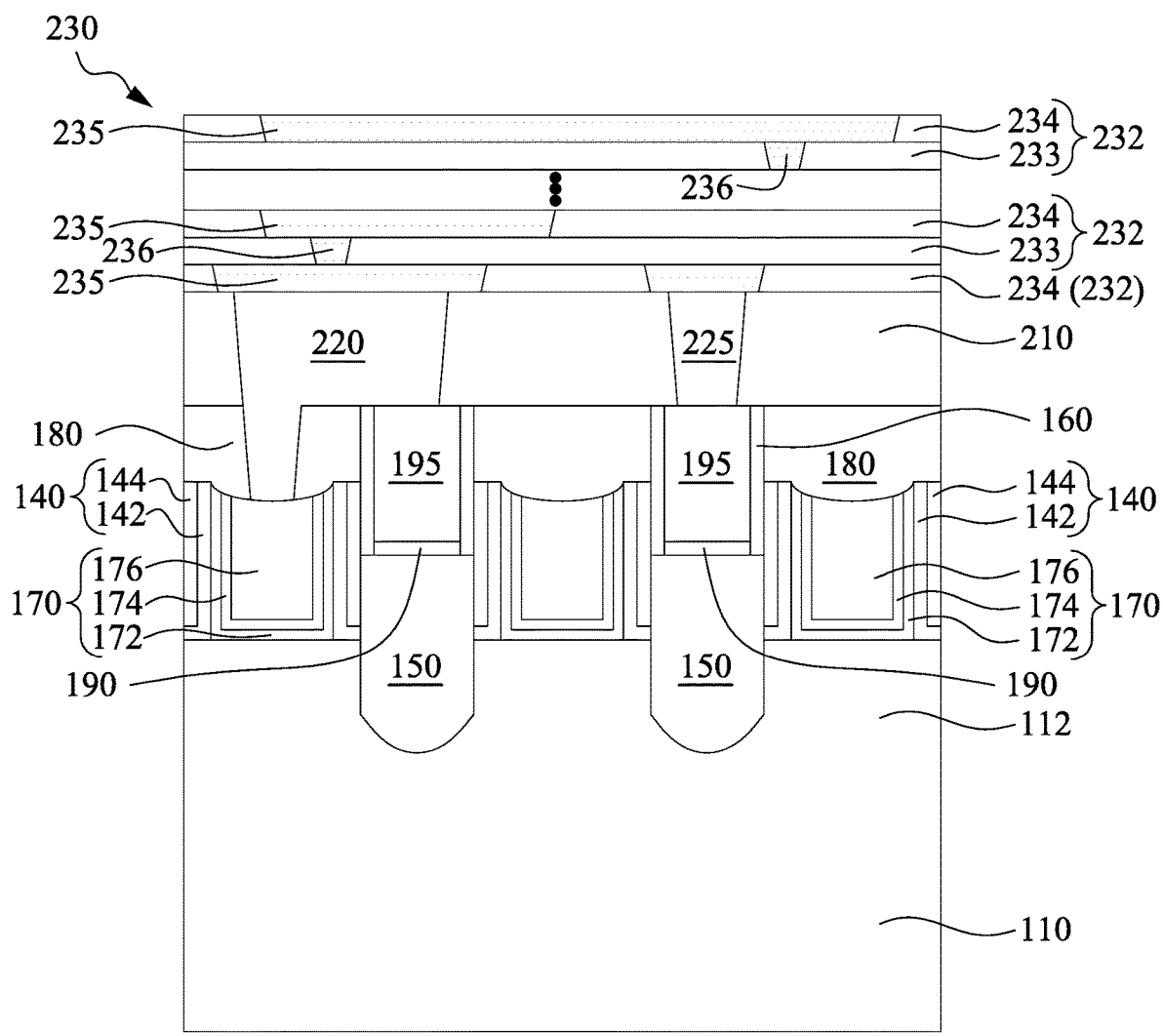

Reference is made to FIG. 11. A front-side multilayer interconnection (MLI) structure 230 is formed over the substrate 110. The front-side MLI structure 230 may include a plurality of front-side metallization layers 232. The number of front-side metallization layers 232 may vary according to design specifications of the semiconductor device. Only three front-side metallization layers 232 are illustrated in FIG. 11 for the sake of simplicity. Except the bottommost front-side metallization layers 232, the other front-side metallization layers 232 each includes a first front-side inter-metal dielectric (IMD) layer 233 and a second front-side IMD layer 234. The second front-side IMD layers 234 are formed over the corresponding first front-side IMD layers 233. The front-side metallization layers 232 include one or more horizontal interconnects, such as front-side metal lines 235, respectively extending horizontally or laterally in the second front-side IMD layers 234 and vertical interconnects, such as front-side conductive vias 236, respectively extending vertically in the first front-side IMD layers 233.

The front-side metal lines 235 and front-side conductive vias 236 can be formed using, for example, a single damascene process, a dual damascene process, the like, or combinations thereof. In some embodiments, the front-side IMD layers 233-234 may include low-k dielectric materials having k values, for example, lower than about 4.0 or even 2.0 disposed between such conductive features. In some embodiments, the front-side IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The front-side metal lines and vias 235 and 236 may include metal materials such as copper, aluminum, tungsten, combinations thereof, or the like. In some embodiments, the front-side metal lines and vias 235 and 236 may further include one or more barrier/adhesion layers (not shown) to protect the respective front-side IMD layers 233-234 from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like.

Figure 12A:
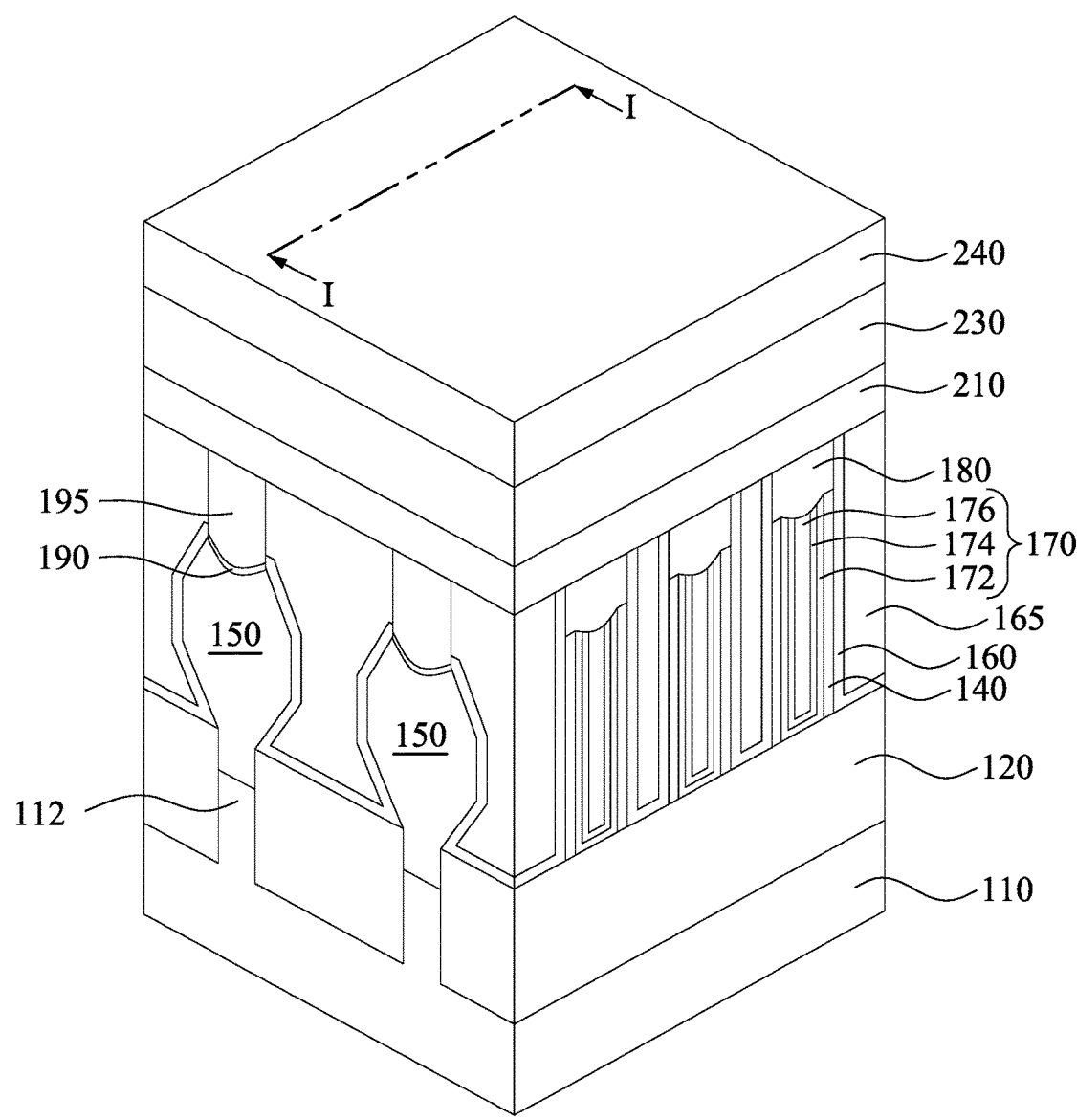
Figure 12B:
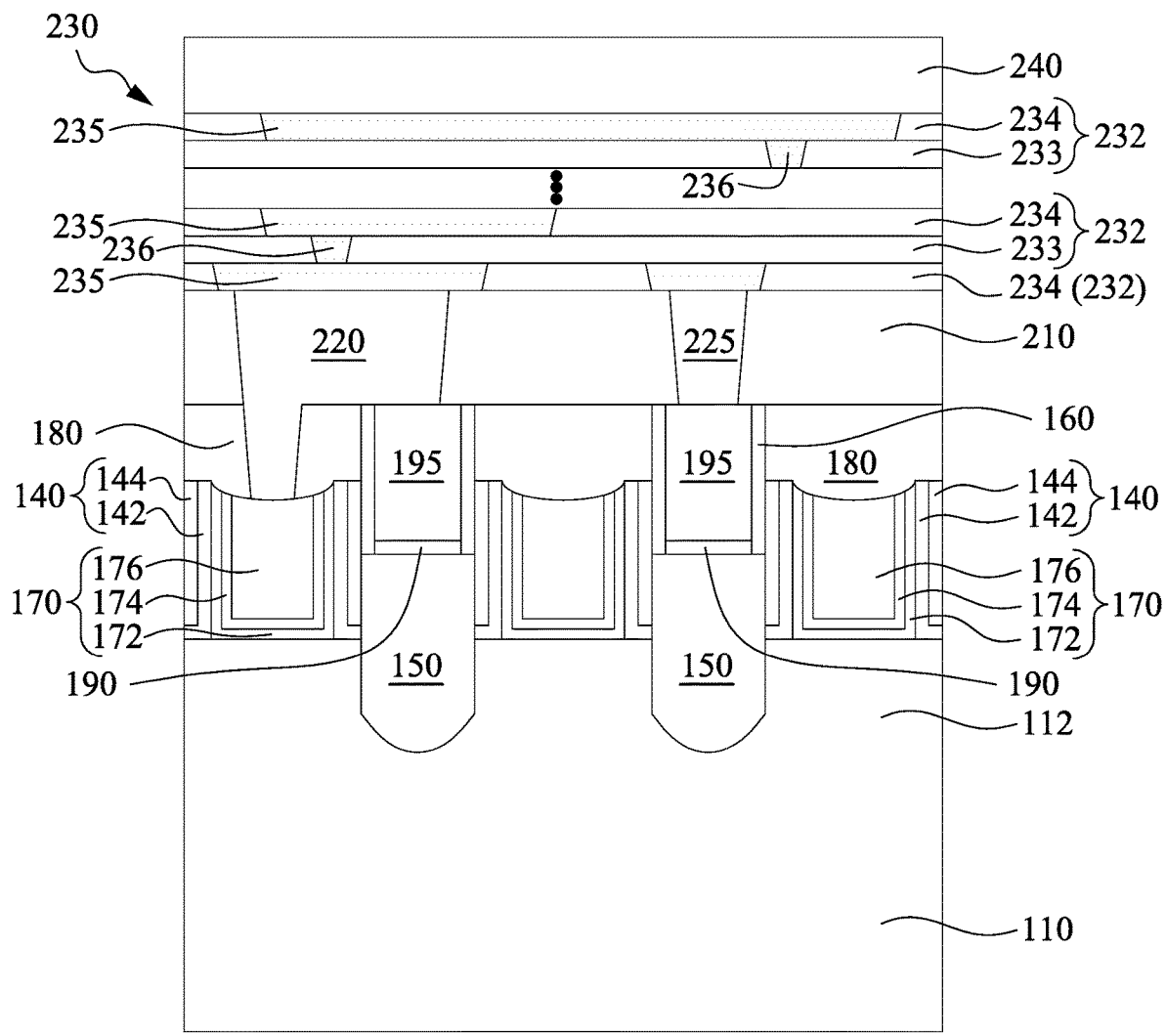
Figure 13A:
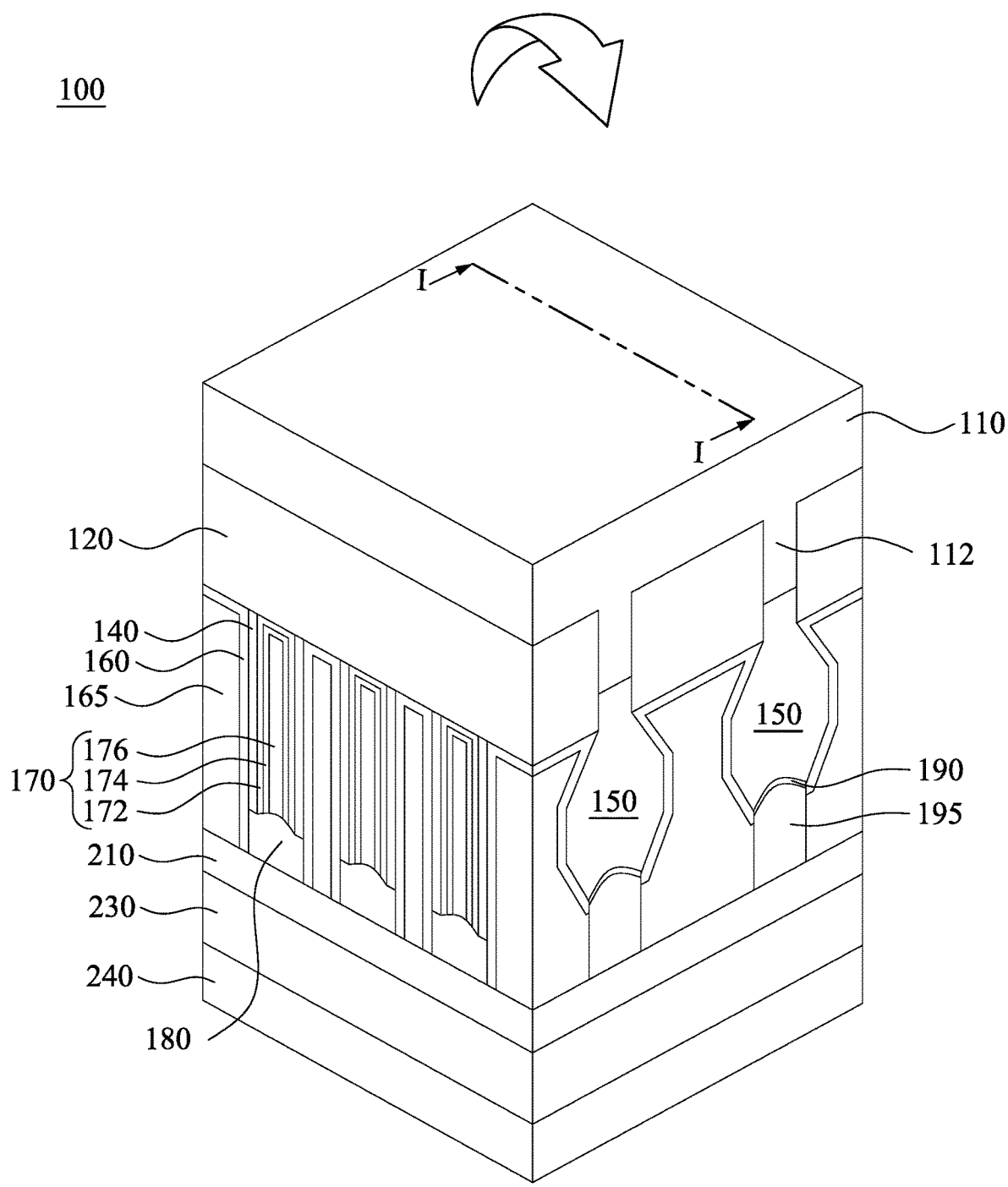
Figure 13B:
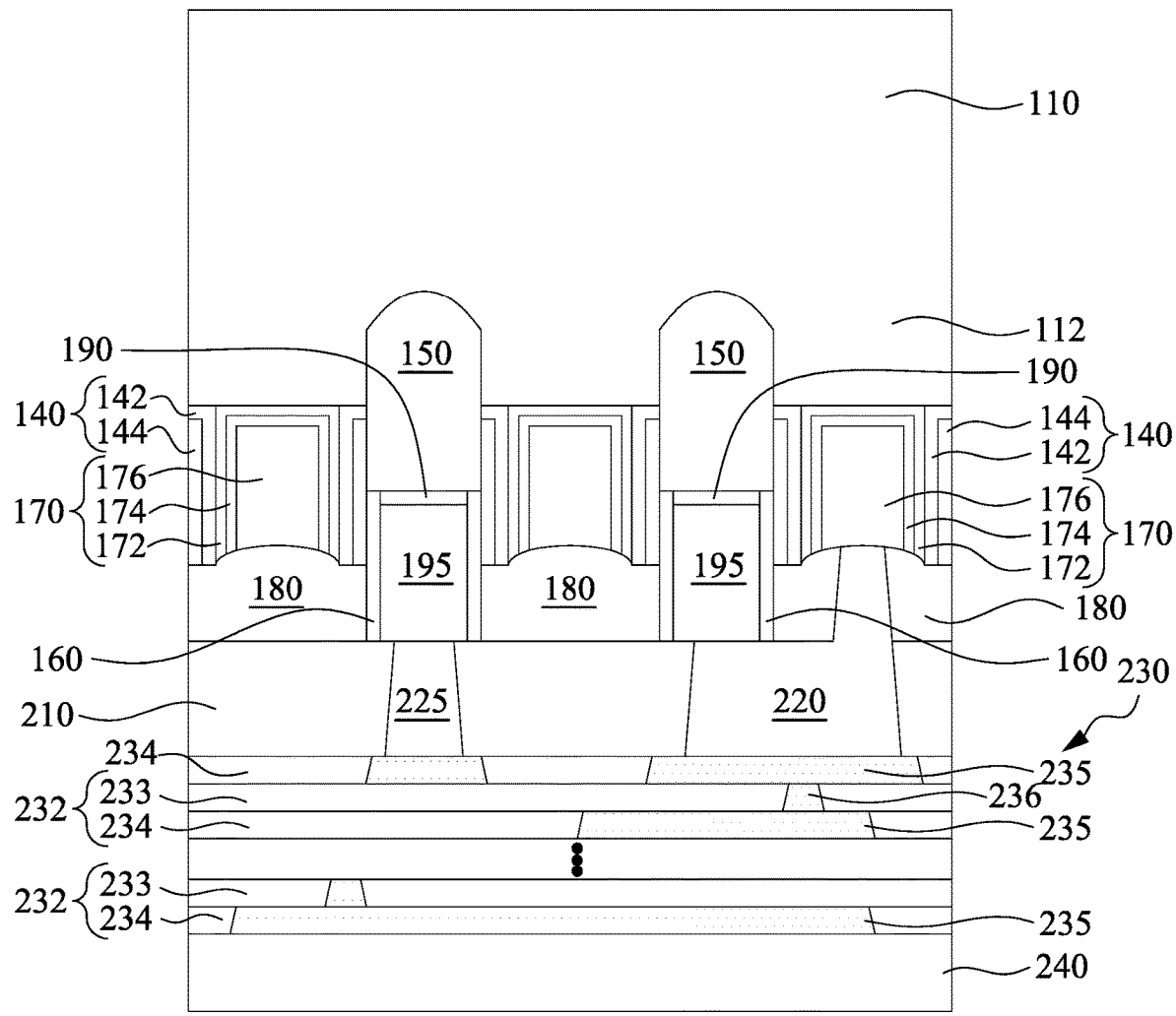

Reference is made to FIGS. 12A and 12B, where FIG. 12B is a cross-sectional view taken along line I-I of FIG. 12A. A carrier substrate 240 is bonded to the front-side MLI structure 230 in accordance with some embodiments of the present disclosure. For clarity, the front-side metallization layers 232 are shown in FIG. 12B and are omitted in FIG. 12A. The carrier substrate 240 may be silicon, doped or undoped, or may include other semiconductor materials, such as germanium; a compound semiconductor; or combinations thereof. The carrier substrate 240 may provide a structural support during subsequent processing on backside of the semiconductor device and may remain in the final product in some embodiments. In some other embodiments, the carrier substrate 240 may be removed after the subsequent processing on backside of semiconductor device is complete. In some embodiments, the carrier substrate 240 is bonded to a topmost dielectric layer of the front-side MLI structure 230 by, for example, fusion bonding. Afterwards, the semiconductor device is flipped upside down, such that a backside surface of the substrate 110 faces upwards, as illustrated in FIGS. 13A and 13B.

Figure 14:
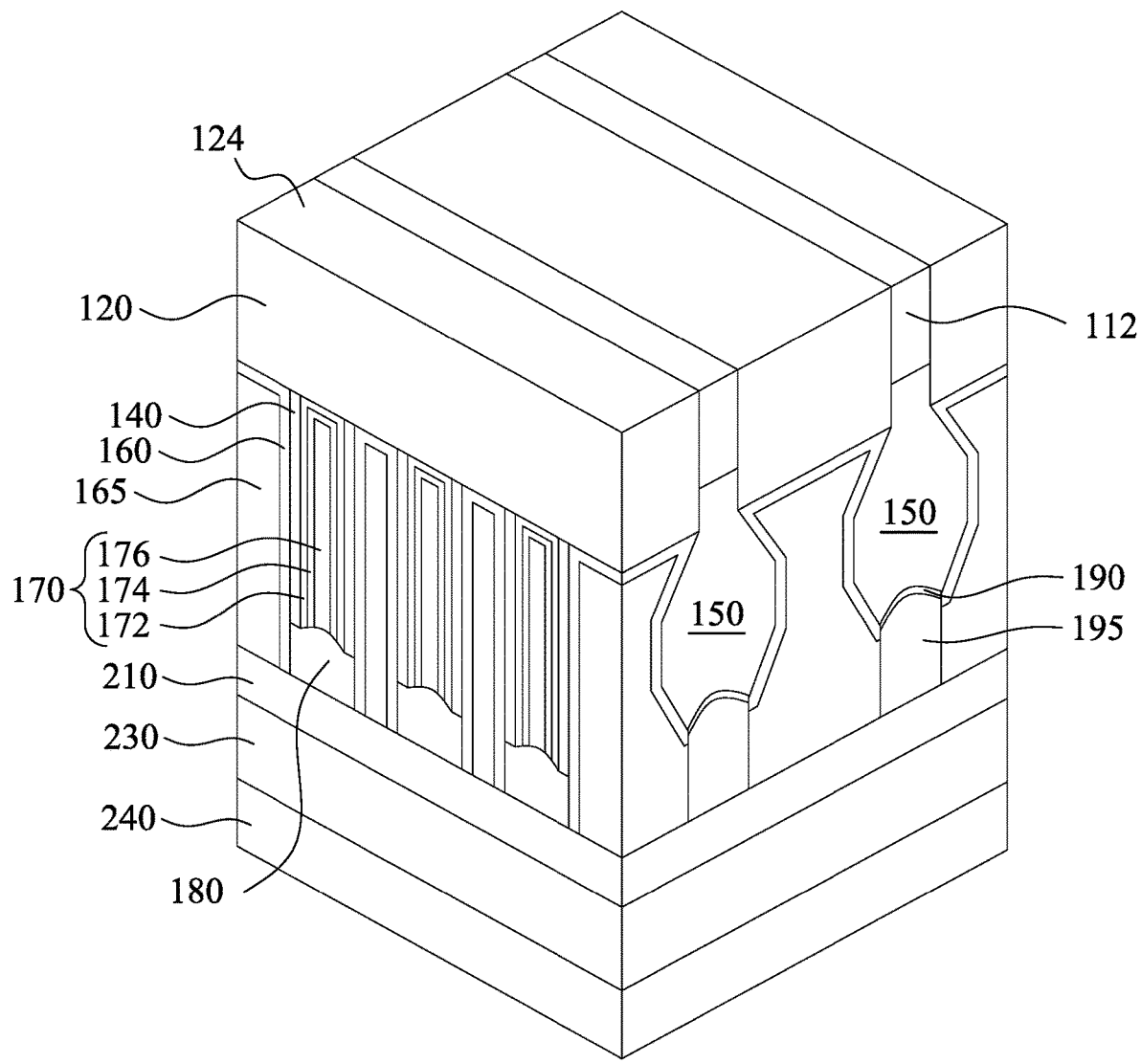
Figure 14:
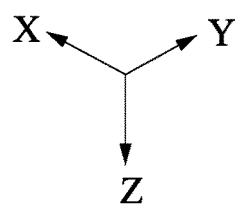

Reference is made to FIG. 14. The substrate 110 is thinned down to expose the bottom surface 124 of the isolation structure 120. In some embodiments, thinning is accomplished by a CMP process, a grinding process, or the like.

Figure 15A:
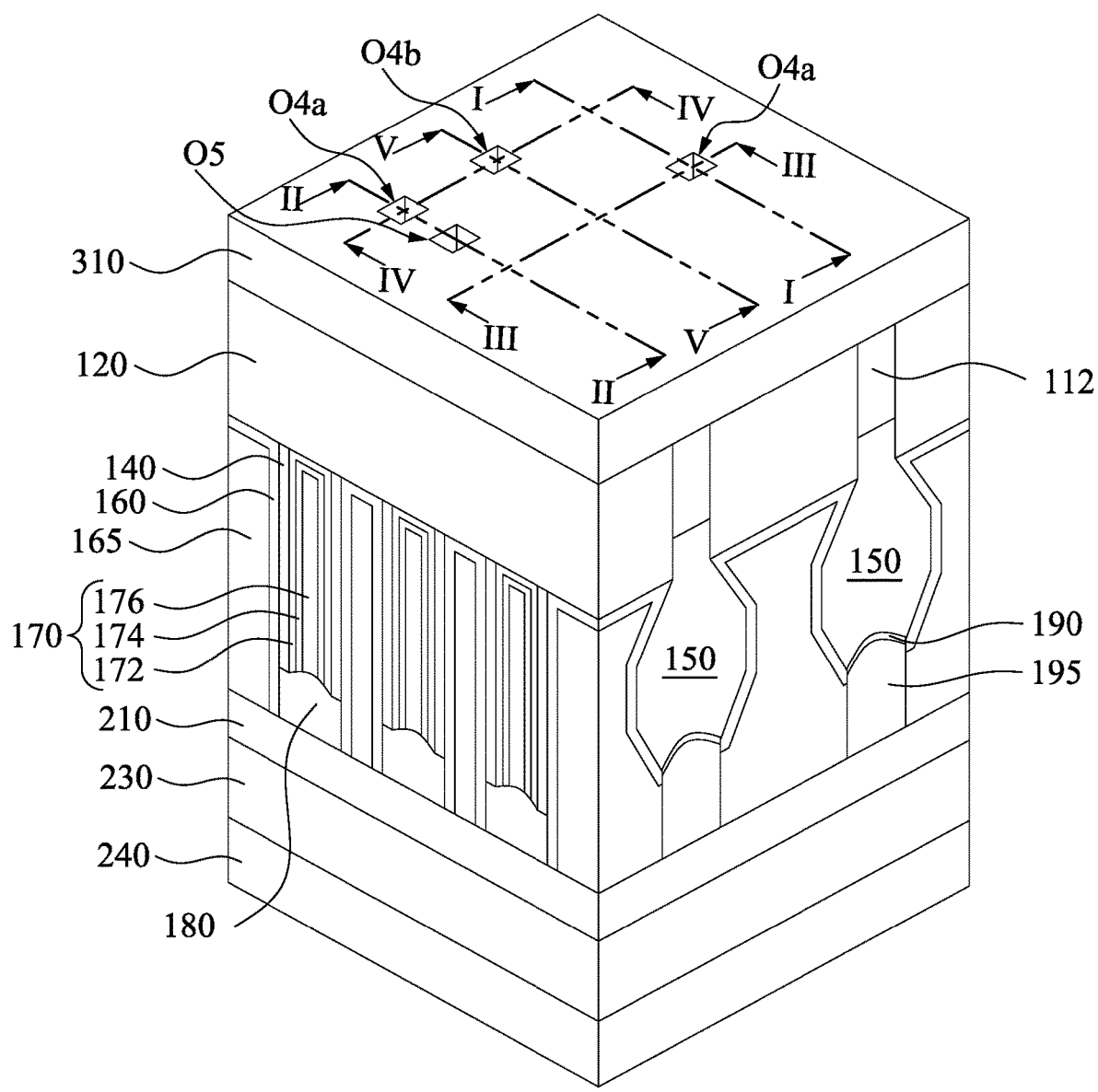
Figure 15A:
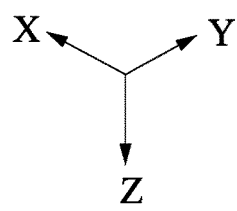
Figure 15B:
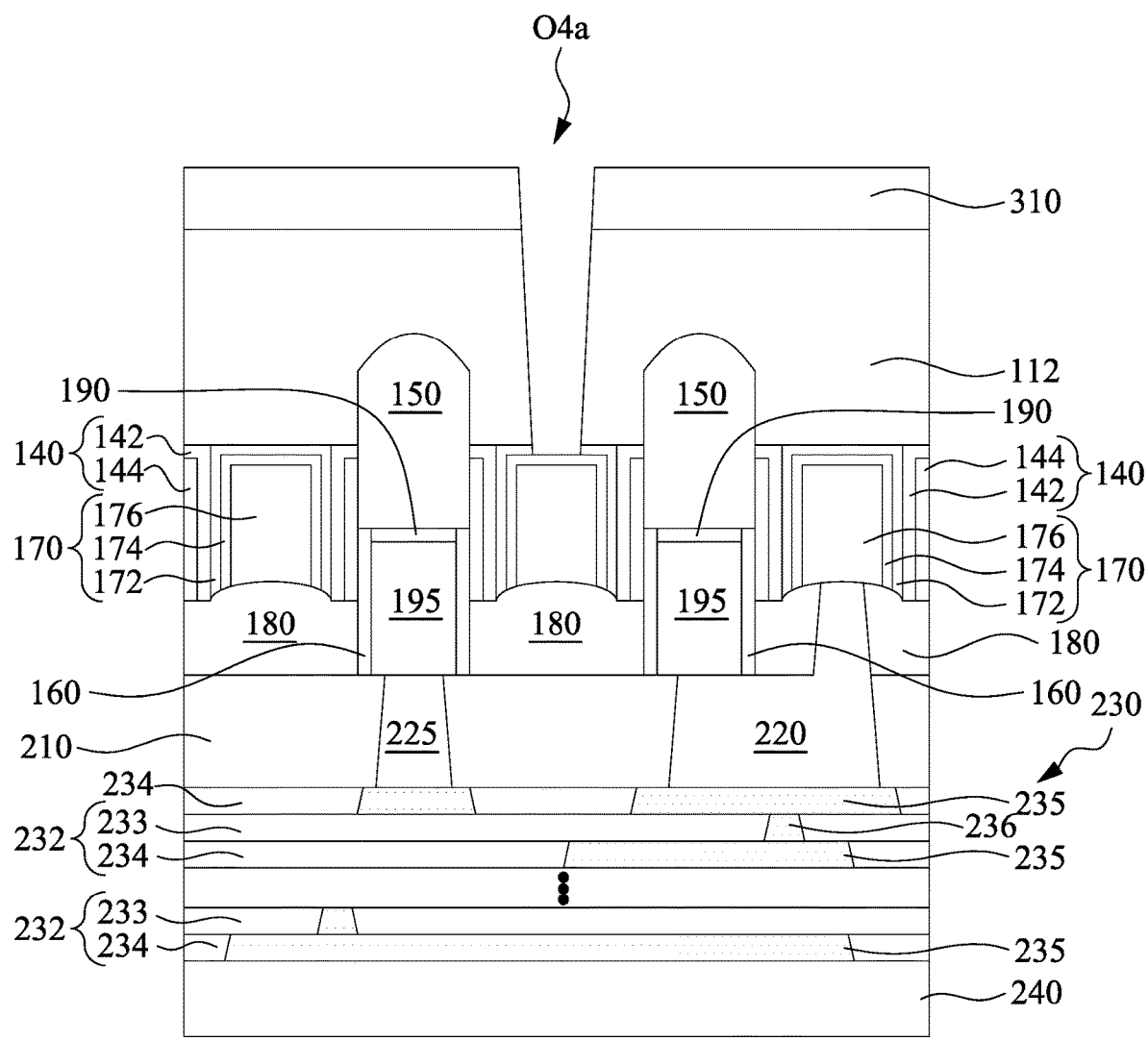
Figure 15C:
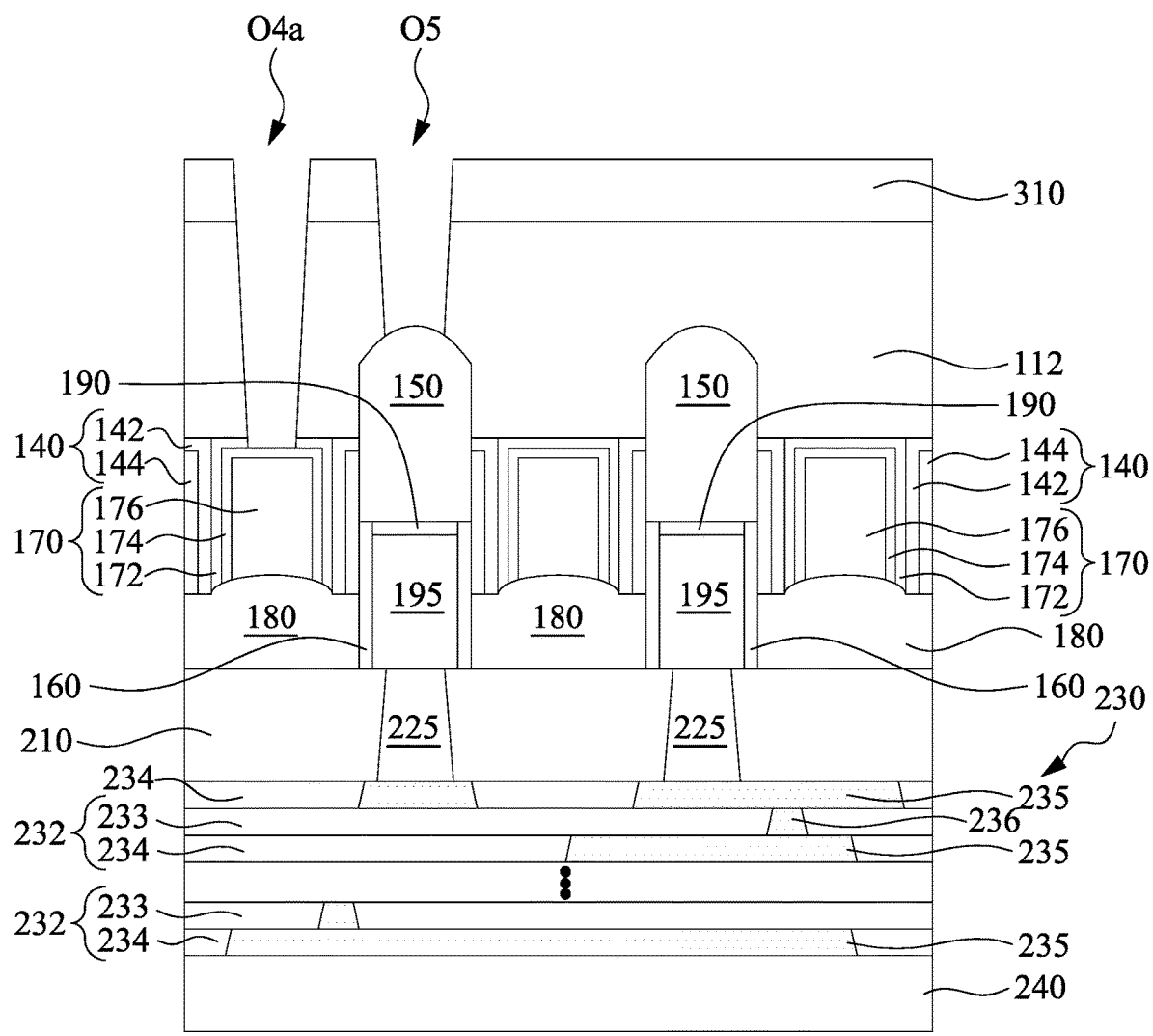
Figure 15D:
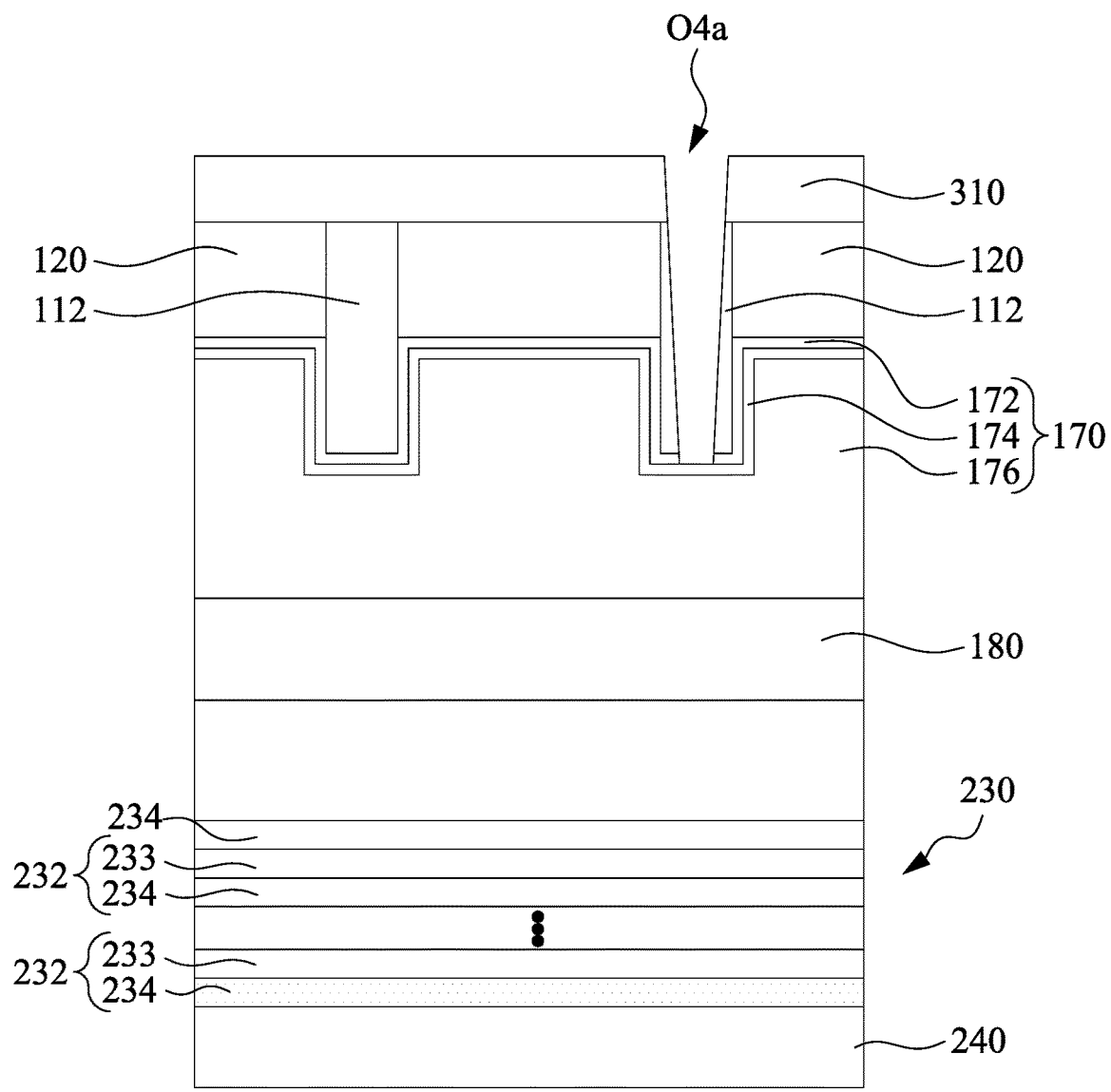
Figure 15E:
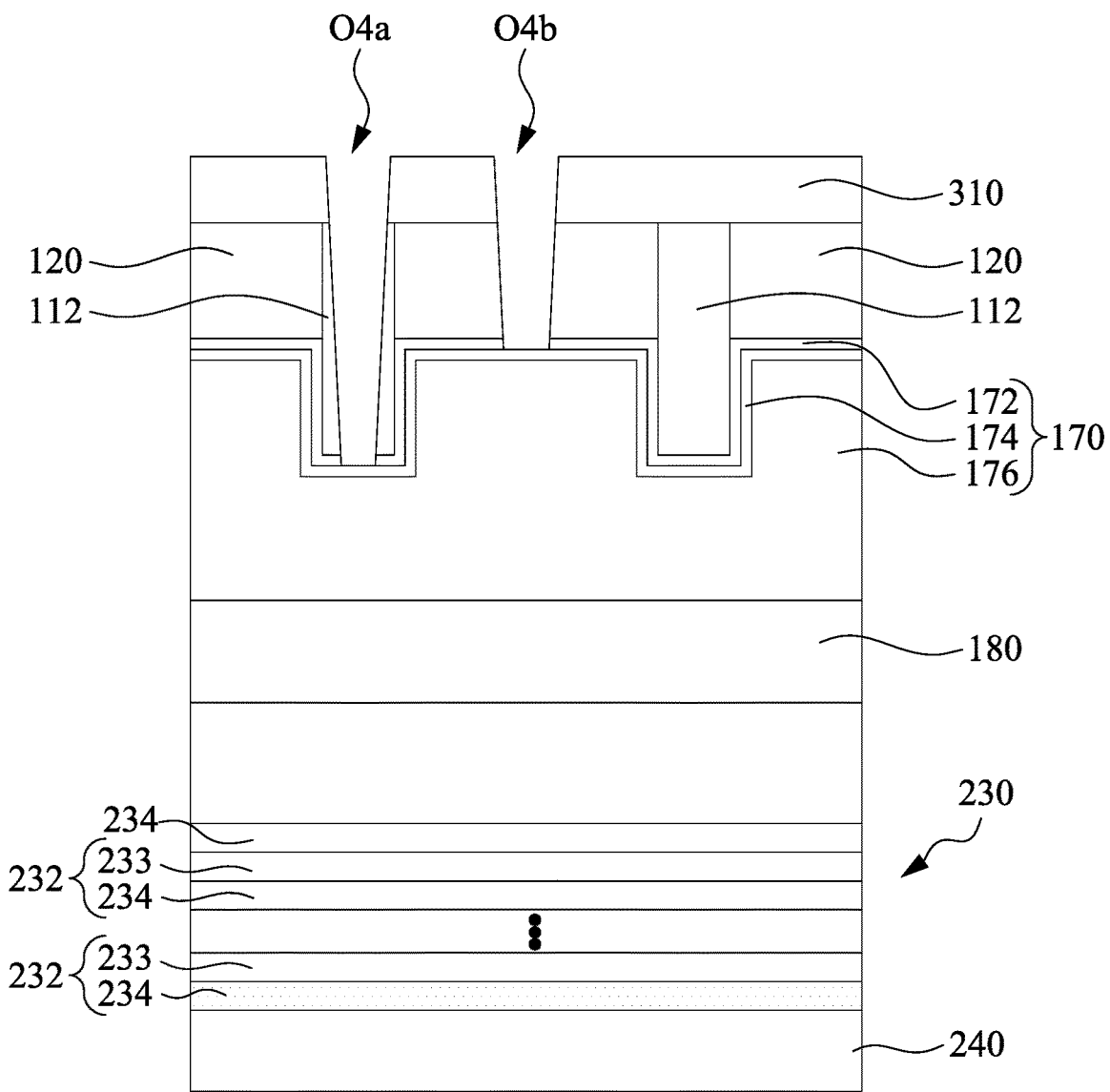
Figure 15F:
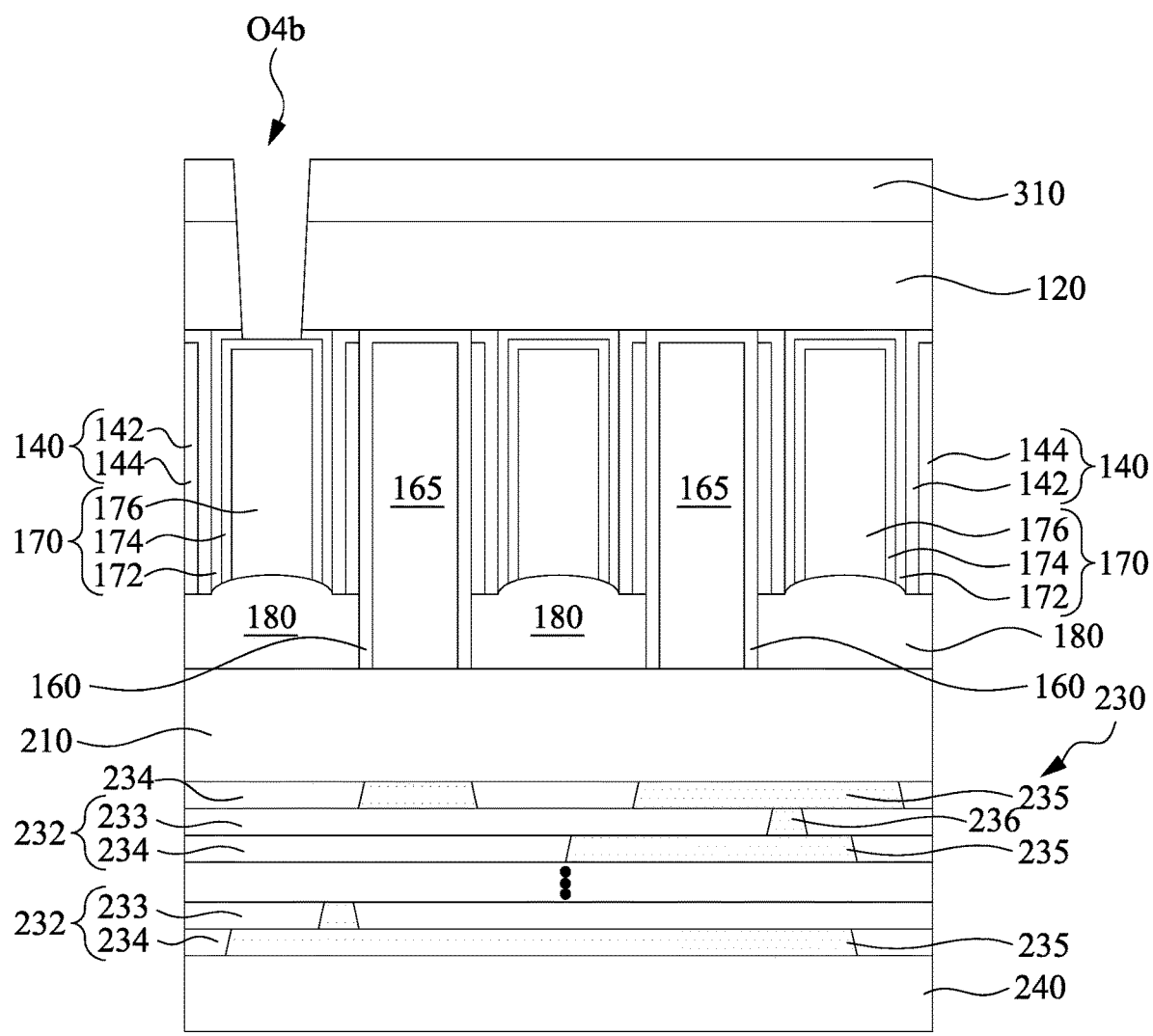

Reference is made to FIGS. 15A-15F, where FIG. 15B is a cross-sectional view taken along line I-I of FIG. 15A, FIG. 15C is a cross-sectional view taken along line II-II of FIG. 15A, FIG. 15D is a cross-sectional view taken along line III-Ill of FIG. 15A, FIG. 15E is a cross-sectional view taken along line IV-IV of FIG. 15A, and FIG. 15F is a cross-sectional view taken along line V-V of FIG. 15A. As shown in FIG. 15A, a third ILD layer 310 is formed to cover the semiconductor fins 112 and the isolation structures 120. In some embodiments, the third ILD layer 310 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The third ILD layer 310 may be deposited by a PECVD process or other suitable deposition technique. In some embodiments, after formation of the third ILD layer 310, the wafer may be subject to a high thermal budget process to anneal the third ILD layer 310.

Subsequently, gate via openings O4a and O4b are formed in the third ILD layer 310 and extend to the gate electrode (e.g., the work function metal layer 174 or the fill metal 176) of the gate structures 170. For example, one of the gate via openings O4a passes through one of the semiconductor fins 112 as shown in FIGS. 15B and 15D, and another one of the gate via openings O4a passes through another one of the semiconductor fins 112 as shown in FIGS. 15C and 15E. Further, the gate via opening O4b passes through one of the isolation structures 120 as shown in FIGS. 15F and 15E. In some embodiments, at least one source/drain via opening O5 is formed in the third ILD layer 310 and extends to one of the source/drain epitaxial structures 150. For example, the source/drain via opening O5 passes through one of the semiconductor fins 112 as shown in FIG. 15C. The gate via openings O4a and O4b and the source/drain via opening O5 may be formed by using a single or multiple etching process(es).

Figure 16A:
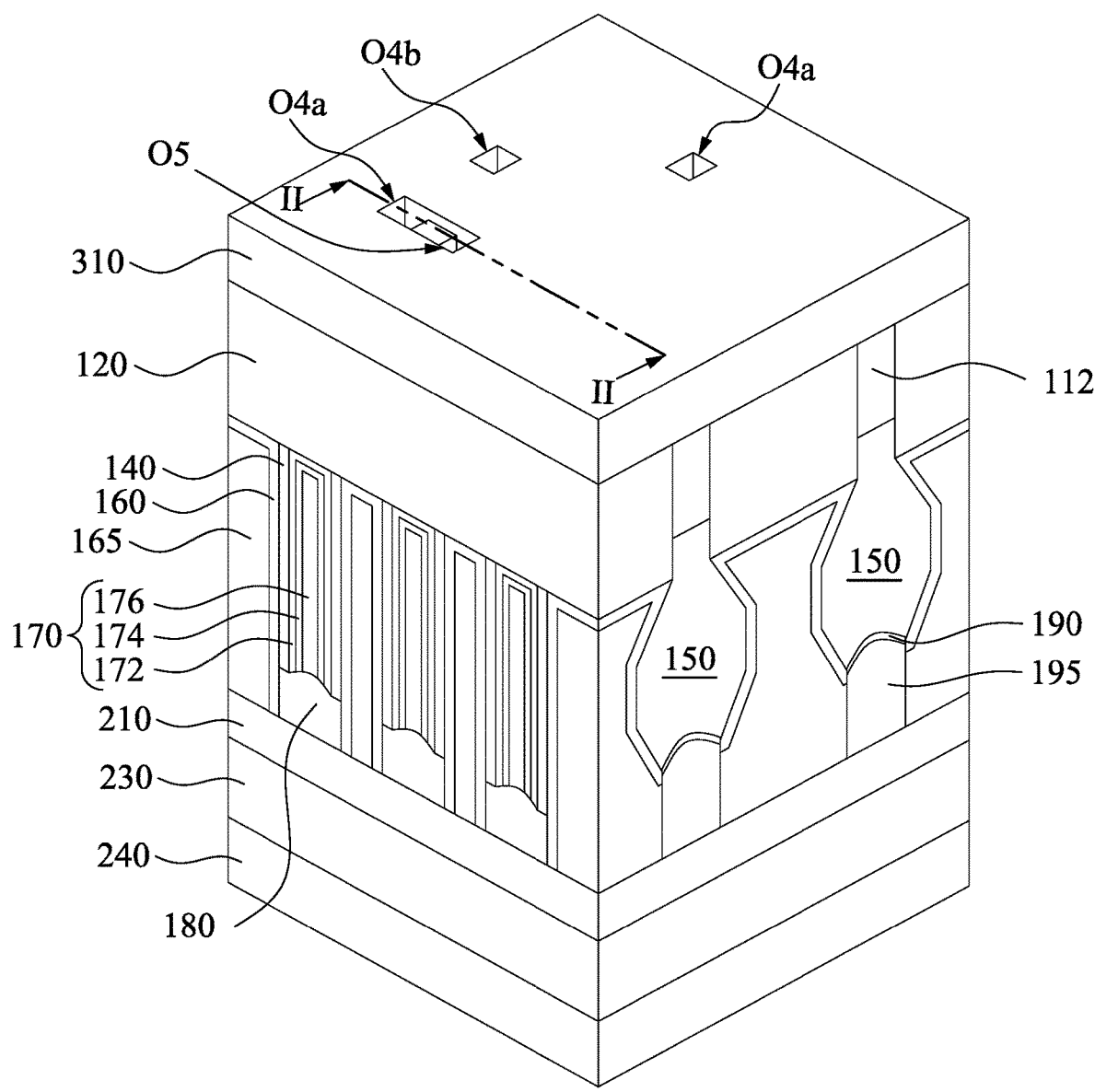
Figure 16B:
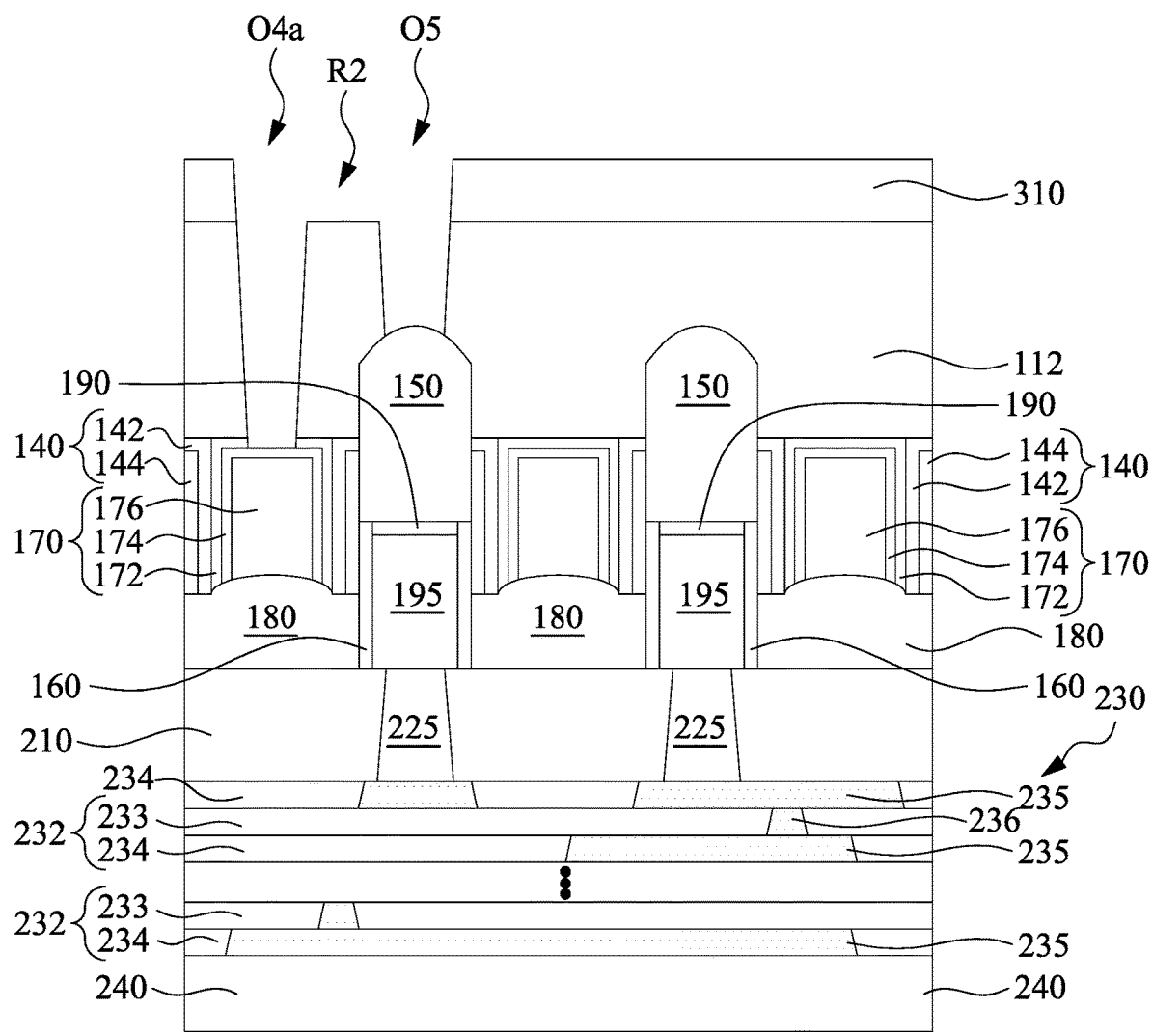

Reference is made to FIGS. 16A and 16B, where FIG. 16B is a cross-sectional view taken along line II-II of FIG. 16A. A portion of the third ILD layer 310 is removed, such that the source/drain via opening O5 is connected to the adjacent gate via opening O4a through a recess R2. For example, a mask layer is formed over the third ILD layer 310 and exposes the portion of the third ILD layer 310. The portion of the third ILD layer 310 is then removed by using the mask layer as an etch mask. The mask layer is then removed after the formation of the recess R2. In some embodiments, the recess R2 exposes the semiconductor fin 112 as shown in FIG. 16B. In some other embodiments, the depth of the recess R2 is shallower than a thickness of the third ILD layer 310, such that the recess R2 does not expose the semiconductor fin 112.

Figure 17A:
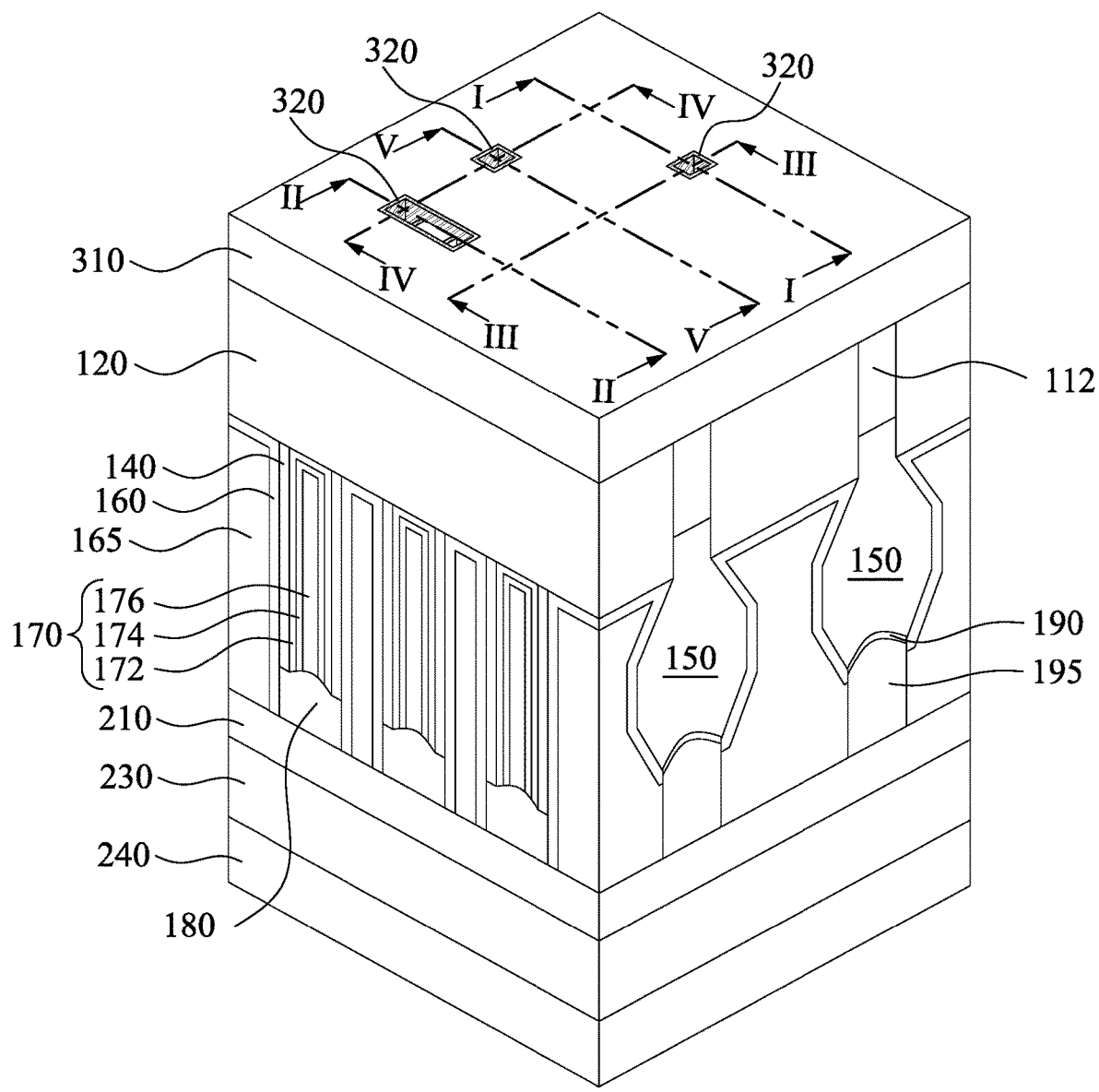
Figure 17B:
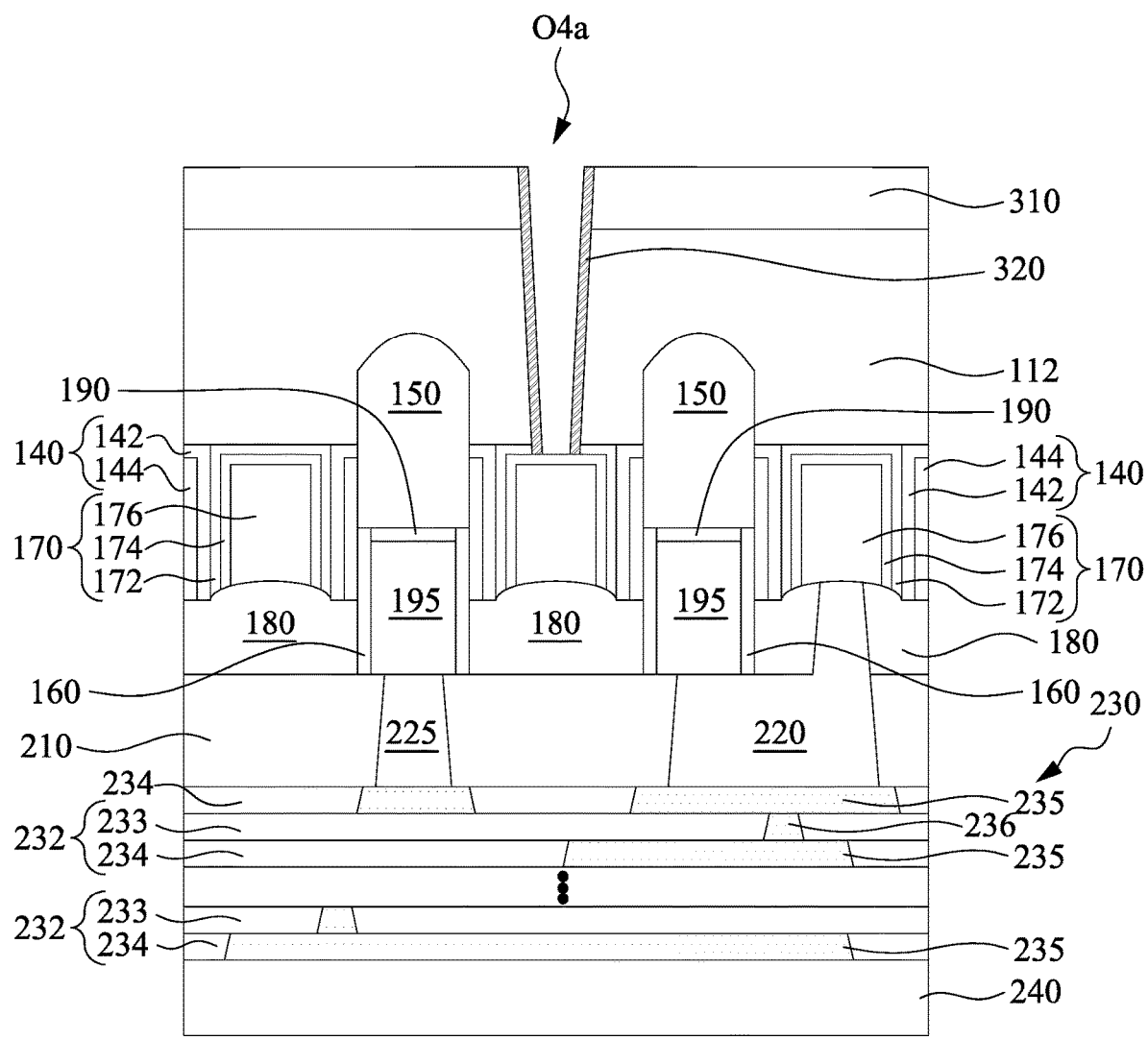
Figure 17C:
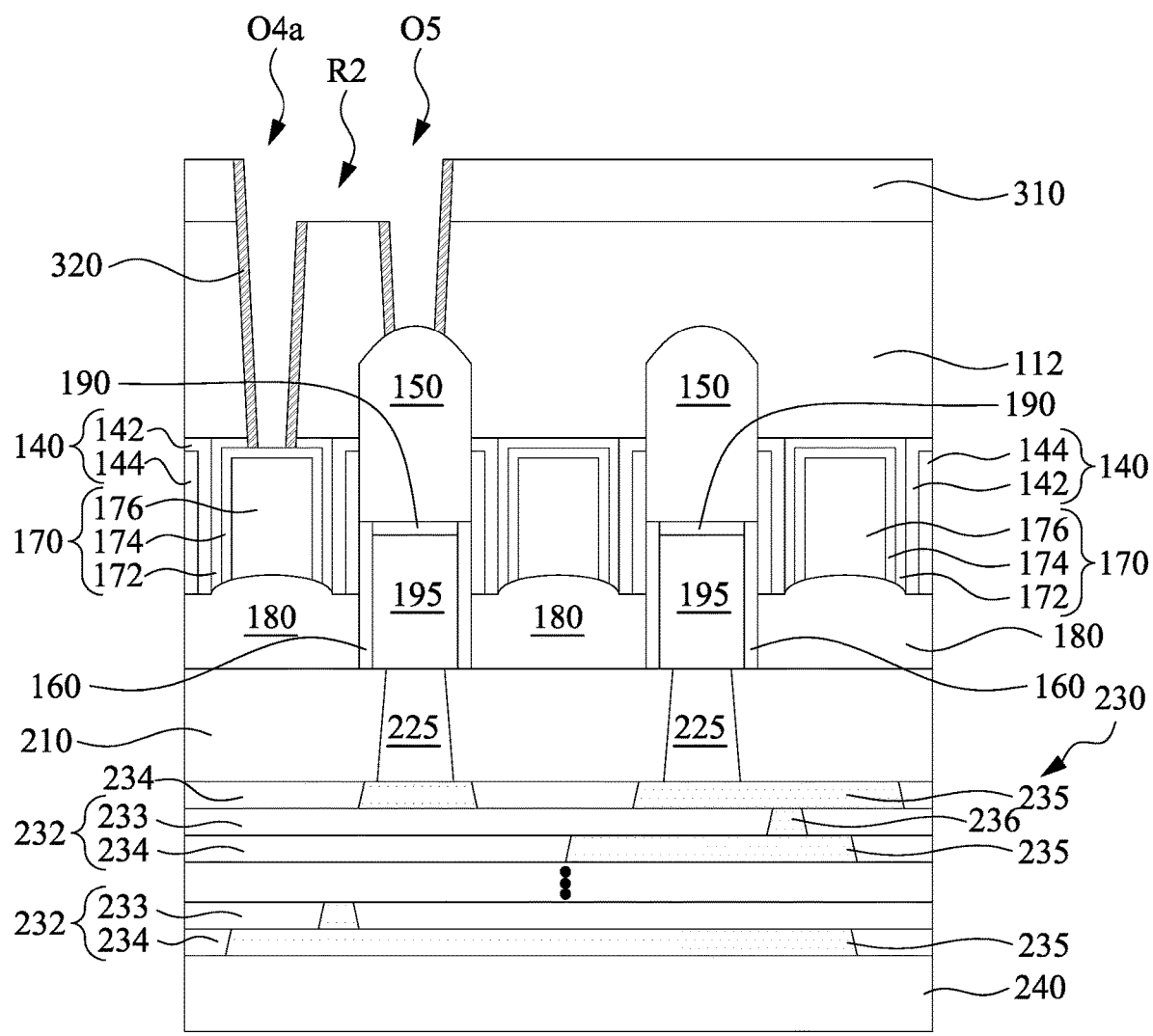
Figure 17D:
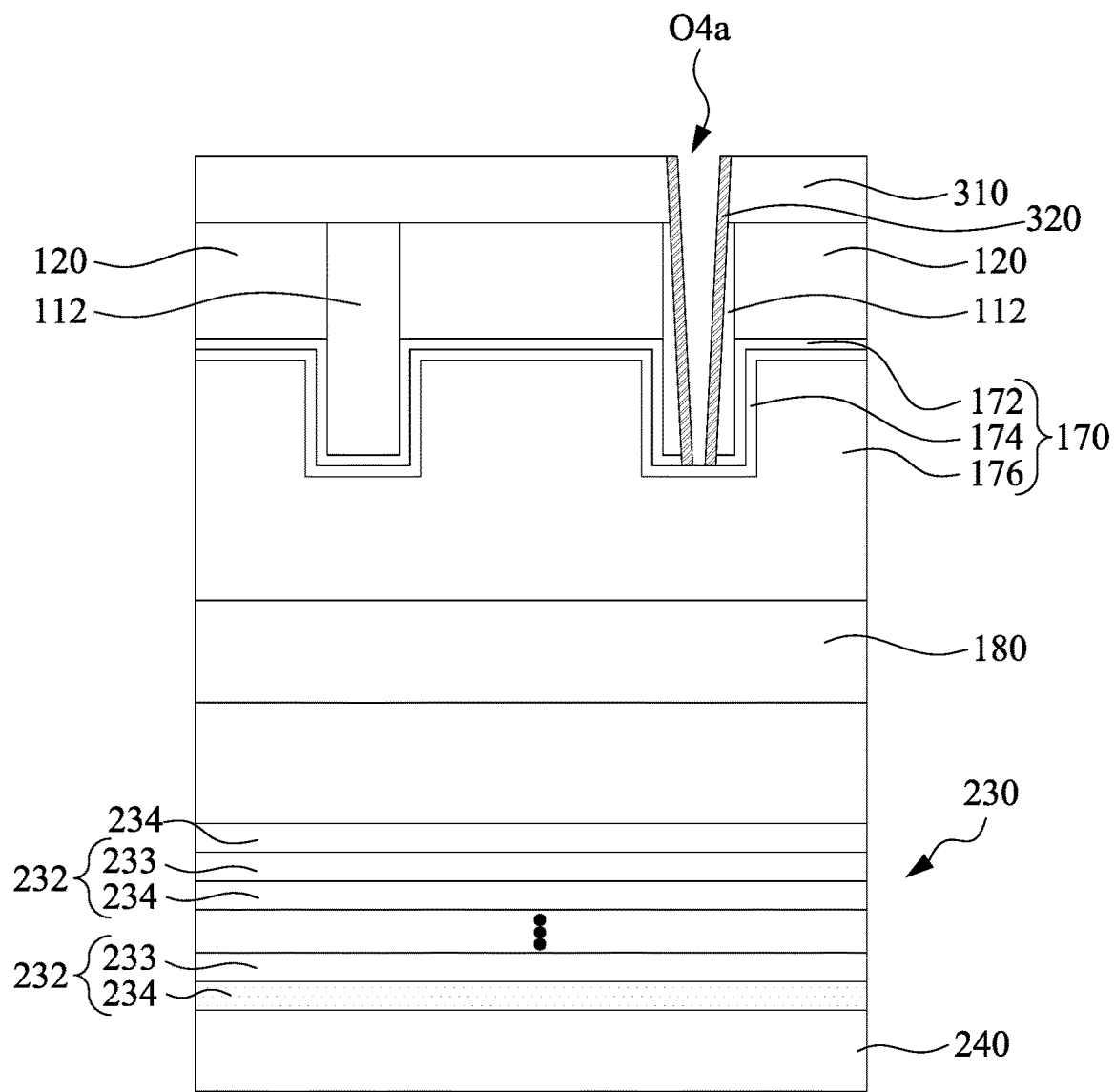
Figure 17E:
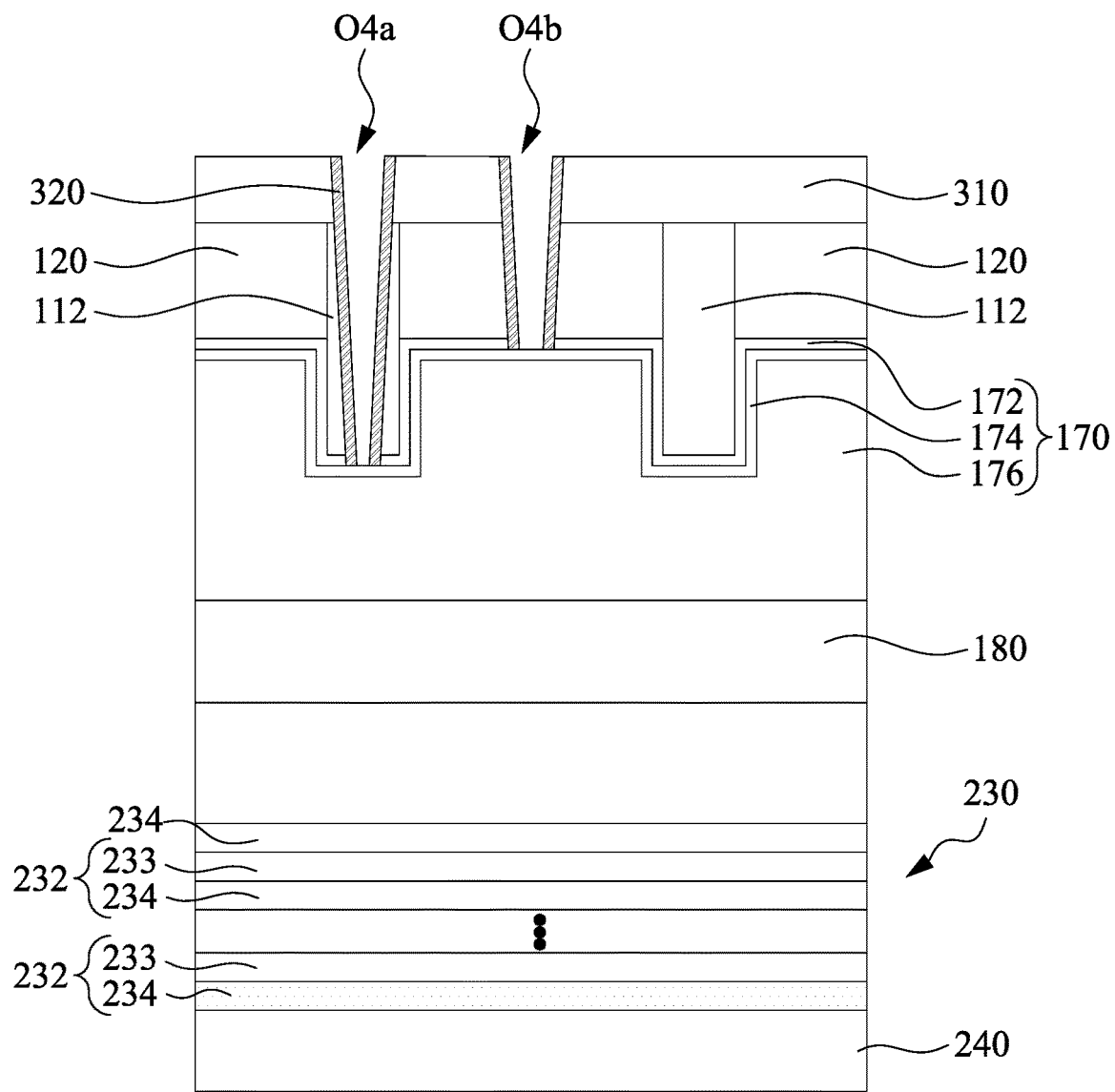
Figure 17F:
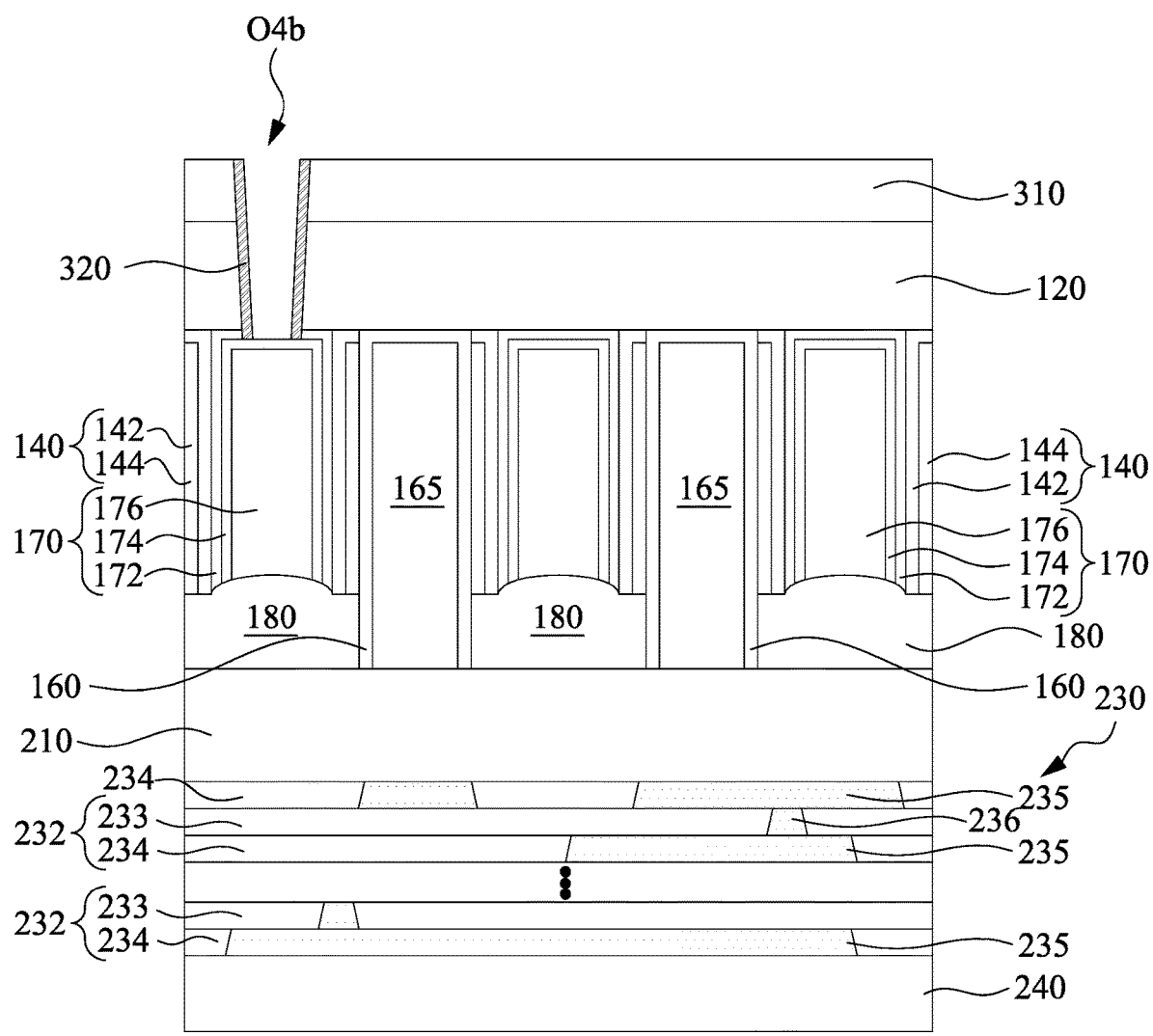

Reference is made to FIGS. 17A-17F, where FIG. 17B is a cross-sectional view taken along line I-I of FIG. 17A, FIG. 17C is a cross-sectional view taken along line II-II of FIG. 17A, FIG. 17D is a cross-sectional view taken along line III-III of FIG. 17A, FIG. 17E is a cross-sectional view taken along line IV-IV of FIG. 17A, and FIG. 17F is a cross-sectional view taken along line V-V of FIG. 17A. Spacer structures 320 are formed on inner sidewalls of the gate via openings O4a and O4b and the source/drain via opening O5. The formation of the spacer structures 320 may include blanket forming spacer layers and then performing etching operations to remove the horizontal portions of the spacer layers. The remaining vertical portions of the spacer layers form the spacer structures 320. The spacer structures 320 include one or more dielectric materials, such as silicon oxide, silicon nitride, silicon oxynitride, SiCN, $SiC_xO_yN_z$, high-k dielectric materials, or combinations thereof. The spacer structures 320 can be formed using a deposition method, such as plasma enhanced chemical vapor deposition (PECVD), plasma enhanced atomic layer deposition (PEALD), or the like.

Figure 18A:
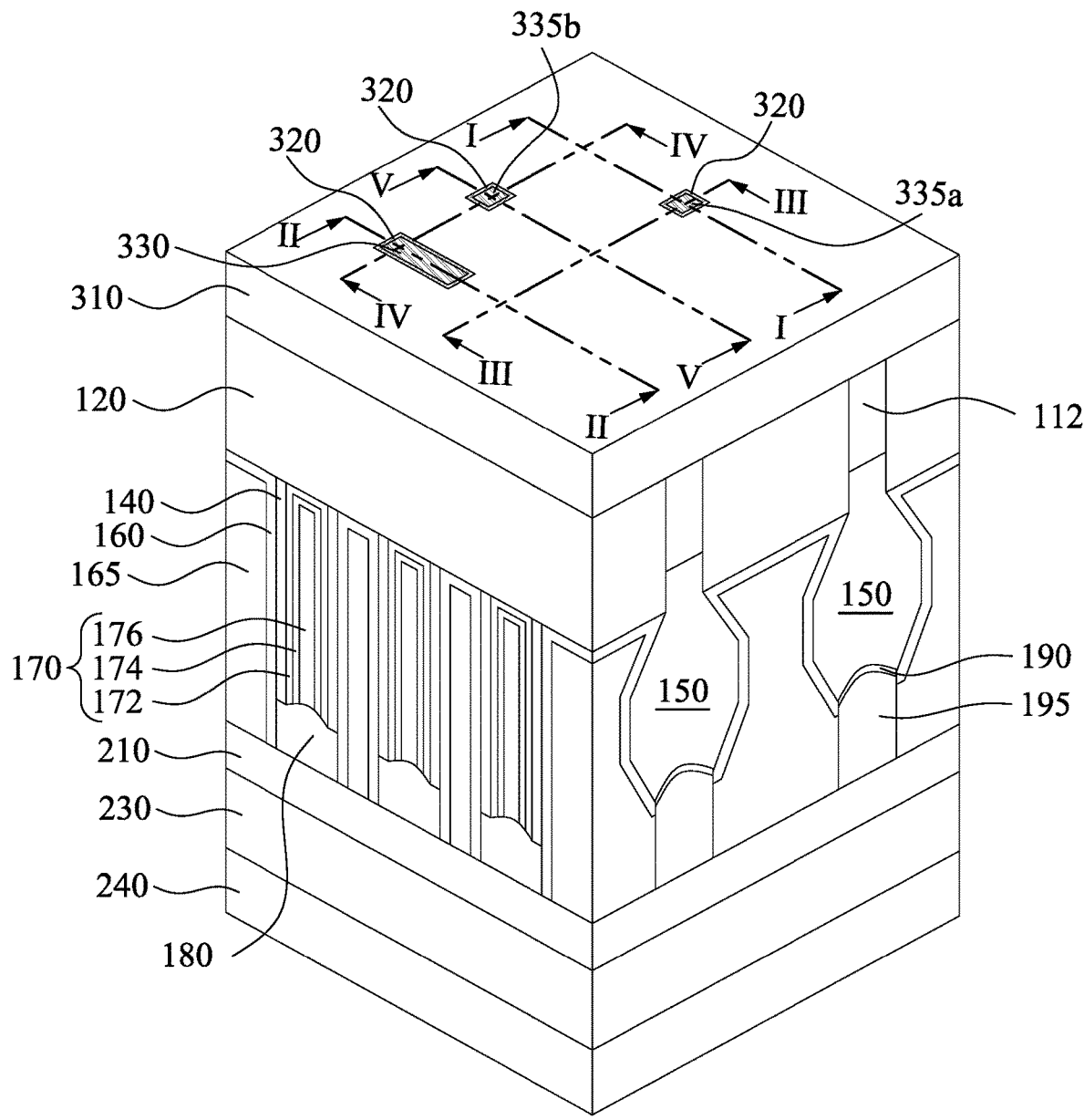
Figure 18B:
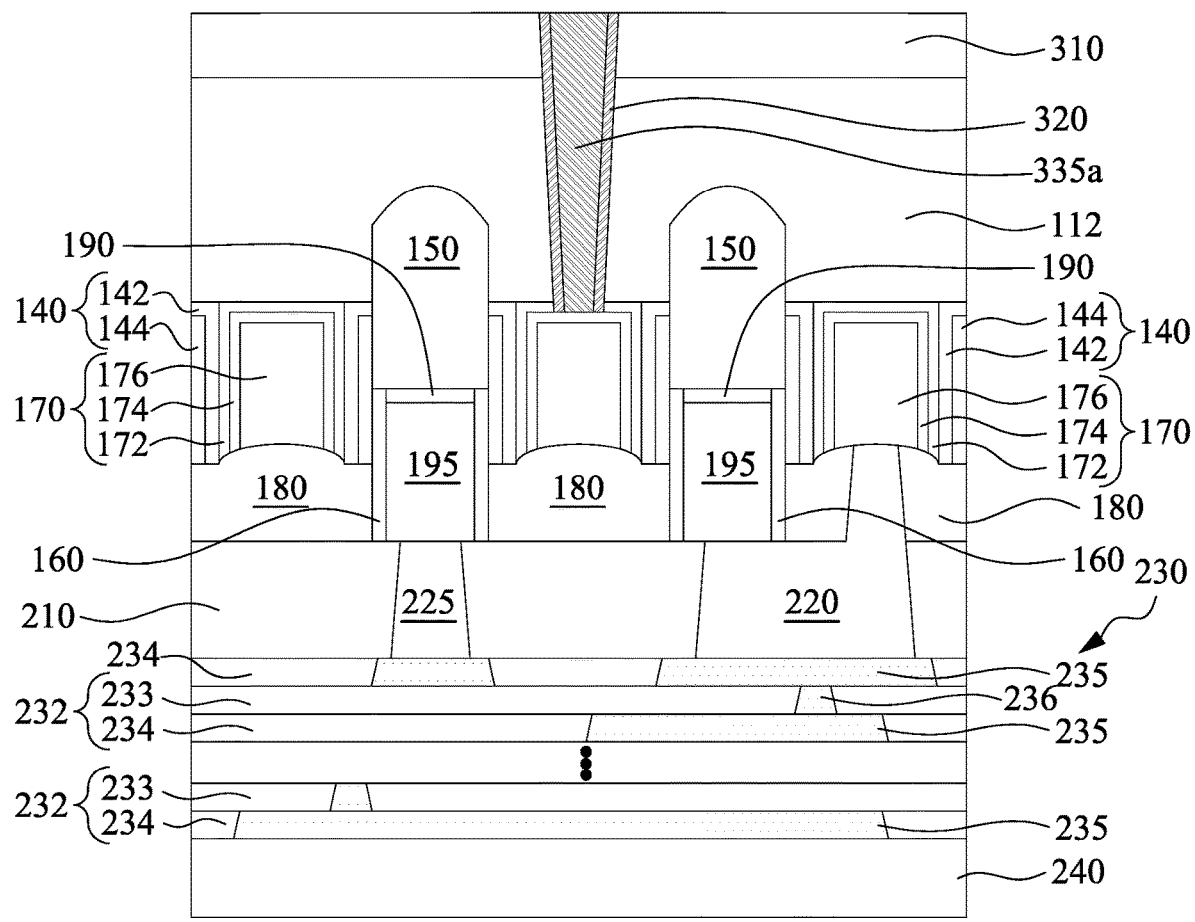
Figure 18C:
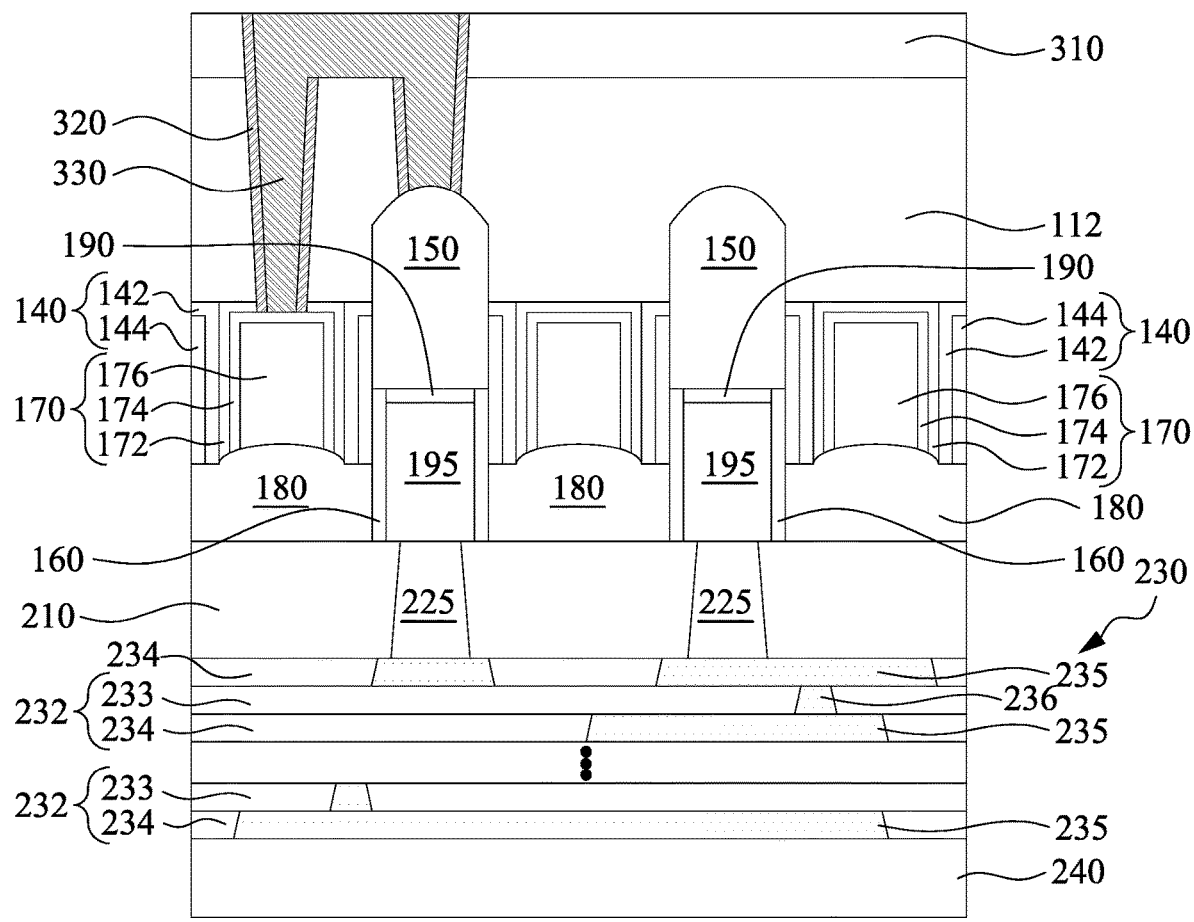
Figure 18D:
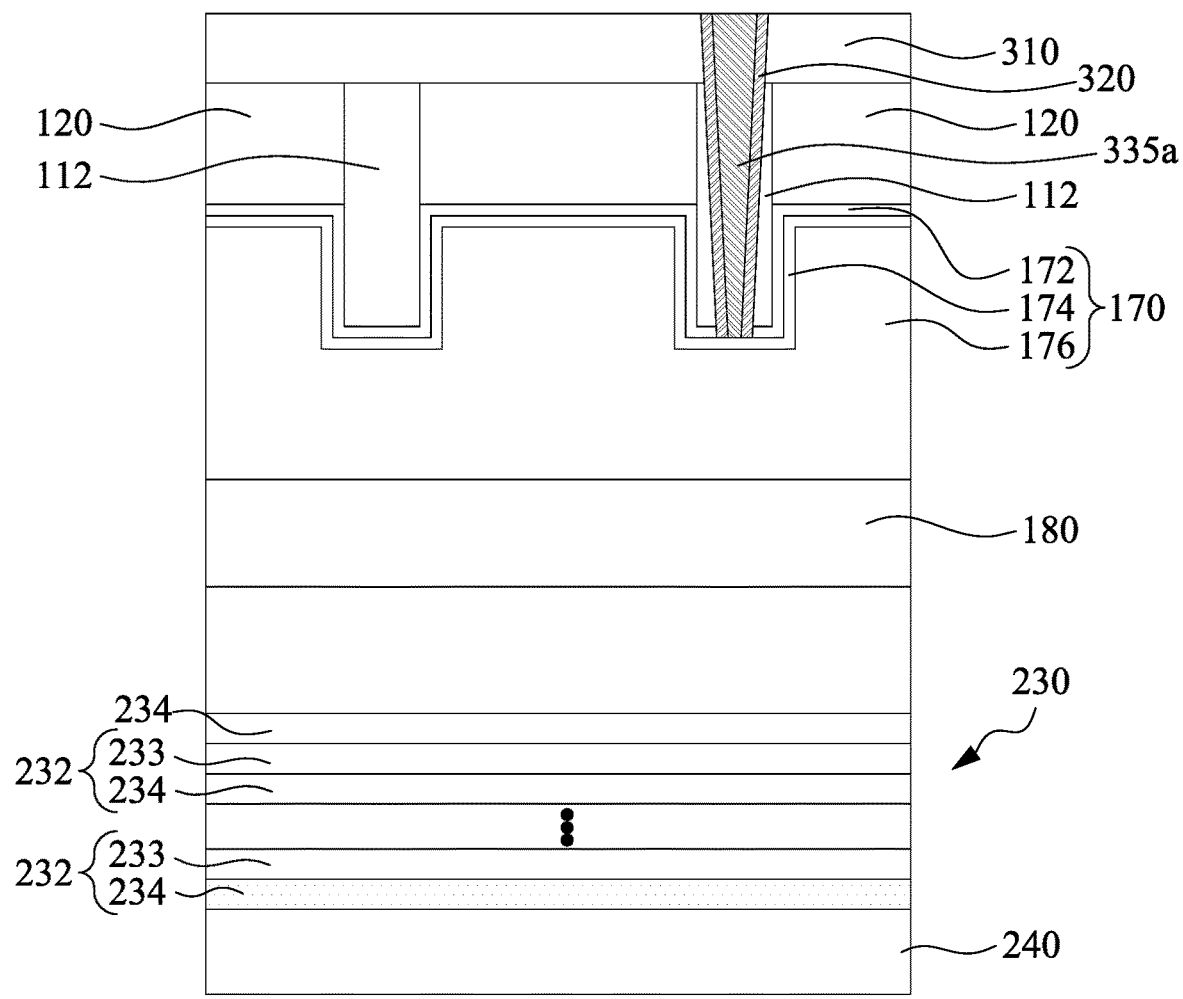
Figure 18E:
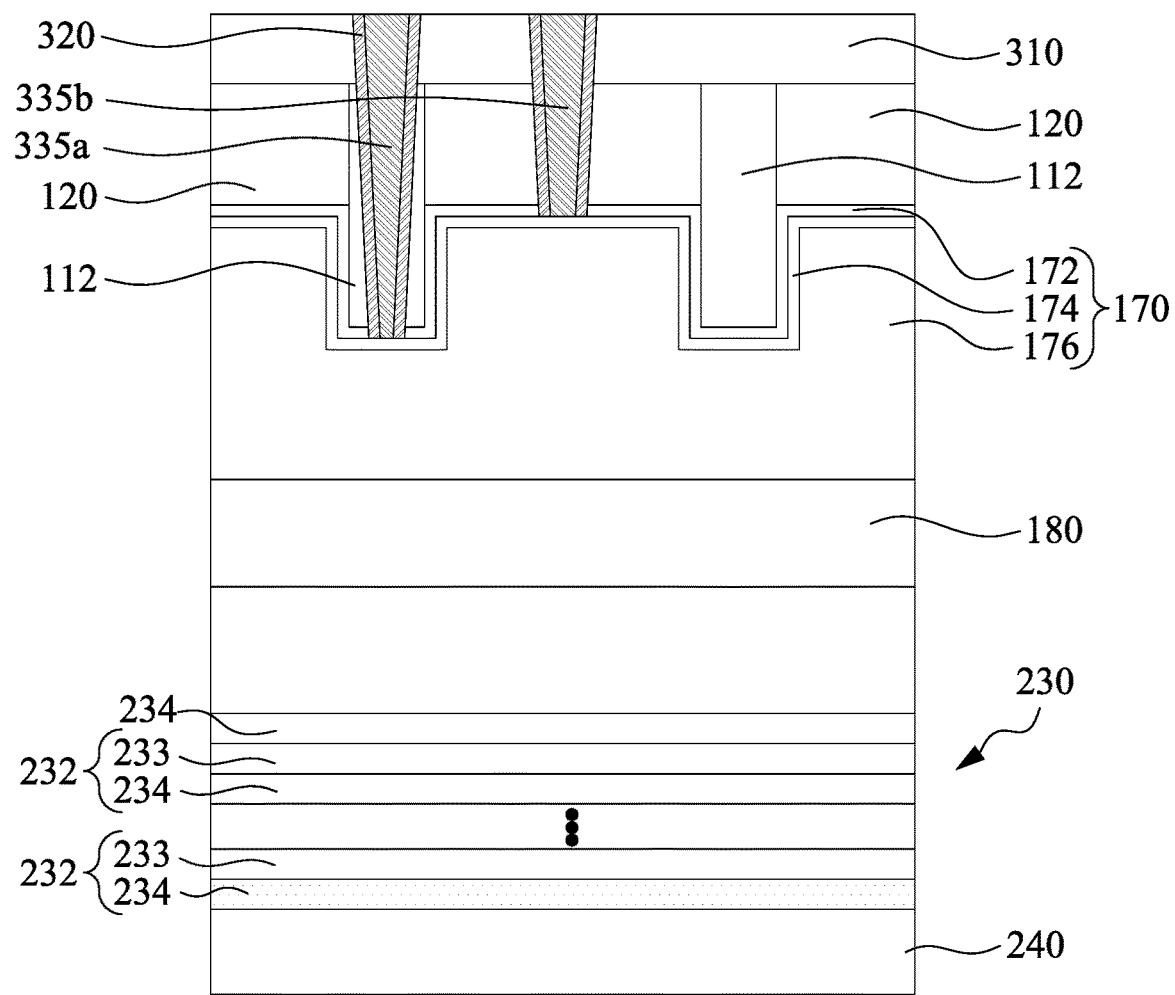
Figure 18F:
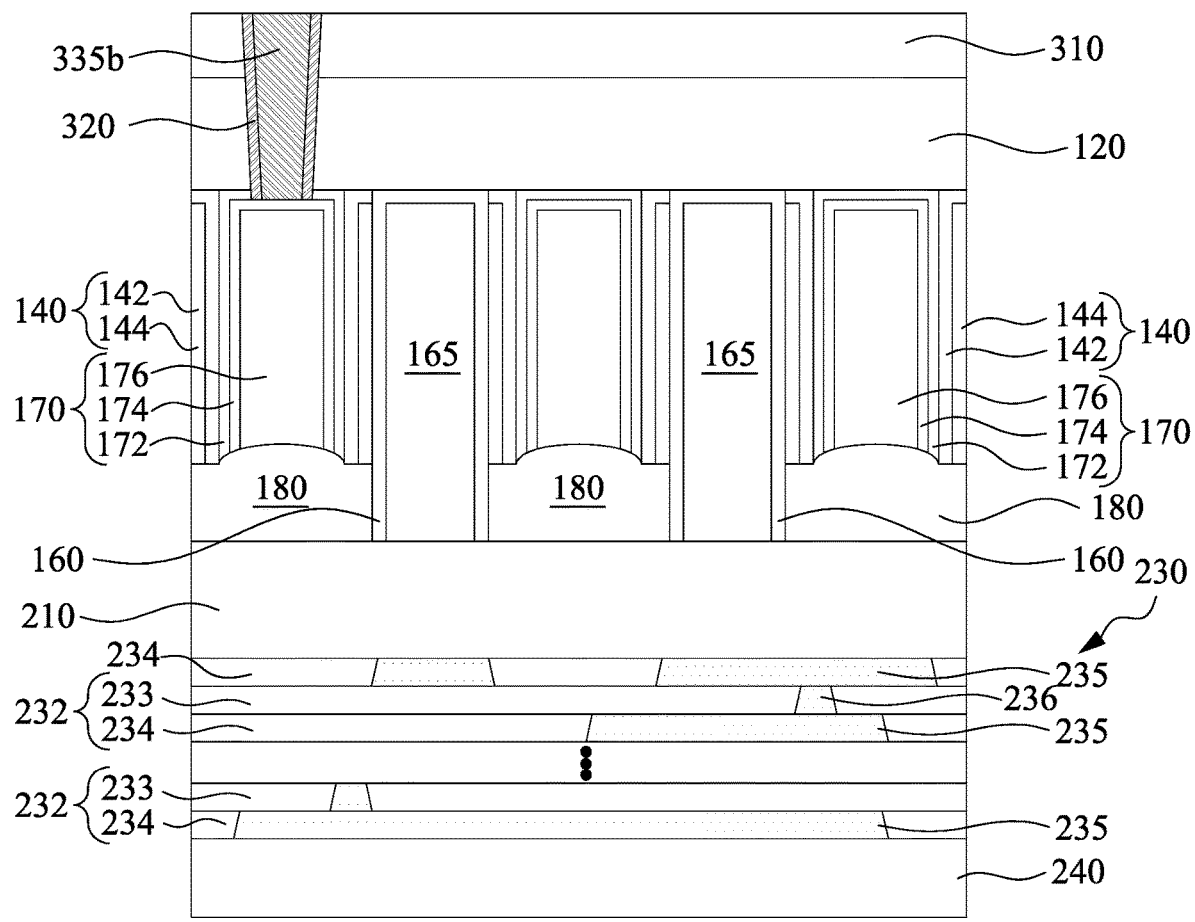

Reference is made to FIGS. 18A-18F, where FIG. 18B is a cross-sectional view taken along line I-I of FIG. 18A, FIG. 18C is a cross-sectional view taken along line II-II of FIG. 18A, FIG. 18D is a cross-sectional view taken along line III-III of FIG. 18A, FIG. 18E is a cross-sectional view taken along line IV-IV of FIG. 18A, and FIG. 18F is a cross-sectional view taken along line V-V of FIG. 18A. Gate via contacts 335a, 335b and a backside butted contact (or butted via) 330 are formed in the openings O4a, O4b, and O5 (see FIG. 17A). Formation of the gate via contacts 335a, 335b and the backside butted contact 330 includes depositing one or more metal materials overfilling the openings O4a, O4b, and O5 and the recess R2, and then performing a CMP process to remove excessive metal materials outside the openings O4a, O4b, and O5. As shown in FIGS. 18B and 18D, the spacer structure 320 isolates the gate via contact 335a from the semiconductor fin 112.

Figure 19A:
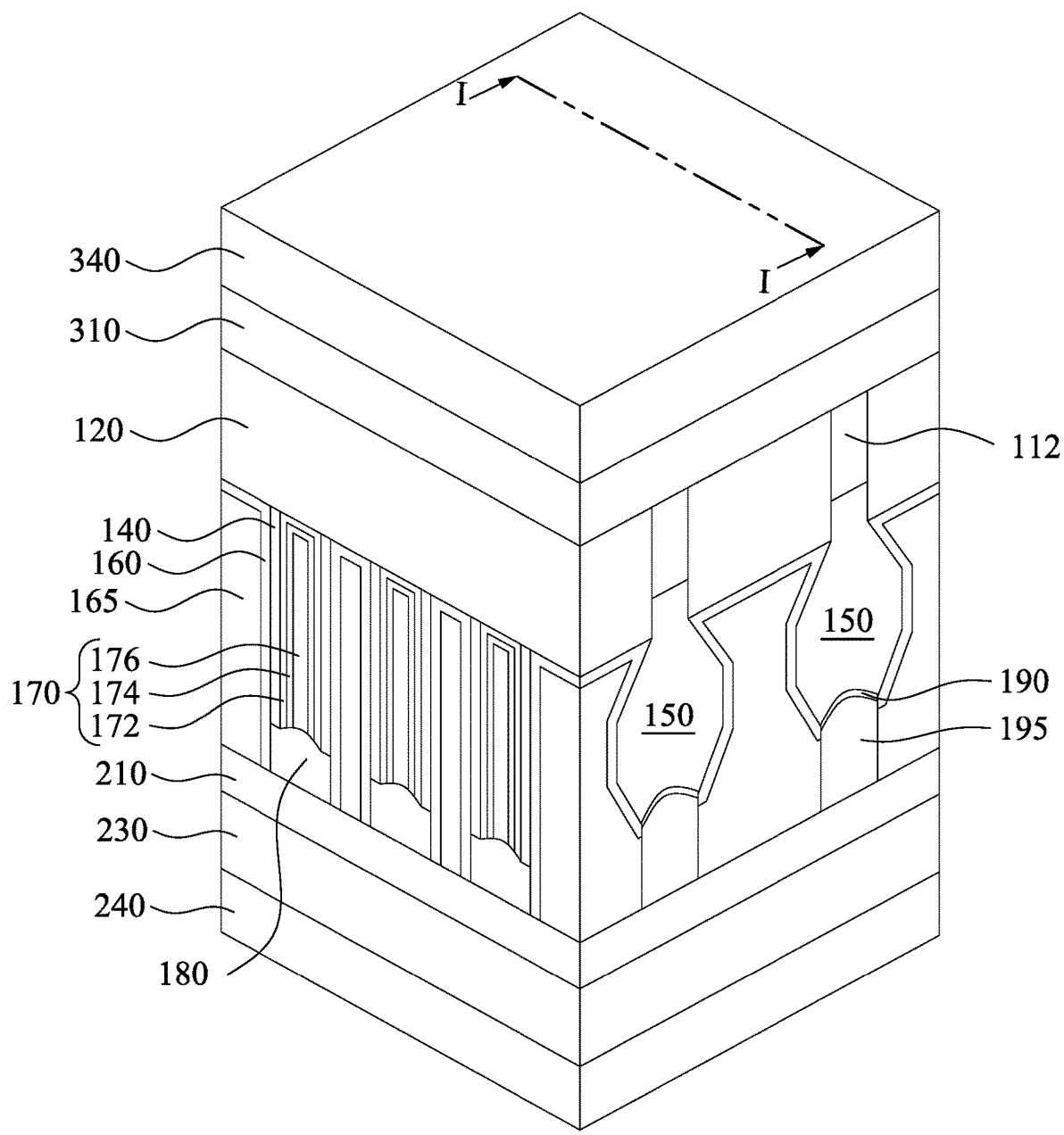
Figure 19B:
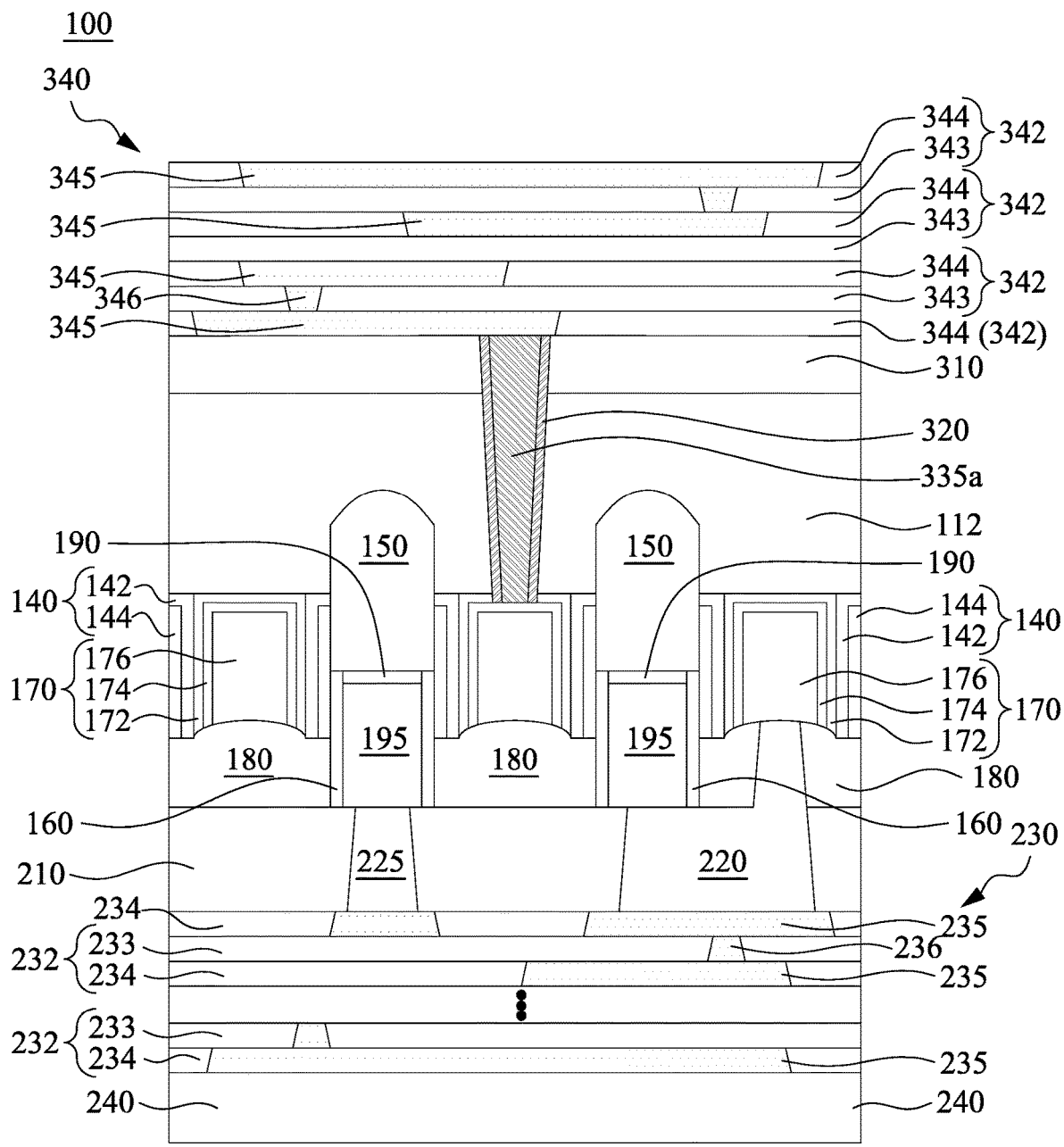

Reference is made to FIGS. 19A-19B, where FIG. 19B is a cross-sectional view taken along line I-I of FIG. 19A. A backside MLI structure 340 is formed over the third ILD layer 310. The backside MLI structure 340 may include a plurality of backside metallization layers 342. For clarity, the backside metallization layers 342 are shown in FIG. 19B and are omitted in FIG. 19A. The number of backside metallization layers 342 may vary according to design specifications of the semiconductor device. Only three backside metallization layers 342 are illustrated in FIG. 19B for the sake of simplicity. Except the bottommost backside metallization layers 342, the other backside metallization layers 342 each includes a first backside inter-metal dielectric (IMD) layer 343 and a second backside IMD layer 344. The second backside IMD layers 344 are formed over the corresponding first backside IMD layers 343. The backside metallization layers 342 include one or more horizontal interconnects, such as backside metal lines 345, respectively extending horizontally or laterally in the second backside IMD layers 344 and vertical interconnects, such as backside conductive vias 346, respectively extending vertically in the first backside IMD layers 343.

The backside metal lines 345 and backside conductive vias 346 can be formed using, for example, a single damascene process, a dual damascene process, the like, or combinations thereof. In some embodiments, the backside IMD layers 343-344 may include low-k dielectric materials having k values, for example, lower than about 4.0 or even 2.0 disposed between such conductive features. In some embodiments, the backside IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The backside metal lines and vias 345 and 346 may include metal materials such as copper, aluminum, tungsten, combinations thereof, or the like. In some embodiments, the backside metal lines and vias 345 and 346 may further include one or more barrier/adhesion layers (not shown) to protect the respective backside IMD layers 343-344 from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like.

Figure 20A:
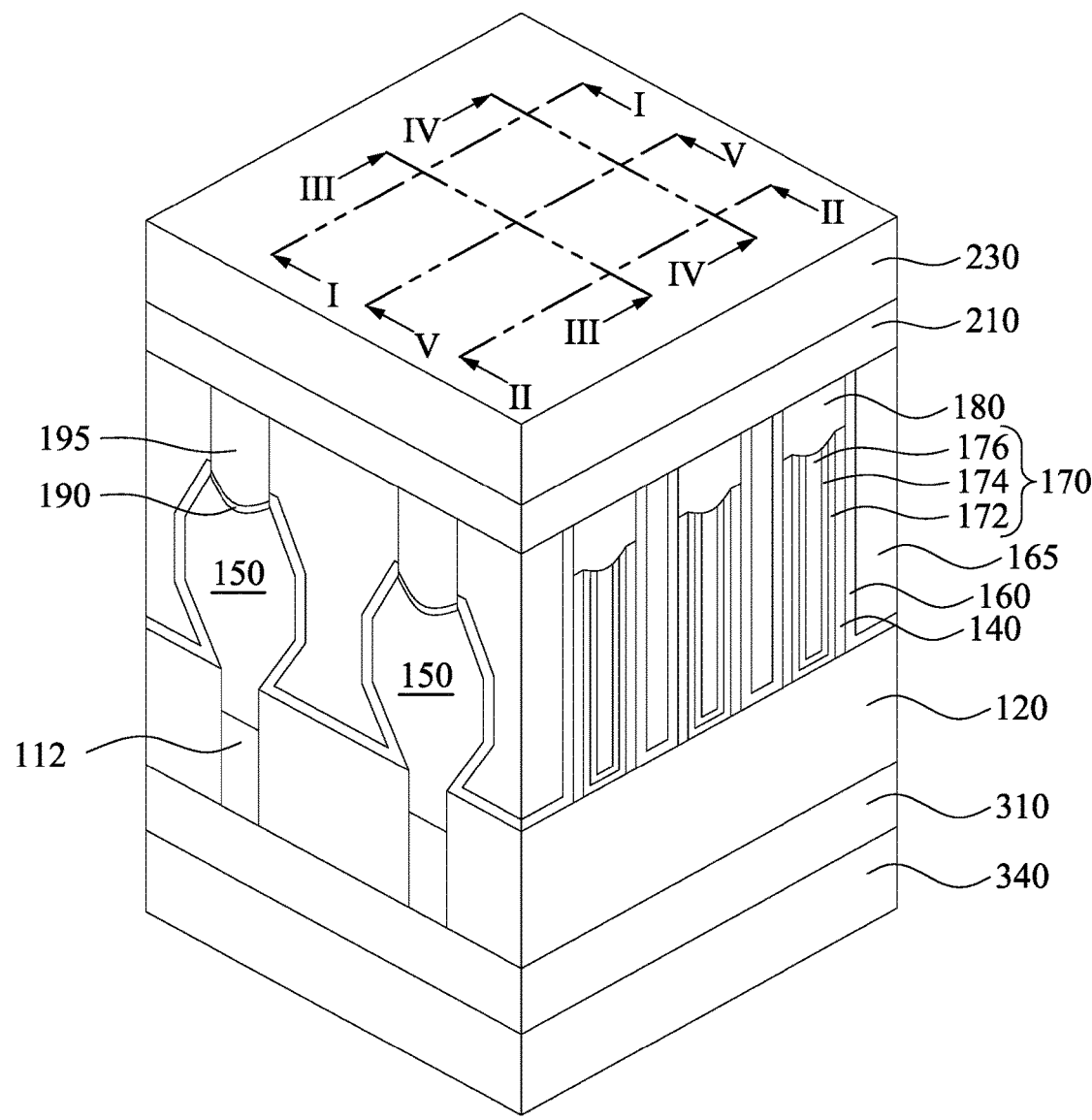
Figure 20B:
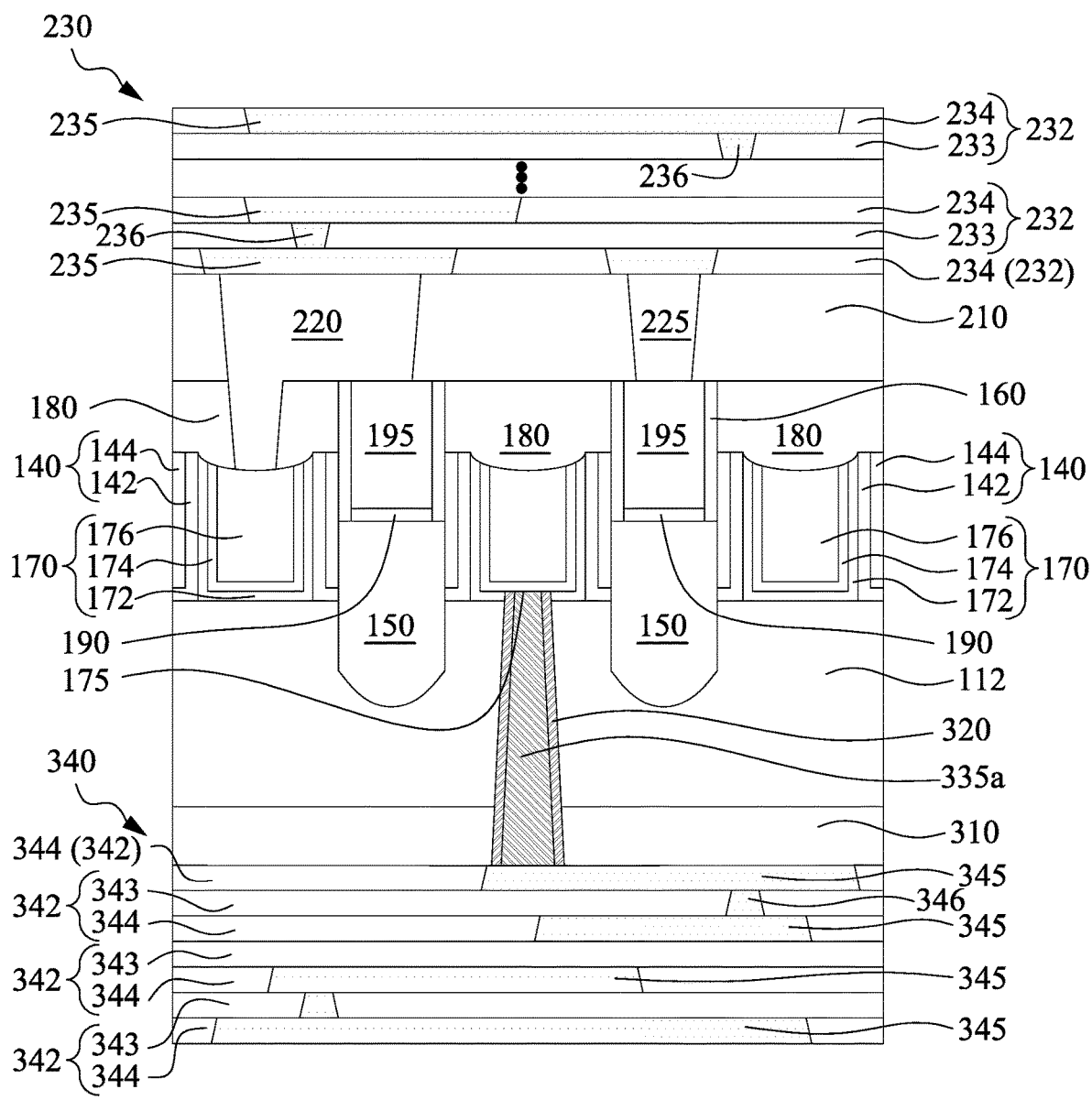
Figure 20C:
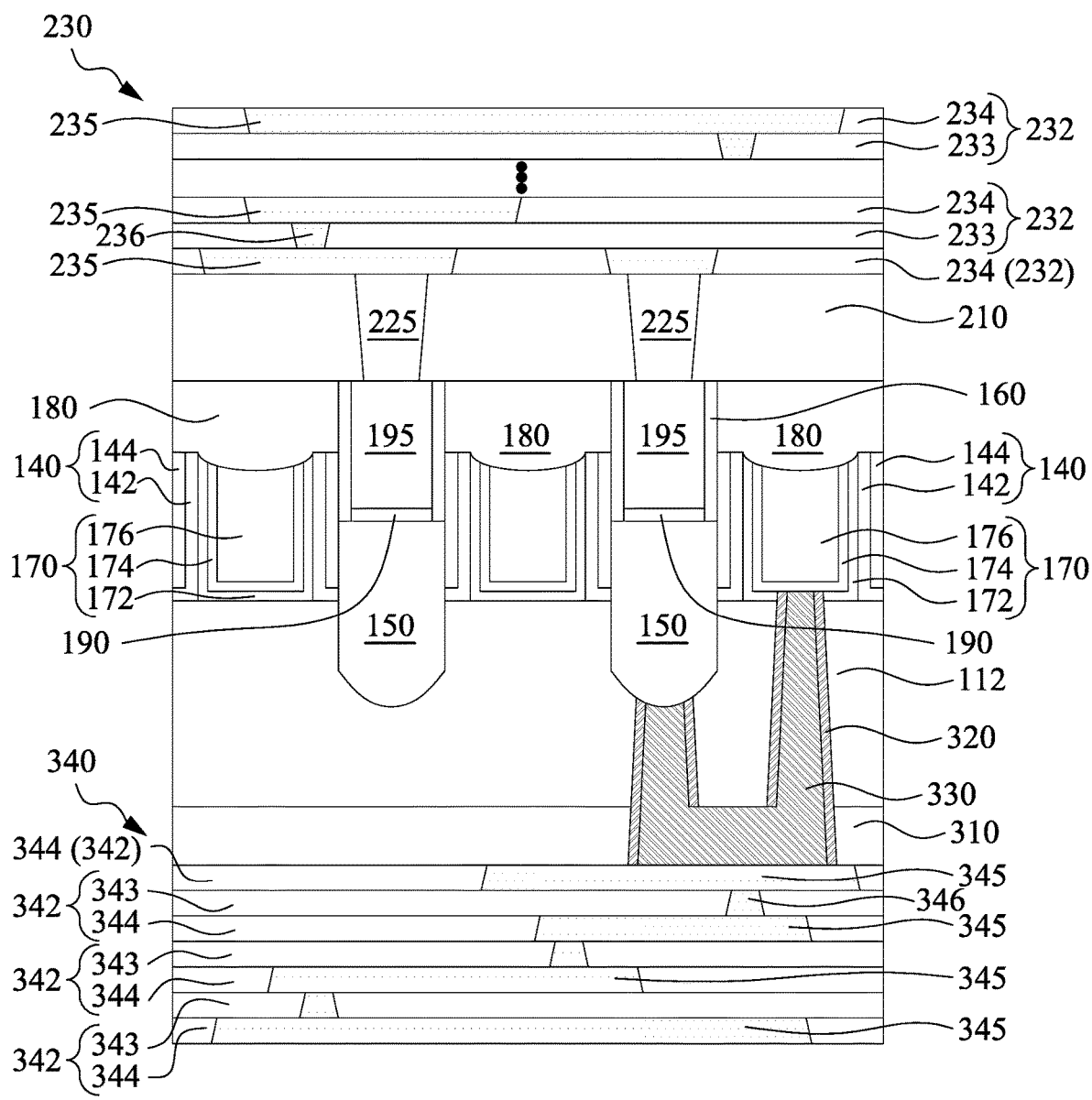
Figure 20D:
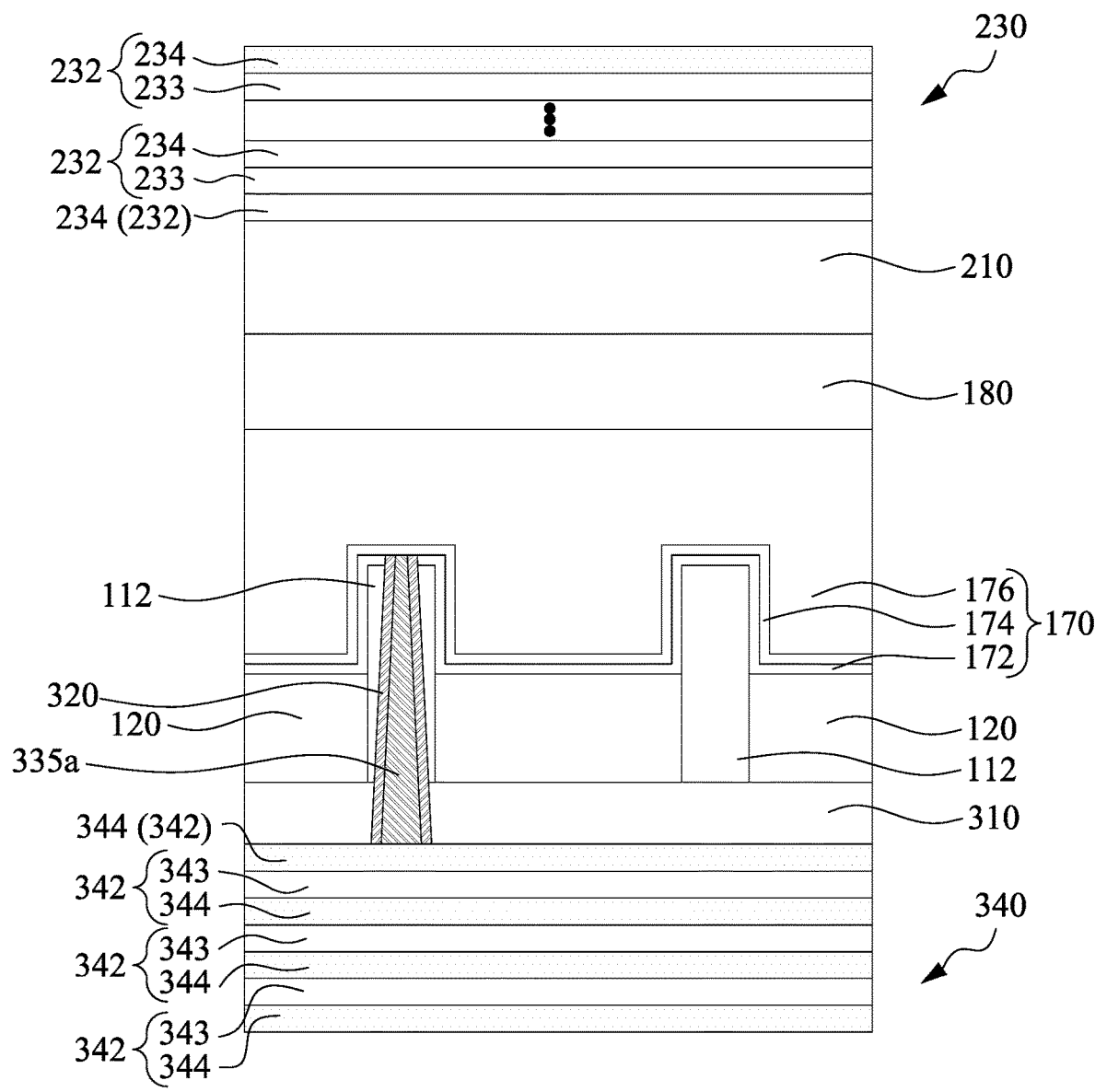
Figure 20E:
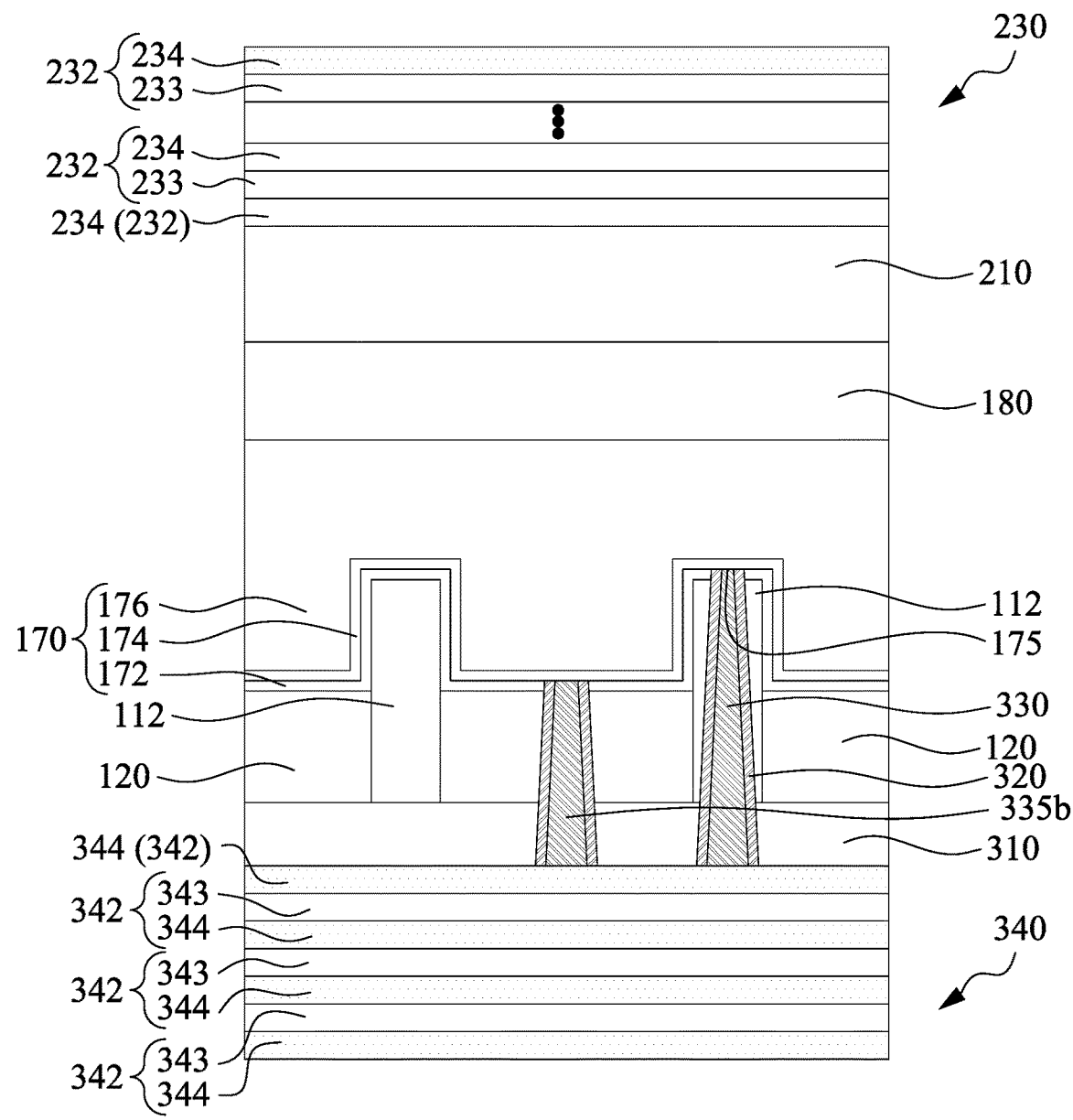
Figure 20F:
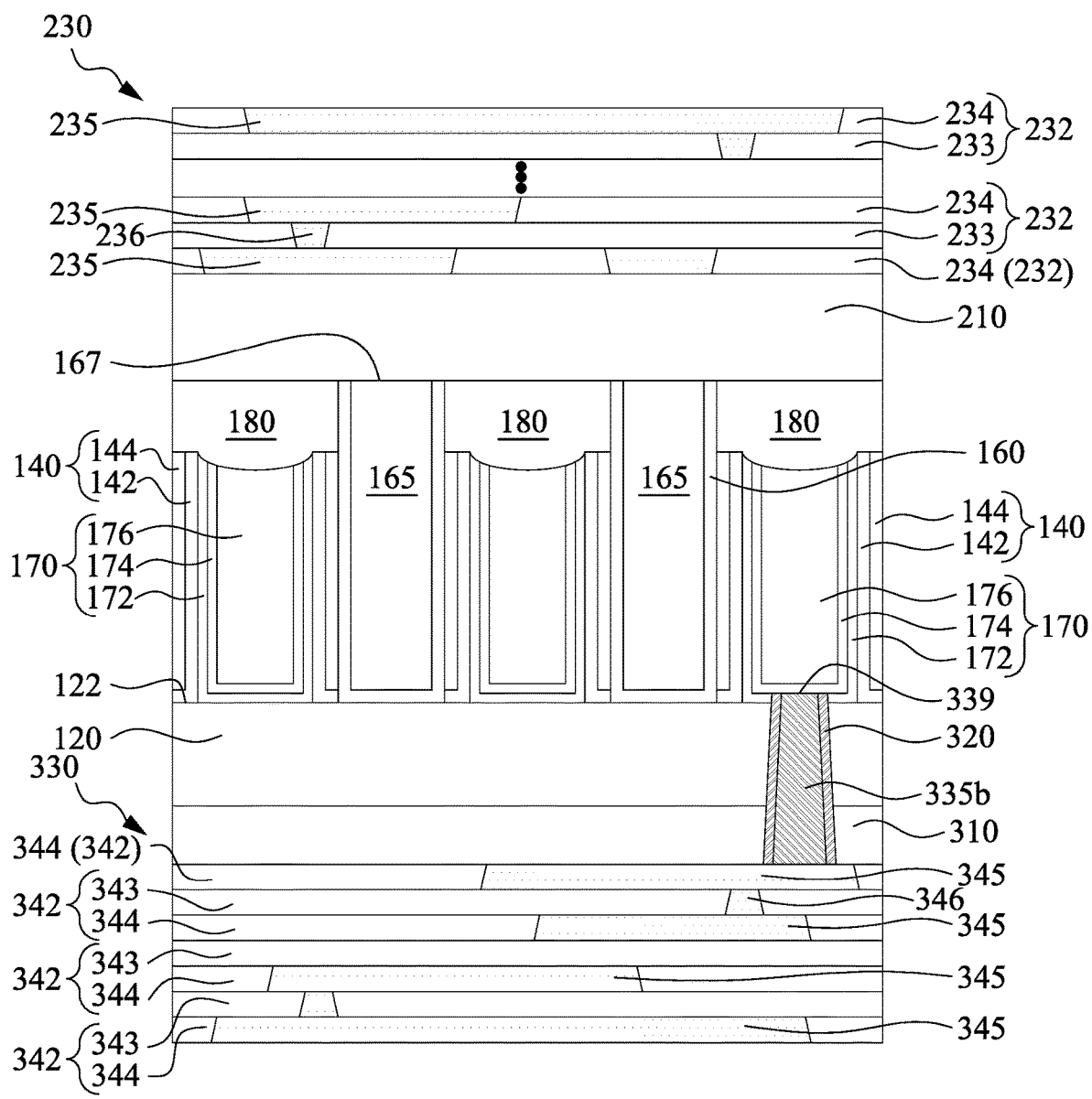

Reference is made to FIGS. 20A-20F, where FIG. 20B is a cross-sectional view taken along line I-I of FIG. 20A, FIG. 20C is a cross-sectional view taken along line II-II of FIG. 20A, FIG. 20D is a cross-sectional view taken along line III-III of FIG. 20A, FIG. 20E is a cross-sectional view taken along line IV-IV of FIG. 20A, and FIG. 20F is a cross-sectional view taken along line V-V of FIG. 20A. Optionally, the carrier substrate 240 (see FIGS. 19A and 19B) is removed, and the semiconductor device in FIGS. 19A and 19B is flipped upside down, such that the front-side MLI structure 230 faces upwards, as illustrated in FIGS. 20A-20F.

As shown in FIGS. 20A and 20B, the semiconductor device 100 includes the semiconductor fins 112, the gate structures 170 across the semiconductor fins 112, the source/drain epitaxial structures 150 on the semiconductor fins 112 and on opposite sides of the gate structures 170, and backside vias under the gate structures 170. For example, the semiconductor device 100 further includes a gate via contact 335a under the gate structure 170. As shown in FIGS. 20B and 20D, the gate via contact 335a passes through the semiconductor fin 112 and the gate dielectric layer 172 to the work function metal layer 174 (or to the fill metal 176 in some embodiments). As such, the gate via contact 335a is electrically connected to one of the gate structures 170. In some embodiments, the gate via contact 335a is in contact with a bottom surface 175 of the work function metal layer 174. As mentioned above, since the gate via contact 335a is formed from a backside of the semiconductor device 100, the gate via contact 335a tapers upward.

The semiconductor device 100 further includes the spacer structures 320. One of the spacer structures 320 laterally surrounds the gate via contact 335a to electrically isolate the gate via contact 335a from the semiconductor fin 112. Stated another way, the spacer structure 320 is in contact with the gate via contact 335a and the semiconductor fin 112. Further, the spacer structure 320 is in contact with the gate dielectric layer 172.

For example, the semiconductor device 100 further includes a gate via contact 335b under the gate structure 170. As shown in FIGS. 20E and 20F, the gate via contact 335b passes through (or is embedded in) the isolation structure 120 and the gate dielectric layer 172 to the work function metal layer 174 (or to the fill metal 176 in some embodiments). As such, the gate via contact 335b is electrically connected to one of the gate structures 170. In some embodiments, the gate via contact 335b is in contact with the bottom surface 175 of the work function metal layer 174. As mentioned above, since the gate via contact 335b is formed from a backside of the semiconductor device 100, the gate via contact 335b tapers upward.

Another one of the spacer structures 320 laterally surrounds the gate via contact 335b. Stated another way, the spacer structure 320 is in contact with the gate via contact 335b and isolation structure 120. Further, the spacer structure 320 is in contact with the gate dielectric layer 172.

For example, the semiconductor device 100 further includes a backside butted contact 330 under the gate structure 170 and the source/drain epitaxial structure 150. As shown in FIGS. 20C and 20E, the backside butted contact 330 passes through the semiconductor fin 112 and the gate dielectric layer 172 to the work function metal layer 174 (or to the fill metal 176 in some embodiments). As such, the backside butted contact 330 is electrically connected to one of the gate structures 170. In some embodiments, the backside butted contact 330 is in contact with a bottom surface 175 of the work function metal layer 174. As mentioned above, since the backside butted contact 330 is formed from a backside of the semiconductor device 100, the backside butted contact 330 tapers upward.

Some of the spacer structures 320 laterally surround the backside butted contact 330. Stated another way, the spacer structures 320 are in contact with the backside butted contact 330 and semiconductor fin 112. Further, the spacer structures 320 are in contact with the gate dielectric layer 172 and the source/drain epitaxial structure 150.

The semiconductor device 100 includes at least one of the gate via contacts 335a, 335b and the backside butted contact 330. In some embodiments, the semiconductor device 100 further includes front-side vias, such as the front-side butted contact 220 and/or the source/drain via 225 as shown in FIG. 20B. Further, the semiconductor device 100 may include front-side gate via contacts formed in the second ILD layer 210 and connected to the gate structure 170. In some embodiments, each of the gate via contact 335a, 335b and the backside butted contact 330 has a width or length in a range of about 8 nm to about 30 nm, and has a height in a range of about 10 nm to about 50 nm.

The gate structure 170 is between the backside vias (e.g., the gate via contact 335a, 335b and the backside butted contact 330) and the dielectric cap 180. In some embodiments, a top surface 167 of the first ILD layer 165 is higher than a top surface 339 of the backside vias (e.g., the gate via contact 335a, 335b and the backside butted contact 330), and a top surface 122 of the isolation structure 120 is lower than the top surface 339 of the backside vias (e.g., the gate via contact 335a, 335b and the backside butted contact 330). The backside vias (e.g., the gate via contact 335a, 335b and the backside butted contact 330) are electrically isolated from the front-side MLI structure 230.

Figure 21:
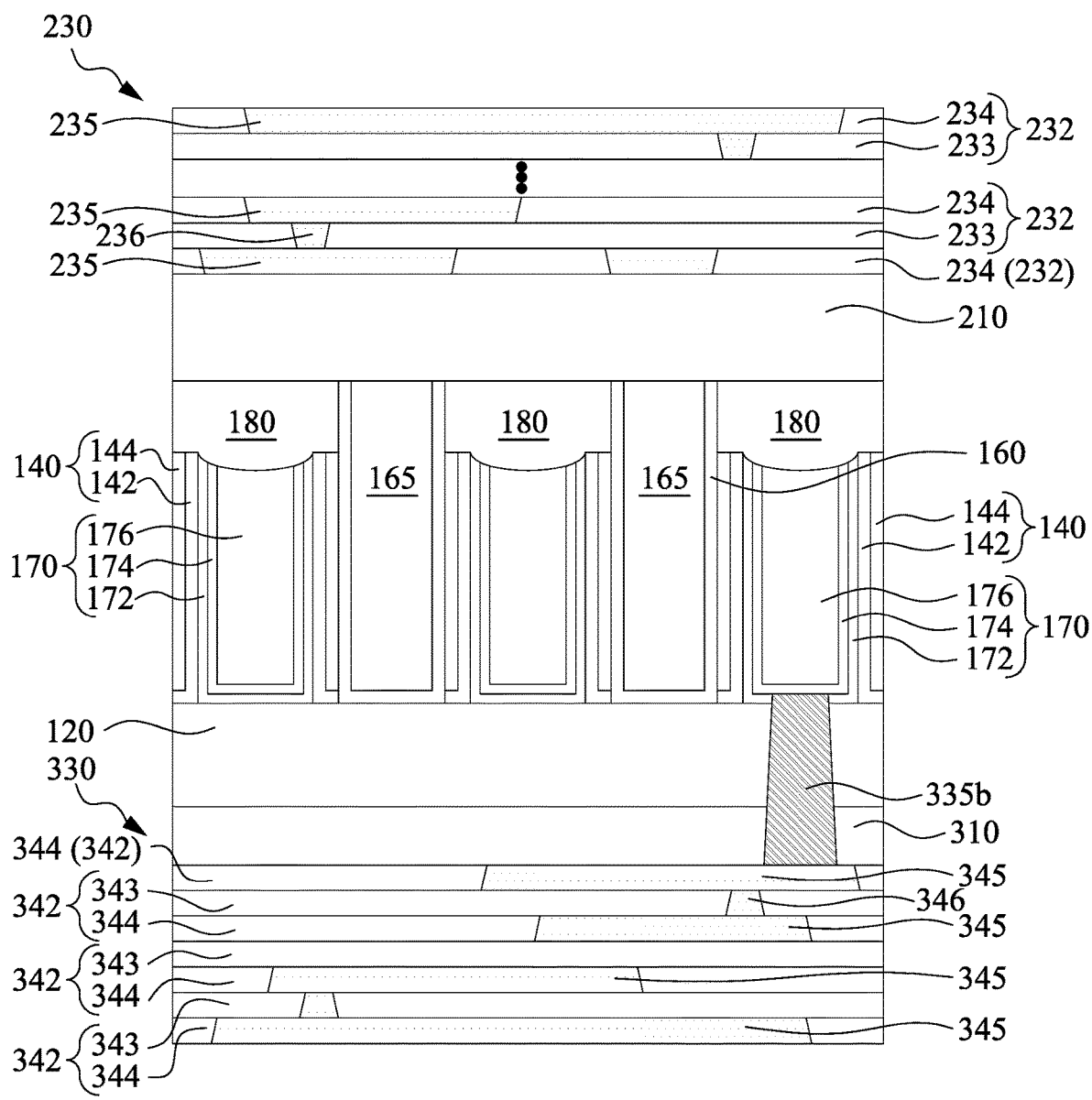
FIG. 21 is a cross-sectional view of a semiconductor device in accordance with some embodiments of the present disclosure.

FIG. 21 is a cross-sectional view of a semiconductor device (or an integrated circuit structure) 100a in accordance with some embodiments of the present disclosure. The difference between the semiconductor device 100a in FIG. 21 and the semiconductor device 100 in FIG. 20F is the present of the spacer structure. In FIG. 21, the spacer structure 320 (see FIG. 20F) is omitted. That is, the gate via contact 335b is in contact with the isolation structure 120 and the third ILD layer 310. Other relevant structural details of the semiconductor device 100a in FIG. 21 are the same as or similar to the semiconductor device 100 in FIG. 20F, and, therefore, a description in this regard will not be repeated hereinafter.

Figure 22:
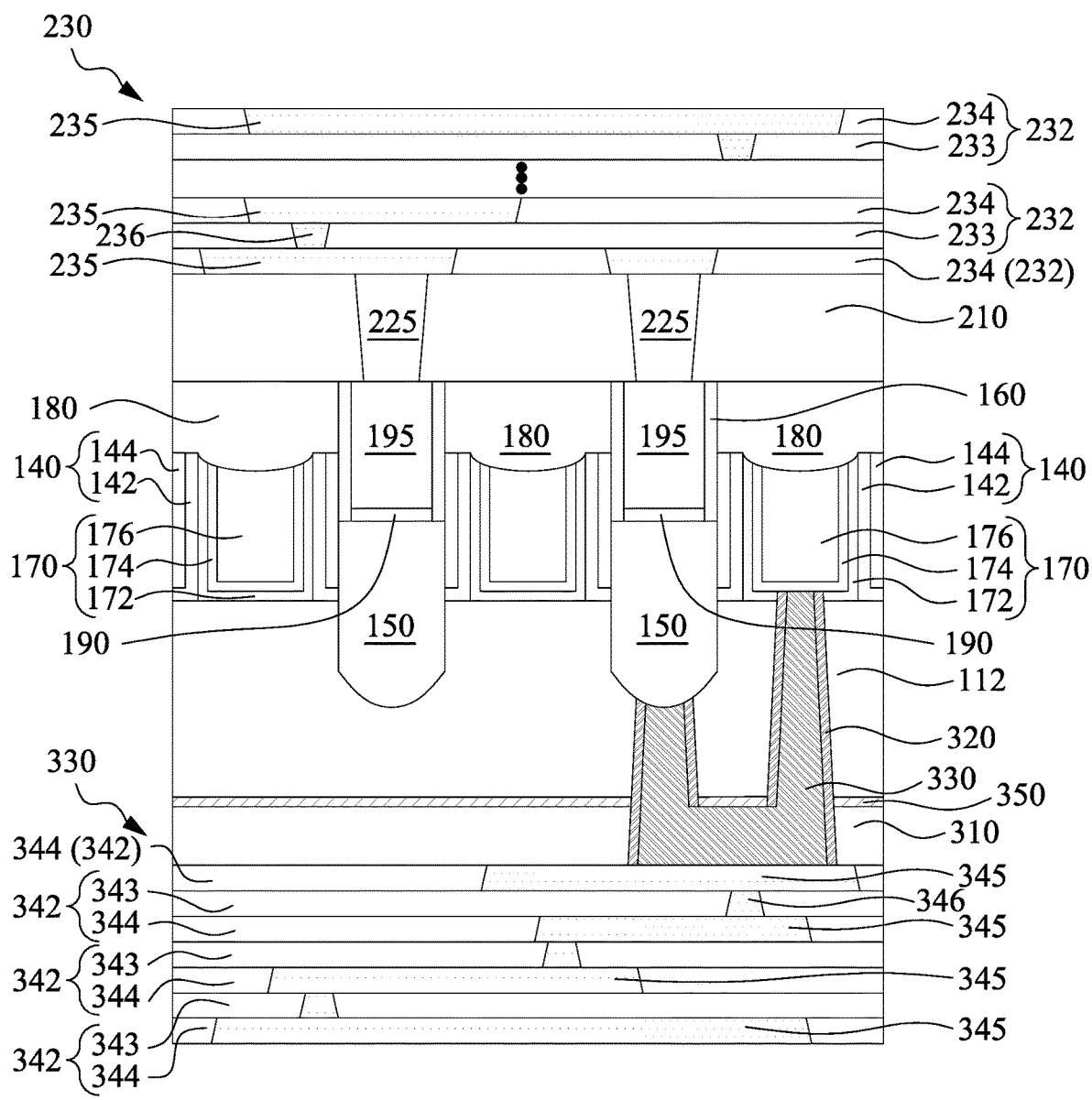
FIG. 22 is a cross-sectional view of a semiconductor device in accordance with some embodiments of the present disclosure.

FIG. 22 is a cross-sectional view of a semiconductor device (or an integrated circuit structure) 100b in accordance with some embodiments of the present disclosure. The difference between the semiconductor device 100b in FIG. 22 and the semiconductor device 100 in FIG. 20C is the present of an etch stop layer. In FIG. 22, an etch stop layer 350 is formed to cover the semiconductor fins 112 and the isolation structures 120 prior to the formation of the third ILD layer 310. As such, the etch stop layer 350 is between the third ILD layer 310 and the semiconductor fins 112 and/or between the third ILD layer 310 and the isolation structures 120. The etch stop layer 350 can be an etch stop layer for etching the recess R2 (see FIG. 16B). The etch stop layer 350 is made of a material different from the third ILD layer 310, such that the etching process for forming the recess R2 has an etching selectivity between the etch stop layer 350 and the third ILD layer 310. For example, the etch stop layer 350 is a nitride layer (e.g., silicon nitride) and the third ILD layer 310 is an oxide layer (e.g., silicon dioxide). Other relevant structural details of the semiconductor device 100b in FIG. 22 are the same as or similar to the semiconductor device 100 in FIG. 20C, and, therefore, a description in this regard will not be repeated hereinafter.

FIGS. 23A-34F illustrate a method for manufacturing a semiconductor device (or an integrated circuit structure) 200 at various stages in accordance with some embodiments of the present disclosure. In addition to the semiconductor device 200, FIGS. 23A, 24A, 25A, 26A, 27A, 28-31A, 32A, 33, and 34A depict X-axis, Y-axis, and Z-axis directions. In some embodiments, the semiconductor device shown in FIGS. 23A-34F may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

FIGS. 23A, 24A, 25A, 26A, 27A, 28-31A, 32A, 33, and 34A are perspective views of some embodiments of the semiconductor device 200 at intermediate stages during fabrication. FIGS. 23B, 24B, 25B, 26B, 27B, 31B, 32B, and 34B are cross-sectional views of some embodiments of the semiconductor device 200 at intermediate stages during fabrication along a first cut (e.g., cut I-I), which is along a lengthwise direction of the channel (semiconductor fin). FIGS. 25C, 26C, 27C, 31C, 32C, and 34C are cross-sectional views of some embodiments of the semiconductor device 200 at intermediate stages during fabrication along a second cut (e.g., cut II-II), which is along a lengthwise direction of another channel (another semiconductor fin). FIGS. 25D, 26D, 27D, 31D, 32D, and 34D cross-sectional views of some embodiments of the semiconductor device 200 at intermediate stages during fabrication along a third cut (e.g., cut III-III), which is in one of the gate regions and perpendicular to the lengthwise direction of the channel. FIGS. 25E, 26E, 27E, 31E, 32E, and 34E cross-sectional views of some embodiments of the semiconductor device 200 at intermediate stages during fabrication along a fourth cut (e.g., cut IV-IV), which is in another of the gate regions and perpendicular to the lengthwise direction of the channel. FIGS. 25F, 26F, 27F, 31F, 32F, and 34F cross-sectional views of some embodiments of the semiconductor device 200 at intermediate stages during fabrication along a fifth cut (e.g., cut V-V), which is in the isolation region and is parallel to the lengthwise direction of the channel.

Figure 23A:
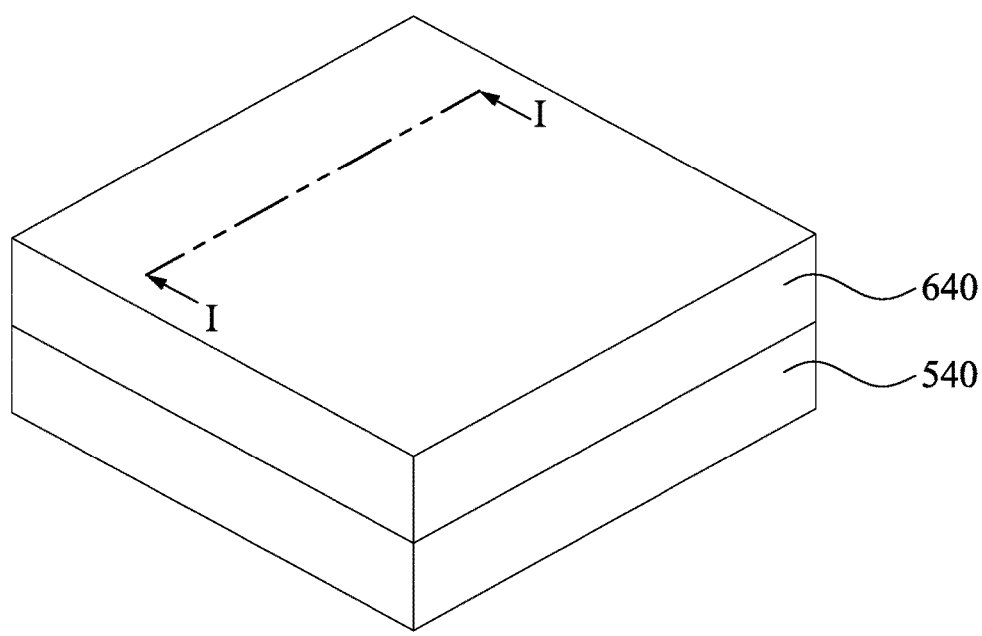
FIGS. 23A-34F illustrate a method for manufacturing a semiconductor device at various stages in accordance with some embodiments of the present disclosure.
Figure 23B:
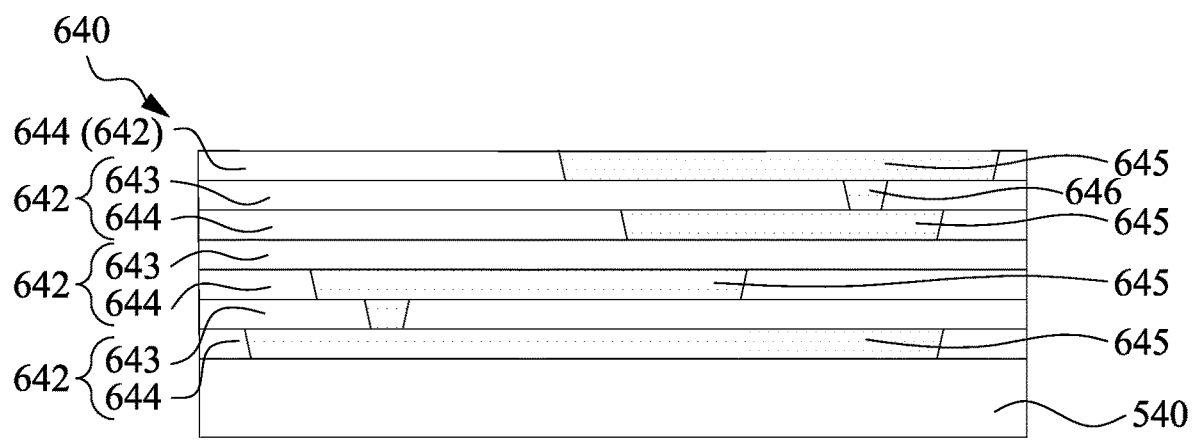

Reference is made to FIGS. 23A-23B, where FIG. 23B is a cross-sectional view taken along line I-I of FIG. 23A. A carrier substrate 540 is provided. The carrier substrate 540 may be silicon, doped or undoped, or may include other semiconductor materials, such as germanium; a compound semiconductor; or combinations thereof. The carrier substrate 540 may provide a structural support during subsequent processing on backside of the semiconductor device and may remain in the final product in some embodiments. In some other embodiments, the carrier substrate 540 may be removed after the subsequent processing on front-side of semiconductor device is complete.

Subsequently, a backside MLI structure 640 is formed over the carrier substrate 540. The backside MLI structure 640 may include a plurality of backside metallization layers 642. For clarity, the backside metallization layers 642 are shown in FIG. 23B and are omitted in FIG. 23A. The number of backside metallization layers 642 may vary according to design specifications of the integrated circuit structure. Only three backside metallization layers 642 are illustrated in FIG. 23B for the sake of simplicity. Except the topmost backside metallization layers 642, the other backside metallization layers 642 each includes a first backside inter-metal dielectric (IMD) layer 643 and a second backside IMD layer 644. The first backside IMD layers 643 are formed over the corresponding second backside IMD layers 644. The backside metallization layers 642 include one or more horizontal interconnects, such as backside metal lines 645, respectively extending horizontally or laterally in the second backside IMD layers 644 and vertical interconnects, such as backside conductive vias 646, respectively extending vertically in the first backside IMD layers 643.

For example, a dielectric layer is formed over the carrier substrate 540, and openings are formed in the dielectric layer. Conductive materials are filled in the openings to form the backside metal lines 645. Another dielectric layer is then formed over the dielectric layer and the backside metal lines 645, and openings are formed in the dielectric layer. Another conductive material is then filled in the openings to form the backside conductive vias 646. These operations are performed cyclically, and the backside MLI structure 640 is formed. In some embodiments, since the backside metallization layers 642 are formed from bottom to top, the backside metal lines 645 and the backside conductive vias 646 are tapered downward as shown in FIG. 23B.

Figure 24A:
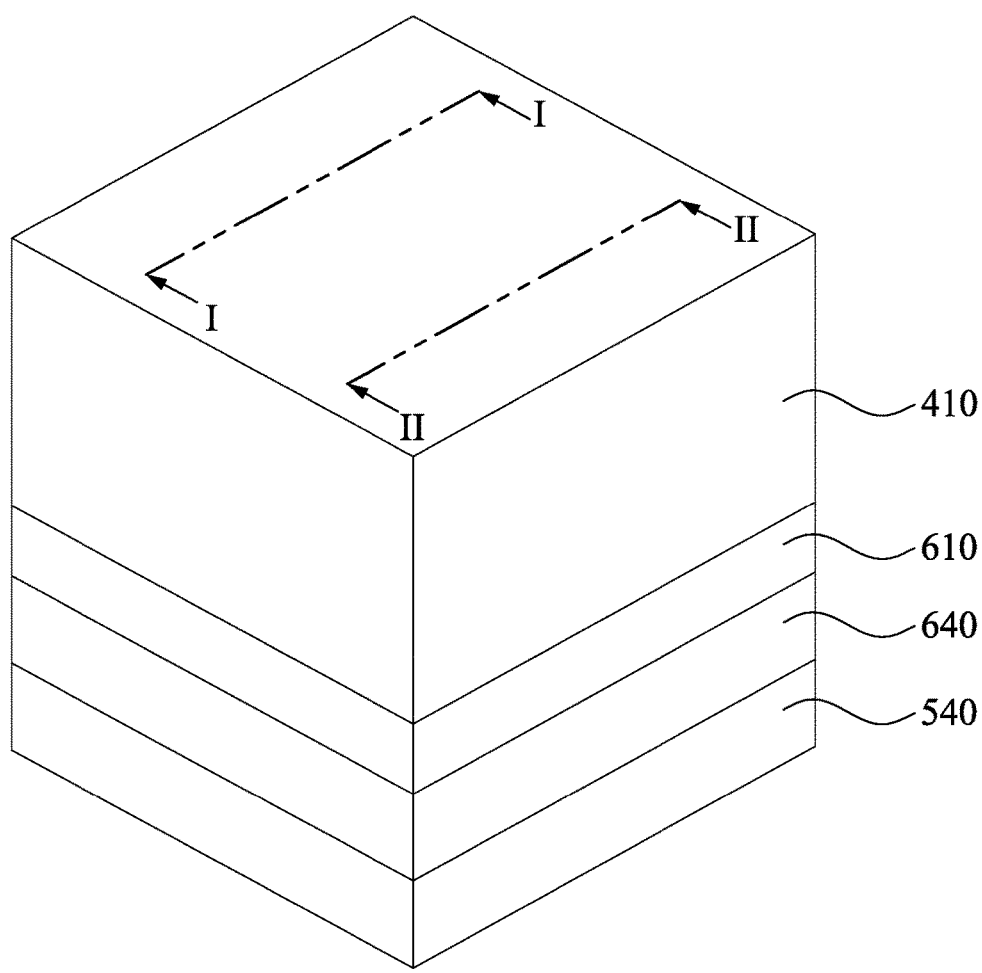
Figure 24B:
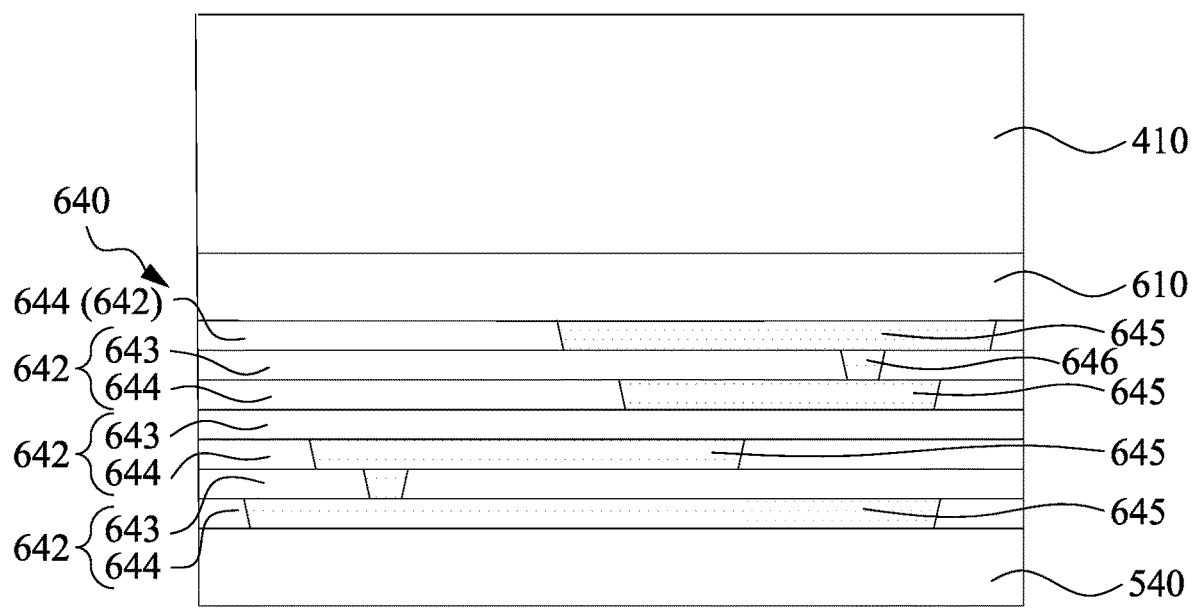
Figure 24C:
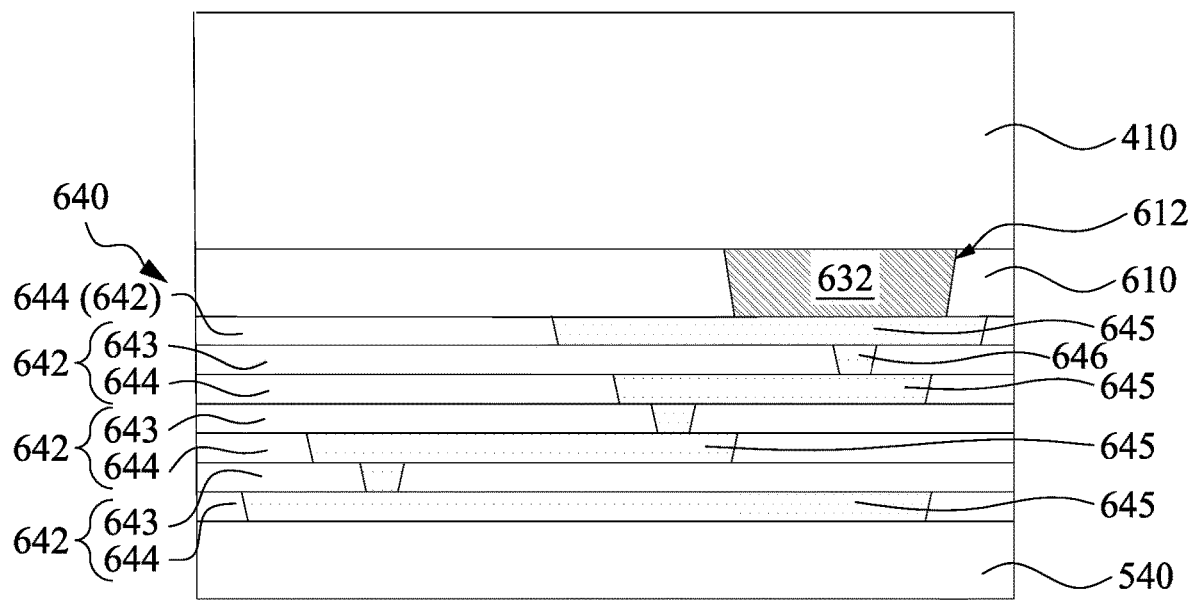

Reference is made to FIGS. 24A-24C, where FIG. 24B is a cross-sectional view taken along line I-I of FIG. 24A, and FIG. 24C is a cross-sectional view taken along line II-II of FIG. 24A. As shown in FIG. 24A, a third ILD layer 610 is formed to cover the backside MLI structure 640. Materials, configurations, dimensions, processes and/or operations regarding the third ILD layer 610 are similar to or the same as the third ILD layer 310 of FIG. 20A.

A conductive structure 632 is then formed in the third ILD layer 610 as shown in FIG. 24C. For example, at least one opening 612 is formed in the third ILD layer 610, and conductive materials are filled in the opening 612 to form the conductive structure 632. The conductive structure 632 is connected to one of the backside metal lines 645.

Subsequently, a substrate 410 is formed over the third ILD layer 610. For example, a semiconductor material (such as a wafer) is bonded to the third ILD layer 610, and the semiconductor material is thin down to a predetermined thickness. Alternatively, the semiconductor material is epitaxially grown or CVD grown over the third ILD layer 610. Materials, configurations, and/or dimensions regarding the substrate 410 are similar to or the same as the substrate 110 of FIG. 1.

Figure 25A:
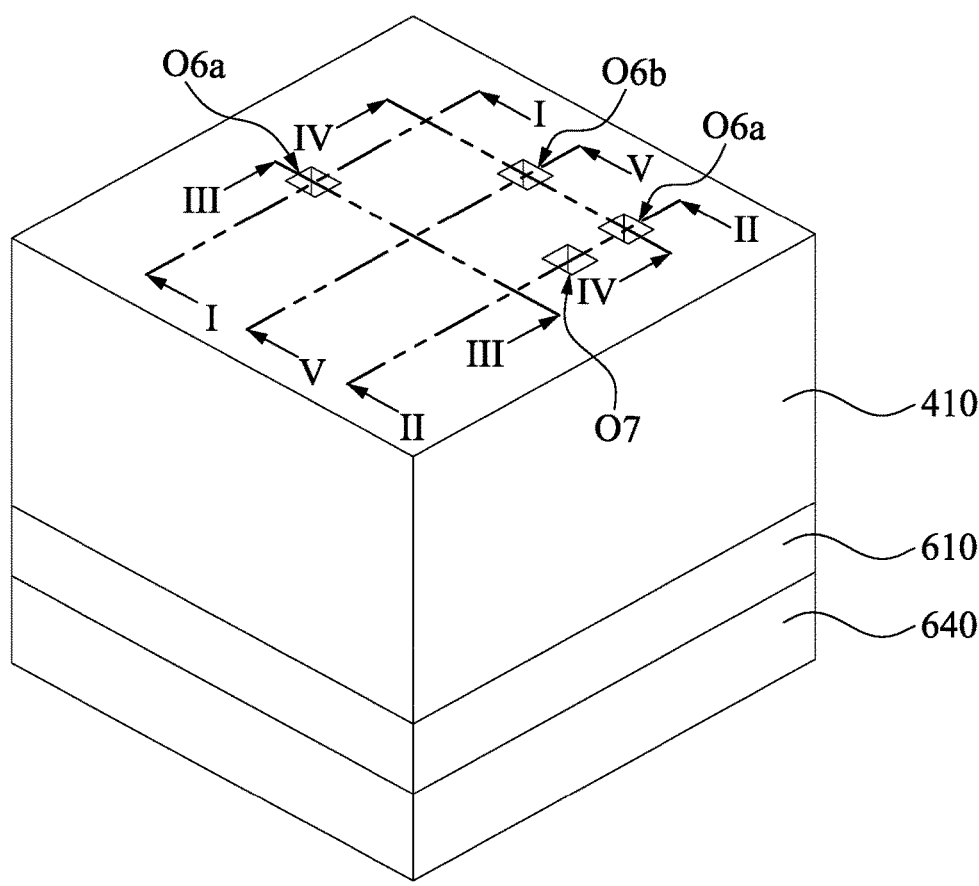
Figure 25B:
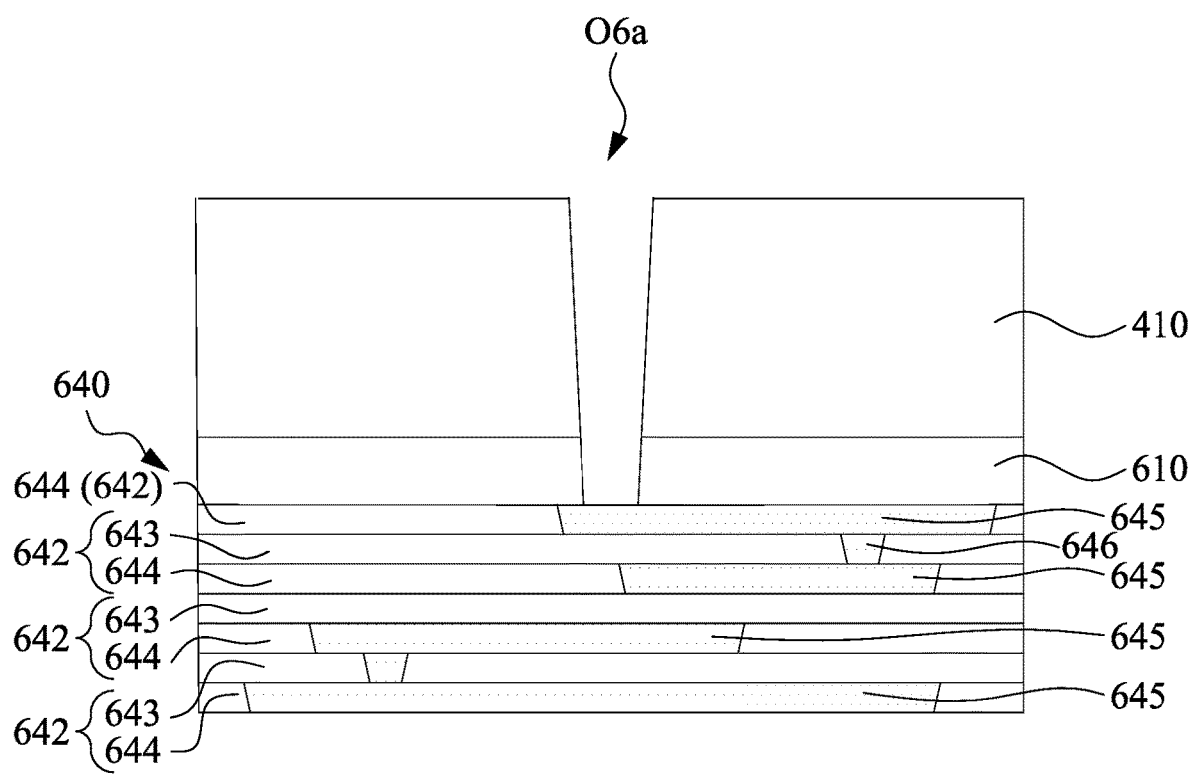
Figure 25C:
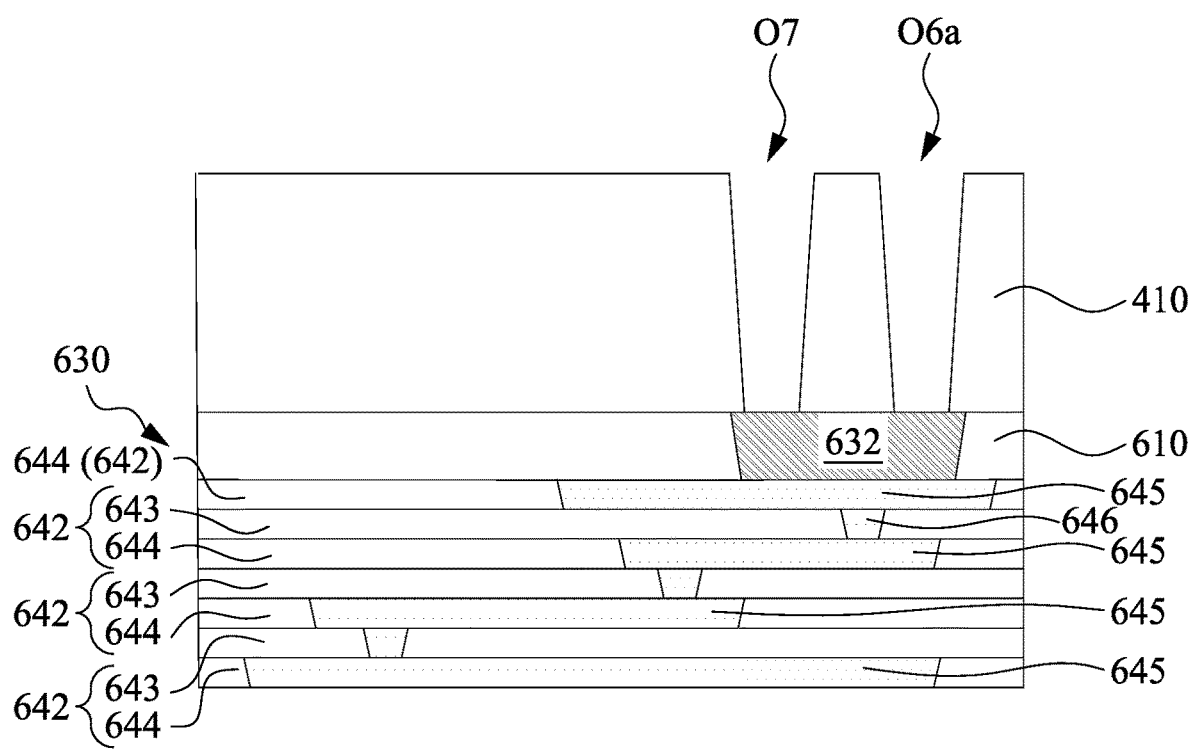
Figure 25D:
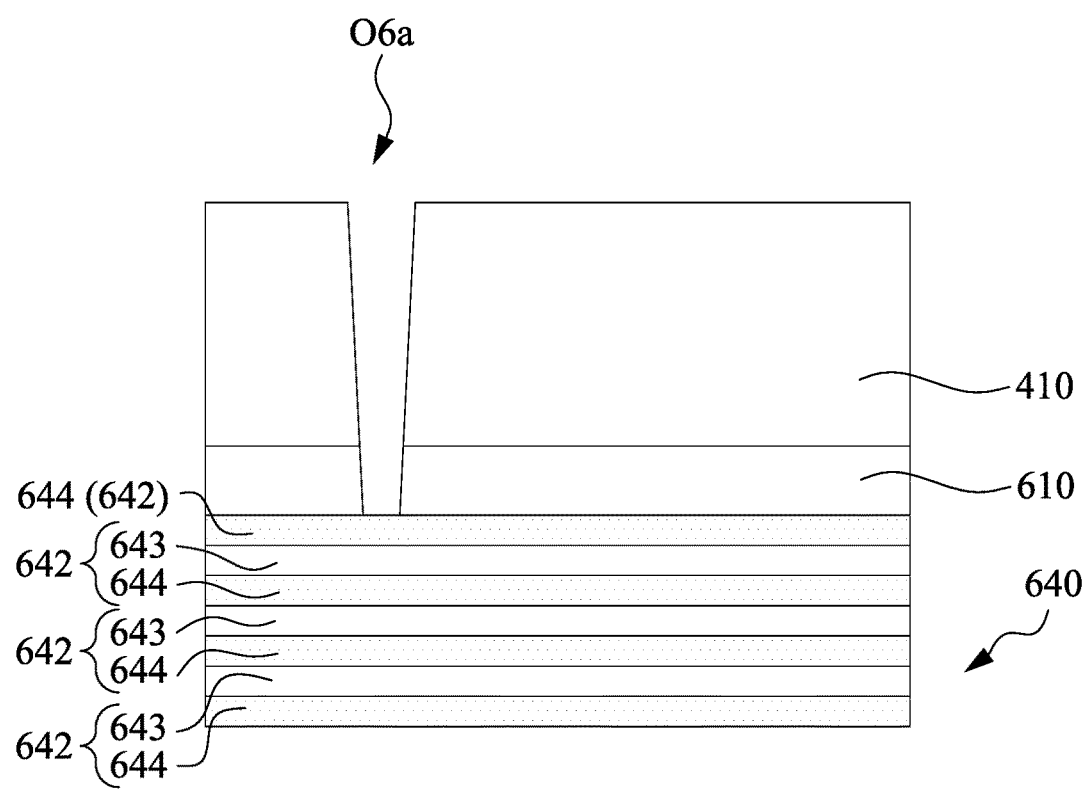
Figure 25E:
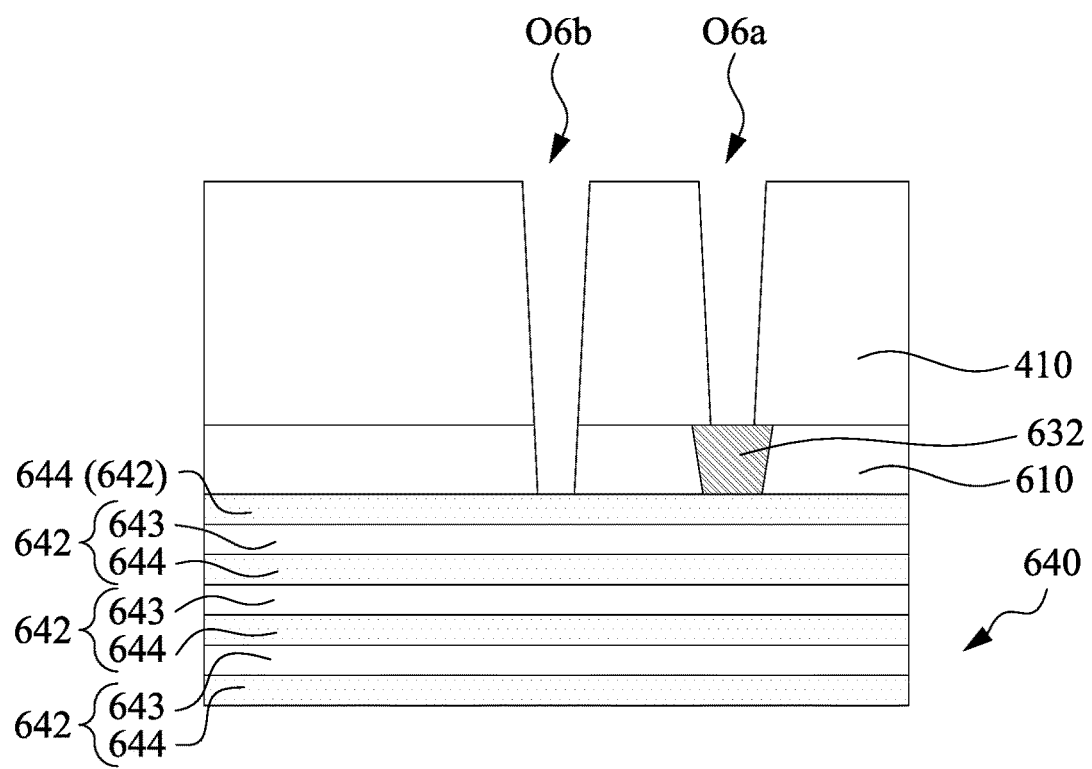
Figure 25F:
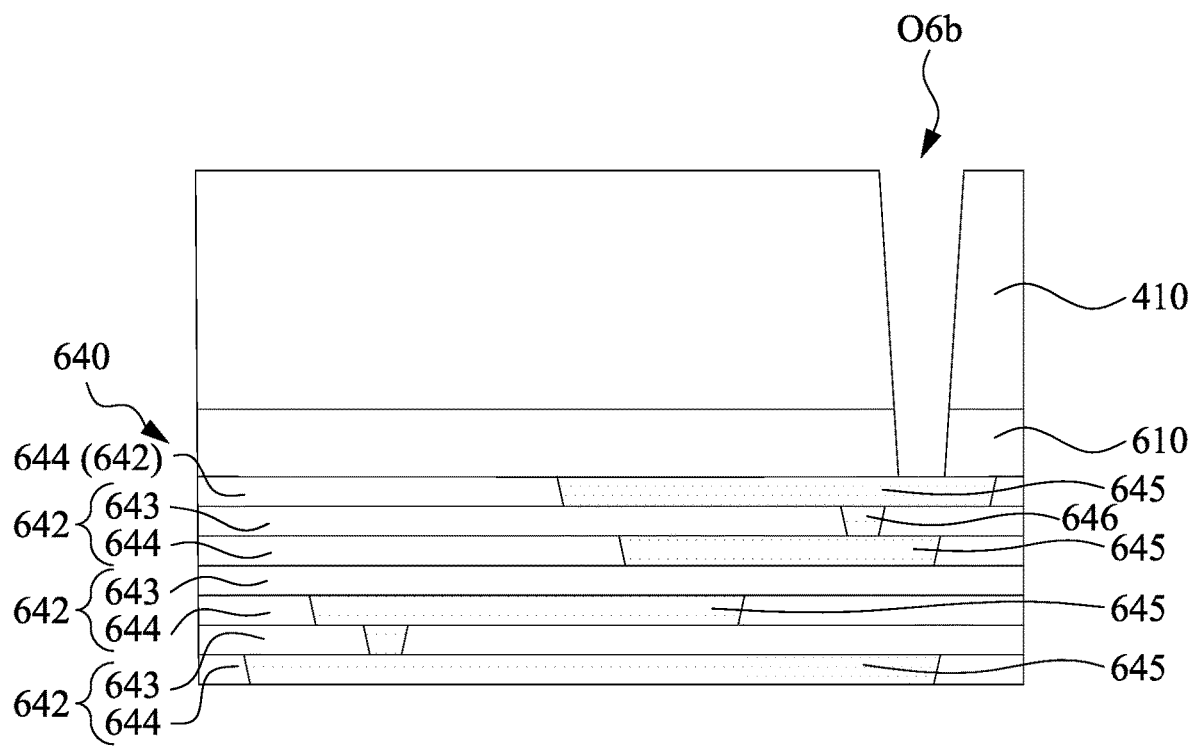

Reference is made to FIGS. 25A-25F, where FIG. 25B is a cross-sectional view taken along line I-I of FIG. 25A, FIG. 25C is a cross-sectional view taken along line II-II of FIG. 25A, FIG. 25D is a cross-sectional view taken along line III-III of FIG. 25A, FIG. 25E is a cross-sectional view taken along line IV-IV of FIG. 25A, and FIG. 25F is a cross-sectional view taken along line V-V of FIG. 25A. After the formation of the substrate 410, the carrier substrate 540 (see FIG. 24A) is removed in some embodiments. The carrier substrate 540 can be removed after the formation of the front-side MLI structure 530 (see FIG. 34A) in some other embodiments. Gate via openings O6a and O6b are then formed in the substrate 410 and extend to the backside metal lines 645 or the conductive structure 632. For example, the gate via opening O6b and one of the gate via openings O6a pass through the third ILD layer 610 as shown in FIGS. 25B, 25D, 25E, and 25F, and at least one source/drain via opening O7 and another one of the gate via openings O6a expose the conductive structure 632 as shown in FIGS. 25C and 25E. The gate via openings O6a and O6b and the source/drain via opening O7 may be formed by using a single or multiple etching process(es).

Figure 26A:
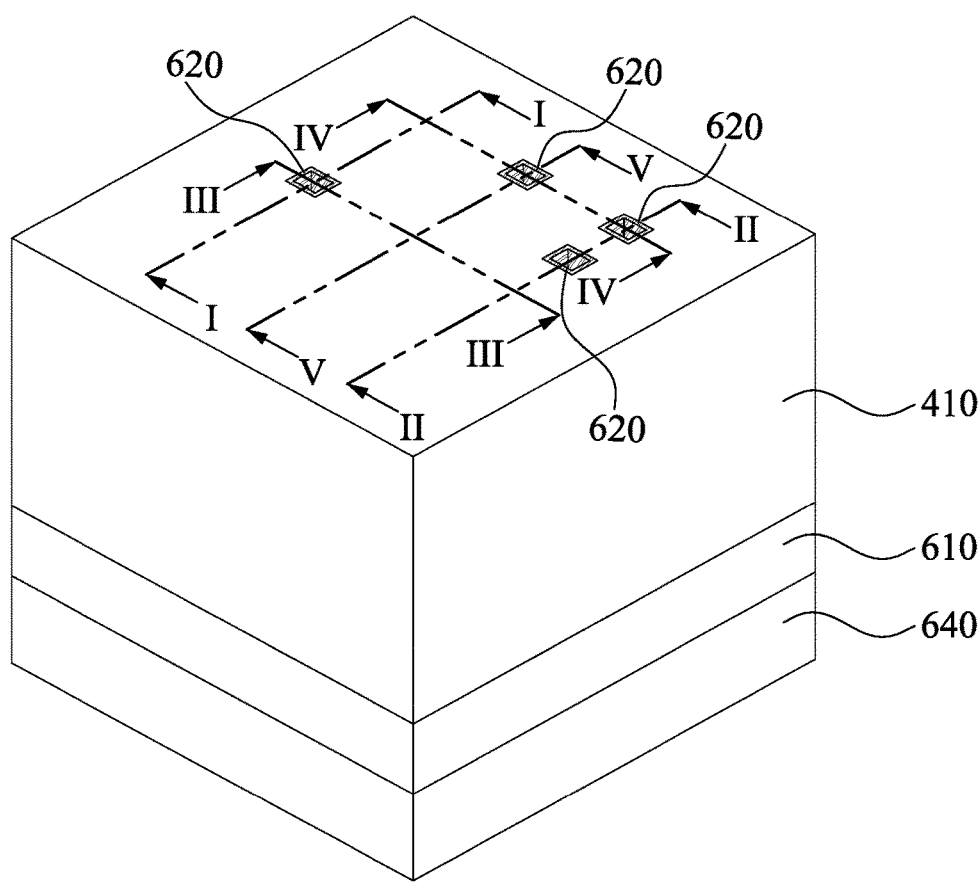
Figure 26B:
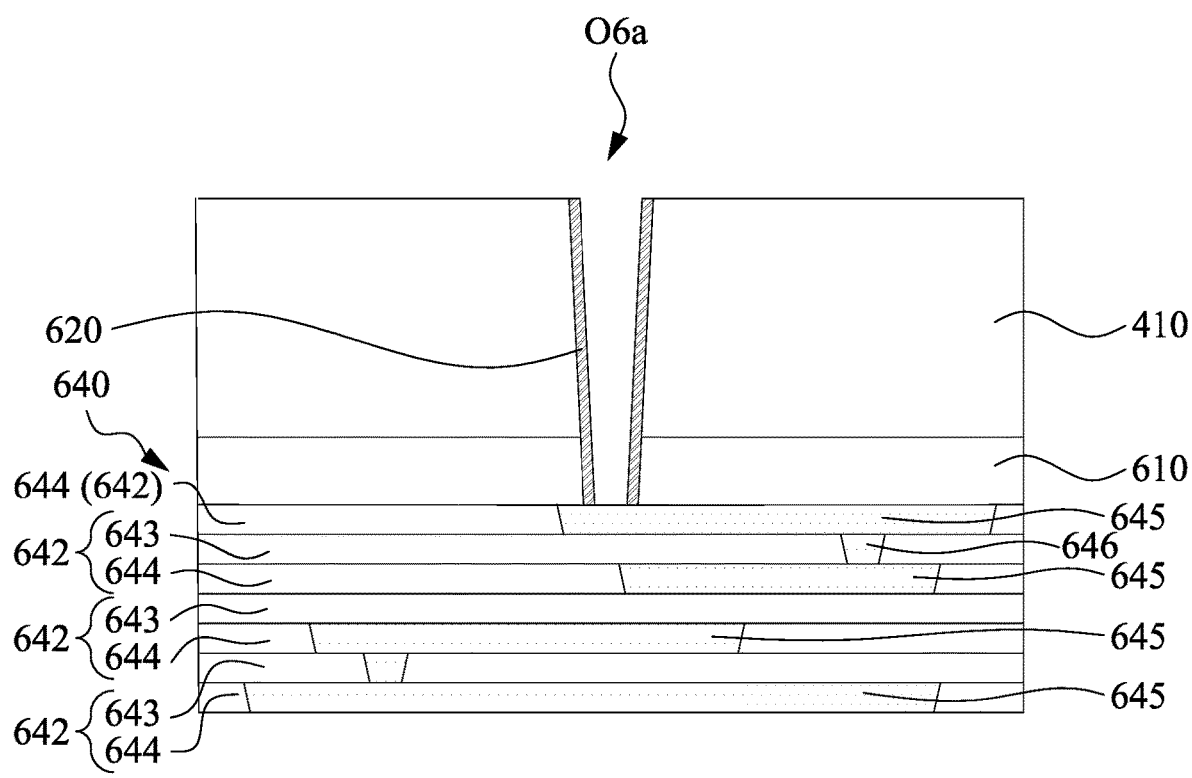
Figure 26C:
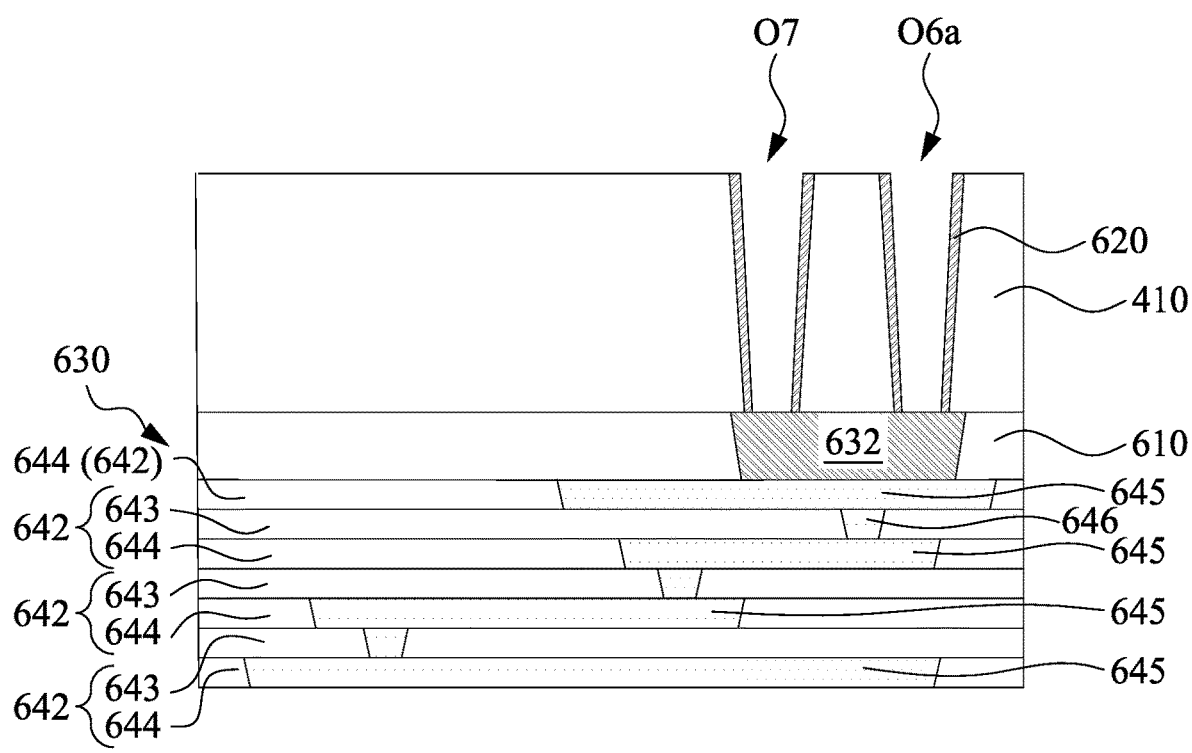
Figure 26D:
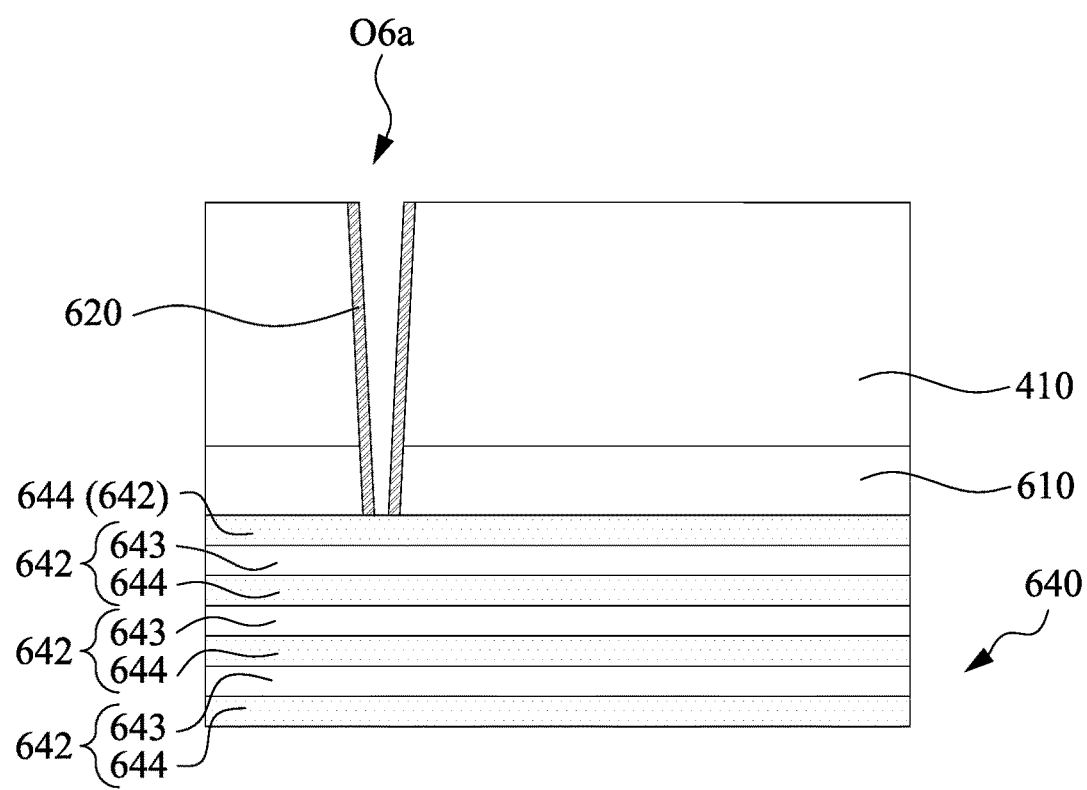
Figure 26E:
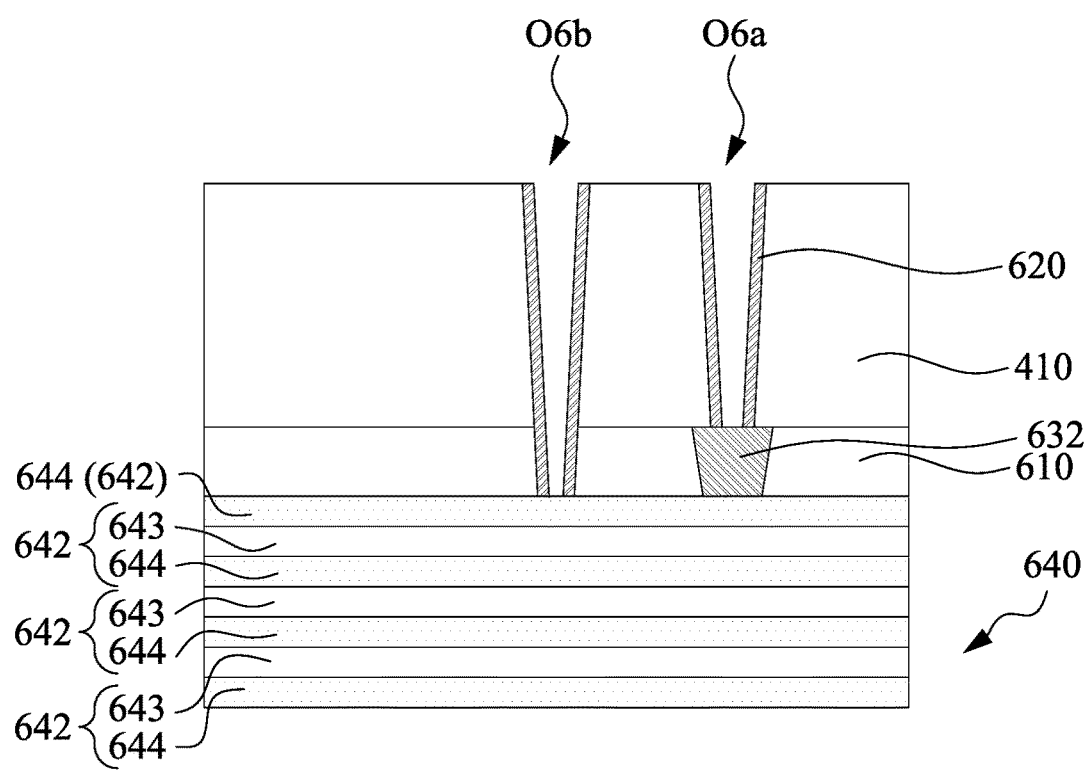
Figure 26F:
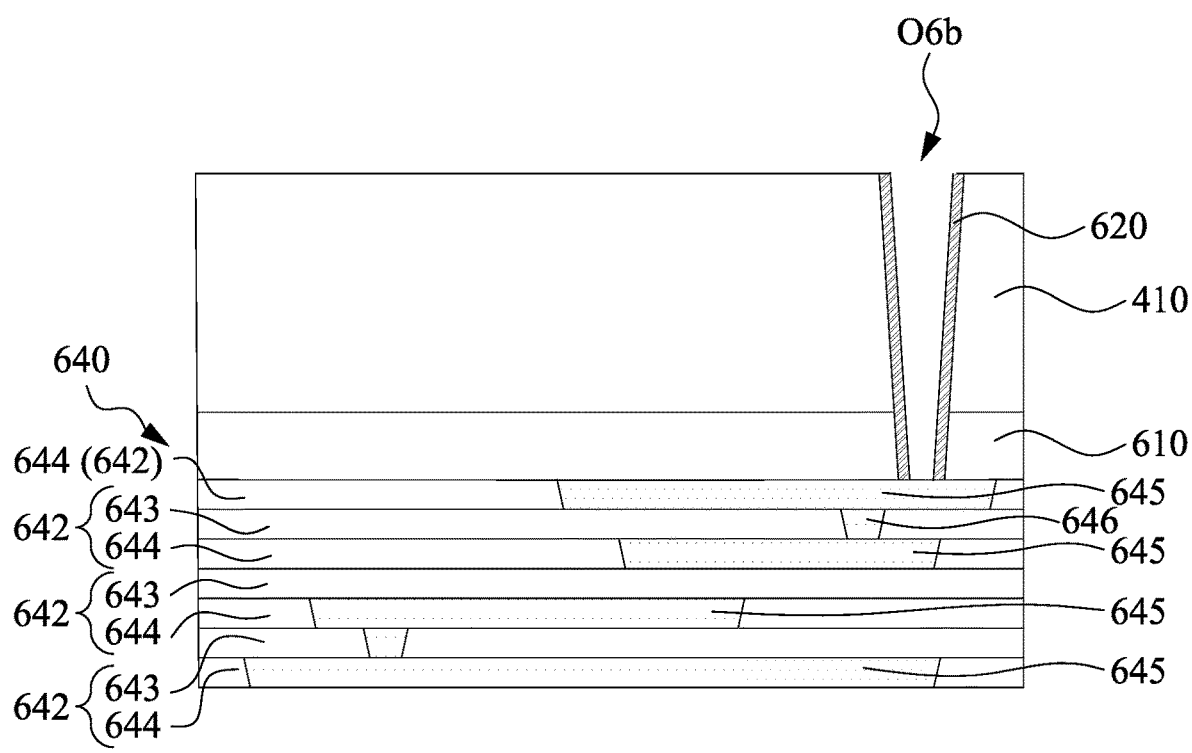

Reference is made to FIGS. 26A-26F, where FIG. 26B is a cross-sectional view taken along line I-I of FIG. 26A, FIG. 26C is a cross-sectional view taken along line II-II of FIG. 26A, FIG. 26D is a cross-sectional view taken along line III-III of FIG. 26A, FIG. 26E is a cross-sectional view taken along line IV-IV of FIG. 26A, and FIG. 26F is a cross-sectional view taken along line V-V of FIG. 26A. Spacer structures 620 are formed on inner sidewalls of the gate via openings O6a and O6b and the source/drain via opening O7. Materials, configurations, dimensions, processes and/or operations regarding the spacer structures 620 are similar to or the same as the spacer structures 320 of FIGS. 17A-17F.

Figure 27A:
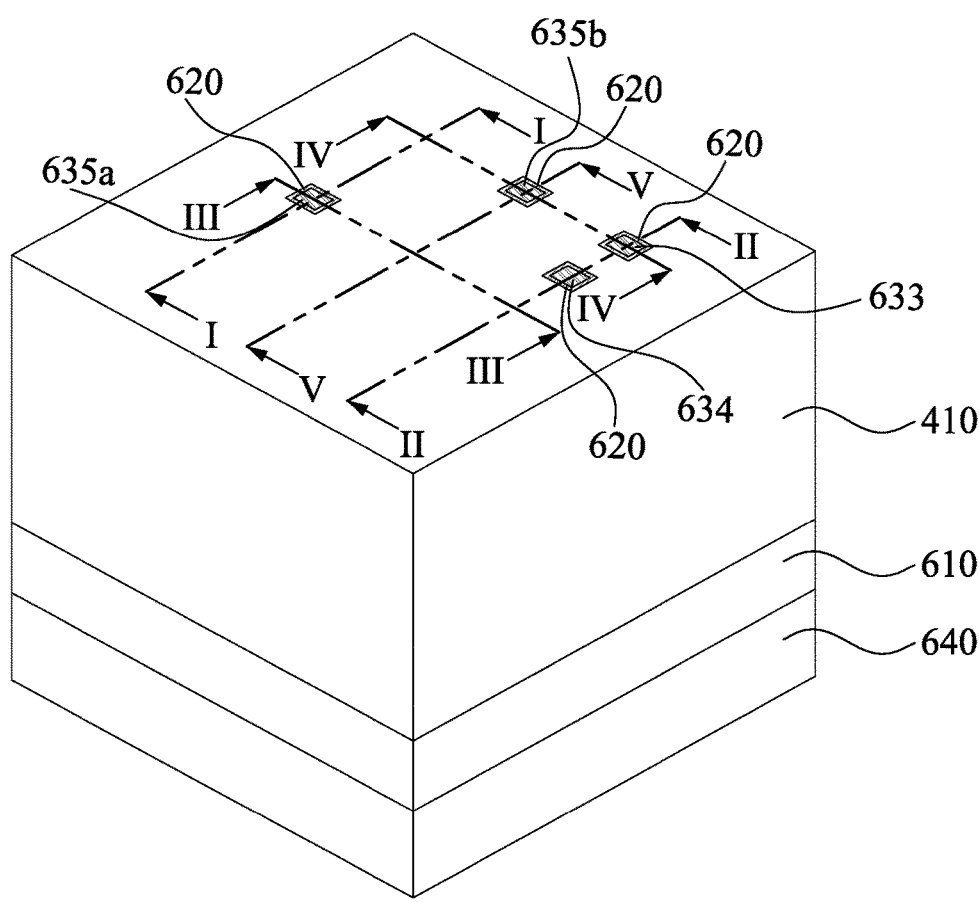
Figure 27B:
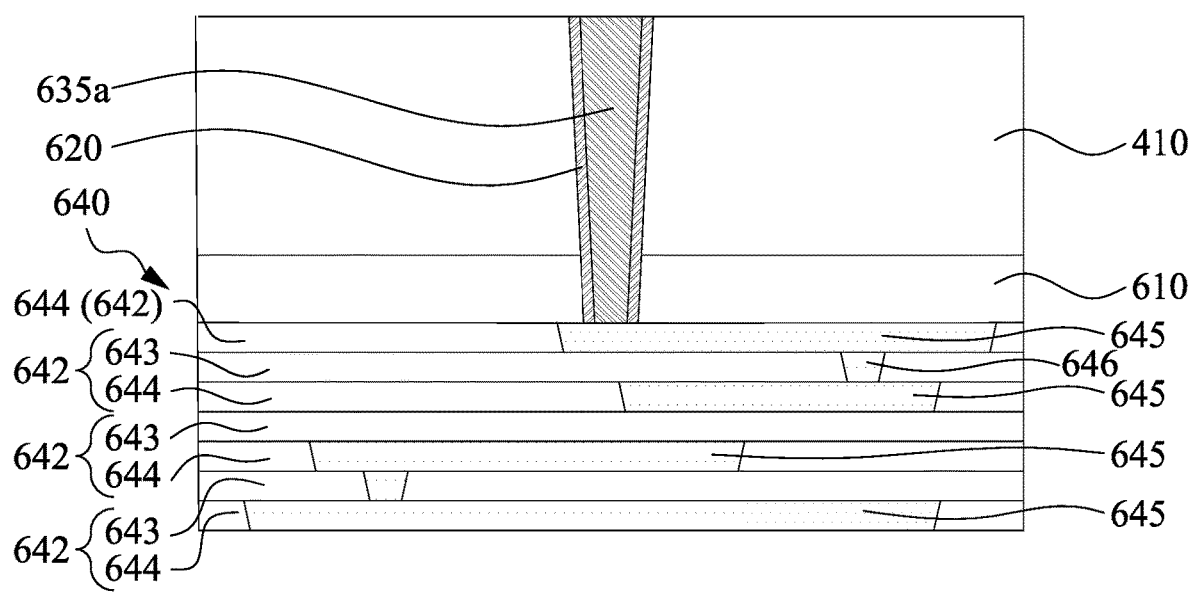
Figure 27C:
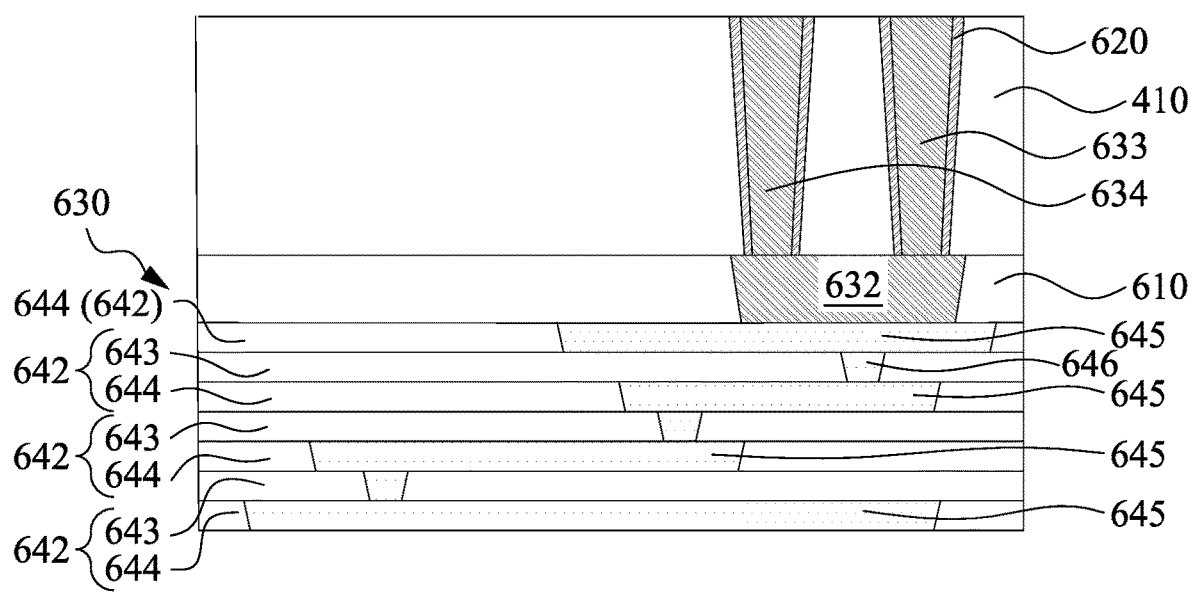
Figure 27D:
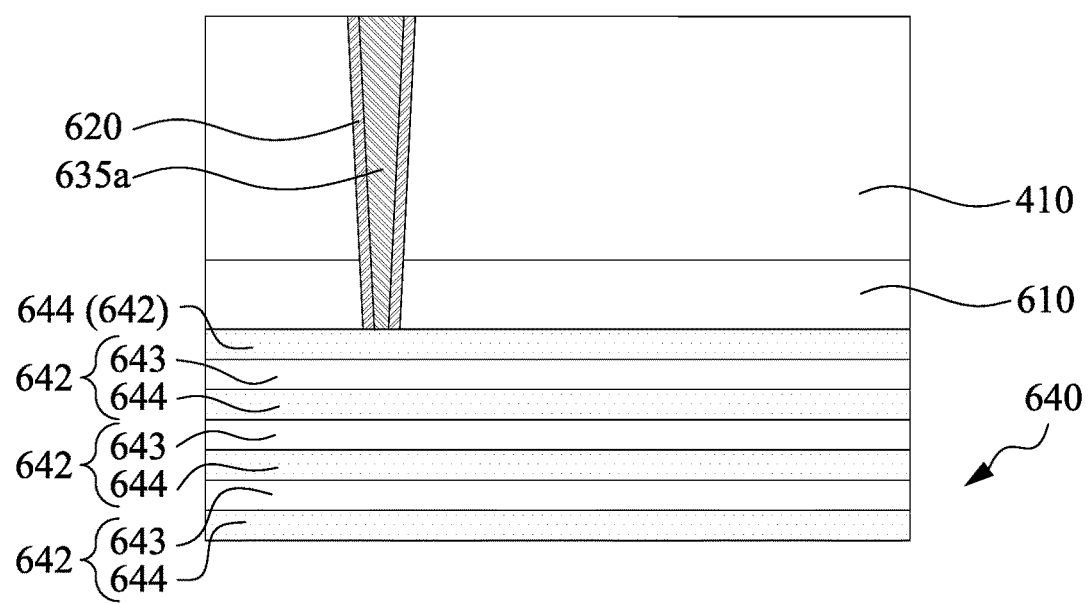
Figure 27E:
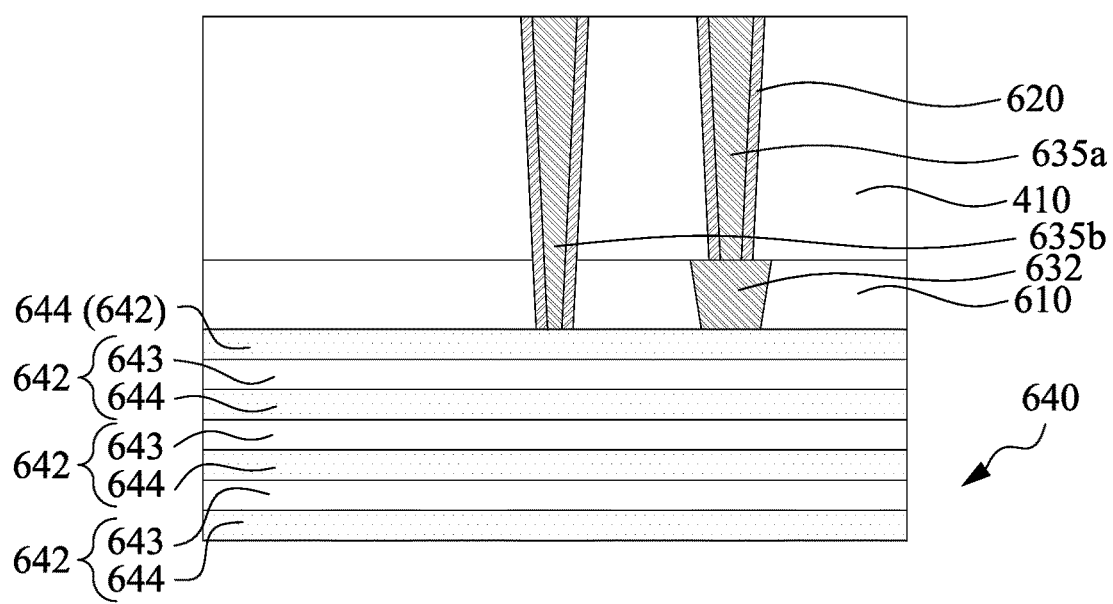
Figure 27F:
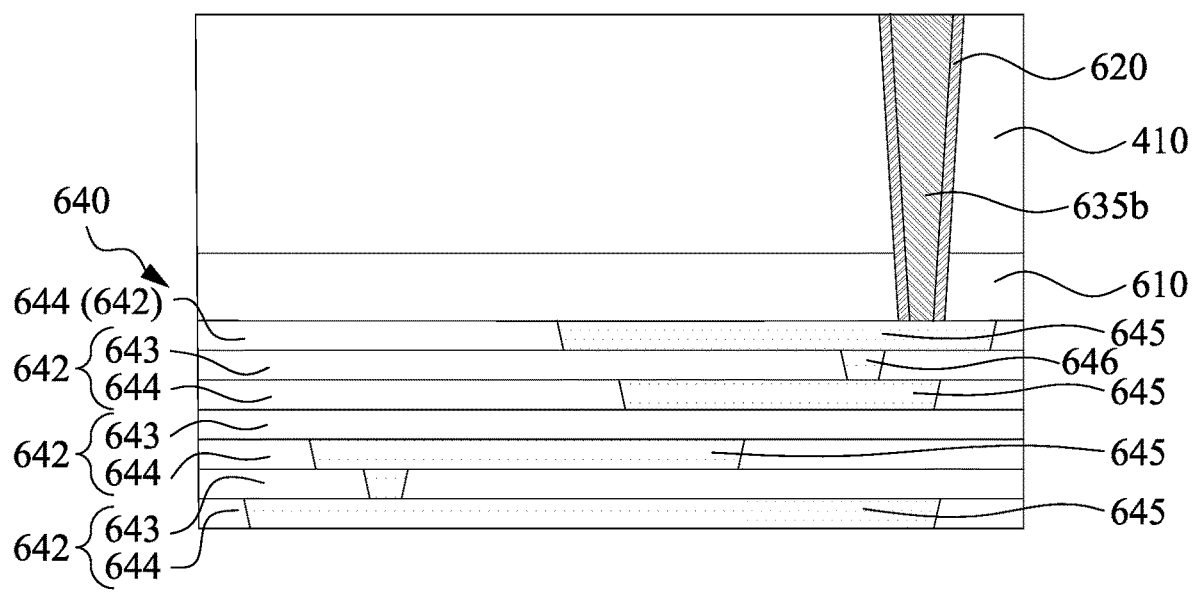

Reference is made to FIGS. 27A-27F, where FIG. 27B is a cross-sectional view taken along line I-I of FIG. 27A, FIG. 27C is a cross-sectional view taken along line II-II of FIG. 27A, FIG. 27D is a cross-sectional view taken along line III-III of FIG. 27A, FIG. 27E is a cross-sectional view taken along line IV-IV of FIG. 27A, and FIG. 27F is a cross-sectional view taken along line V-V of FIG. 27A. Gate via contacts 635a, 635b and backside butted contacts (or butted via) 633, 634 are formed in the openings O6a, O6b, and O7 (see FIG. 26A). Formation of the gate via contacts 635a, 635b and backside butted contact 633, 634 includes depositing one or more metal materials overfilling the openings O6a, O6b, and O7, and then performing a CMP process to remove excessive metal materials outside the openings O6a, O6b, and O7.

Figure 28:
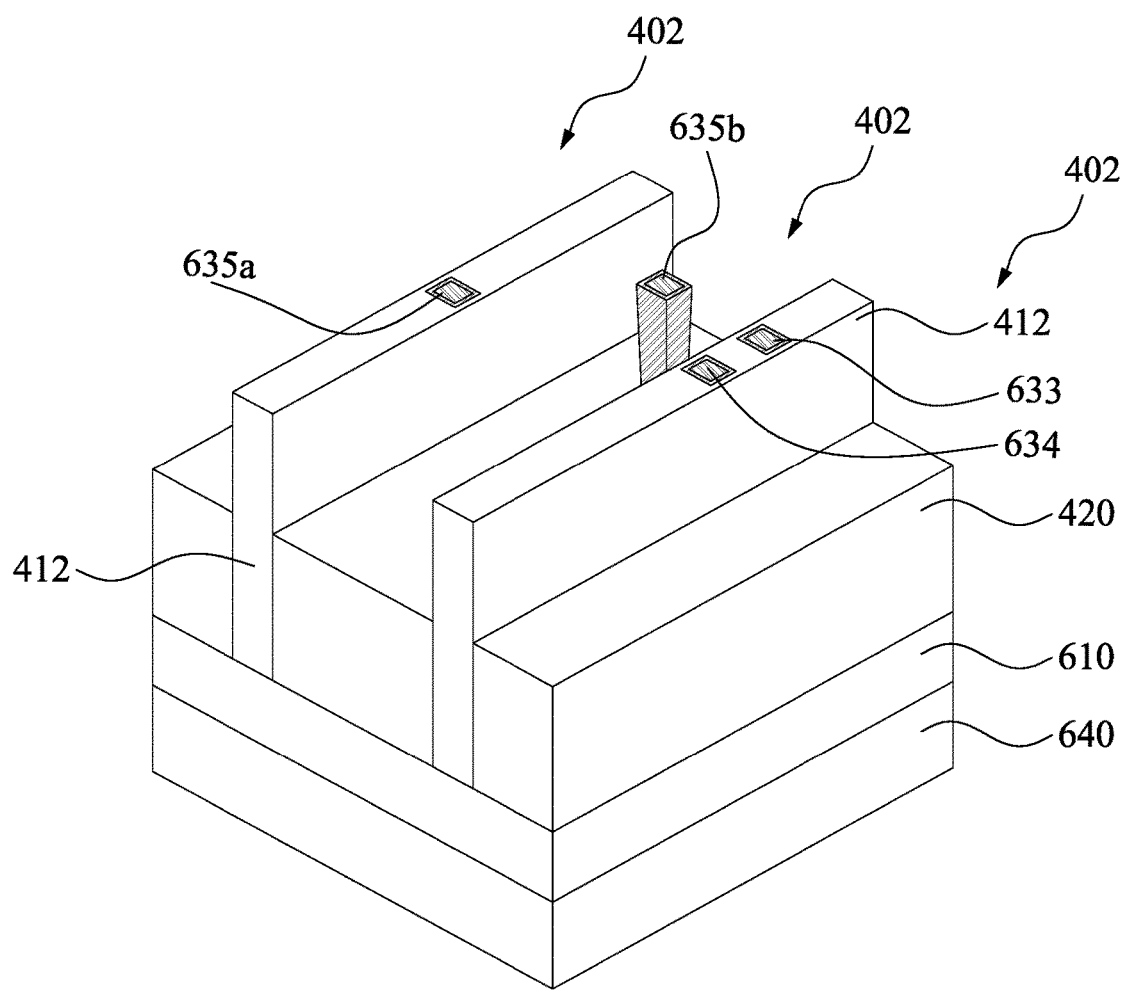
Figure 28:
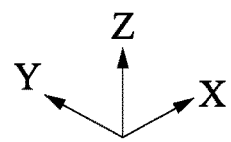

Reference is made to FIG. 28. The substrate 410 (see FIG. 27A) is patterned to be one or more semiconductor fins (may be referred to as channel layers) 412. Materials, configurations, dimensions, processes and/or operations regarding the semiconductor fins 412 are similar to or the same as the semiconductor fins 112 of FIG. 1. As shown in FIG. 28, the backside butted contacts 633, 634 and the gate via contact 635a are embedded in the semiconductor fins 412. That is, the semiconductor fins 412 wraps the backside butted contacts 633, 634 and the gate via contact 635a.

Isolation structures 420, such as shallow trench isolations (STI), are disposed in trenches 402 and over the third ILD layer 610. The isolation structures 420 can be equivalently referred to as an isolation insulating layer in some embodiments. Materials, configurations, dimensions, processes and/or operations regarding the isolation structures 420 are similar to or the same as the isolation structures 120 of FIG. 2. As shown in FIG. 28, the gate via contact 635b is partially embedded in the isolation structures 420, and a top portion of the gate via contact 635b protrudes from the isolation structures 420.

Figure 29:
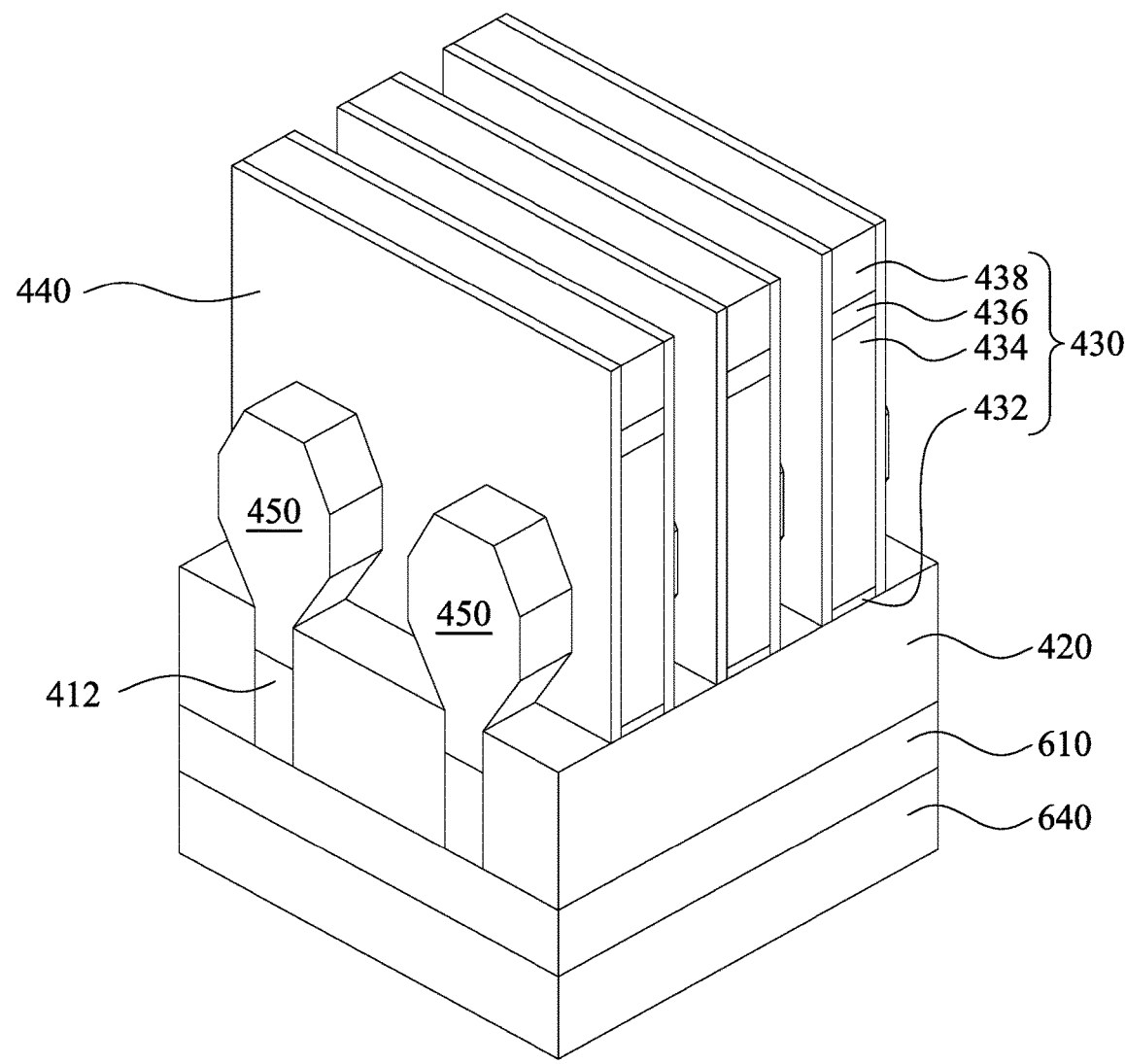

Reference is made to FIG. 29. The structure of FIG. 28 undergoes the processes similar to the processes shown in FIGS. 3 and 4. That is, dummy gate structures 430 including dummy gate dielectric layers 432, dummy gate electrodes 434, oxide mask layers 436, and nitride mask layers 438 are at least partially disposed over the semiconductor fins 412. Materials, configurations, dimensions, processes and/or operations regarding the dummy gate structures 430 are similar to or the same as the dummy gate structures 130 of FIG. 3.

Gate spacers 440 including first spacer layers 442 and second spacer layers 444 (see FIG. 31B) are formed on sidewalls of the dummy gate structures 430. Materials, configurations, dimensions, processes and/or operations regarding the gate spacers 440 are similar to or the same as the gate spacers 140 of FIG. 3.

After the formation of the gate spacers 440 is completed, source/drain epitaxial structures 450 are formed on source/drain regions of the semiconductor fins 412 that are not covered by the dummy gate structures 430 and the gate spacers 440. Materials, configurations, dimensions, processes and/or operations regarding the source/drain epitaxial structures 450 are similar to or the same as the source/drain epitaxial structures 150 of FIG. 3.

Figure 30:
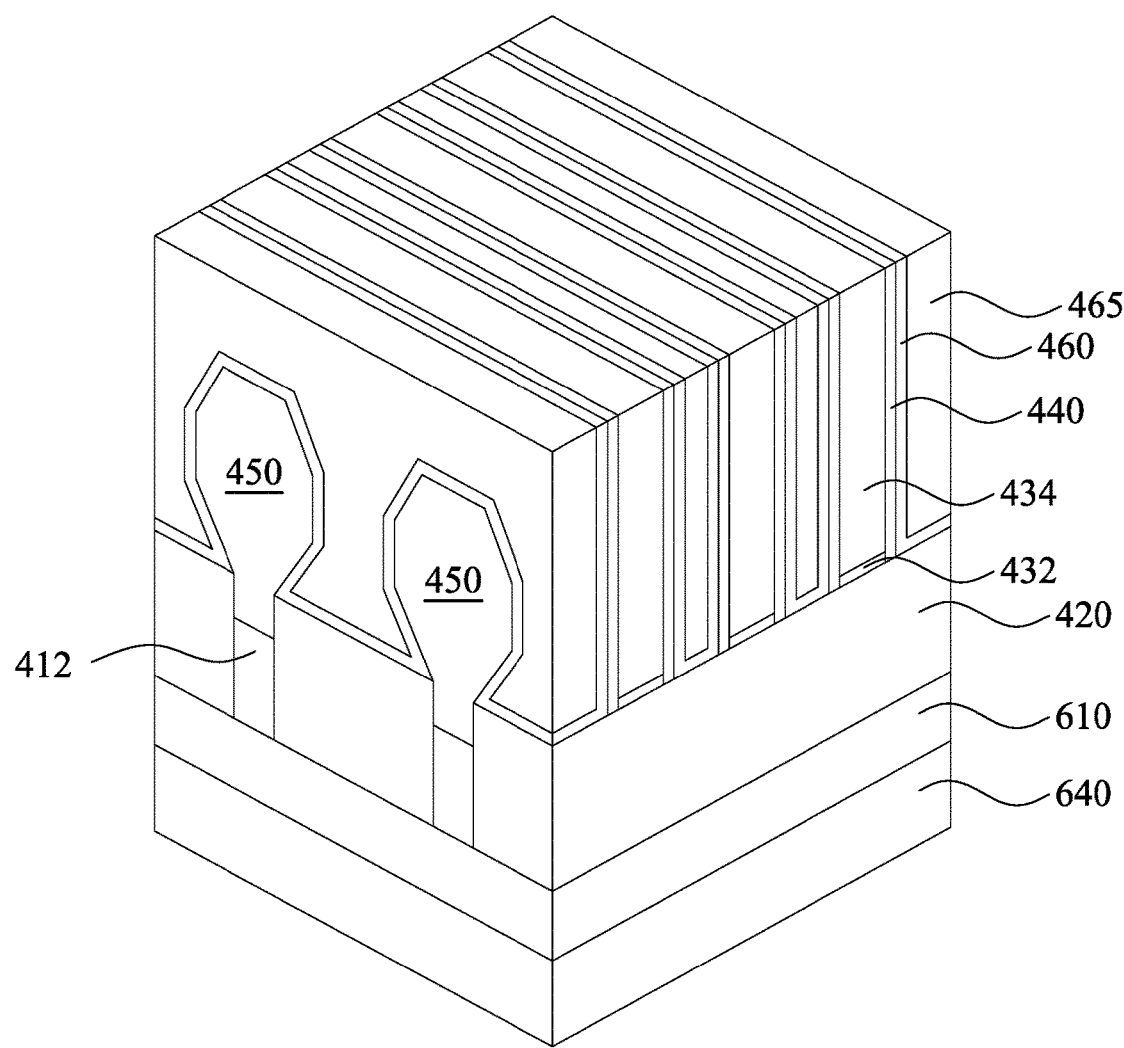

Reference is made to FIG. 30. A first interlayer dielectric (ILD) layer 465 is formed on the semiconductor fins 412 and the isolation structures 410. In some embodiments, a contact etch stop layer (CESL) 460 is also formed prior to forming the first ILD layer 465. In some examples, after forming the first ILD layer 465, a planarization process may be performed to remove excessive materials of the first ILD layer 465. In some embodiments, the CMP process also removes the oxide mask layers 436 and the nitride mask layers 438 (as shown in FIG. 29) and exposes the dummy gate electrodes 434. Materials, configurations, dimensions, processes and/or operations regarding the first ILD layer 465 are similar to or the same as the first ILD layer 165 of FIG. 5. Materials, configurations, dimensions, processes and/or operations regarding the CESL 460 are similar to or the same as the CESL 160 of FIG. 5.

Figure 31A:
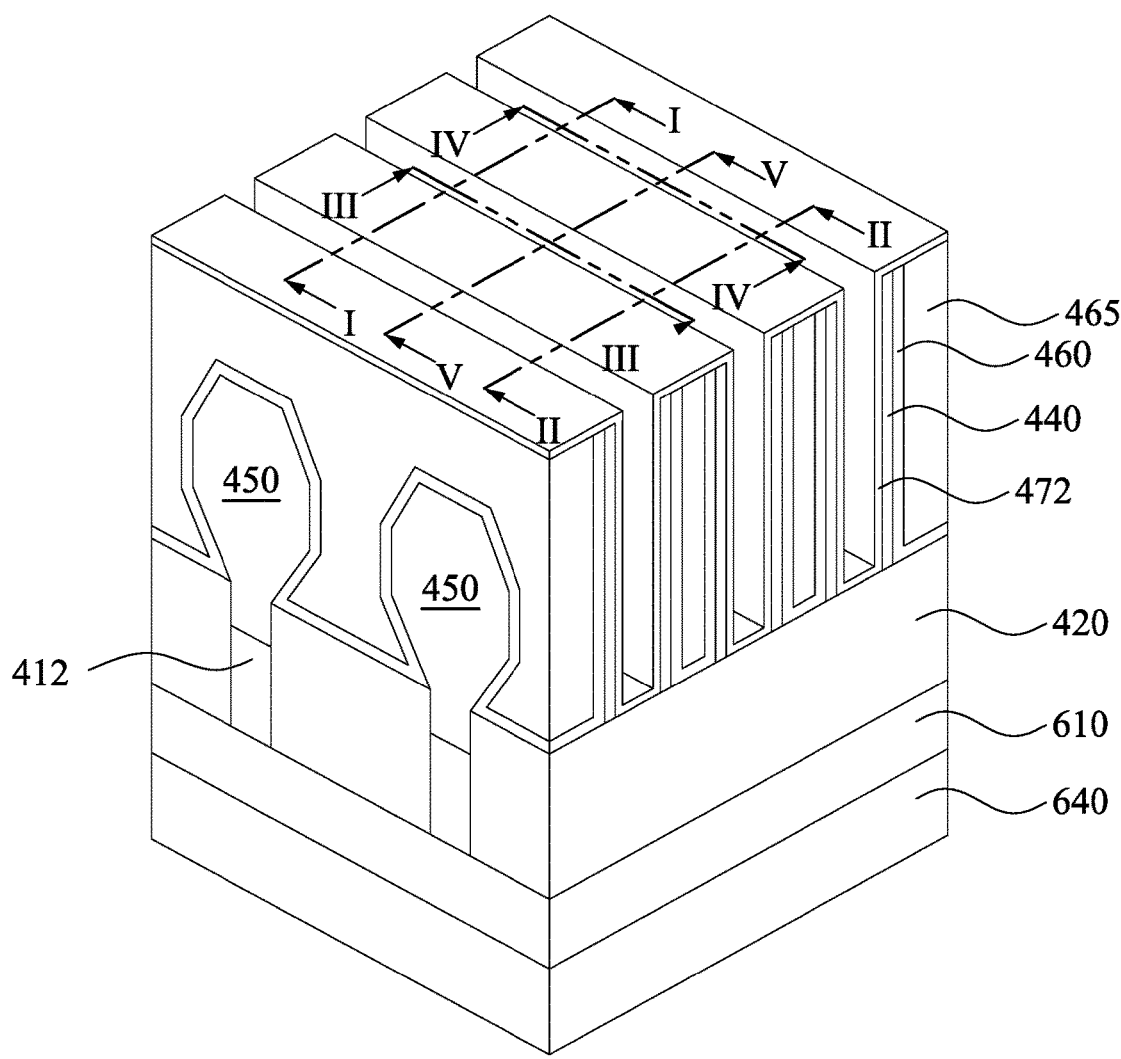
Figure 31B:
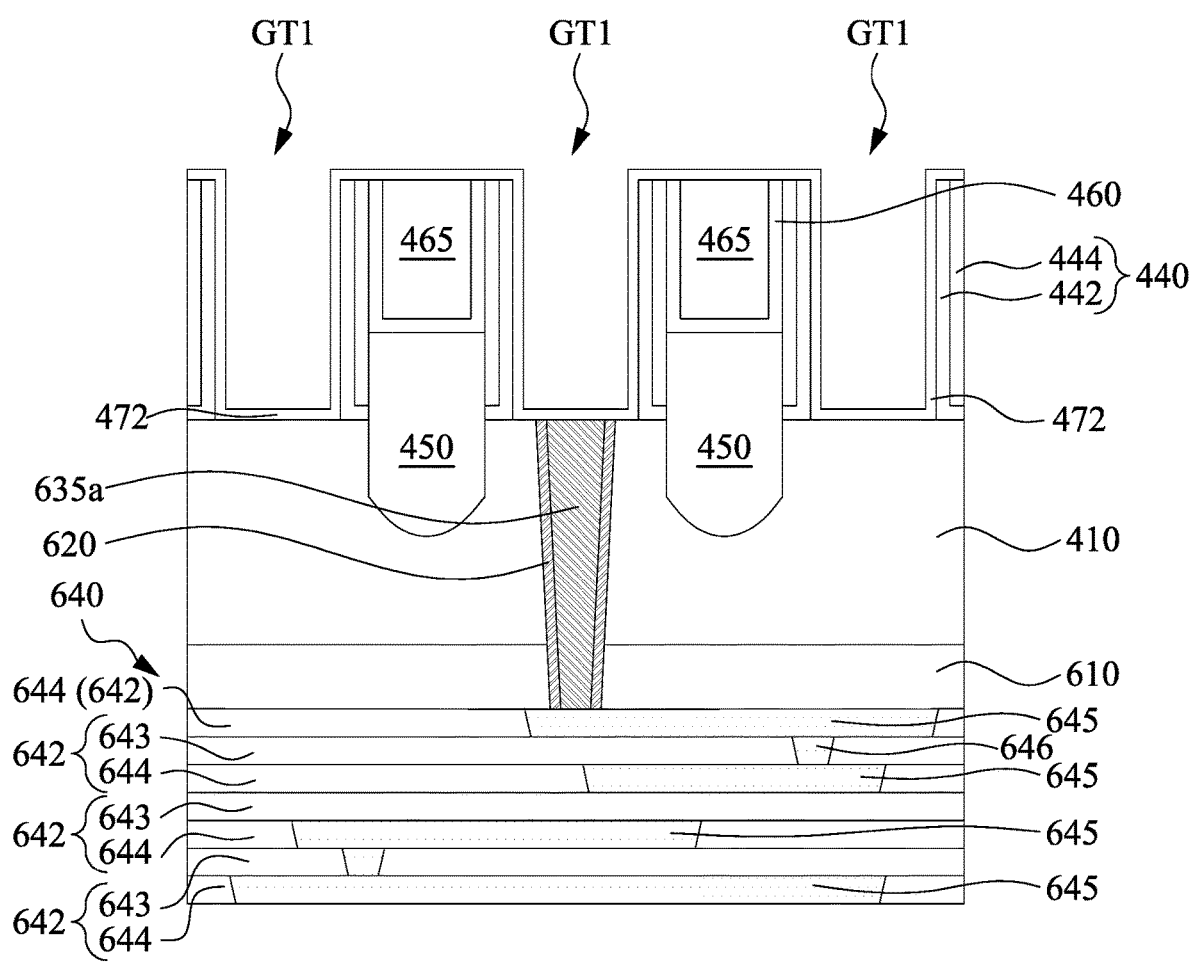
Figure 31C:
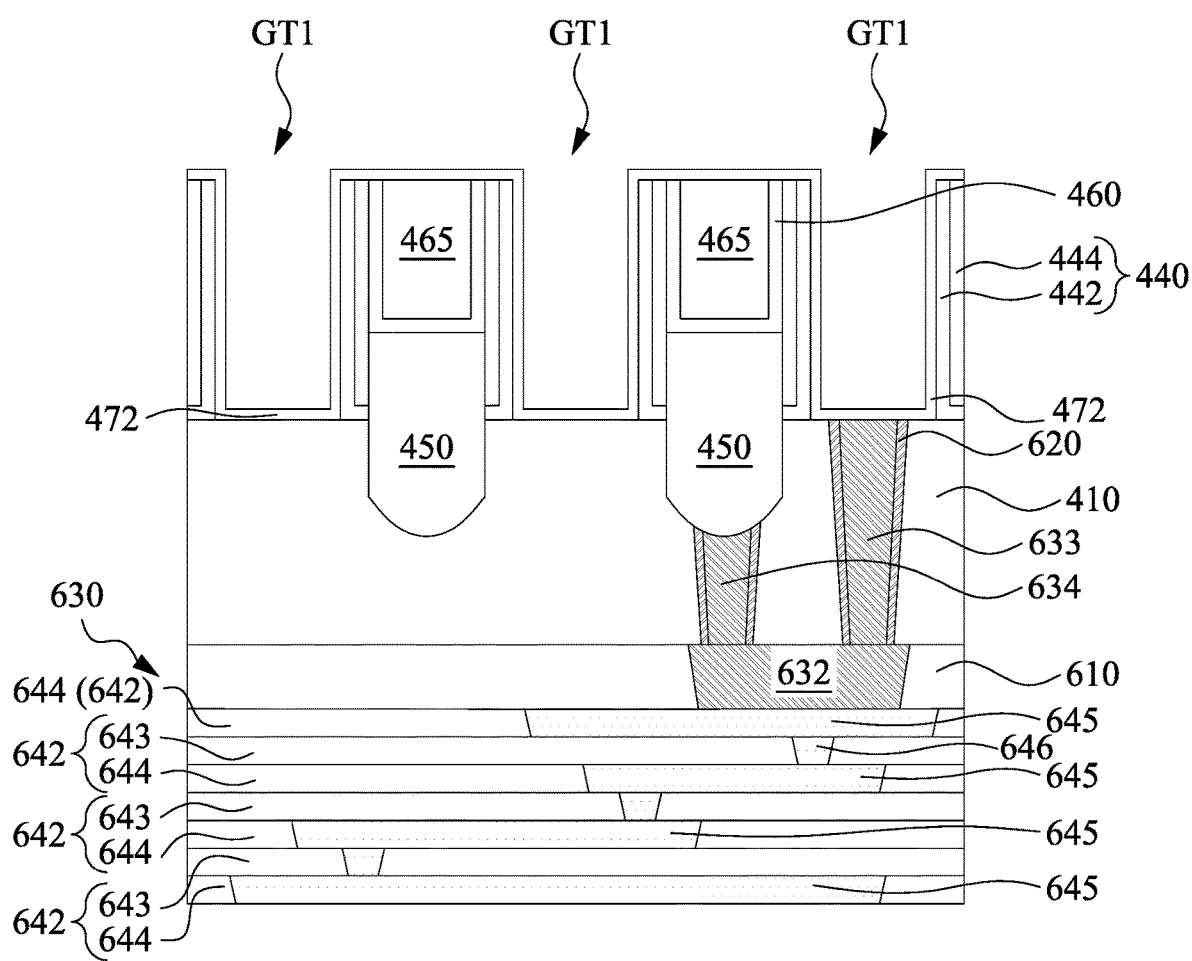
Figure 31D:
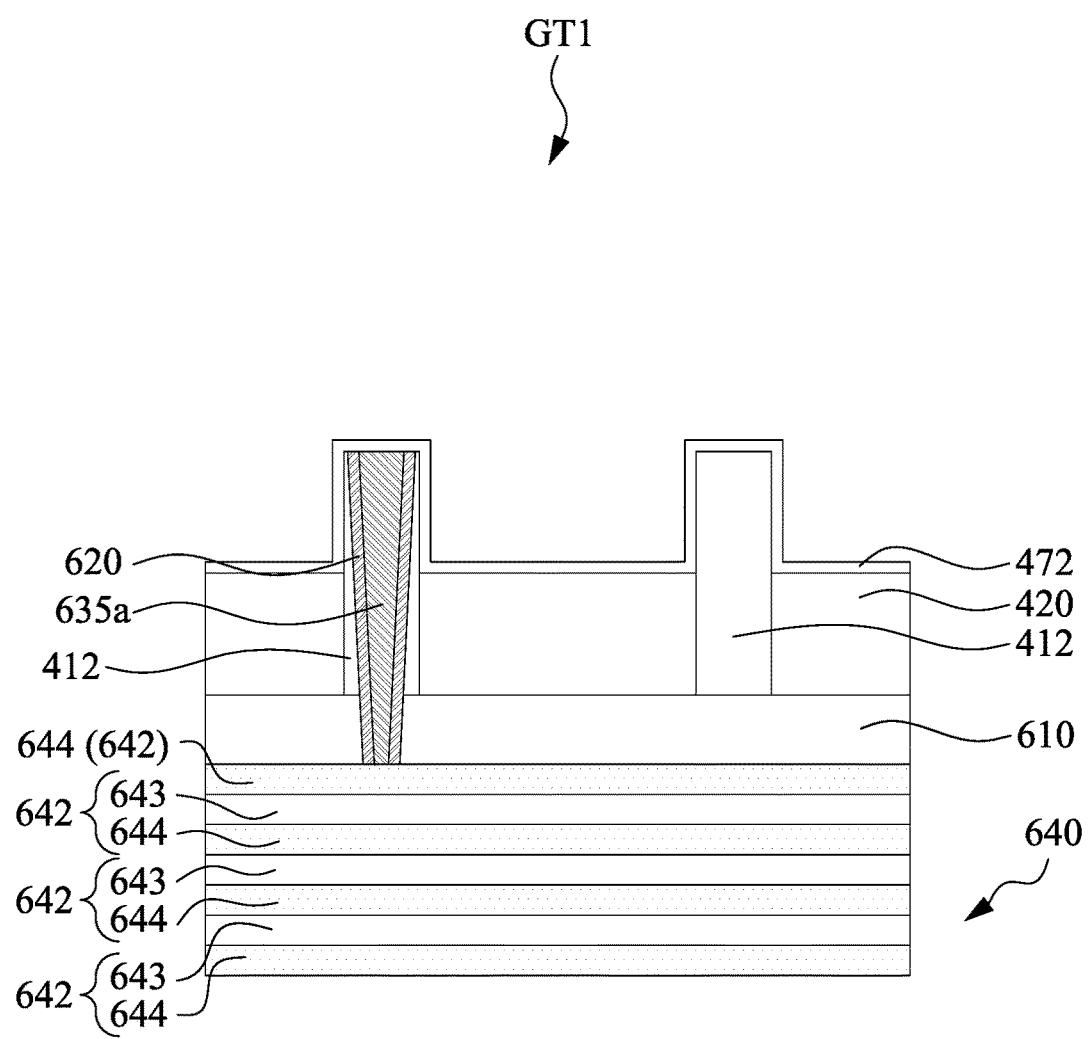
Figure 31E:
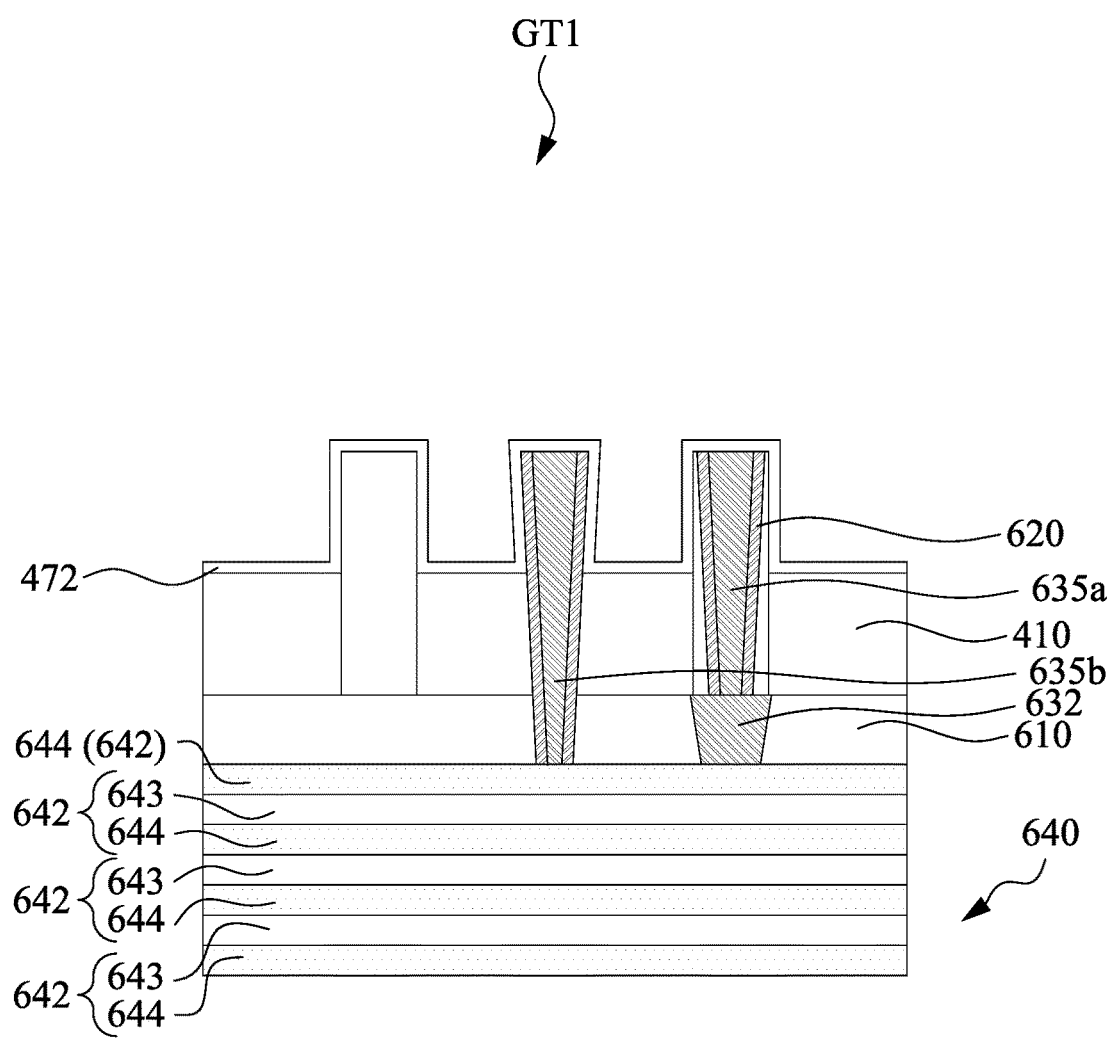
Figure 31F:
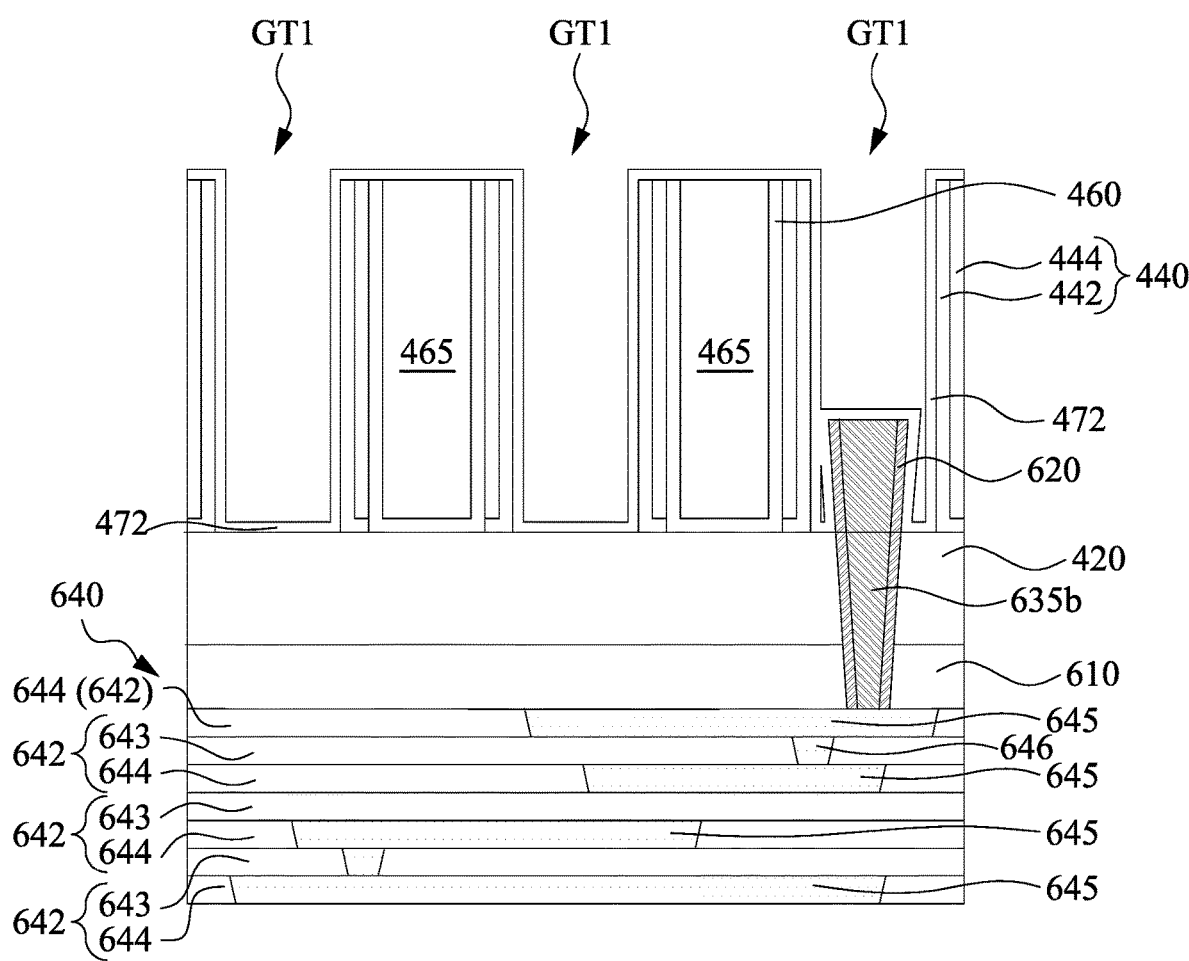

Reference is made to FIGS. 31A-31F, where FIG. 31B is a cross-sectional view taken along line I-I of FIG. 31A, FIG. 31C is a cross-sectional view taken along line II-II of FIG. 31A, FIG. 31D is a cross-sectional view taken along line III-III of FIG. 31A, FIG. 31E is a cross-sectional view taken along line IV-IV of FIG. 31A, and FIG. 31F is a cross-sectional view taken along line V-V of FIG. 31A. The dummy gate electrodes 434 and the dummy gate dielectric layers 432 (see FIG. 30) are removed, resulting in gate trenches GT1 between corresponding gate spacers 440. Thereafter, a gate dielectric layer 472 is formed to lining the gate trenches GT1. The gate dielectric layer 472 covers the gate via contacts 635a, 635b and the backside butted contact 633, 634. Materials, configurations, dimensions, processes and/or operations regarding the gate dielectric layer 472 are similar to or the same as the gate dielectric layer 172 of FIG. 6.

Figure 32A:
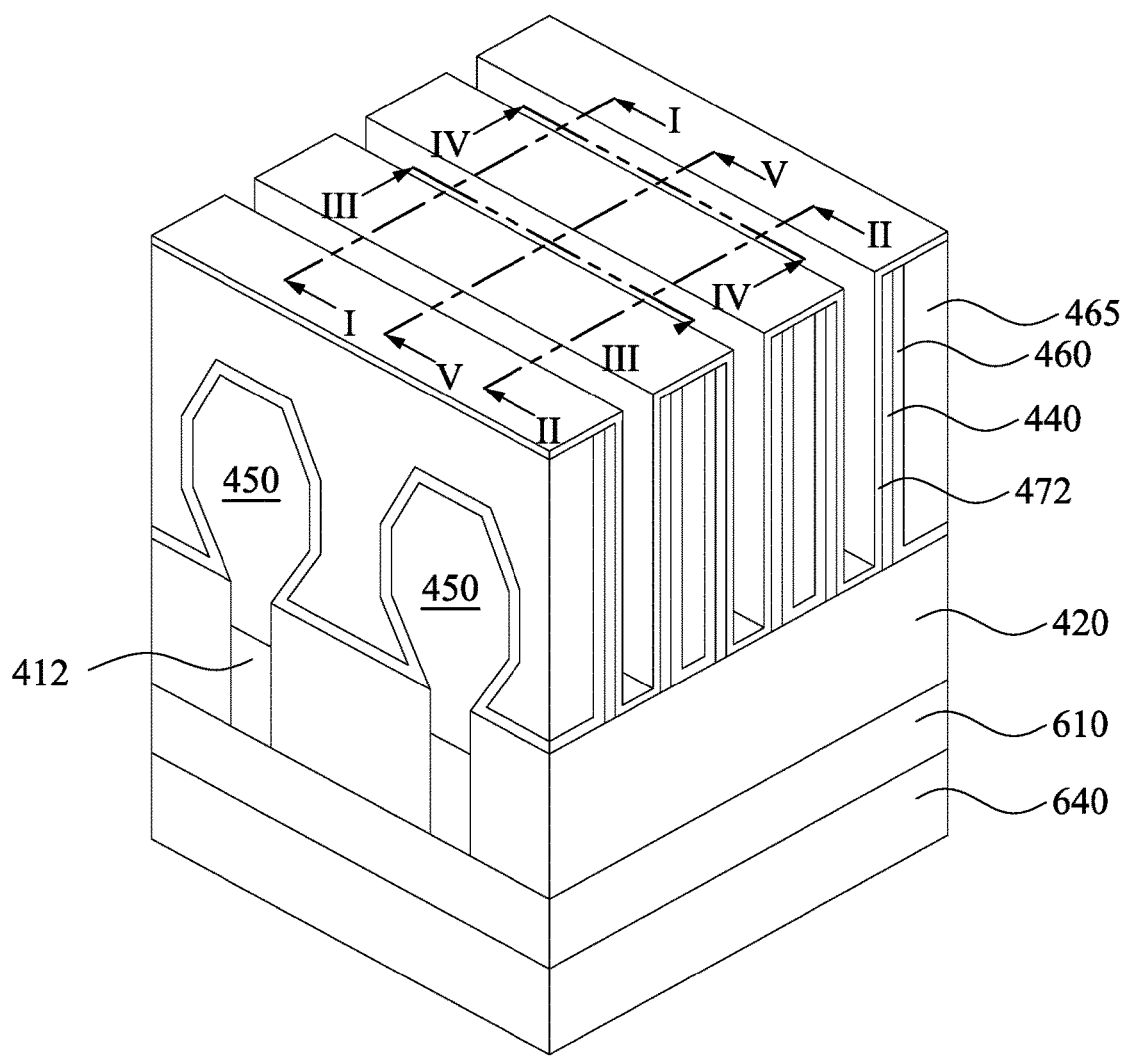
Figure 32B:
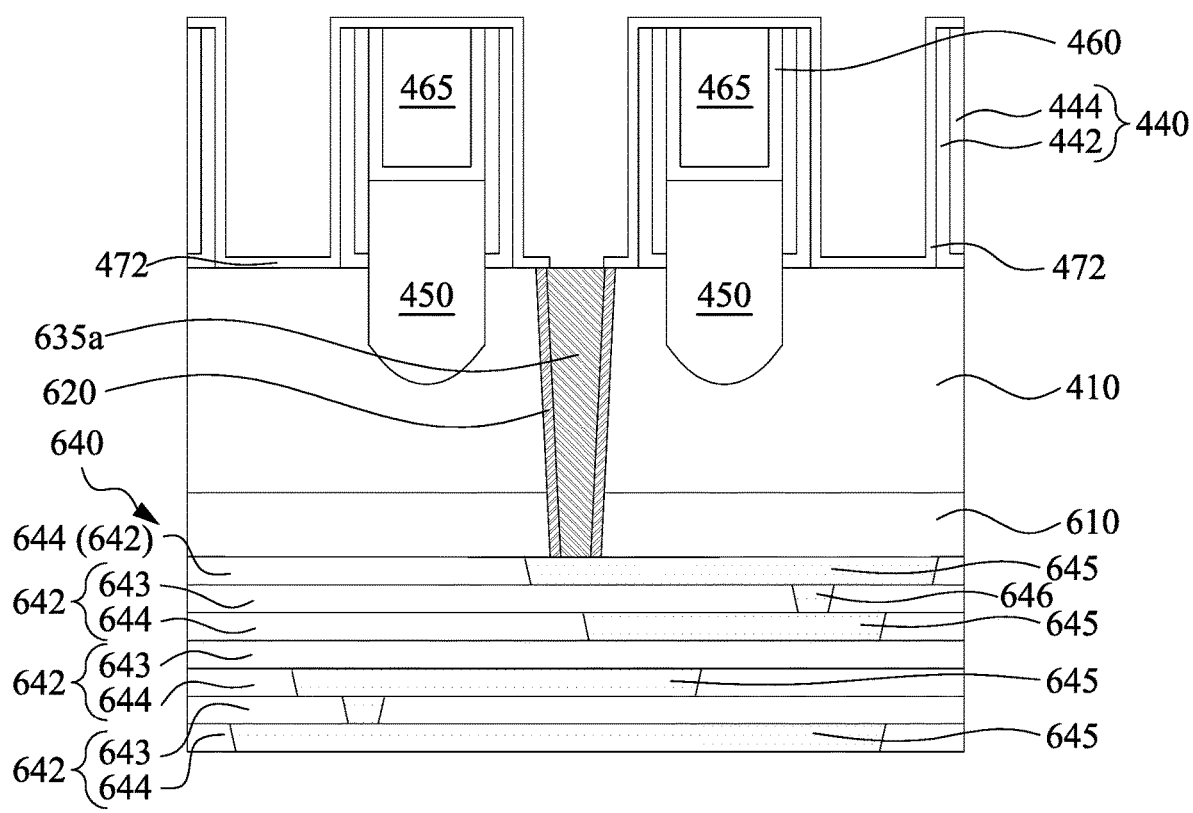
Figure 32C:
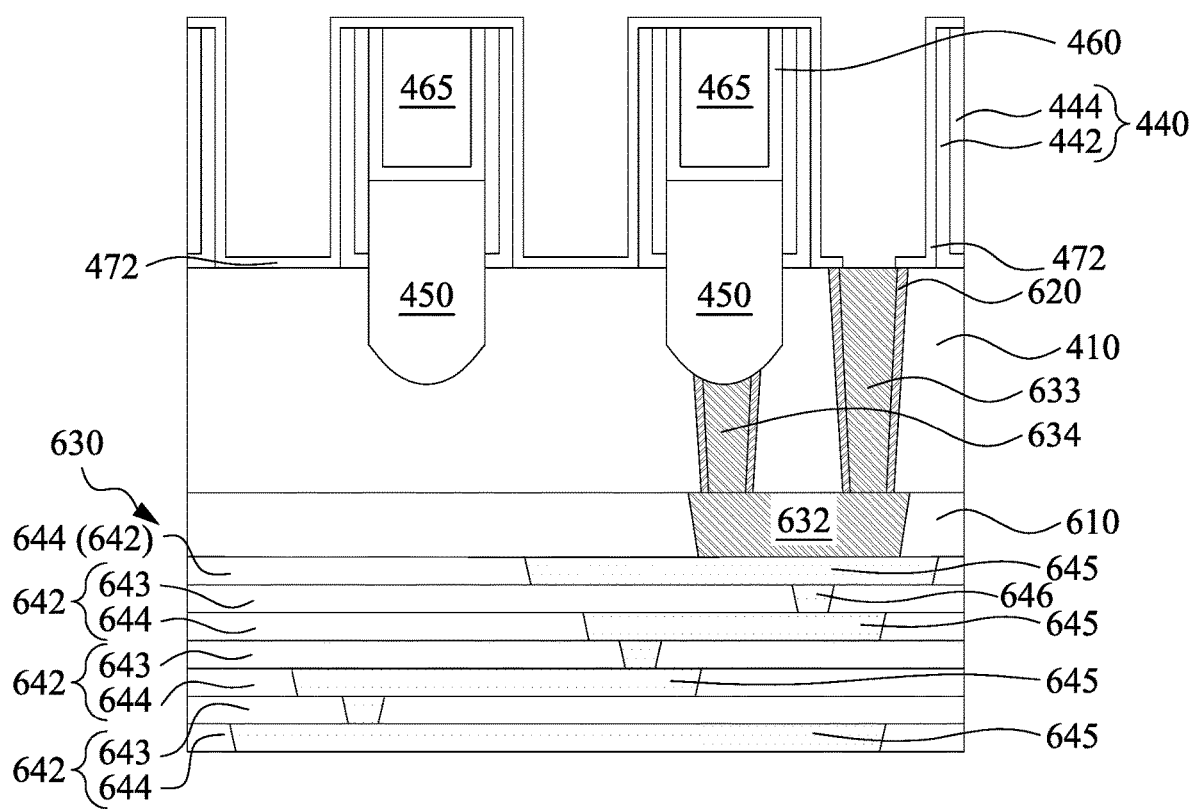
Figure 32D:
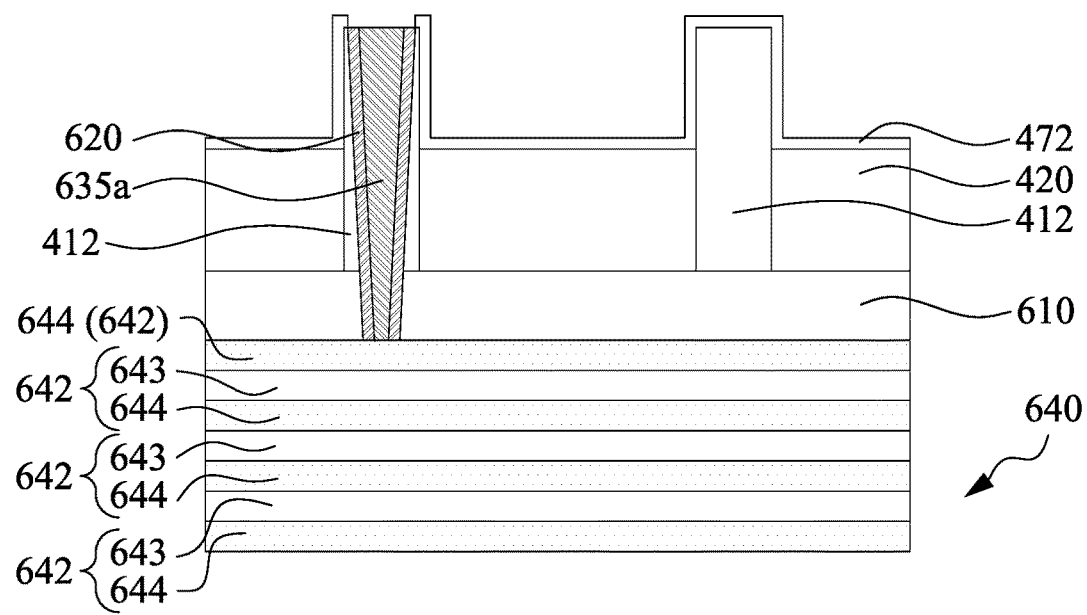
Figure 32E:
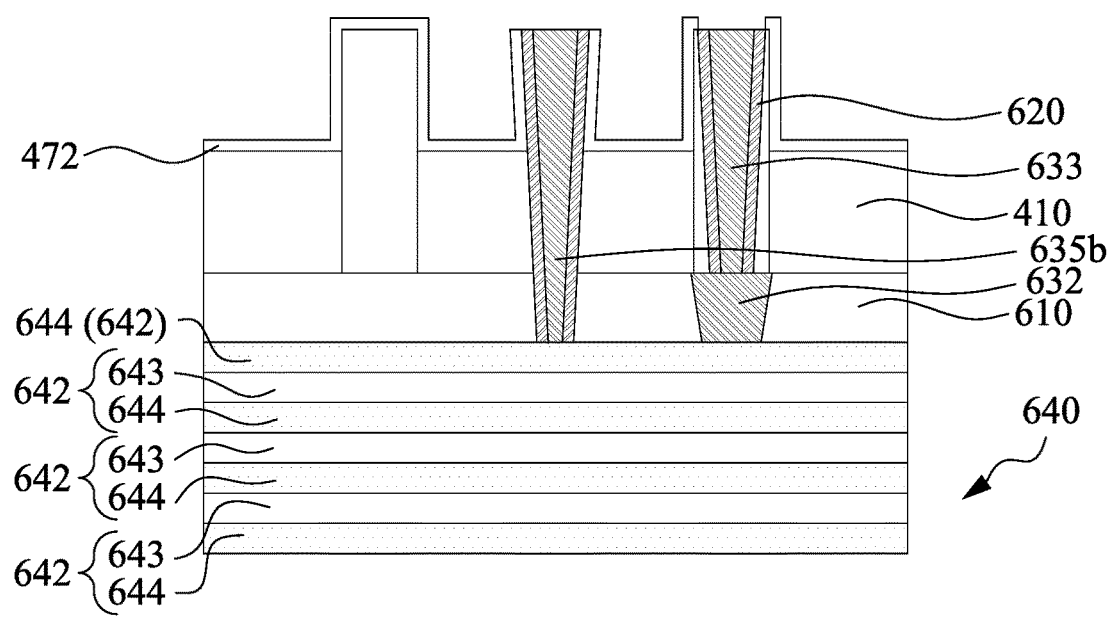
Figure 32F:
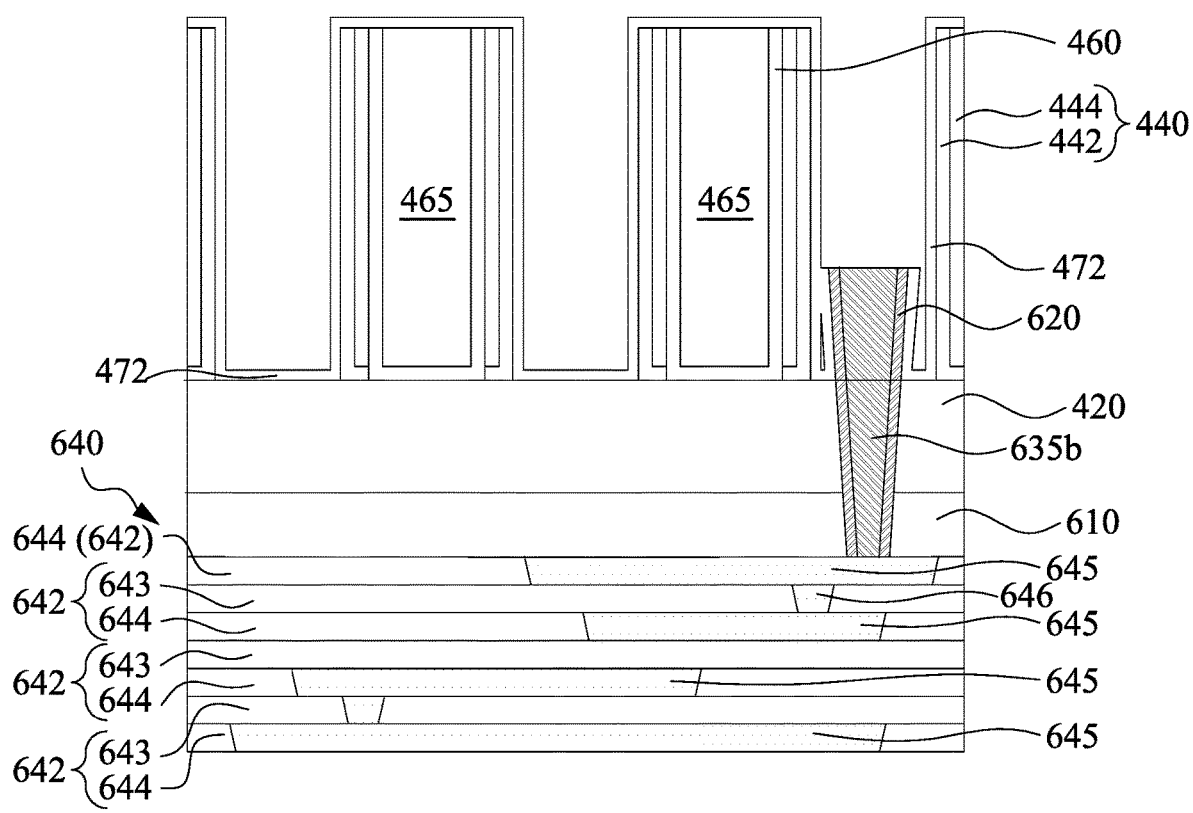

Reference is made to FIGS. 32A-32F, where FIG. 32B is a cross-sectional view taken along line I-I of FIG. 32A, FIG. 32C is a cross-sectional view taken along line II-II of FIG. 32A, FIG. 32D is a cross-sectional view taken along line III-III of FIG. 32A, FIG. 32E is a cross-sectional view taken along line IV-IV of FIG. 32A, and FIG. 32F is a cross-sectional view taken along line V-V of FIG. 32A. A patterning process is performed to the structure of FIG. 31A, such that portions of the gate dielectric layer 472 covering the top surfaces of the gate via contacts 635a, 635b and the backside butted contact 633, 634 are removed as shown in FIGS. 32B-32F. For example, a patterned mask layer can be formed over the structure of FIG. 31A. The patterned mask layer exposes the portions of the gate dielectric layer 472 covering the top surfaces of the gate via contacts 635a, 635b and the backside butted contact 633, 634. Subsequently, an etching process is performed to remove these portions of the gate dielectric layer 472, such that the top surfaces of the gate via contacts 635a, 635b and the backside butted contact 633, 634 are exposed. The patterned mask layer is removed after the etching process.

In some embodiments, the gate dielectric layer 472 shown in FIGS. 32A-32F can be formed by using a selectively deposition process. That is, a deposition rate of the gate dielectric layer 472 on a metal material (e.g., the gate via contacts 635a, 635b and the backside butted contact 633, 634) is faster than a deposition rate of the gate dielectric layer 472 on a dielectric material (e.g., the spacer structures 320, the gate spacers 440, the first ILD layer 465, and the CESL 460. As such, the deposited gate dielectric layer 472 exposes the top surfaces of the gate via contacts 635a, 635b and the backside butted contact 633, 634.

Figure 33:
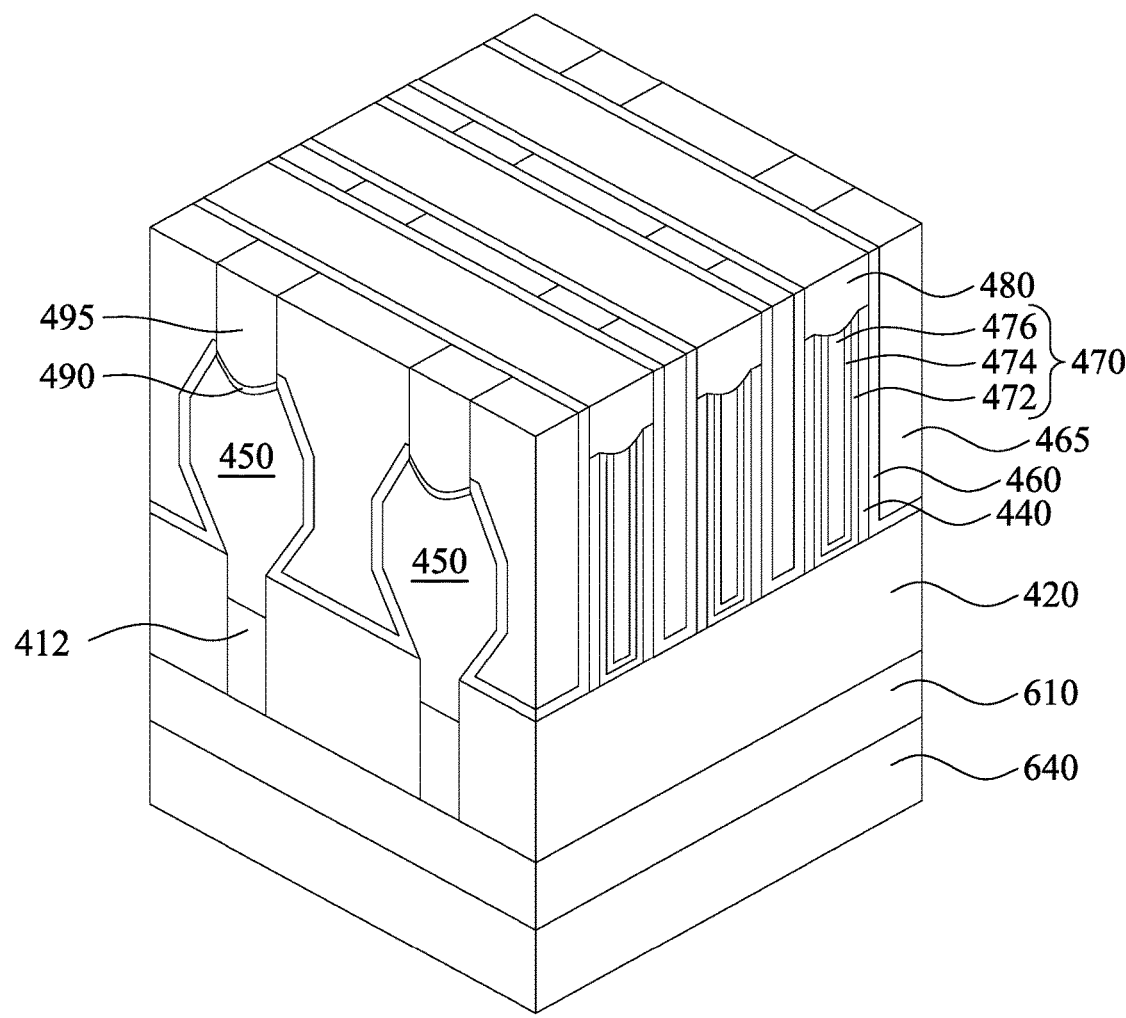

Reference is made to FIG. 33. The structure of FIG. 32A undergoes the processes similar to the processes shown in FIGS. 6 and 7A. That is, gate structures 470 including the gate dielectric layers 472 and a gate electrode (including work function metal layers 474 and fill metals 476) are formed in the gate trenches GT1. Materials, configurations, dimensions, processes and/or operations regarding the gate structures 470 are similar to or the same as the gate structures 170 of FIG. 6.

Subsequently, an etching back process is performed to etch back the replacement gate structures 470 and the gate spacers 440, and dielectric caps 480 are formed over the etched gate structures 470. Materials, configurations, dimensions, processes and/or operations regarding the dielectric caps 480 are similar to or the same as the dielectric caps 180 of FIG. 7A.

After the formation of the dielectric caps 480 is completed, source/drain contacts 495 are formed extending through the first ILD layer 465. In some embodiments, metal alloy layers 490 are respectively formed above the source/drain epitaxial structures 450 prior to forming the source/drain contacts 495. Materials, configurations, dimensions, processes and/or operations regarding the source/drain contacts 495 are similar to or the same as the source/drain contacts 195 of FIG. 7A. Materials, configurations, dimensions, processes and/or operations regarding the metal alloy layers 490 are similar to or the same as the metal alloy layers 190 of FIG. 7A.

Figure 34A:
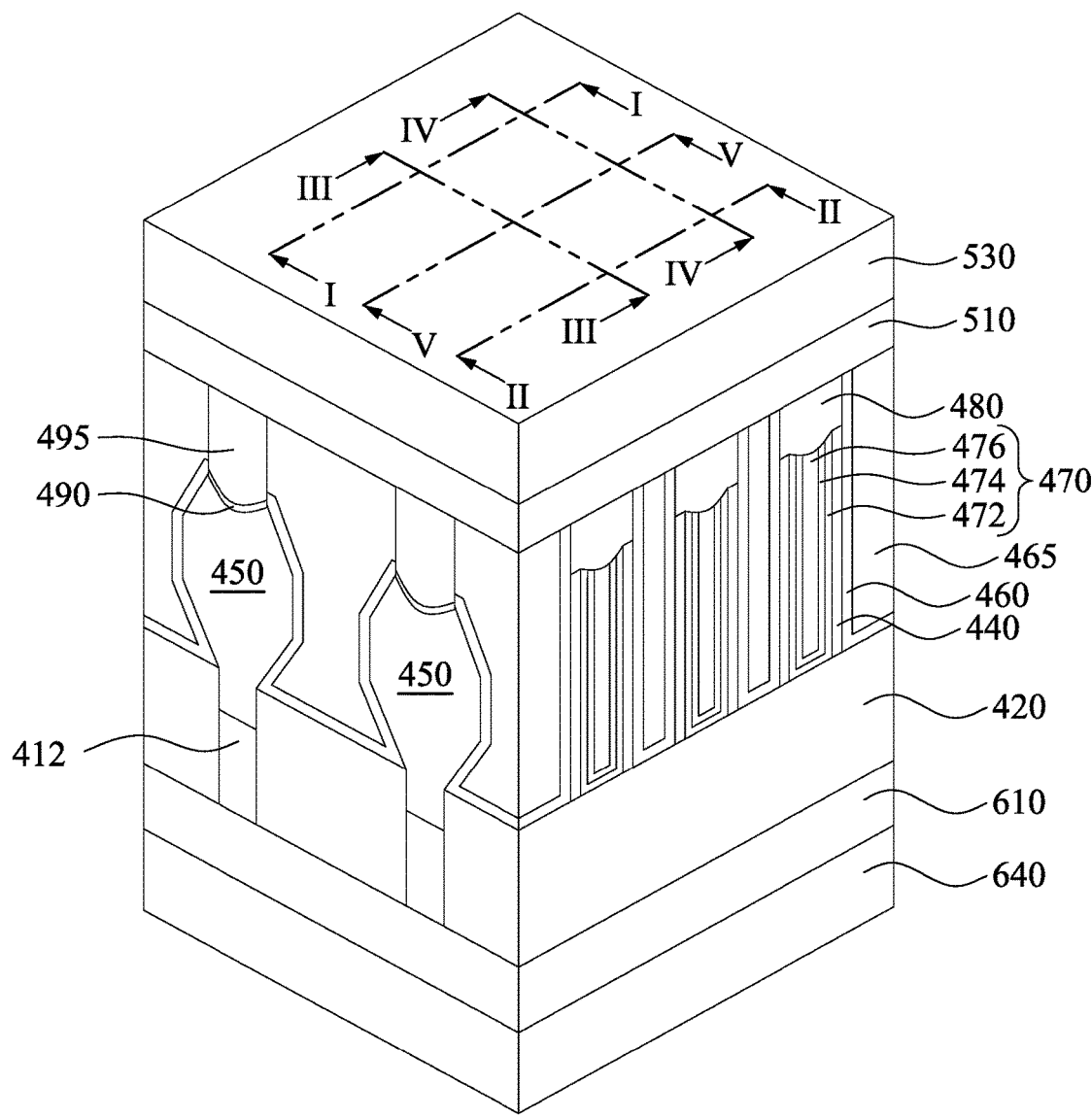
Figure 34B:
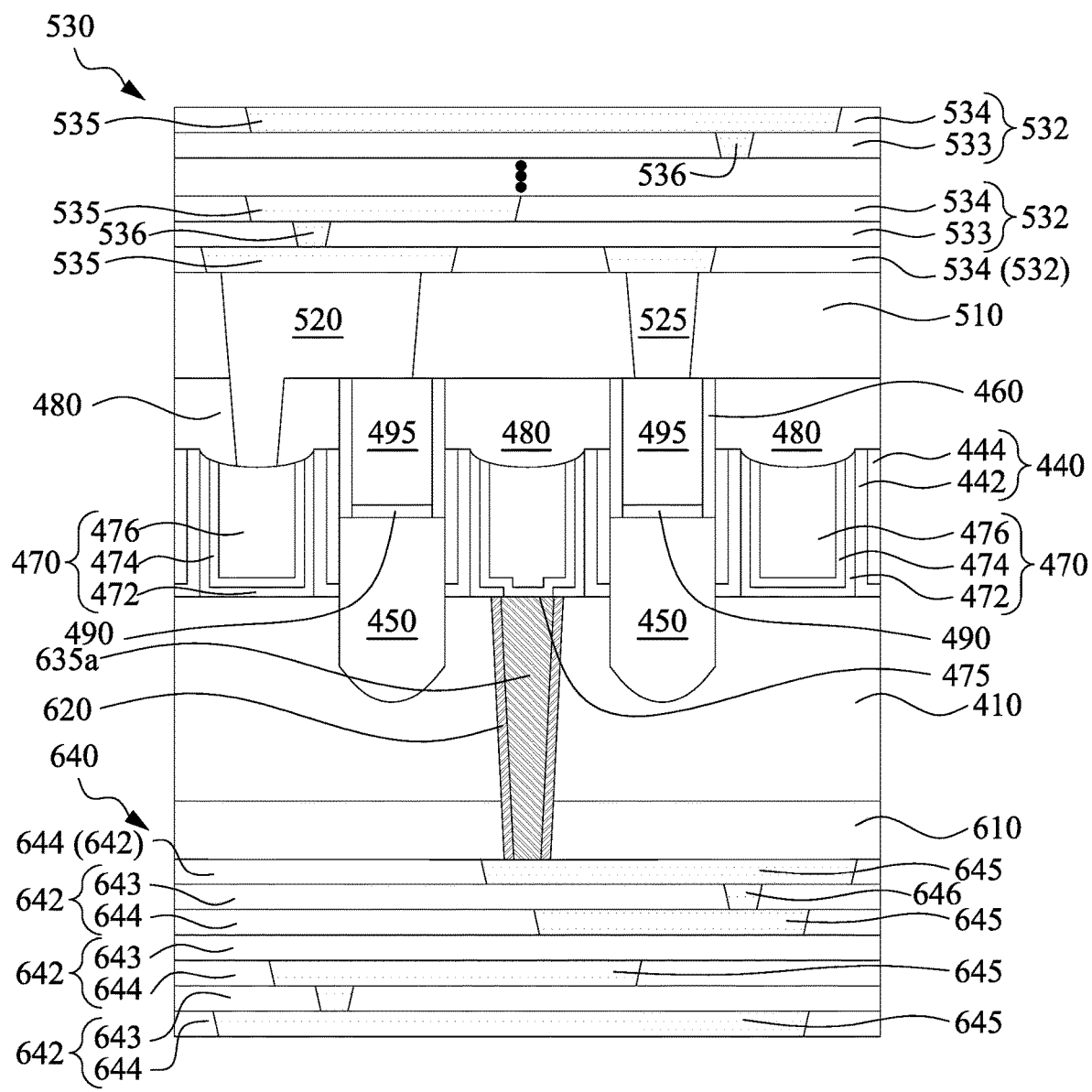
Figure 34C:
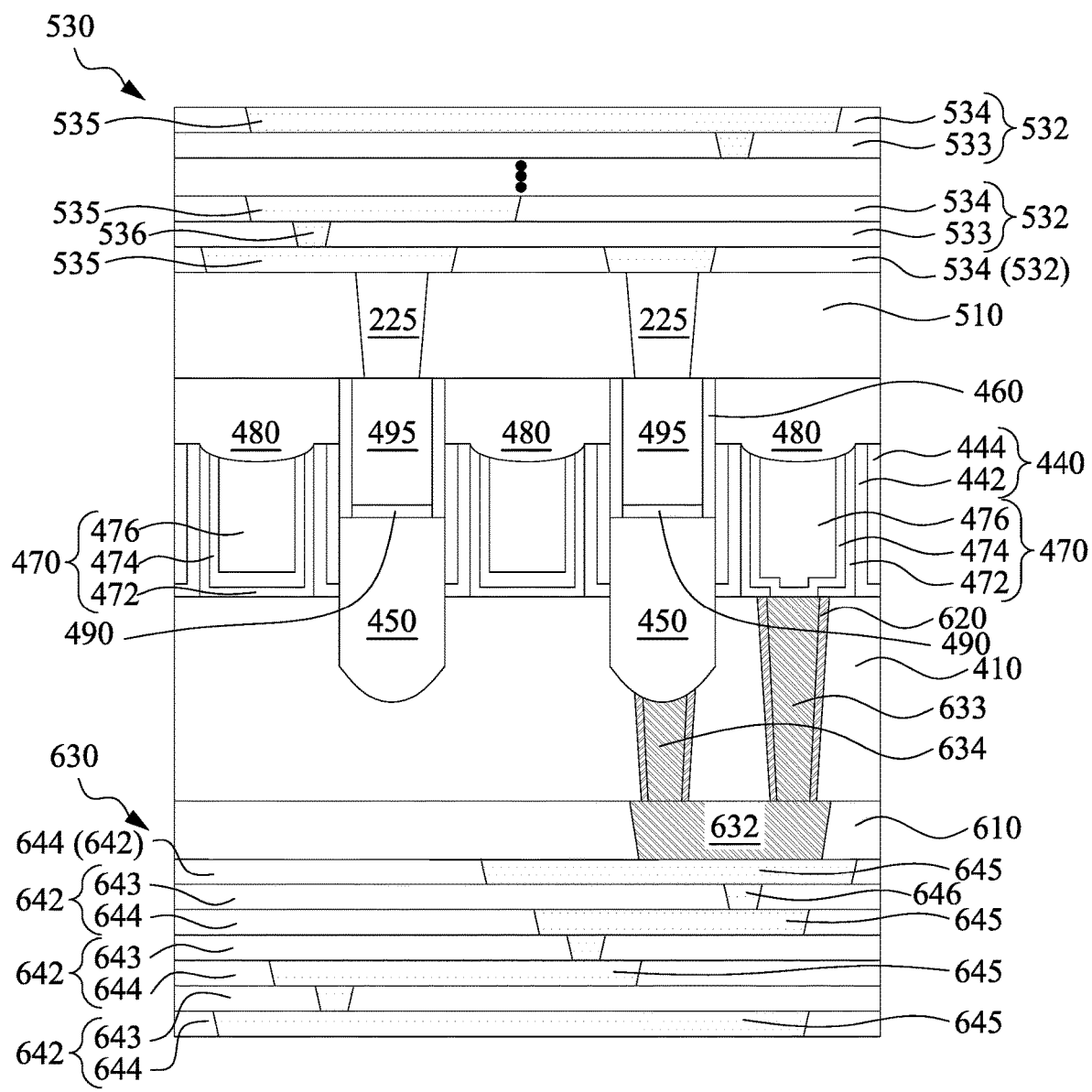
Figure 34D:
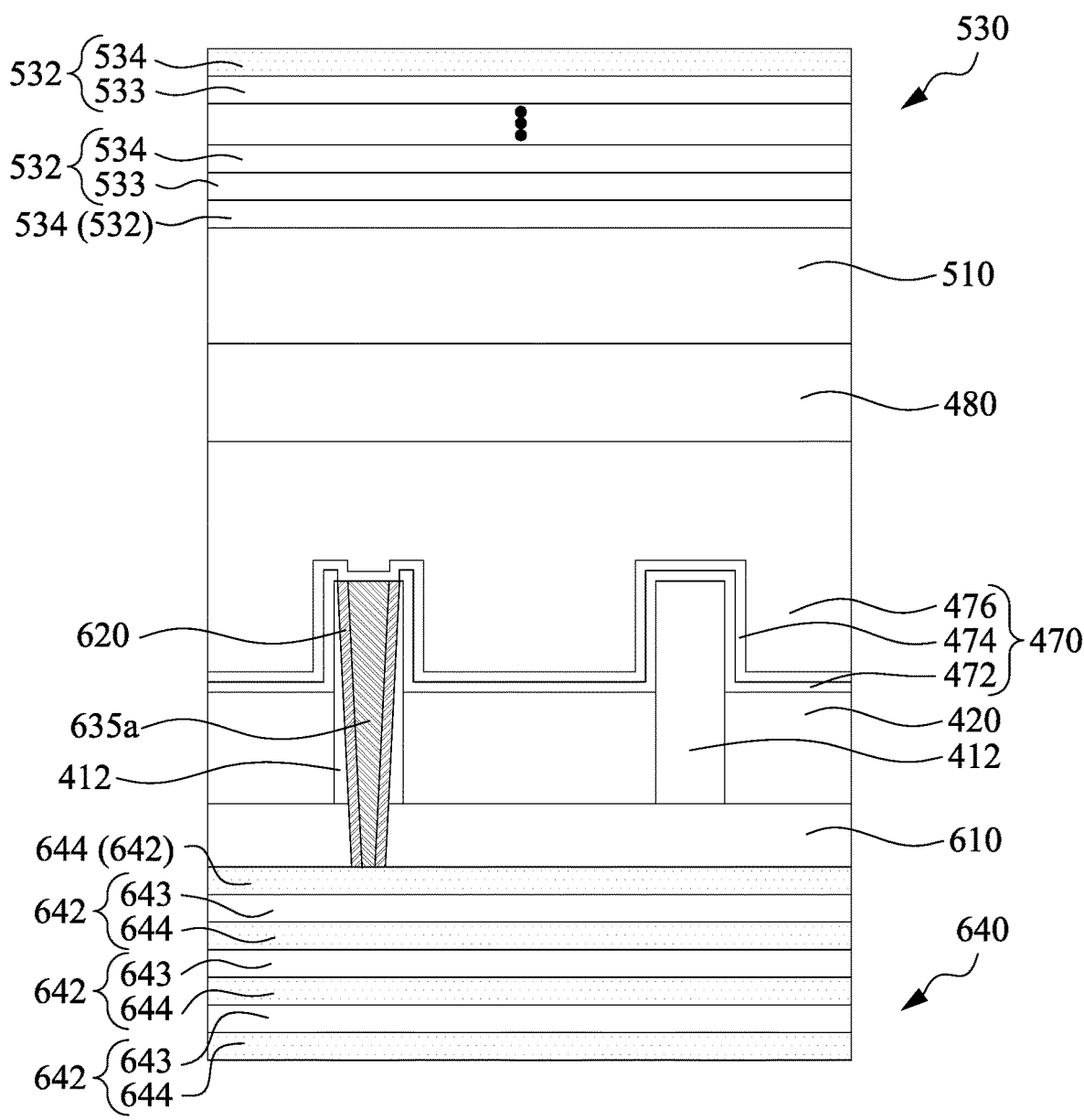
Figure 34E:
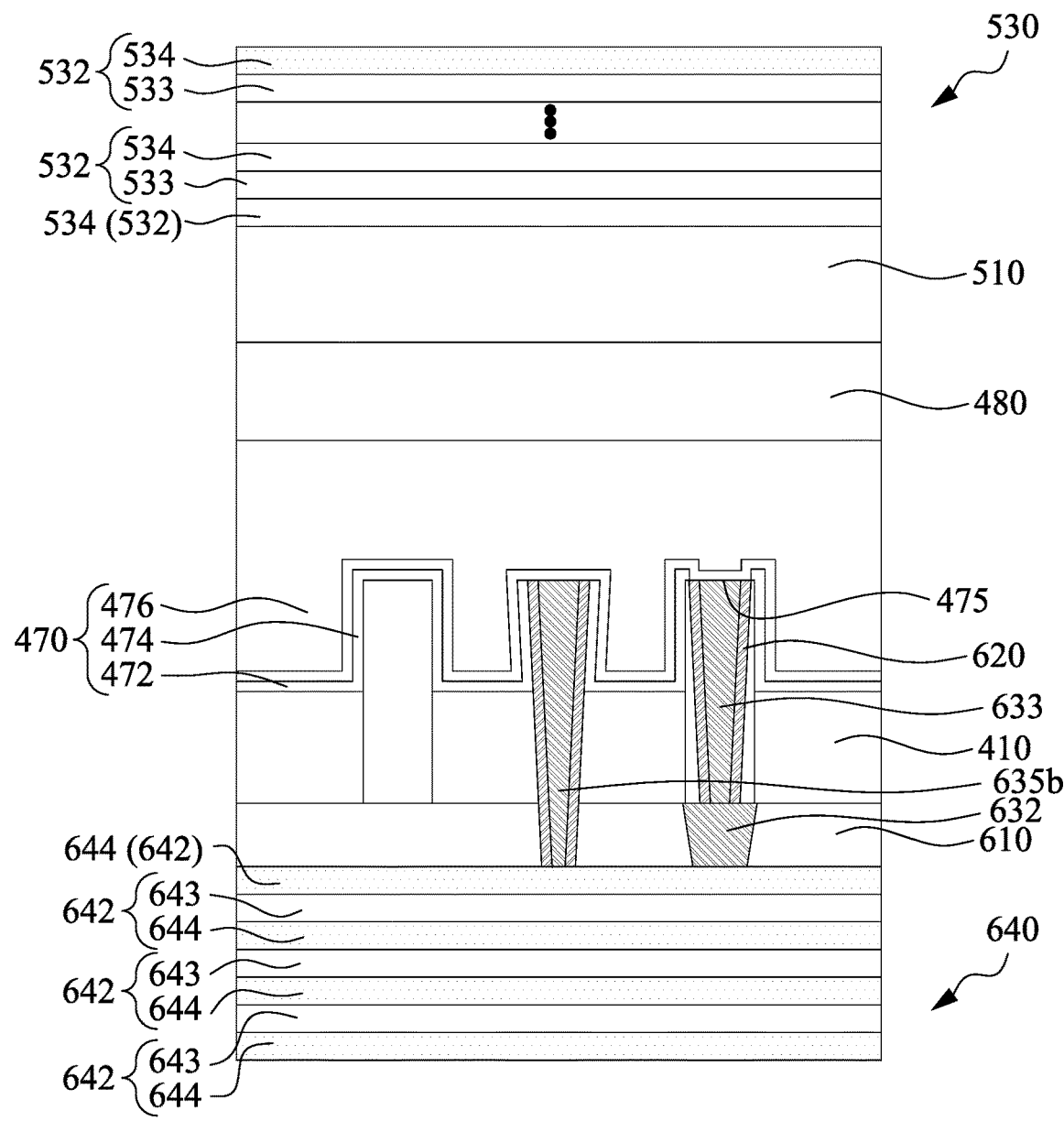
Figure 34F:
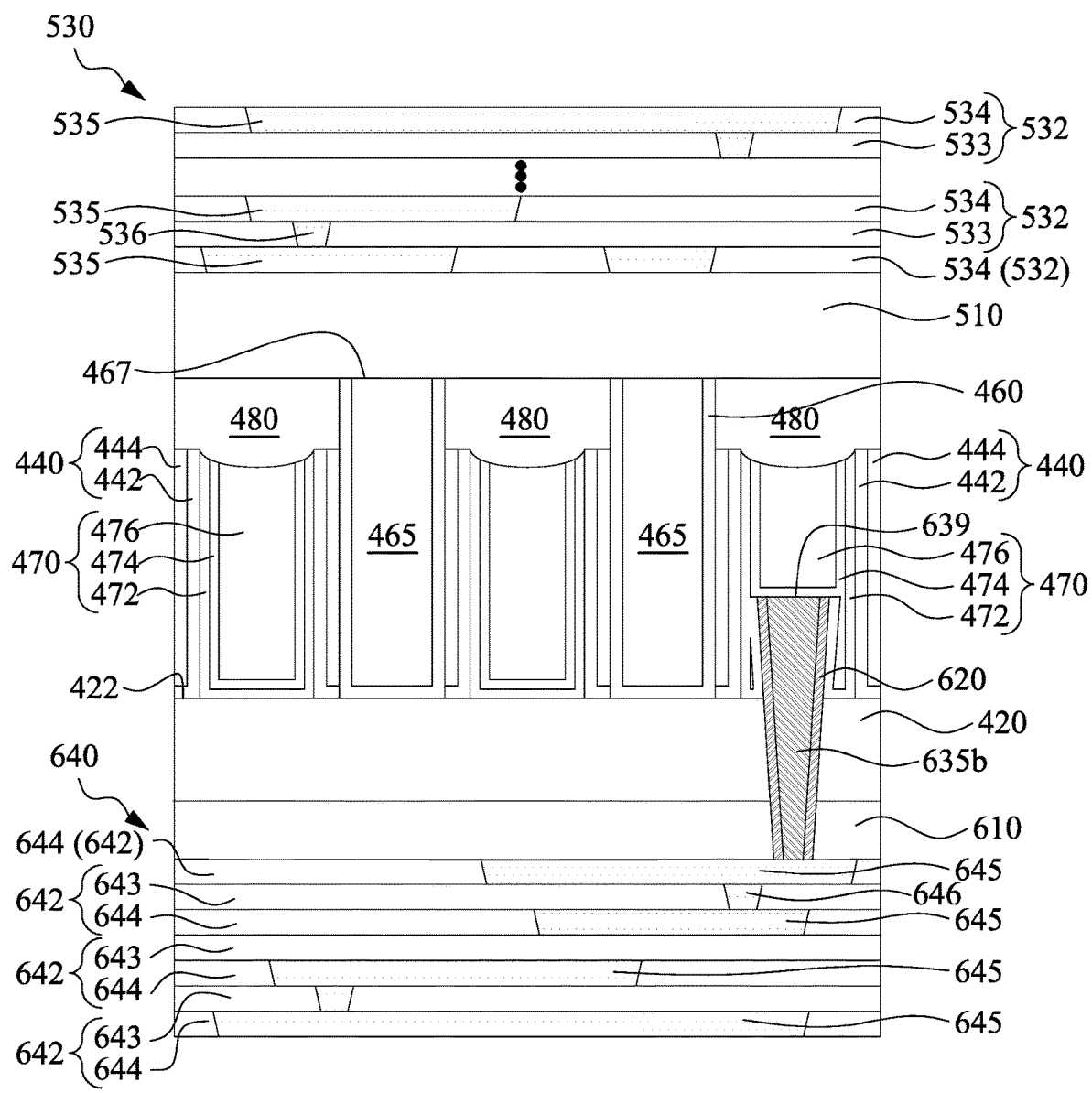

Reference is made to FIGS. 34A-34F, where FIG. 34B is a cross-sectional view taken along line I-I of FIG. 34A, FIG. 34C is a cross-sectional view taken along line II-II of FIG. 34A, FIG. 34D is a cross-sectional view taken along line III-III of FIG. 34A, FIG. 34E is a cross-sectional view taken along line IV-IV of FIG. 34A, and FIG. 34F is a cross-sectional view taken along line V-V of FIG. 34A. The structure of FIG. 33 undergoes the processes similar to the processes shown in FIGS. 8-11. That is, a second ILD layer 510 is formed over the semiconductor fins 412 and the isolation structures 420. At least one front-side butted contact (or butted via) 520 and at least one source/drain via 525 are formed in the second ILD layer 510. Materials, configurations, dimensions, processes and/or operations regarding the second ILD layer 510 are similar to or the same as the second ILD layer 210 of FIG. 8. Materials, configurations, dimensions, processes and/or operations regarding the front-side butted contact 520 and the source/drain via 525 are similar to or the same as the front-side butted contact 220 and the source/drain via 225 of FIG. 10.

Subsequently, a front-side MLI structure 530 is formed over the second ILD layer 510. The front-side MLI structure 530 may include a plurality of front-side metallization layers 532. The number of front-side metallization layers 532 may vary according to design specifications of the integrated circuit structure. Only three front-side metallization layers 532 are illustrated in FIGS. 34B-34F for the sake of simplicity. Except the bottommost front-side metallization layers 532, the other front-side metallization layers 532 each includes a first front-side inter-metal dielectric (IMD) layer 533 and a second front-side IMD layer 534. The second front-side IMD layers 534 are formed over the corresponding first front-side IMD layers 533. The front-side metallization layers 532 include one or more horizontal interconnects, such as front-side metal lines 535, respectively extending horizontally or laterally in the second front-side IMD layers 534 and vertical interconnects, such as front-side conductive vias 536, respectively extending vertically in the first front-side IMD layers 533. Materials, configurations, dimensions, processes and/or operations regarding the front-side MLI structure 530 are similar to or the same as the front-side MLI structure 230 of FIG. 11.

As shown in FIGS. 34A and 34B, the semiconductor device 200 includes the semiconductor fins 412, the gate structures 470 across the semiconductor fins 412, the source/drain epitaxial structures 450 on the semiconductor fins 412 and on opposite sides of the gate structures 470, and backside vias under the gate structures 470. For example, the semiconductor device 200 further includes a gate via contact 635a under the gate structure 470. As shown in FIGS. 34B and 34D, the gate via contact 635a passes through the semiconductor fin 412 to the work function metal layer 474. As such, the gate via contact 635a is electrically connected to one of the gate structures 670. In some embodiments, the gate via contact 635a is in contact with a bottom surface 475 of the work function metal layer 474. As mentioned above, since the gate via contact 635a is formed from a front-side of the semiconductor device 200, the gate via contact 635a tapers downward. Further, as shown in FIG. 34B, a portion of the work function metal layer 474 passes through the gate dielectric layer 472 to the gate via contact 635a.

The semiconductor device 200 further includes the spacer structures 620. One of the spacer structures 620 laterally surrounds the gate via contact 635a to electrically isolate the gate via contact 635a from the semiconductor fin 412. Stated another way, the spacer structure 620 is in contact with the gate via contact 635a and the semiconductor fin 412. Further, the spacer structure 620 is in contact with the gate dielectric layer 472.

For example, the semiconductor device 200 further includes a gate via contact 635b under the gate structure 470. As shown in FIGS. 34E and 34F, the gate via contact 635b passes through (or is embedded in) the isolation structure 420 to the work function metal layer 474. That is, as shown in FIG. 34E, the gate structure 470 surrounds a top portion of the gate via contact 635b. As such, the gate via contact 635b is electrically connected to one of the gate structures 470. In some embodiments, the gate via contact 635b is in contact with the bottom surface 475 of the work function metal layer 474. As mentioned above, since the gate via contact 635b is formed from a front-side of the semiconductor device 200, the gate via contact 635b tapers downward.

Another one of the spacer structures 620 laterally surrounds the gate via contact 635b. Stated another way, the spacer structure 620 is in contact with the gate via contact 635b and isolation structure 420. Further, the spacer structure 620 is in contact with the gate dielectric layer 472.

For example, the semiconductor device 200 further includes the backside butted contacts 633 and 634 under the gate structure 470 and the source/drain epitaxial structure 450. As shown in FIGS. 34C and 34E, the backside butted contacts 633 and 634 pass through the semiconductor fin 412 to the work function metal layer 474. As such, the backside butted contacts 633 and 634 are electrically connected to one of the gate structures 470. In some embodiments, the backside butted contacts 633 and 634 are in contact with a bottom surface 475 of the work function metal layer 474. As mentioned above, since the backside butted contacts 633 and 634 are formed from a backside of the semiconductor device 200, the backside butted contacts 633 and 634 are tapered upward.

Some of the spacer structures 620 laterally surround the backside butted contacts 633 and 634. Stated another way, the spacer structures 620 are in contact with the backside butted contacts 633 and 634 and semiconductor fin 412. Further, the spacer structures 620 are in contact with the gate dielectric layer 472 and the source/drain epitaxial structure 450.

The semiconductor device 200 includes at least one of the gate via contact 635a, 635b and the backside butted contacts 633 and 634. In some embodiments, the semiconductor device 200 further includes front-side vias, such as the front-side butted contact 520 and/or the source/drain via 525 as shown in FIG. 34B. Further, the semiconductor device 200 may include front-side gate via contacts formed in the second ILD layer 510 and connected to the gate structure 470. In some embodiments, each of the gate via contact 635a, 635b and the backside butted contacts 633, 634 has a width or length in a range of about 8 nm to about 30 nm, and has a height in a range of about 10 nm to about 50 nm.

The gate structure 470 is between the backside vias (e.g., the gate via contact 635a, 635b and the backside butted contacts 633, 634) and the dielectric cap 480. In some embodiments, a top surface 467 of the first ILD layer 465 is higher than a top surface 639 of the backside vias (e.g., the gate via contact 635a, 635b and the backside butted contacts 633, 634), and a top surface 422 of the isolation structure 420 is lower than the top surface 639 of the backside vias (e.g., the gate via contact 635a, 635b and the backside butted contacts 633, 634). The backside vias (e.g., the gate via contact 635a, 635b and the backside butted contacts 633, 634) are electrically isolated from the front-side MLI structure 530.

FIGS. 35-49F illustrate a method for manufacturing a semiconductor device (or an integrated circuit structure) 300 at various stages in accordance with some embodiments of the present disclosure. In addition to the semiconductor device 300, FIGS. 35-43A, 44A, 45A, 46A, 47A, 48A, and 49A depict X-axis, Y-axis, and Z-axis directions. In some embodiments, the semiconductor device shown in FIGS. 35-49F may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

FIGS. 35-42, 43A, 44A, 45A, 46A, 47A, 48A, and 49A are perspective views of some embodiments of the semiconductor device 300 at intermediate stages during fabrication. FIGS. 43B, 44B, 45B, 46B, 47B, 48B, and 49B are cross-sectional views of some embodiments of the semiconductor device 300 at intermediate stages during fabrication along a first cut (e.g., cut I-I), which is along a lengthwise direction of the channel (semiconductor fin). FIGS. 46C, 47C, and 49C are cross-sectional views of some embodiments of the semiconductor device 300 at intermediate stages during fabrication along a second cut (e.g., cut II-II), which is along a lengthwise direction of another channel (another semiconductor fin). FIGS. 46D, 47D, and 49D cross-sectional views of some embodiments of the semiconductor device 300 at intermediate stages during fabrication along a third cut (e.g., cut III-III), which is in one of the gate regions and perpendicular to the lengthwise direction of the channel. FIGS. 46E, 47E, and 49E cross-sectional views of some embodiments of the semiconductor device 300 at intermediate stages during fabrication along a fourth cut (e.g., cut IV-IV), which is in another of the gate regions and perpendicular to the lengthwise direction of the channel. FIGS. 46F, 47F, and 49F cross-sectional views of some embodiments of the semiconductor device 300 at intermediate stages during fabrication along a fifth cut (e.g., cut V-V), which is in the isolation region and is parallel to the lengthwise direction of the channel.

Figure 35:
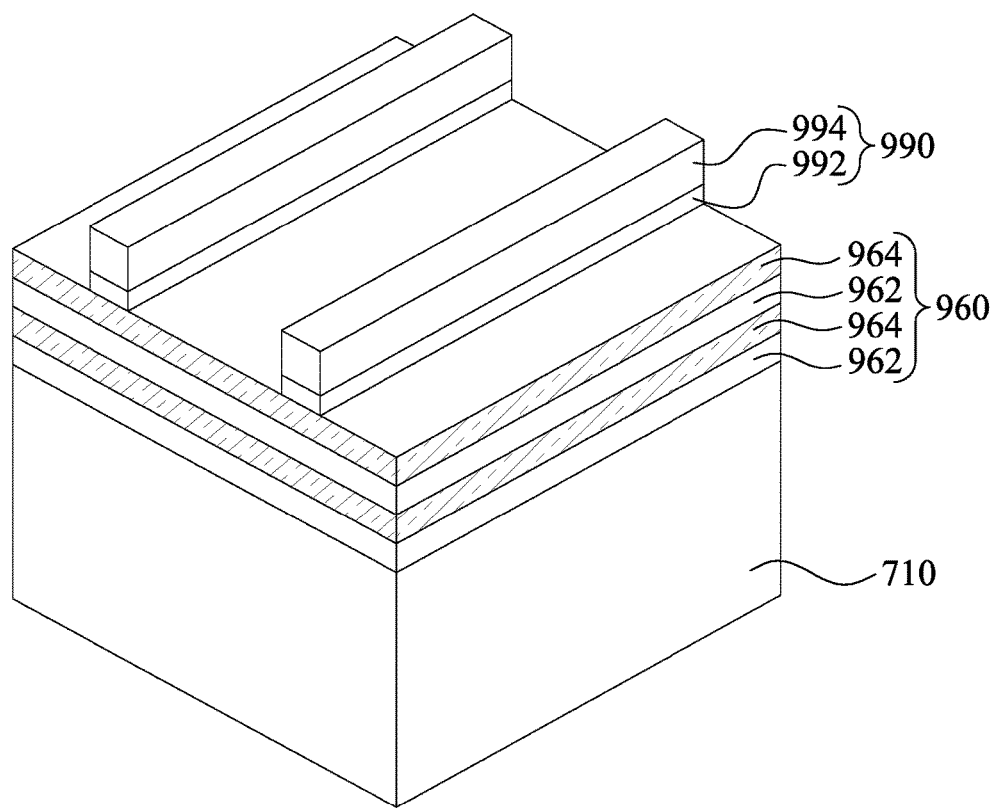
FIGS. 35-49F illustrate a method for manufacturing a semiconductor device at various stages in accordance with some embodiments of the present disclosure.

Reference is made to FIG. 35. A substrate 710, which may be a part of a wafer, is provided. Materials, configurations, dimensions, processes and/or operations regarding the substrate 710 are similar to or the same as the substrate 110 of FIG. 1.

A stacked structure 960 is formed on the substrate 710 through epitaxy, such that the stacked structure 960 forms crystalline layers. The stacked structure 960 includes first semiconductor layers 962 and second semiconductor layers 964 stacked alternately. The first semiconductor layers 962 and the second semiconductor layers 964 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 962 and the second semiconductor layers 964 are made of Si, a Si compound, SiGe, Ge or a Ge compound. In FIG. 35, two layers of the first semiconductor layer 962 and three layers of the second semiconductor layer 964 are disposed. However, the number of the layers are not limited to five, and may be as small as 1 (each layer) and in some embodiments, 3-10 layers of each of the first and second semiconductor layers are formed. By adjusting the numbers of the stacked layers, a driving current of the GAA FET device can be adjusted.

In some embodiments, the first semiconductor layers 962 can be SiGe layers having a germanium atomic percentage greater than zero. In some embodiments, the germanium percentage of the first semiconductor layers 962 is in the range between about 10 percent and about 50 percent. In some embodiments, the second semiconductor layers 964 may be pure silicon layers that are free from germanium. The second semiconductor layers 964 may also be substantially pure silicon layers, for example, with a germanium atomic percentage lower than about 1 percent. Furthermore, the second semiconductor layers 964 may be intrinsic, which are not doped with p-type and n-type impurities. In some embodiments, the first semiconductor layers 962 are referred to as sacrificial layers, and the second semiconductor layers 964 are referred to as channel layers.

Subsequently, a patterned mask layer 990 is formed above the stacked structure 960. In some embodiments, the patterned mask layer 990 includes a first mask layer 992 and a second mask layer 994. The first mask layer 992 may be a pad oxide layer made of a silicon oxide, which can be formed by a thermal oxidation. The second mask layer 994 may be made of a silicon nitride (SiN), which is formed by chemical vapor deposition (CVD), including low pressure CVD (LPCVD) and plasma enhanced CVD (PECVD), plasma enhanced atomic layer deposition (PEALD), atomic layer deposition (ALD), or other suitable process.

Figure 36:
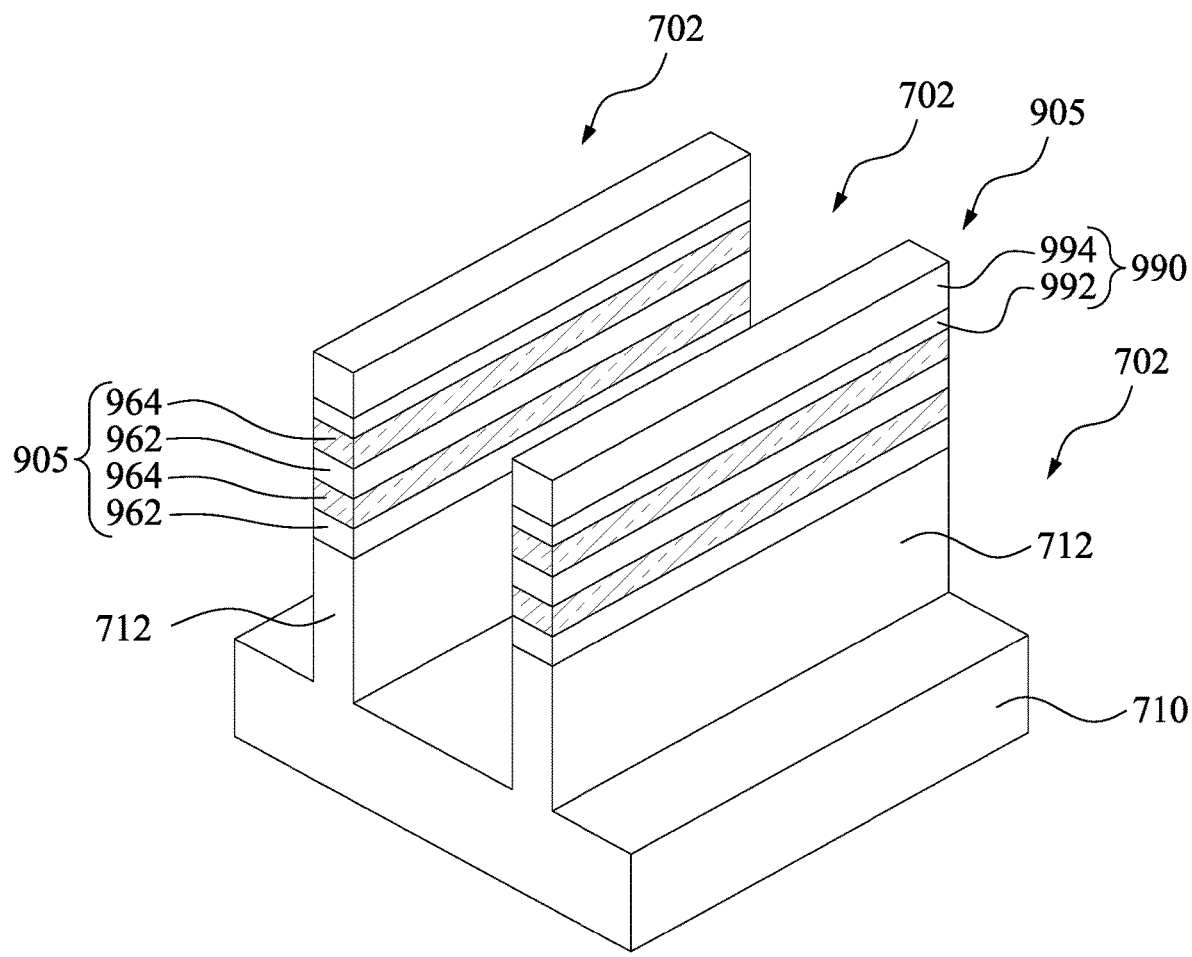

Reference is made to FIG. 36. The stacked structure 960 (see FIG. 35) is patterned by using the patterned mask layer 990 as an etch mask, such that the stacked structure 960 is patterned into fin structures 905 and trenches 702 extending in the X direction. In FIG. 36, two fin structures 905 are arranged in the Y direction. But the number of the fin structures is not limited to, and may be as small as one and three or more. In some embodiments, one or more dummy fin structures are formed on both sides of the fin structures 905 to improve pattern fidelity in the patterning operations.

The trenches 702 extend into the substrate 710, and have lengthwise directions substantially parallel to each other. The trenches 702 form base portions 712 in the substrate 710, where the base portions 712 protrude from the substrate 710, and the fin structures 905 are respectively formed above the base portions 712 of the substrate 710. The remaining portions of the stacked structure 960 are accordingly referred to as the fin structures 905 alternatively.

Figure 37:
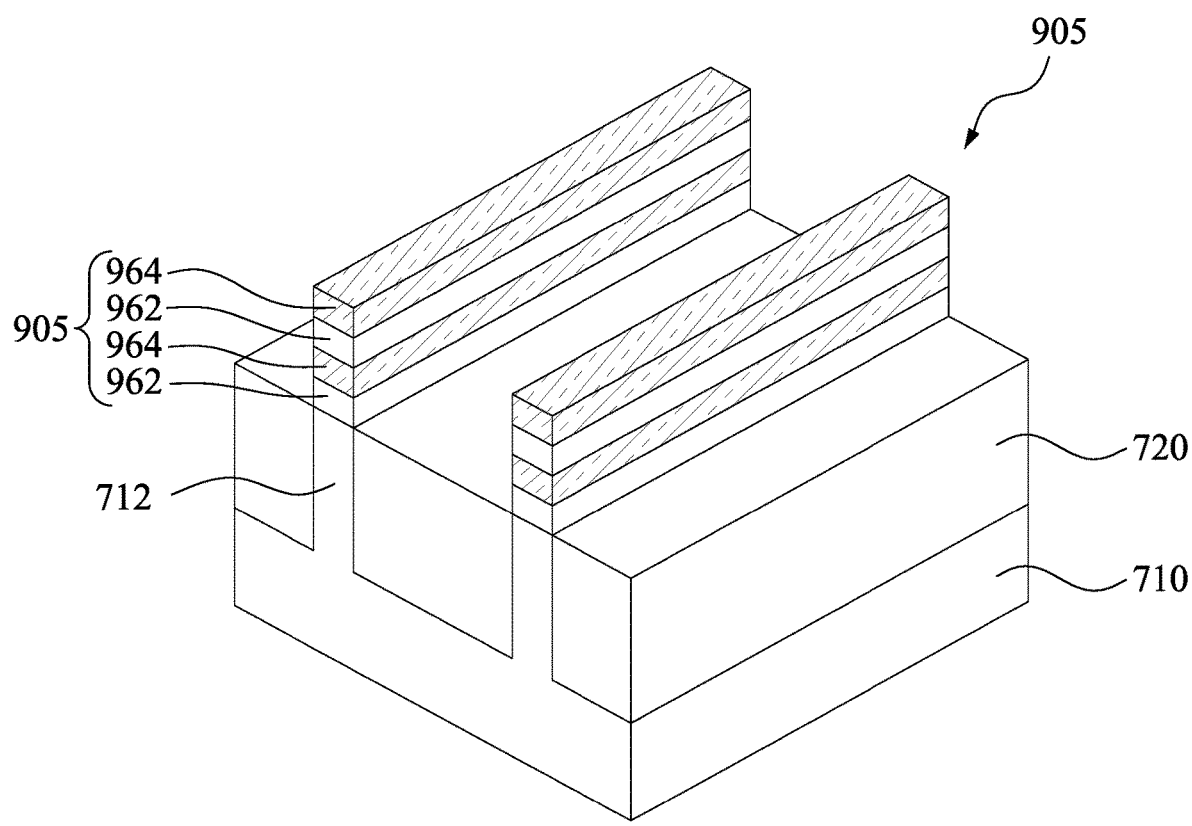

Reference is made to FIG. 37. After the fin structures 905 are formed, isolation structures 720 are formed above the structure in FIG. 36 so that the fin structures 905 are exposed. Materials, configurations, dimensions, processes and/or operations regarding the isolation structures 720 are similar to or the same as the isolation structures 120 of FIG. 2.

Figure 38:
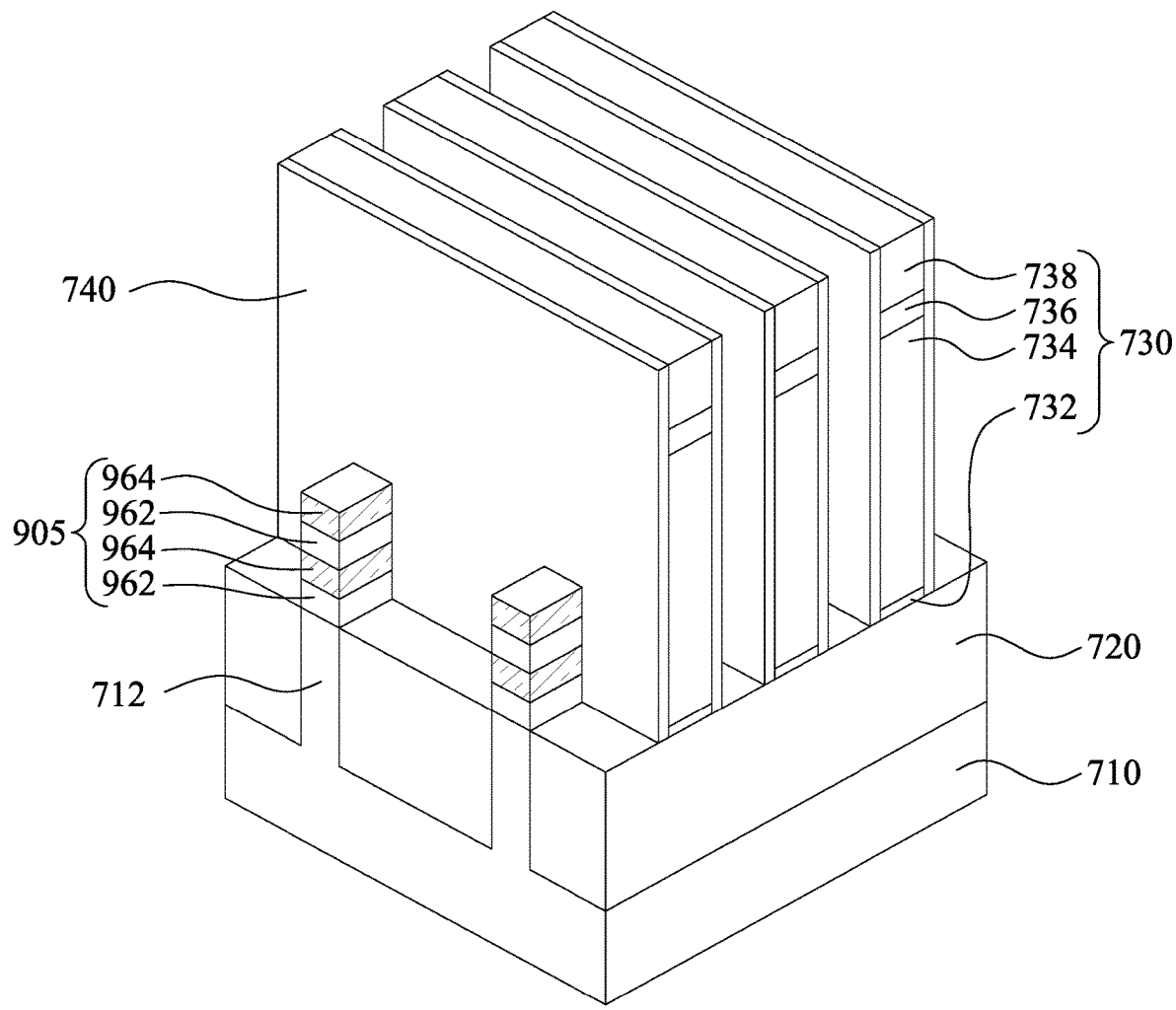

Reference is made to FIG. 38. The structure of FIG. 37 undergoes the processes similar to the processes shown in FIGS. 3 and 4. That is, dummy gate structures 730 including dummy gate dielectric layers 732, dummy gate electrodes 734, oxide mask layers 736, and nitride mask layers 738 are at least partially disposed over the fin structures 905. Materials, configurations, dimensions, processes and/or operations regarding the dummy gate structures 730 are similar to or the same as the dummy gate structures 130 of FIG. 3.

Gate spacers 740 including first spacer layers 742 and second spacer layers 744 (see FIG. 43B) are formed on sidewalls of the dummy gate structures 730. Materials, configurations, dimensions, processes and/or operations regarding the gate spacers 740 are similar to or the same as the gate spacers 140 of FIG. 3.

Figure 39:
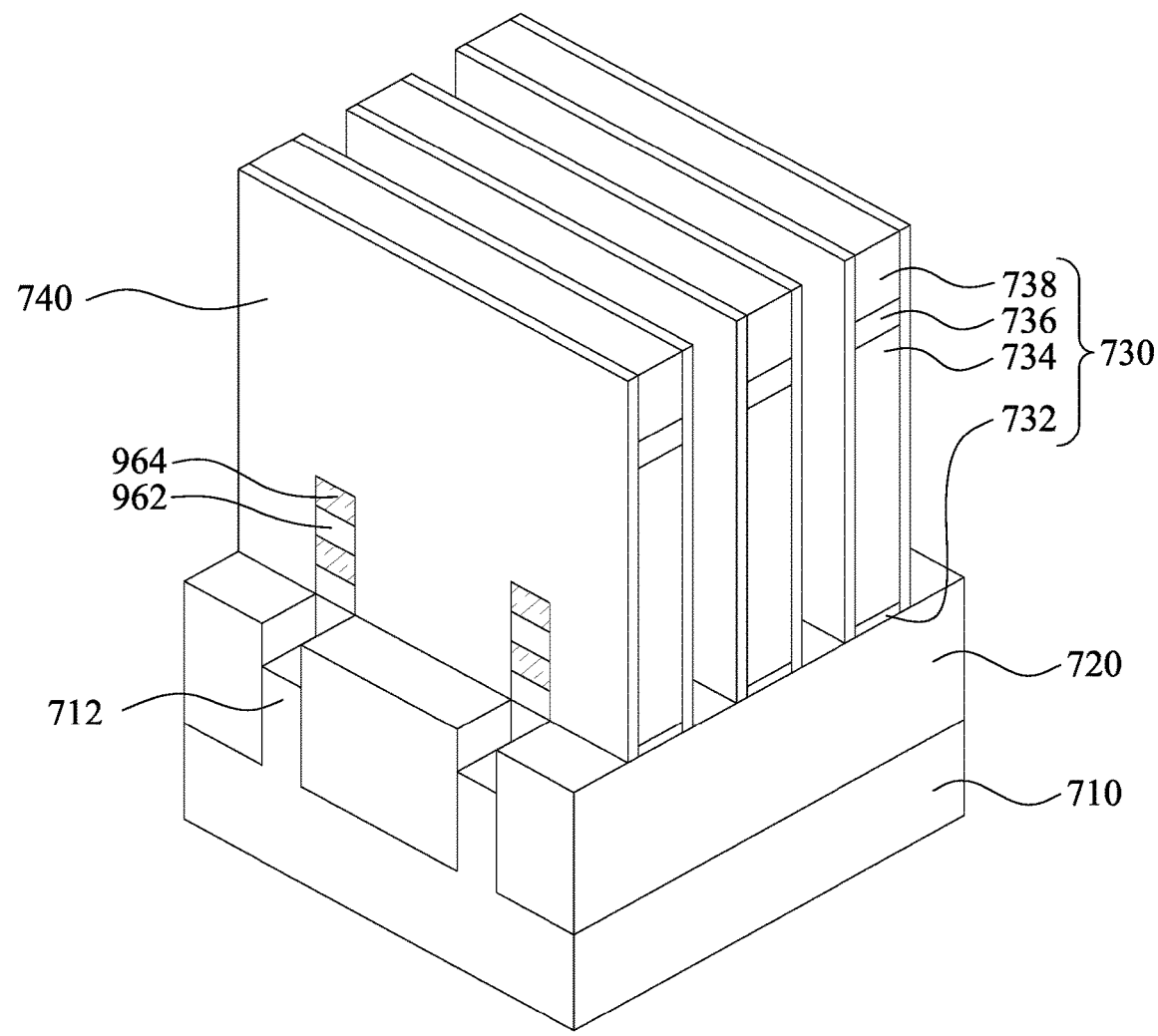

Reference is made to FIG. 39. After the formation of the gate spacers 740 is completed, the exposed portions of the fin structures 905 are removed by using a strained source/drain (SSD) etching process. The SSD etching process may be performed in a variety of ways. In some embodiments, the SSD etching process may be performed by a dry chemical etch with a plasma source and a reaction gas. The plasma source may be an inductively coupled plasma (ICP) etch, a transformer coupled plasma (TCP) etch, an electron cyclotron resonance (ECR) etch, a reactive ion etch (RIE), or the like and the reaction gas may be a fluorine-based gas (such as $SF_6$, $CH_2F_2$, $CH_3F$, $CHF_3$, or the like), chloride ($Cl_2$), hydrogen bromide (HBr), oxygen ($O_2$), the like, or combinations thereof. In some other embodiments, the SSD etching process may be performed by a wet chemical etch, such as ammonium peroxide mixture (APM), $NH_4OH$, TMAH, combinations thereof, or the like. In yet some other embodiments, the SSD etch step may be performed by a combination of a dry chemical etch and a wet chemical etch. During the SSD etching process, portions of the base portions 712 are removed as well.

Figure 40:
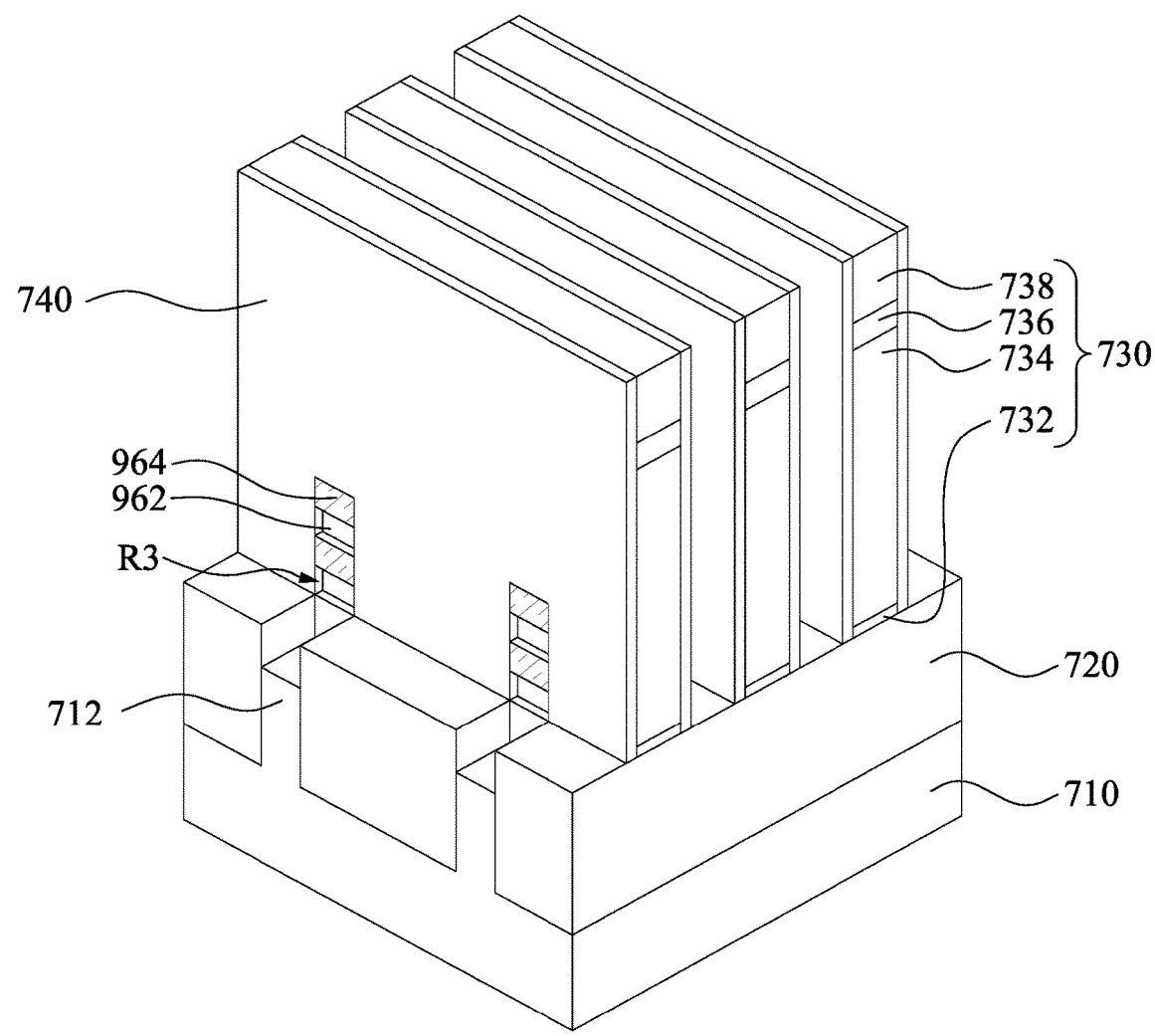

Reference is made to FIG. 40. Subsequently, the first semiconductor layers 962 are horizontally recessed (etched) to for recesses R3 so that the second semiconductor layers 964 laterally extend past opposite end surfaces of the first semiconductor layers 962. In some embodiments, end surfaces of the first semiconductor layers 962 may be substantially vertically aligned with the sidewalls of the dummy gate electrodes 734 and/or the sidewalls of the gate spacers 740.

Figure 41:
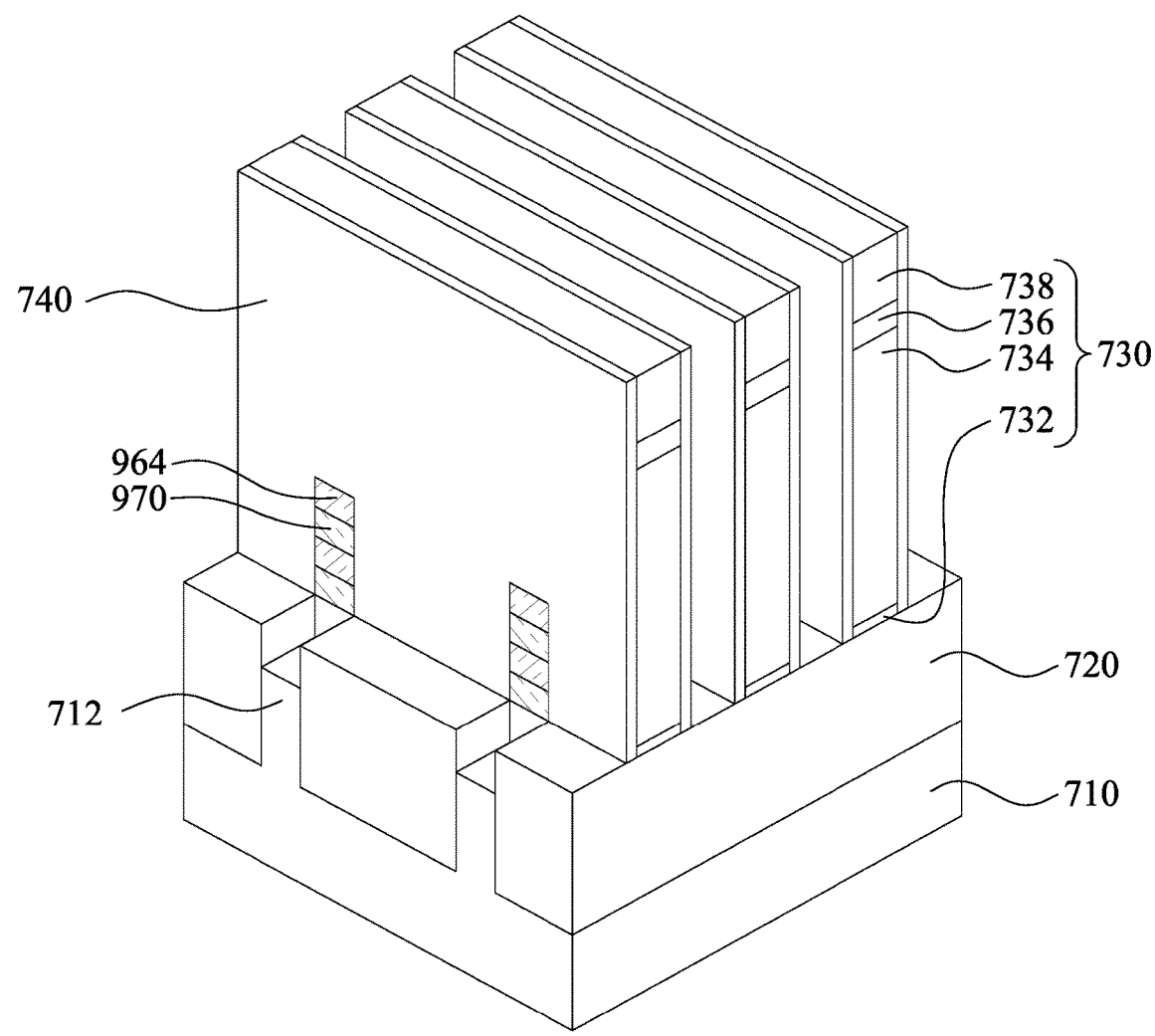

Reference is made to FIG. 41. Inner spacers 970 are respectively formed on sidewalls of the semiconductor layers 962 (see FIG. 40). For example, a dielectric material layer is formed over the structure of FIG. 40, and one or more etching operations are performed to form the inner spacers 970. In some embodiments, the inner spacers 970 includes a silicon nitride-based material, such as SiN, SiON, SiOCN or SiCN and combinations thereof and is different from the material of the gate spacers 940. In some embodiments, the inner spacers 970 are silicon nitride. The inner spacers 970 may fully fill the recesses R3 as shown in FIG. 41. The dielectric material layer can be formed using CVD, including PECVD, PEALD, ALD, or other suitable processes. The etching operations include one or more wet and/or dry etching operations. In some embodiments, the etching is an isotropic etching.

Figure 42:
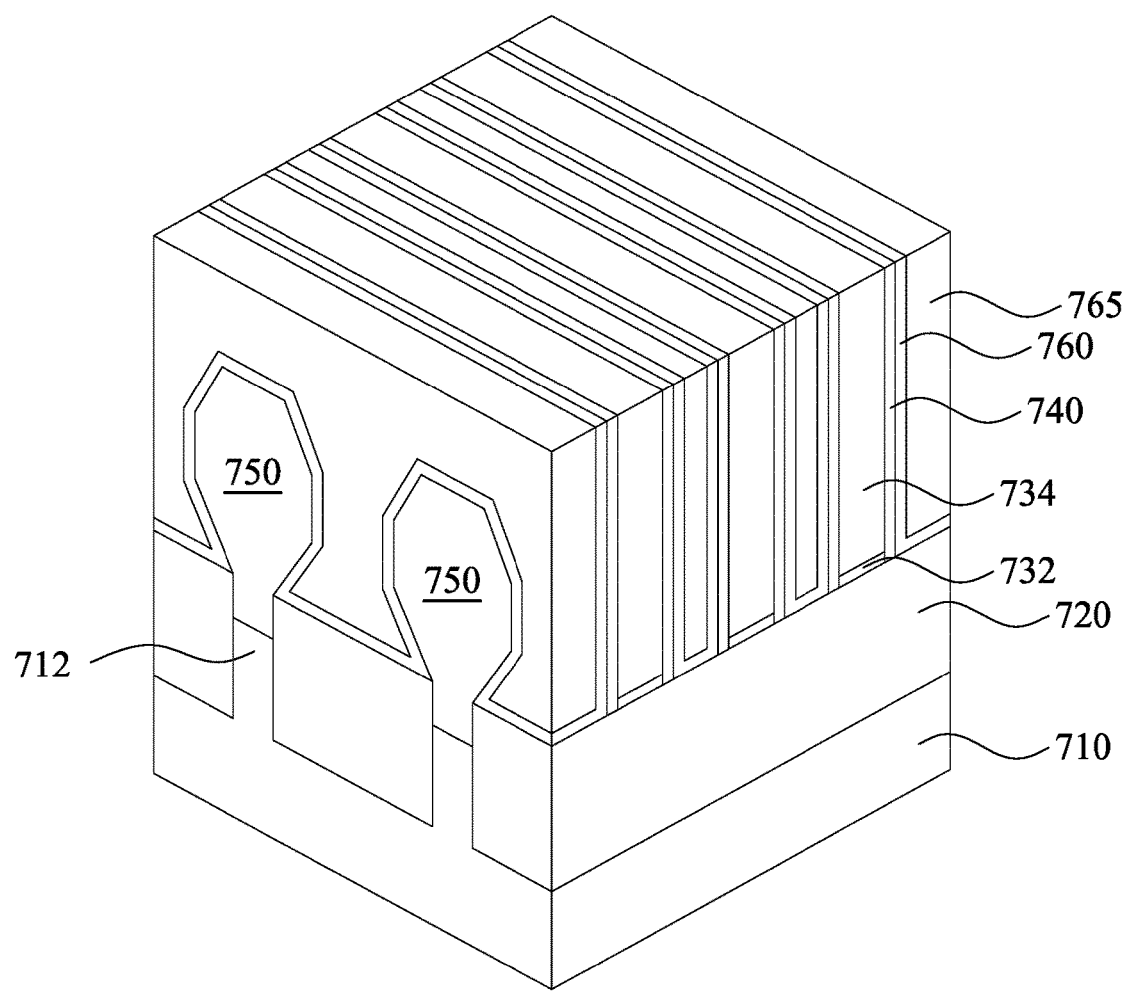

Reference is made to FIG. 42. After the formation of the inner spacers 970 is completed, source/drain epitaxial structures 750 are formed on the base portions 712 that are not covered by the dummy gate structures 730 and the gate spacers 740. Materials, configurations, dimensions, processes and/or operations regarding the source/drain epitaxial structures 750 are similar to or the same as the source/drain epitaxial structures 150 of FIG. 3.

A first interlayer dielectric (ILD) layer 765 is formed on the source/drain epitaxial structures 750 and the isolation structures 720. In some embodiments, a contact etch stop layer (CESL) 760 is also formed prior to forming the first ILD layer 765. In some examples, after forming the first ILD layer 765, a planarization process may be performed to remove excessive materials of the first ILD layer 765. In some embodiments, the CMP process also removes the oxide mask layers 736 and the nitride mask layers 738 (as shown in FIG. 41) and exposes the dummy gate electrodes 734. Materials, configurations, dimensions, processes and/or operations regarding the first ILD layer 765 are similar to or the same as the first ILD layer 165 of FIG. 5. Materials, configurations, dimensions, processes and/or operations regarding the CESL 760 are similar to or the same as the CESL 160 of FIG. 5.

Figure 43A:
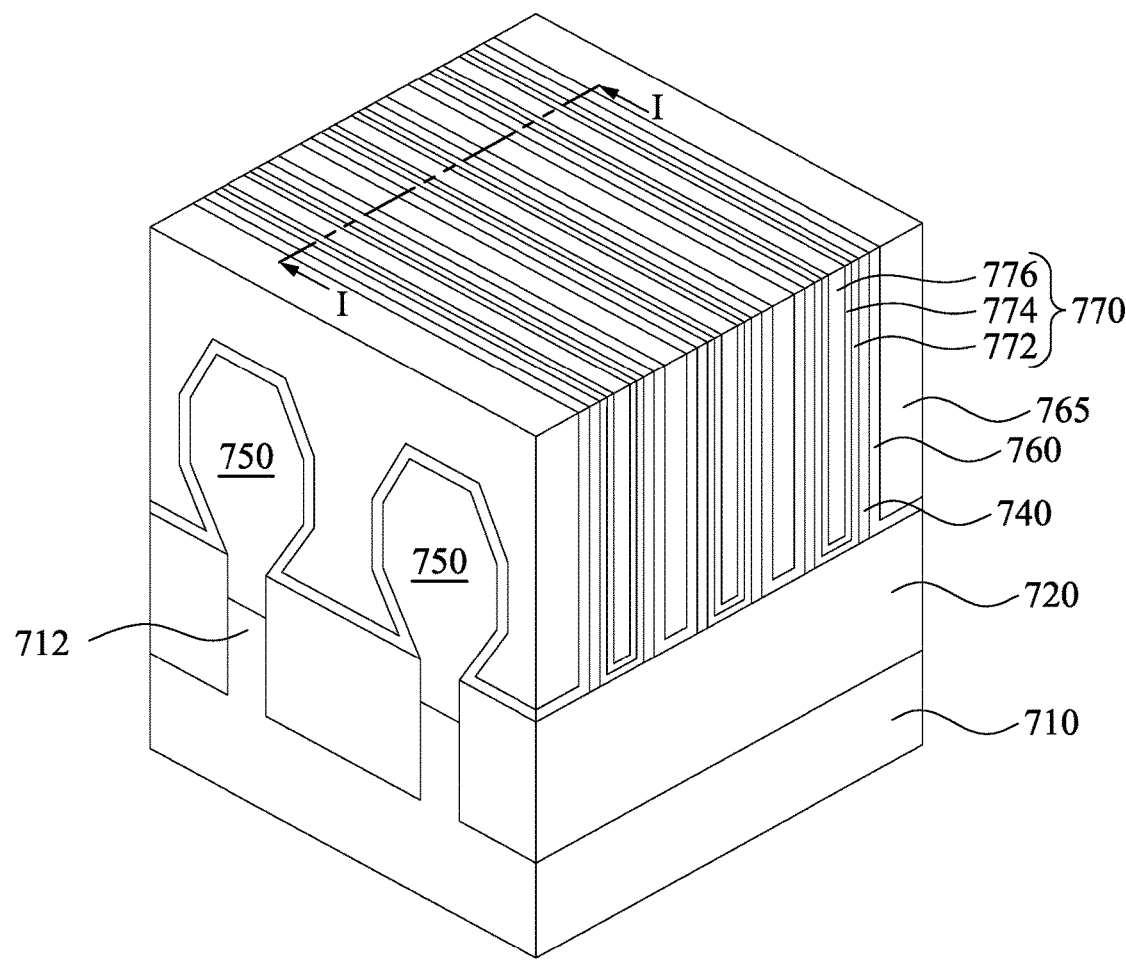
Figure 43B:
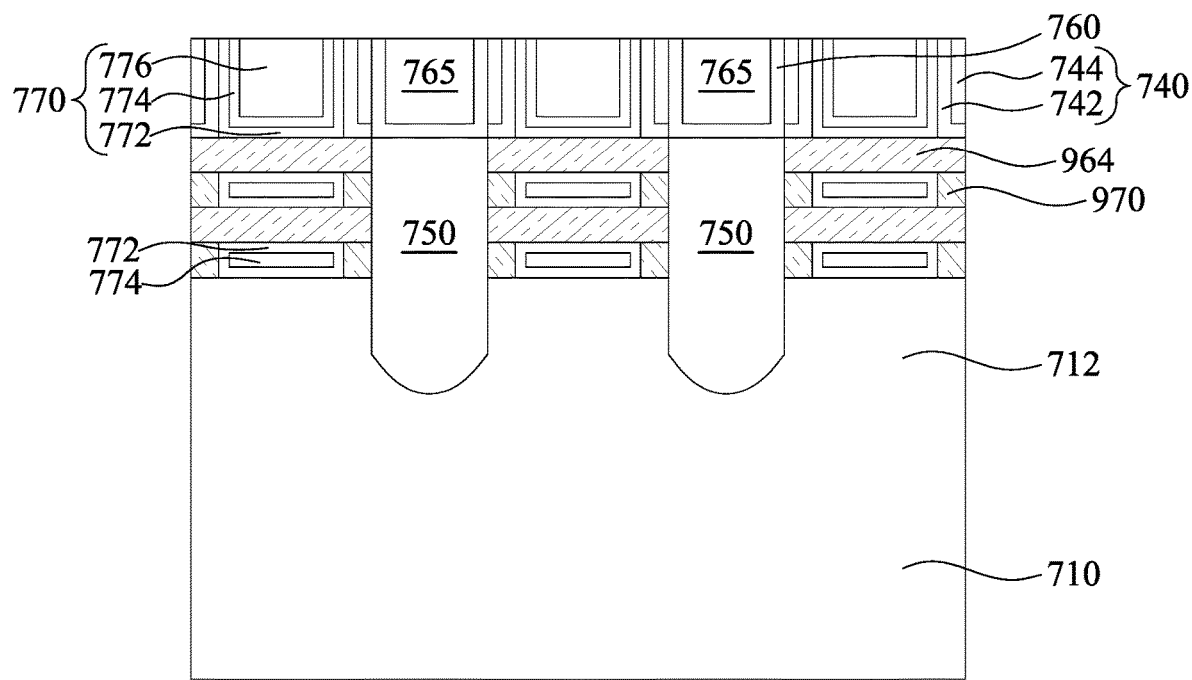

Reference is made to FIGS. 43A-43B, where FIG. 43B is a cross-sectional view taken along line I-I of FIG. 43A. The structure of FIG. 42 undergoes the processes similar to the processes shown in FIGS. 6 and 7A. That is, the dummy gate electrodes 734, the dummy gate dielectric layers 732 (see FIG. 42), and the first semiconductor layers 962 (see FIG. 40) are removed, resulting in gate trenches between corresponding gate spacers 740. Thereafter, gate structures 770 including gate dielectric layers 772 and gate electrodes (including work function metal layers 774 and fill metals 776) are formed in the gate trenches. Materials, configurations, dimensions, processes and/or operations regarding the gate structures 770 are similar to or the same as the gate structures 170 of FIG. 6.

Figure 44A:
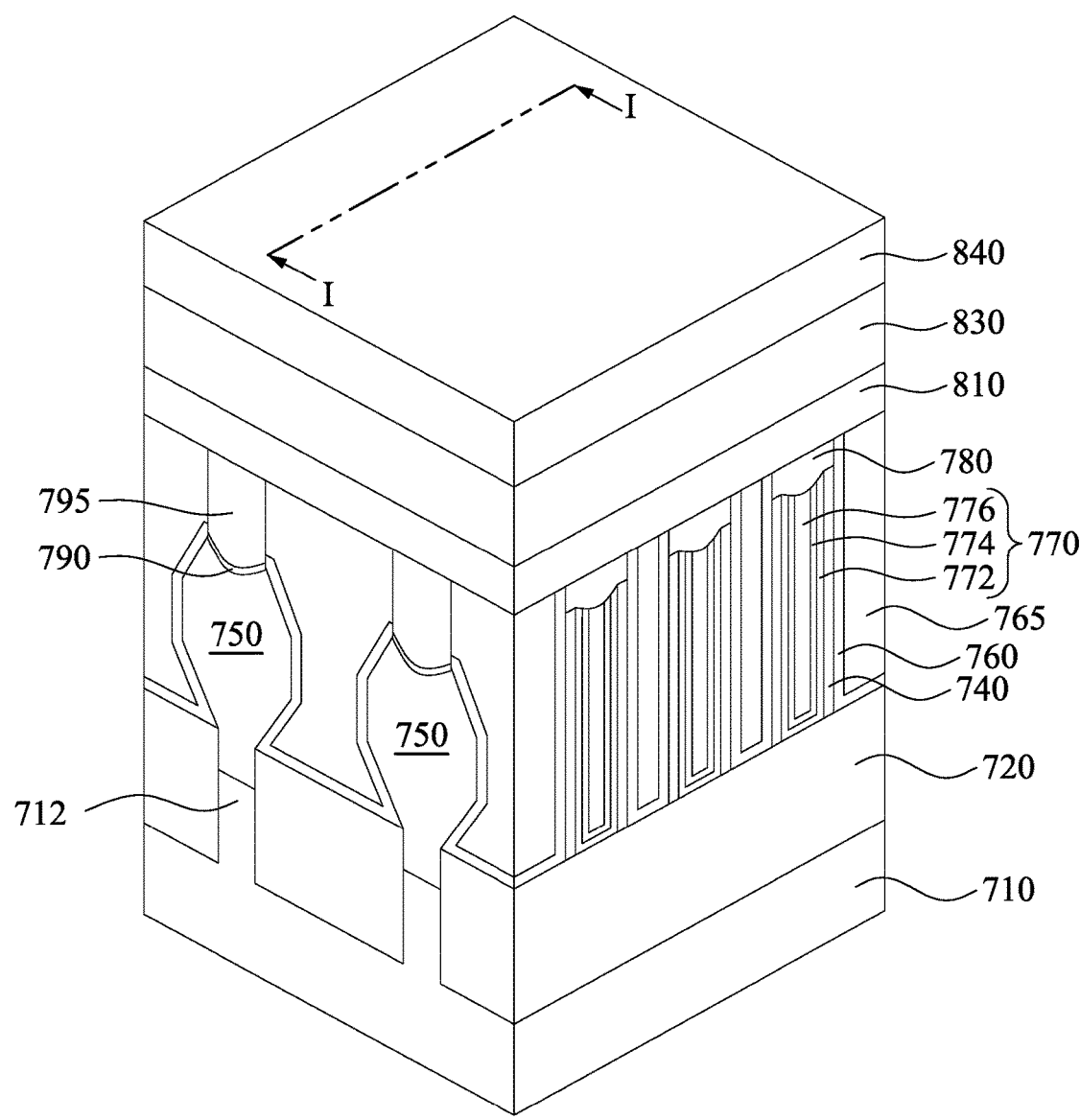
Figure 44B:
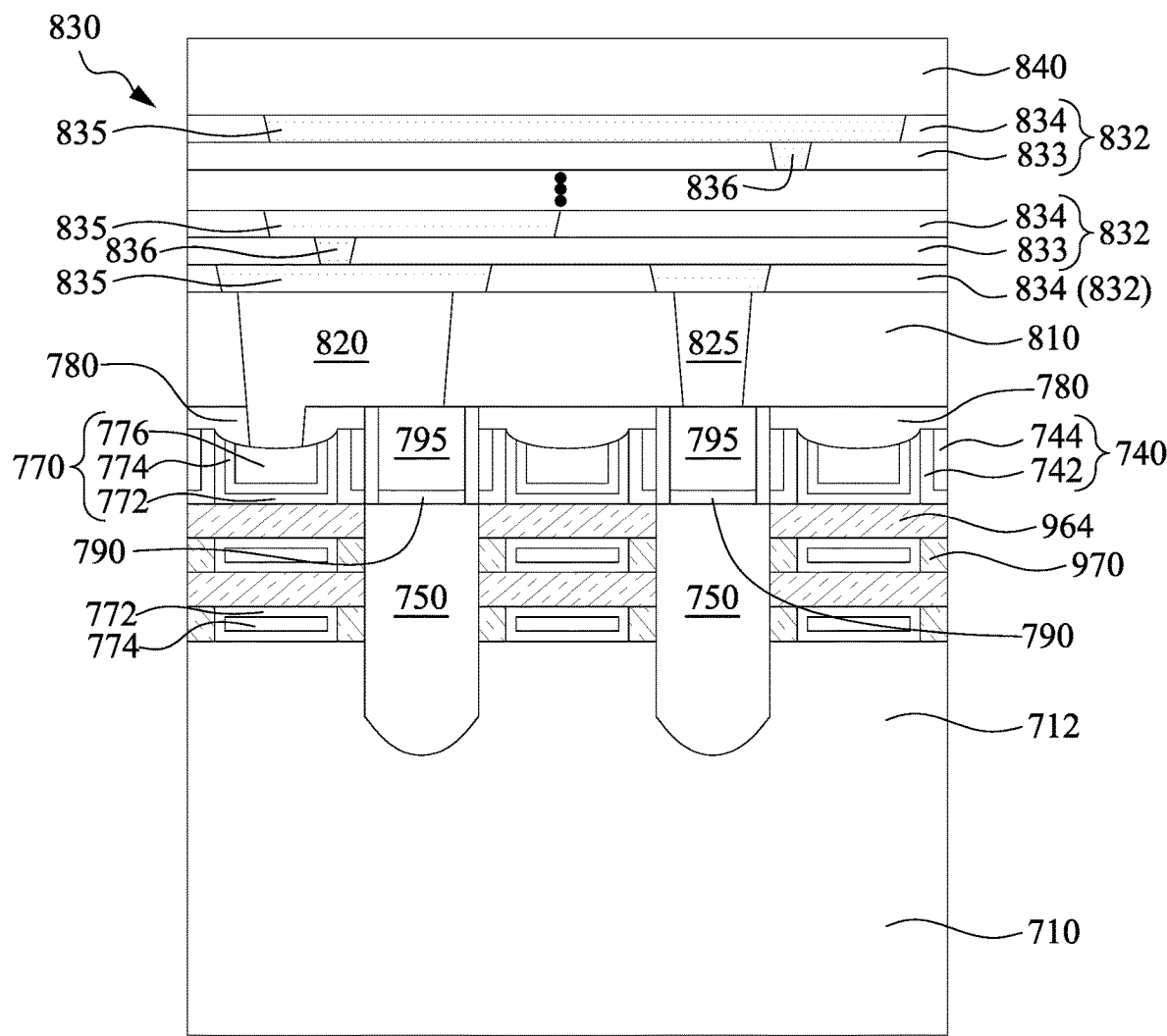
Figure 45A:
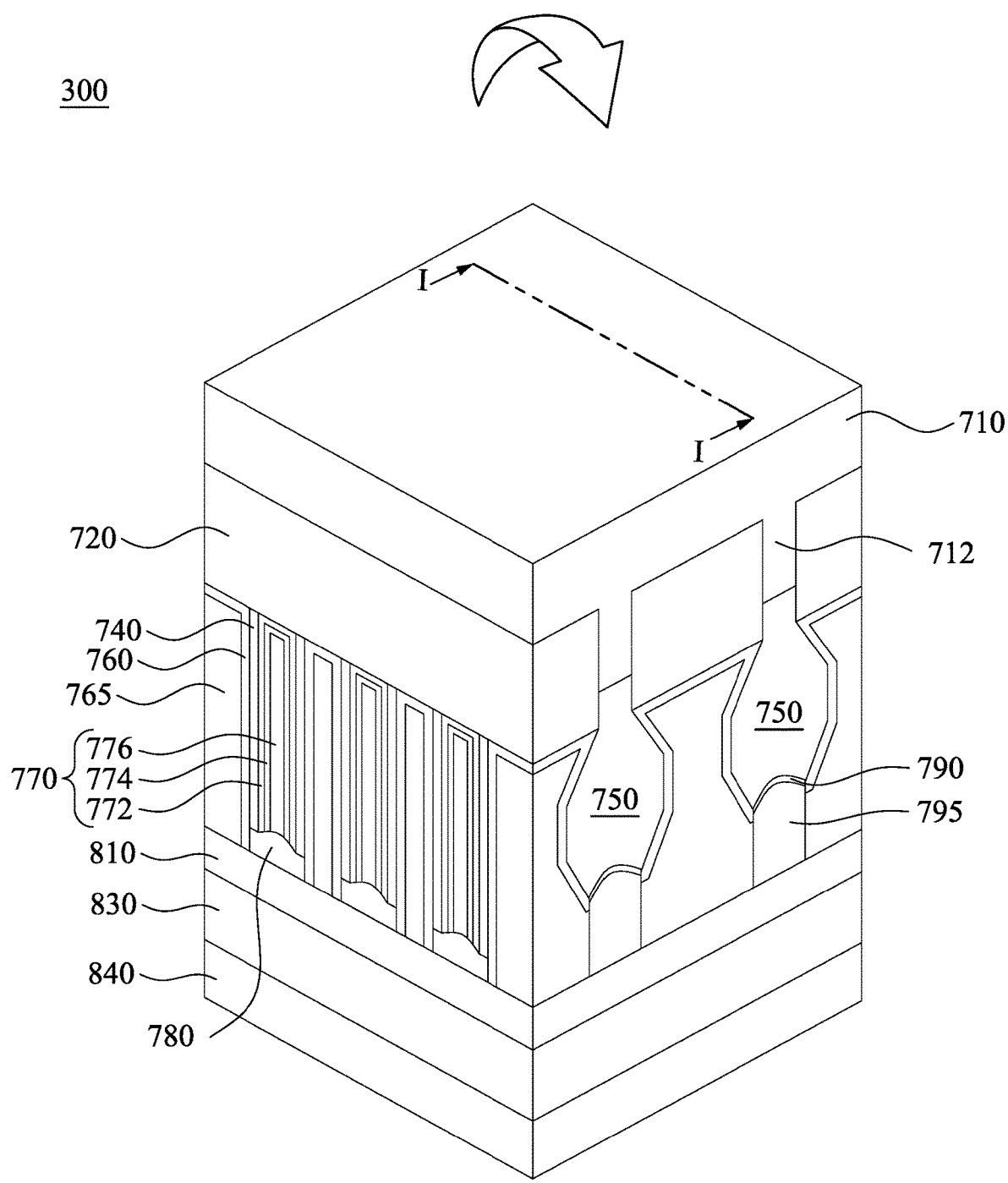
Figure 45B:
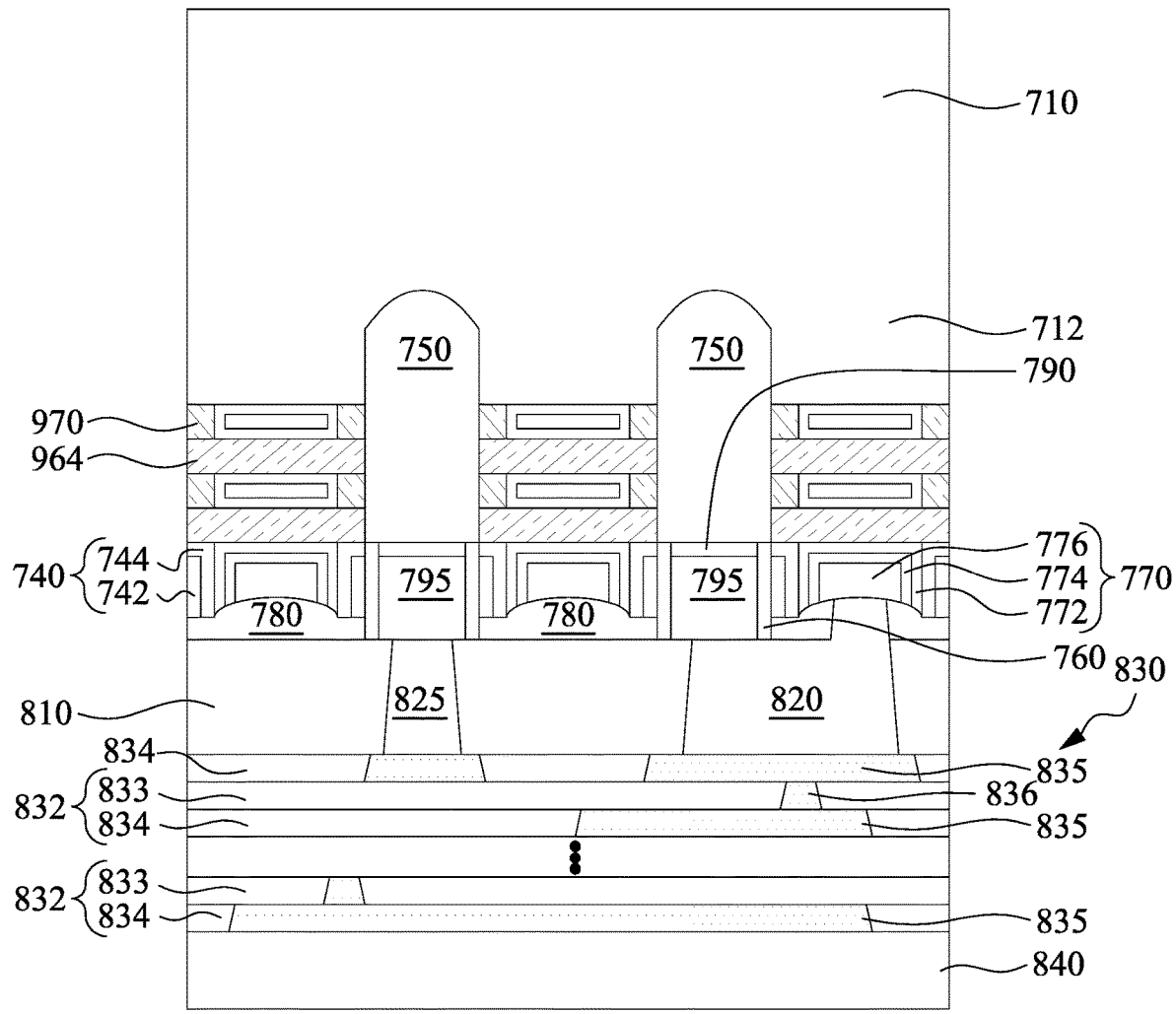

Reference is made to FIGS. 44A-44B, where FIG. 44B is a cross-sectional view taken along line I-I of FIG. 44A. The structure of FIG. 43A undergoes the processes similar to the processes shown in FIGS. 7A-12B. That is, an etching back process is performed to etch back the replacement gate structures 770 and the gate spacers 740, and dielectric caps 780 are formed over the etched gate structures 770. Materials, configurations, dimensions, processes and/or operations regarding the dielectric caps 780 are similar to or the same as the dielectric caps 180 of FIG. 7A.

After the formation of the dielectric caps 780 is completed, source/drain contacts 795 are formed extending through the first ILD layer 765. In some embodiments, metal alloy layers 790 are respectively formed above the source/drain epitaxial structures 750 prior to forming the source/drain contacts 795. Materials, configurations, dimensions, processes and/or operations regarding the source/drain contacts 795 are similar to or the same as the source/drain contacts 195 of FIG. 7A. Materials, configurations, dimensions, processes and/or operations regarding the metal alloy layers 790 are similar to or the same as the metal alloy layers 190 of FIG. 7A.

A second ILD layer 810 is formed over the source/drain epitaxial structures 750 and the isolation structures 720. At least one front-side butted contact (or butted via) 820 and at least one source/drain via 825 are formed in the second ILD layer 810. Materials, configurations, dimensions, processes and/or operations regarding the second ILD layer 810 are similar to or the same as the second ILD layer 210 of FIG. 8. Materials, configurations, dimensions, processes and/or operations regarding the front-side butted contact 820 and the source/drain via 825 are similar to or the same as the front-side butted contact 220 and the source/drain via 225 of FIG. 10.

Subsequently, a front-side MLI structure 830 is formed over the second ILD layer 810. The front-side MLI structure 830 may include a plurality of front-side metallization layers 832. The number of front-side metallization layers 832 may vary according to design specifications of the integrated circuit structure. Only three front-side metallization layers 832 are illustrated in FIG. 44B for the sake of simplicity. Except the bottommost front-side metallization layers 832, the other front-side metallization layers 832 each includes a first front-side inter-metal dielectric (IMD) layer 833 and a second front-side IMD layer 834. The second front-side IMD layers 834 are formed over the corresponding first front-side IMD layers 833. The front-side metallization layers 832 include one or more horizontal interconnects, such as front-side metal lines 835, respectively extending horizontally or laterally in the second front-side IMD layers 834 and vertical interconnects, such as front-side conductive vias 836, respectively extending vertically in the first front-side IMD layers 833. Materials, configurations, dimensions, processes and/or operations regarding the front-side MLI structure 830 are similar to or the same as the front-side MLI structure 230 of FIG. 11.

A carrier substrate 840 is bonded to the front-side MLI structure 830 in accordance with some embodiments of the present disclosure. Materials, configurations, dimensions, processes and/or operations regarding the carrier substrate 840 are similar to or the same as the carrier substrate 240 of FIG. 12A. Afterwards, the semiconductor device is flipped upside down, such that a backside surface of the substrate 710 faces upwards, as illustrated in FIGS. 45A and 45B.

Figure 46A:
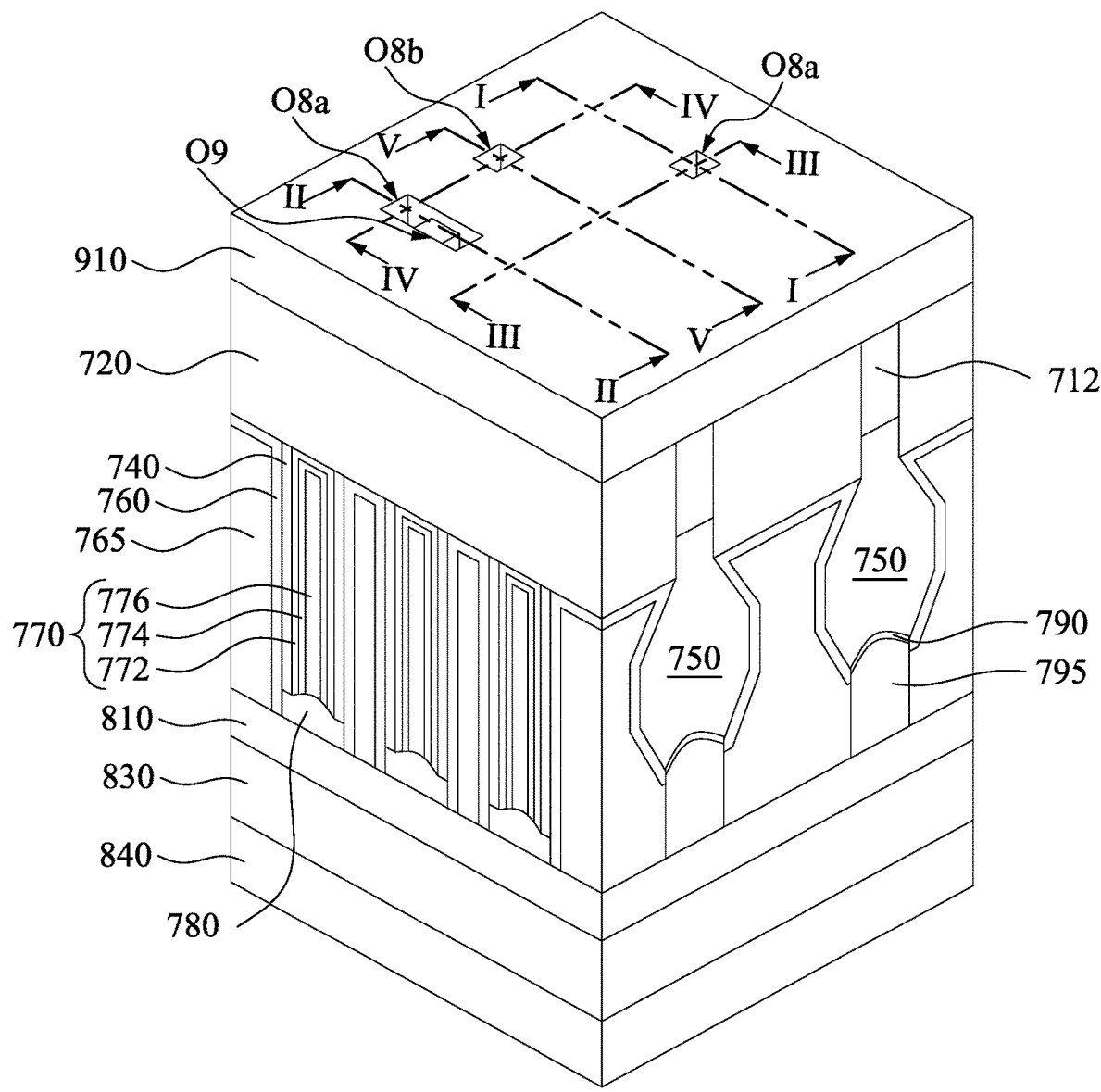
Figure 46B:
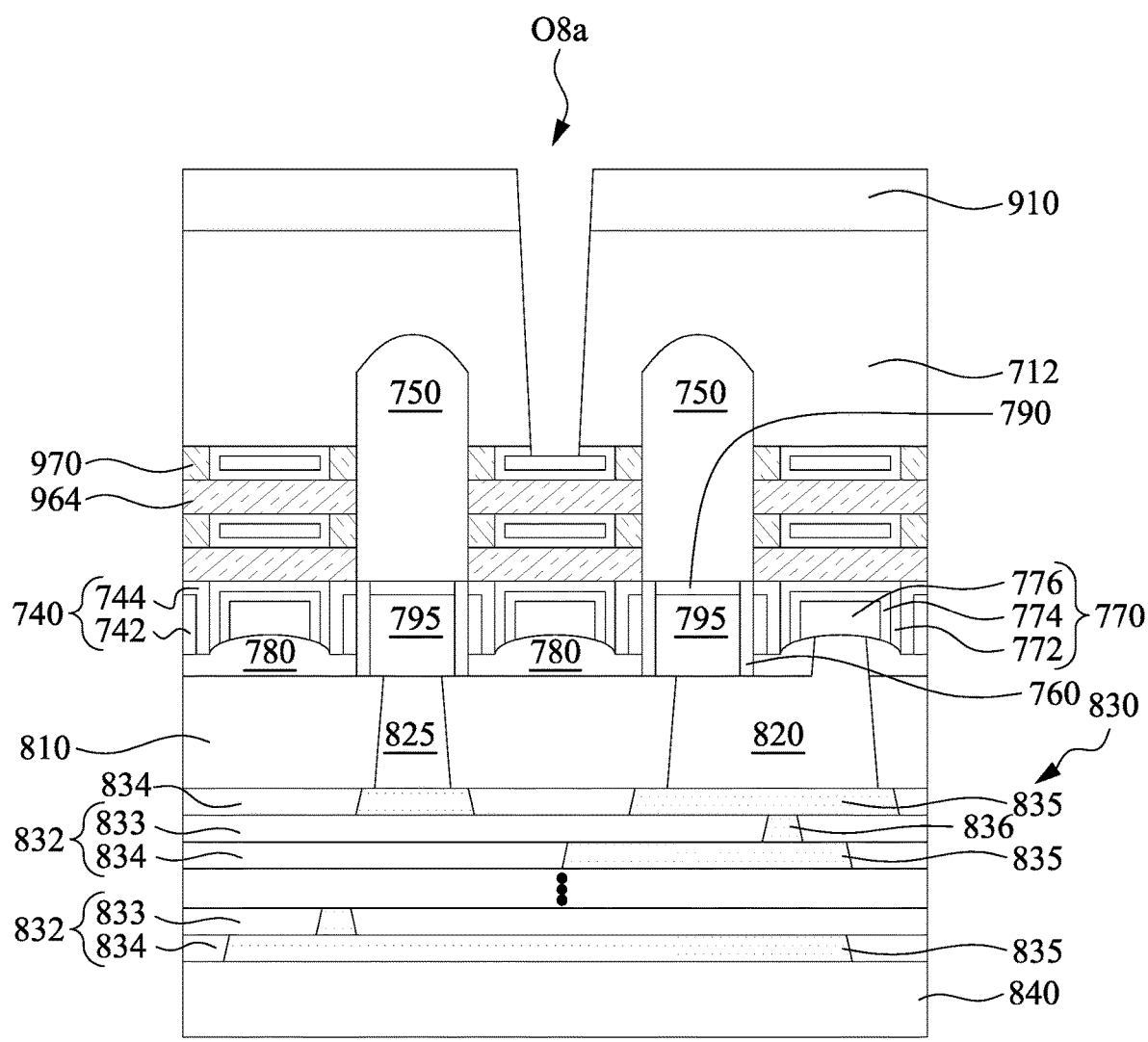
Figure 46C:
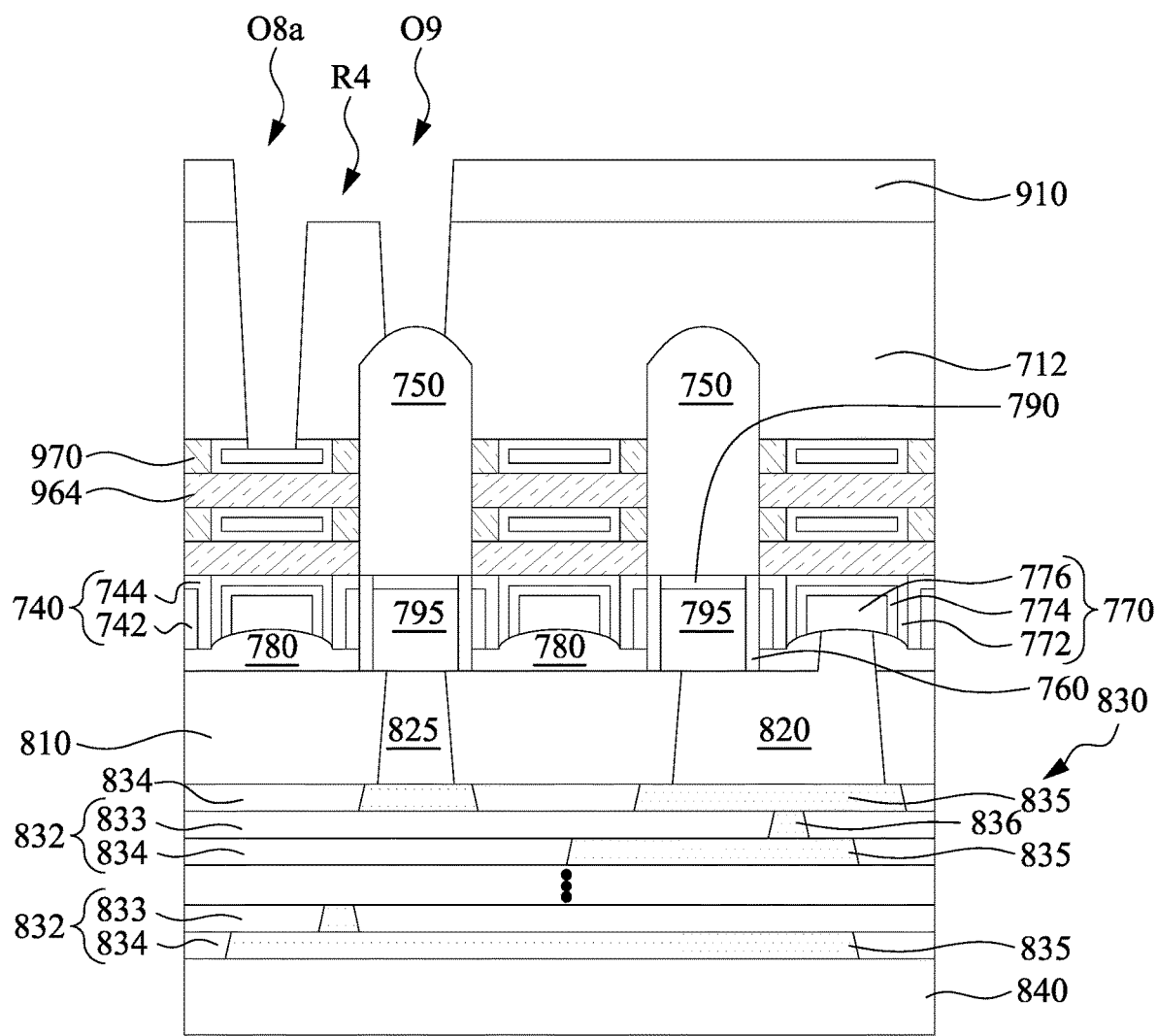
Figure 46D:
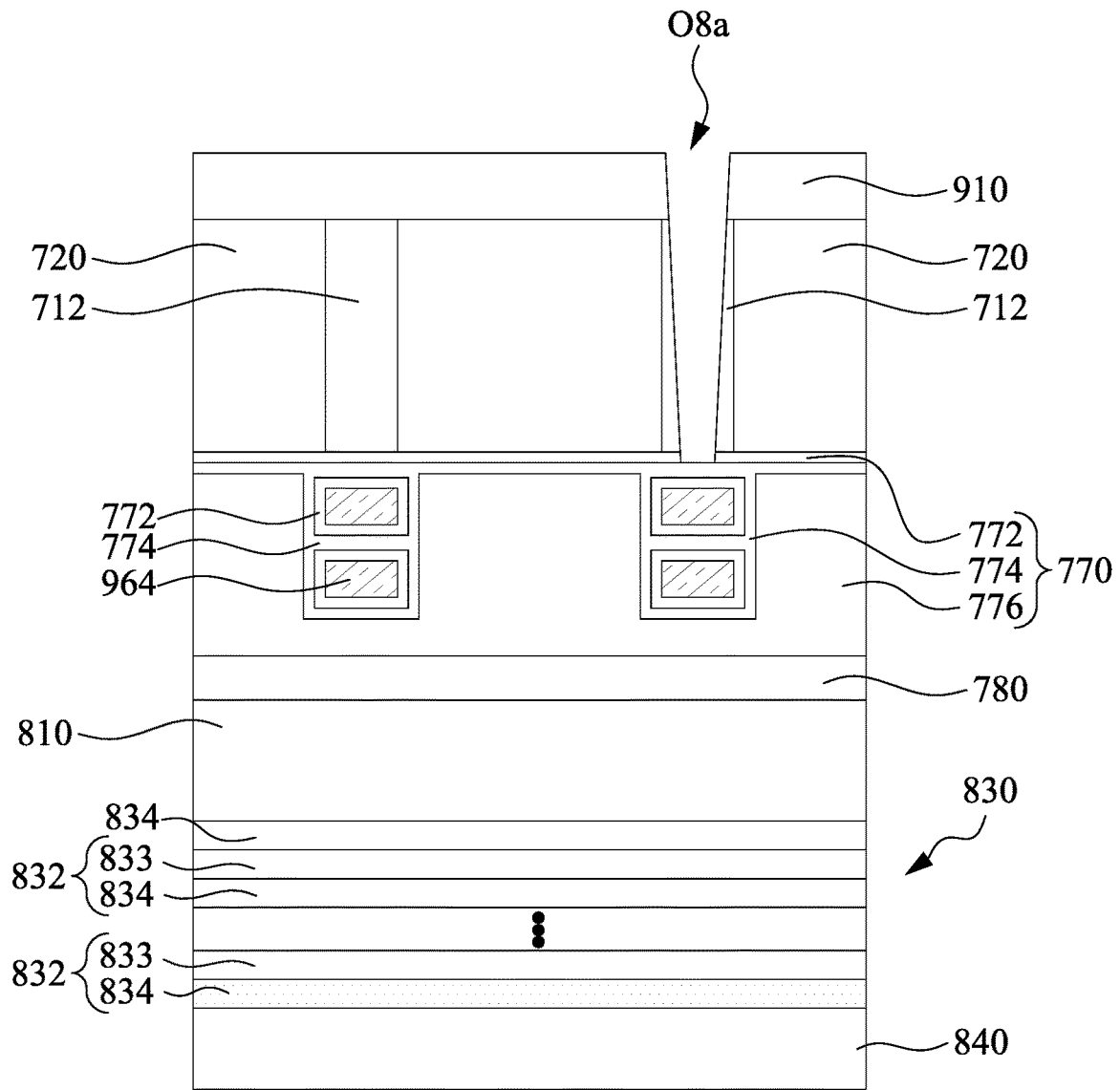
Figure 46E:
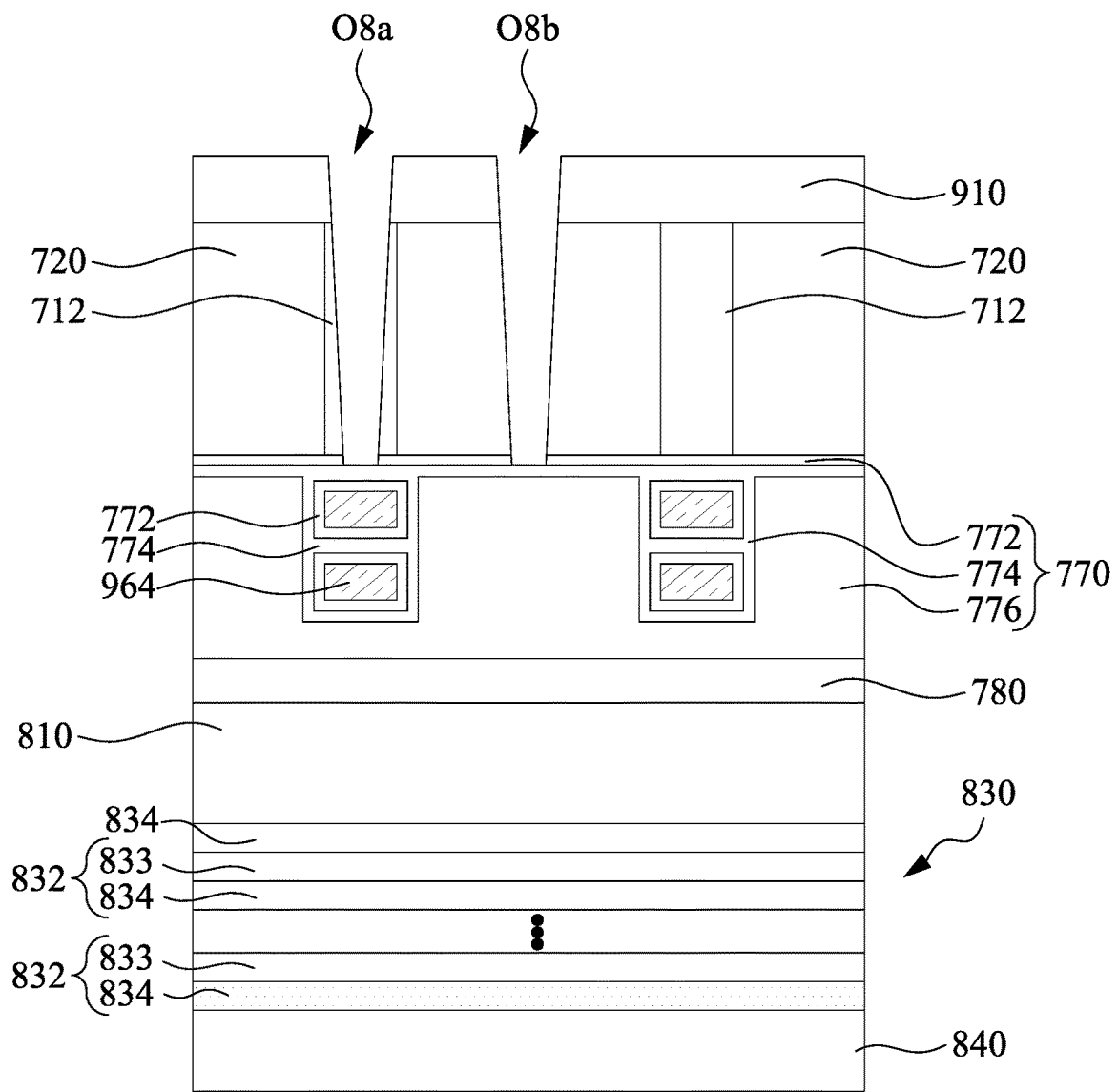
Figure 46F:
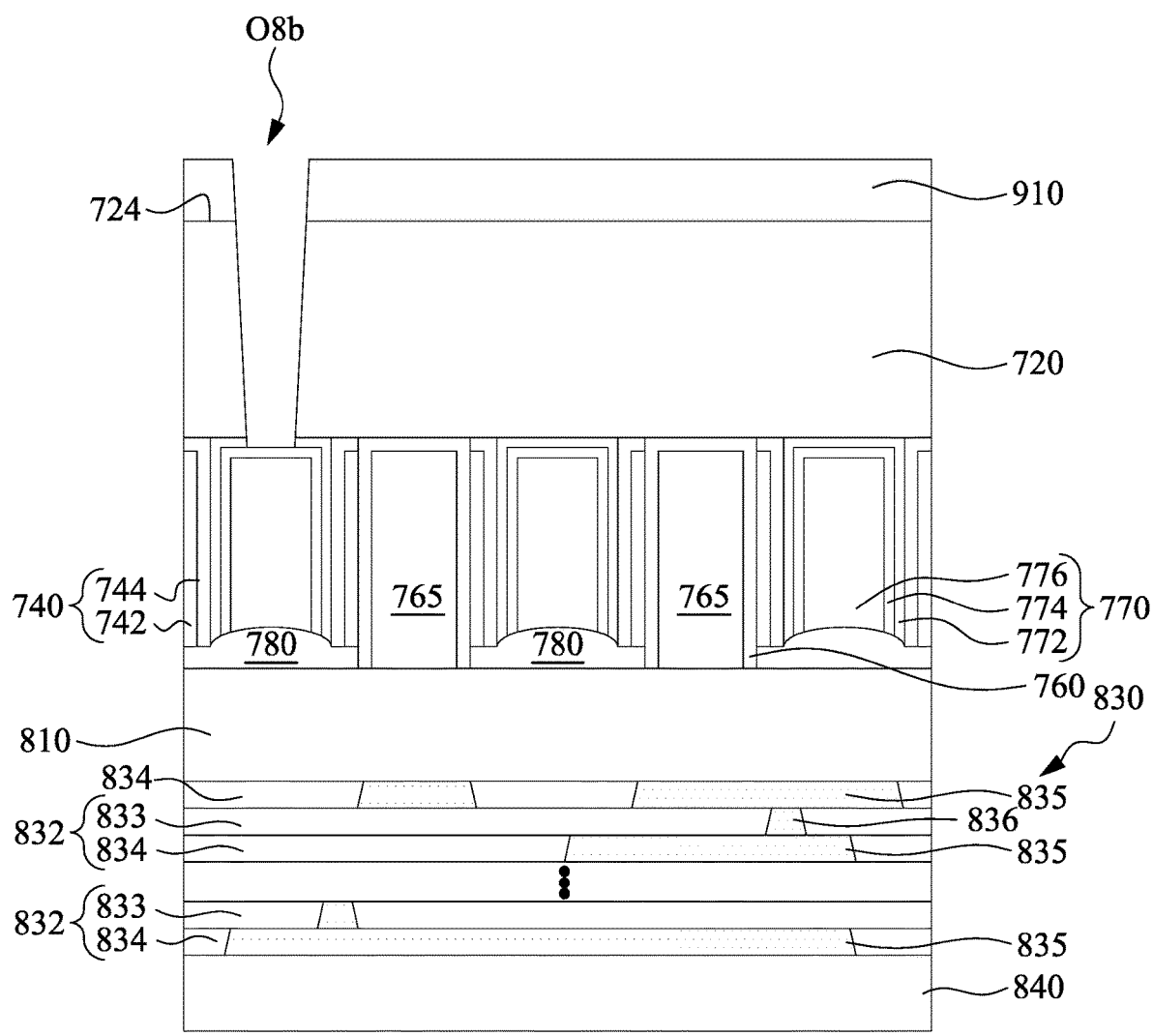

Reference is made to FIGS. 46A-46F, where FIG. 46B is a cross-sectional view taken along line I-I of FIG. 46A, FIG. 46C is a cross-sectional view taken along line II-II of FIG. 46A, FIG. 46D is a cross-sectional view taken along line III-III of FIG. 46A, FIG. 46E is a cross-sectional view taken along line IV-IV of FIG. 46A, and FIG. 46F is a cross-sectional view taken along line V-V of FIG. 46A. The structure of FIG. 45A undergoes the processes similar to the processes shown in FIGS. 14-16F. That is, the substrate 710 in FIG. 45A is thinned down to expose the bottom surface 724 of the isolation structure 720, and a third ILD layer 910 is formed to cover the base portions 712 and the isolation structures 720. Materials, configurations, dimensions, processes and/or operations regarding the third ILD layer 910 are similar to or the same as the third ILD layer 310 of FIG. 15A.

Subsequently, gate via openings O8a and O8b are formed in the third ILD layer 910 and extend to the gate electrode (e.g., the work function metal layer 774 or the fill metal 776) of the gate structures 770. For example, one of the gate via openings O8a passes through one of the base portions 712 as shown in FIGS. 46B and 46D, and another one of the gate via openings O8a passes through another one of the base portions 712 as shown in FIGS. 46C and 46E. Further, the gate via opening O8b passes through one of the isolation structures 720 as shown in FIGS. 46F and 46E. In some embodiments, at least one source/drain via opening O9 is formed in the third ILD layer 910 and extends to one of the source/drain epitaxial structures 750. For example, the source/drain via opening O9 passes through one of the base portion 712 as shown in FIG. 46C. The gate via openings O8a and O8b and the source/drain via opening O9 may be formed by using a single or multiple etching process(es). A portion of the third ILD layer 910 is then removed, such that the source/drain via opening O9 is connected to the adjacent gate via opening O8a through a recess R4.

Figure 47A:
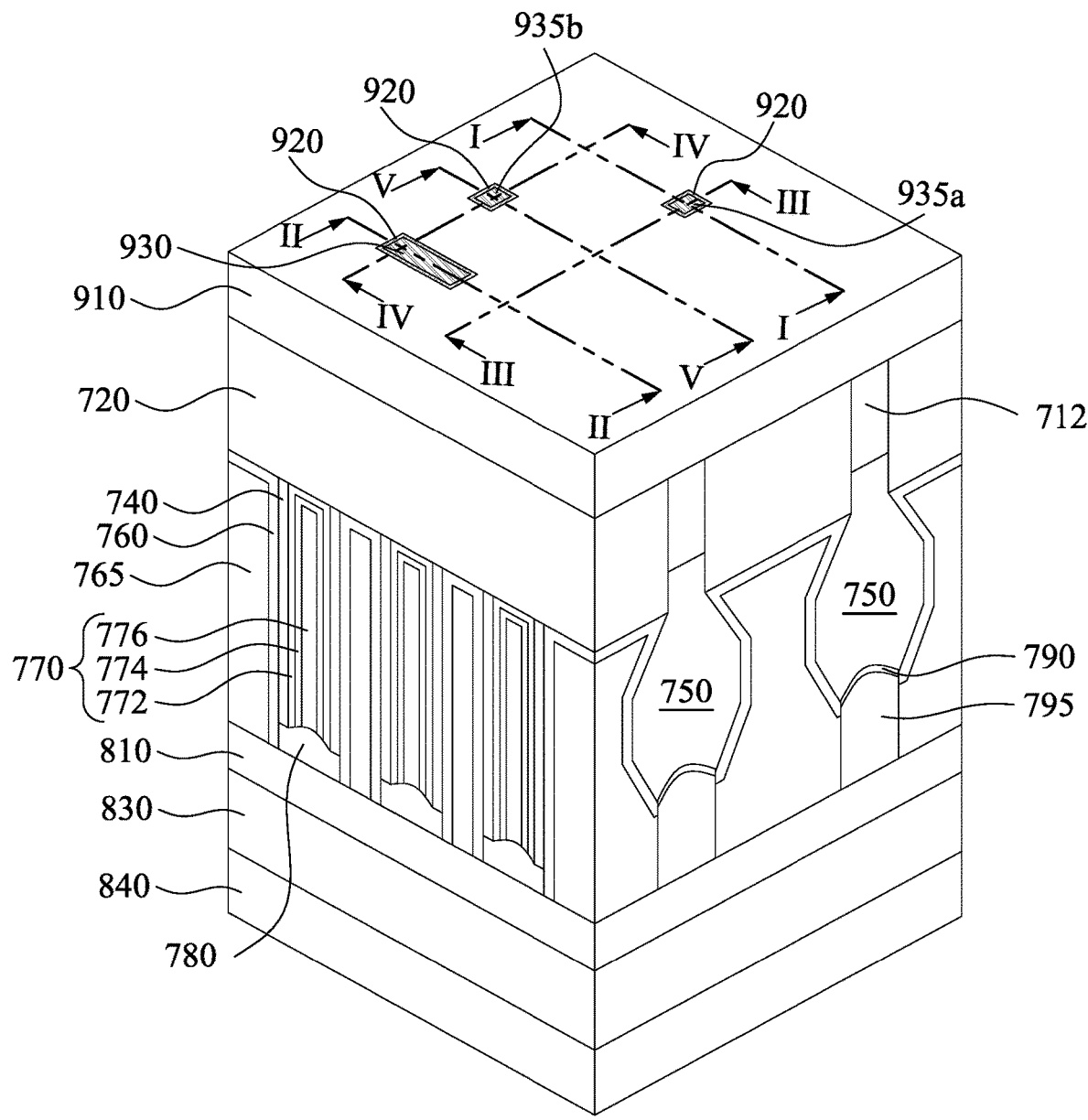
Figure 47A:
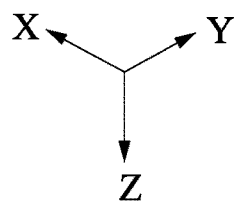
Figure 47B:
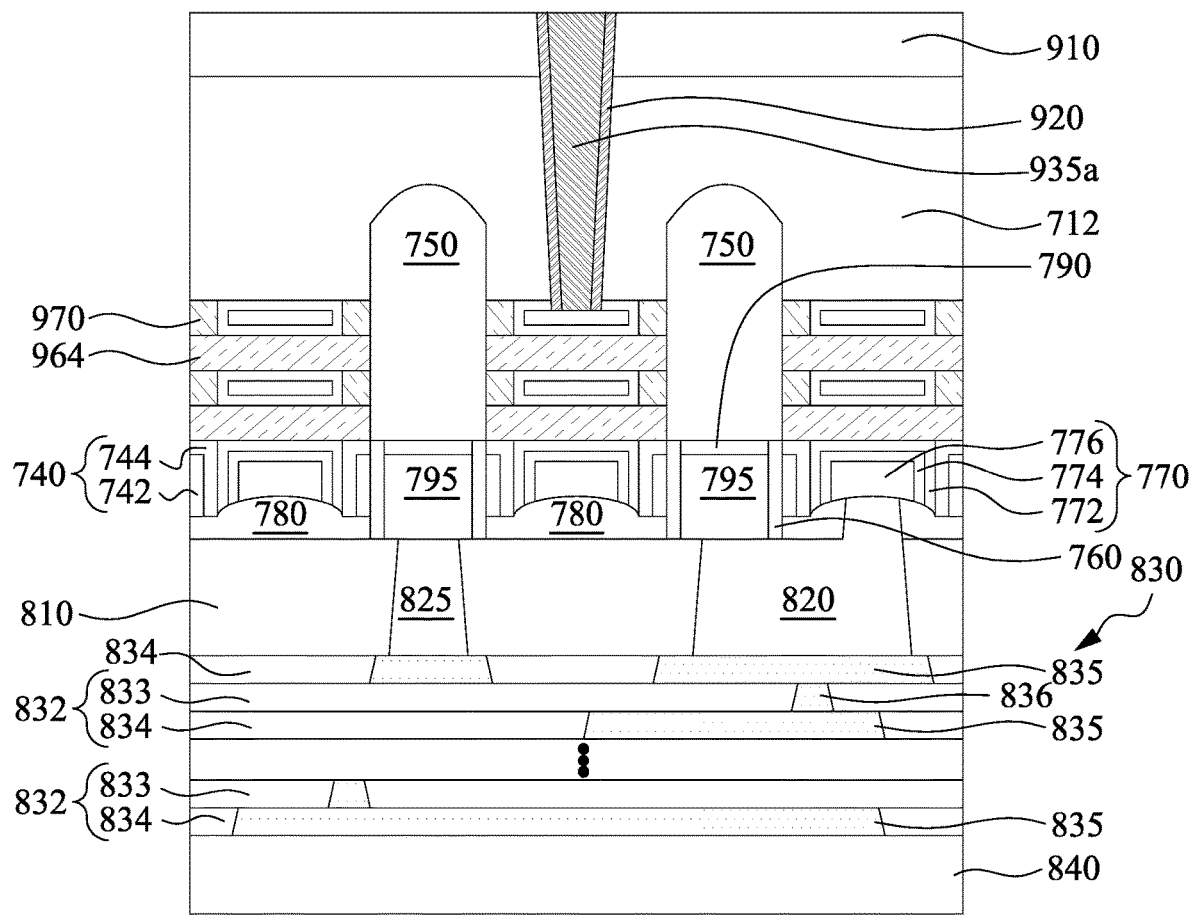
Figure 47C:
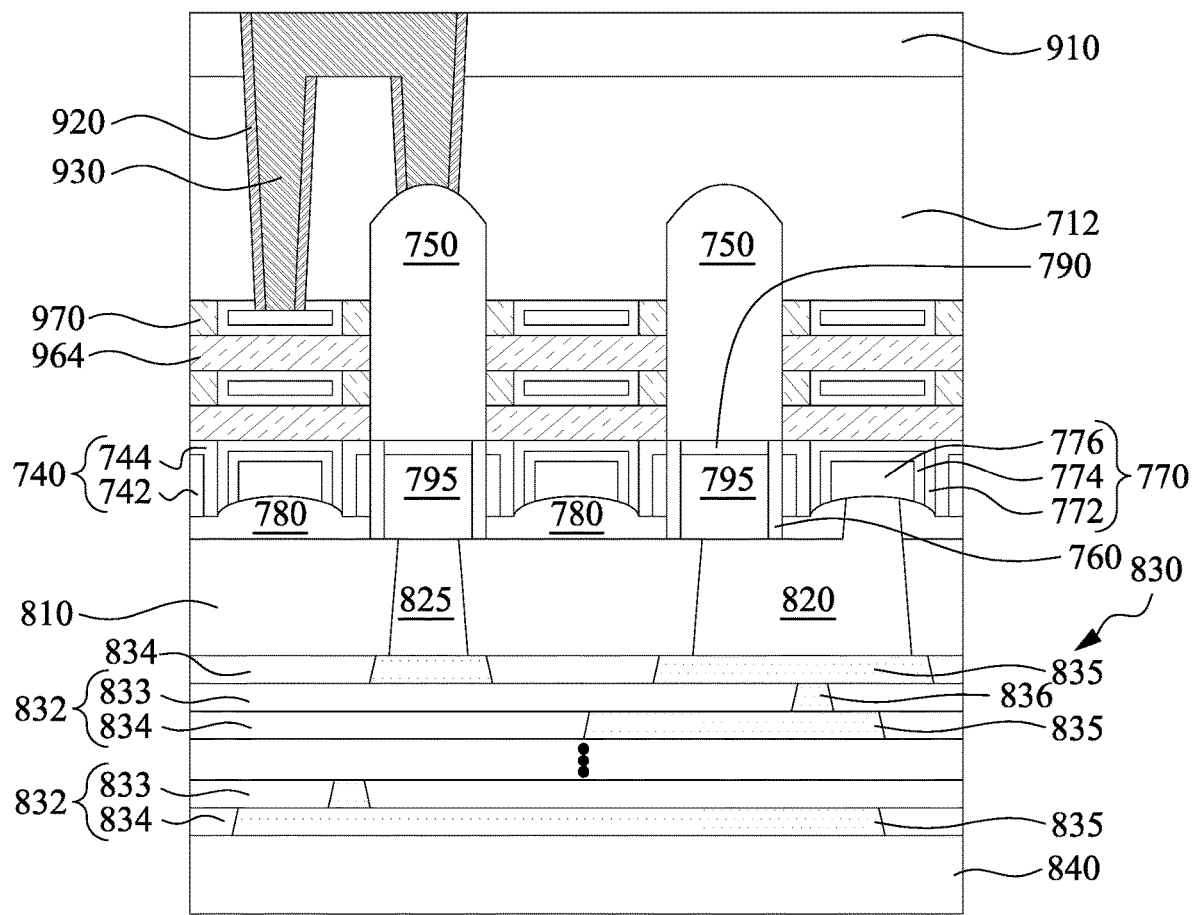
Figure 47D:
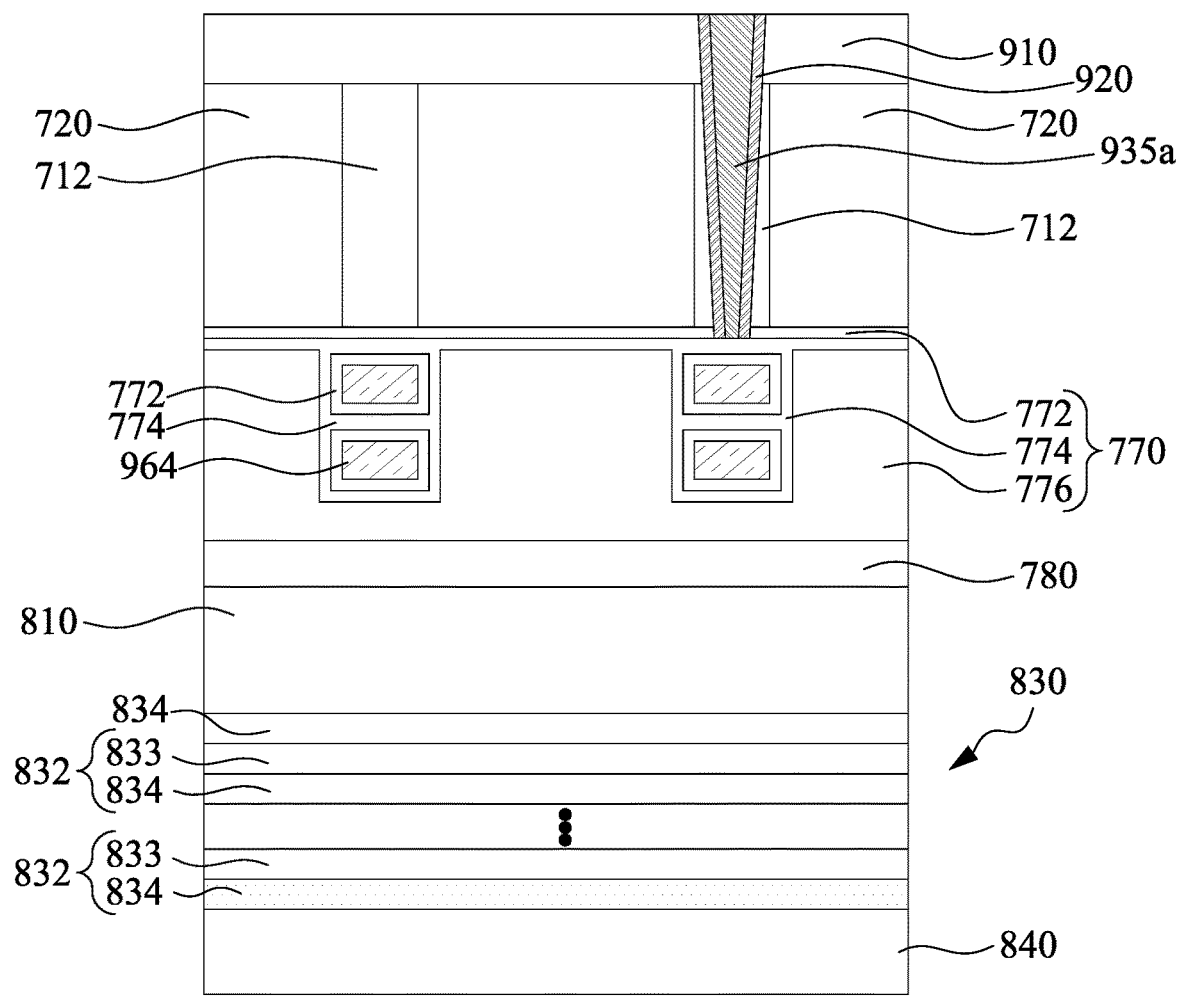
Figure 47E:
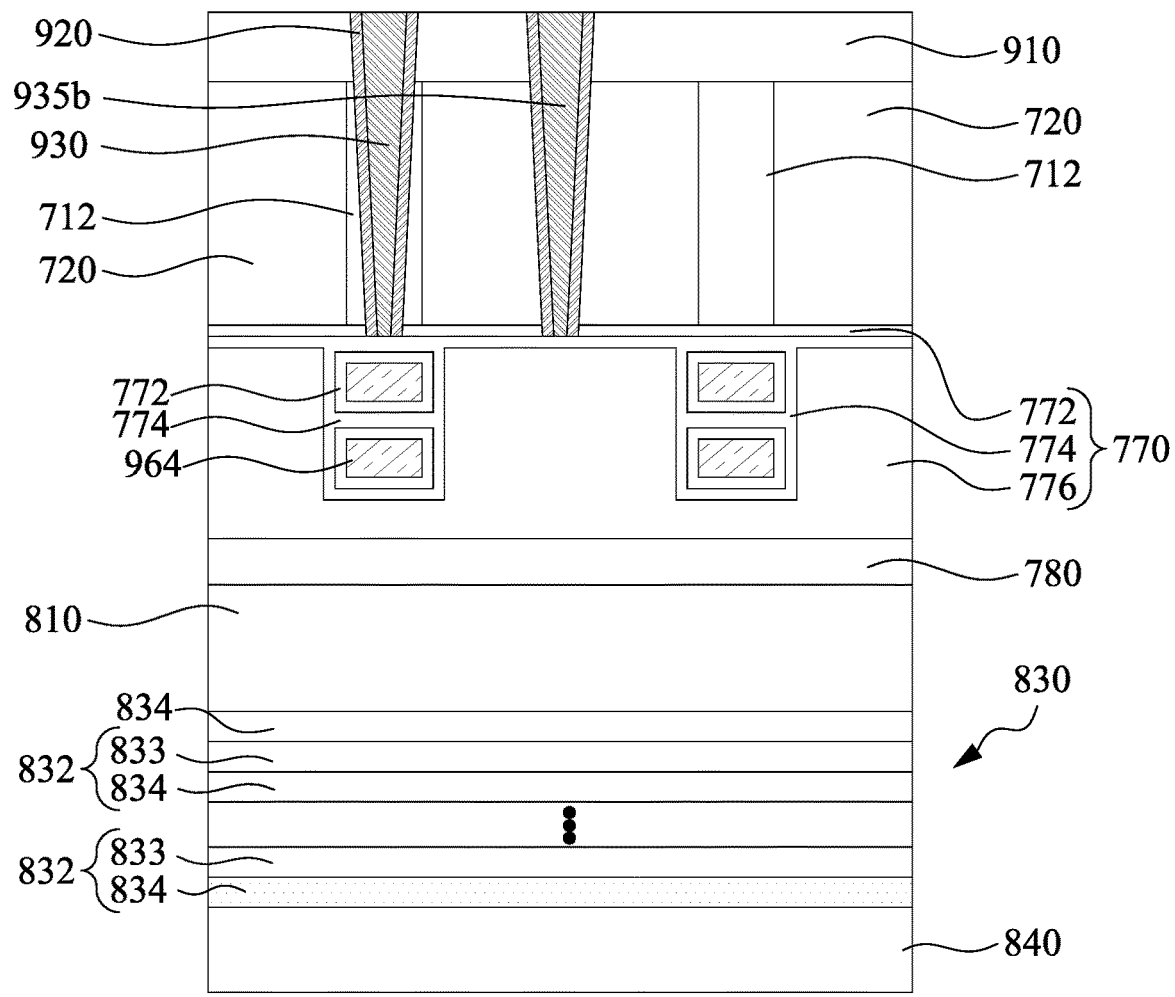
Figure 47F:
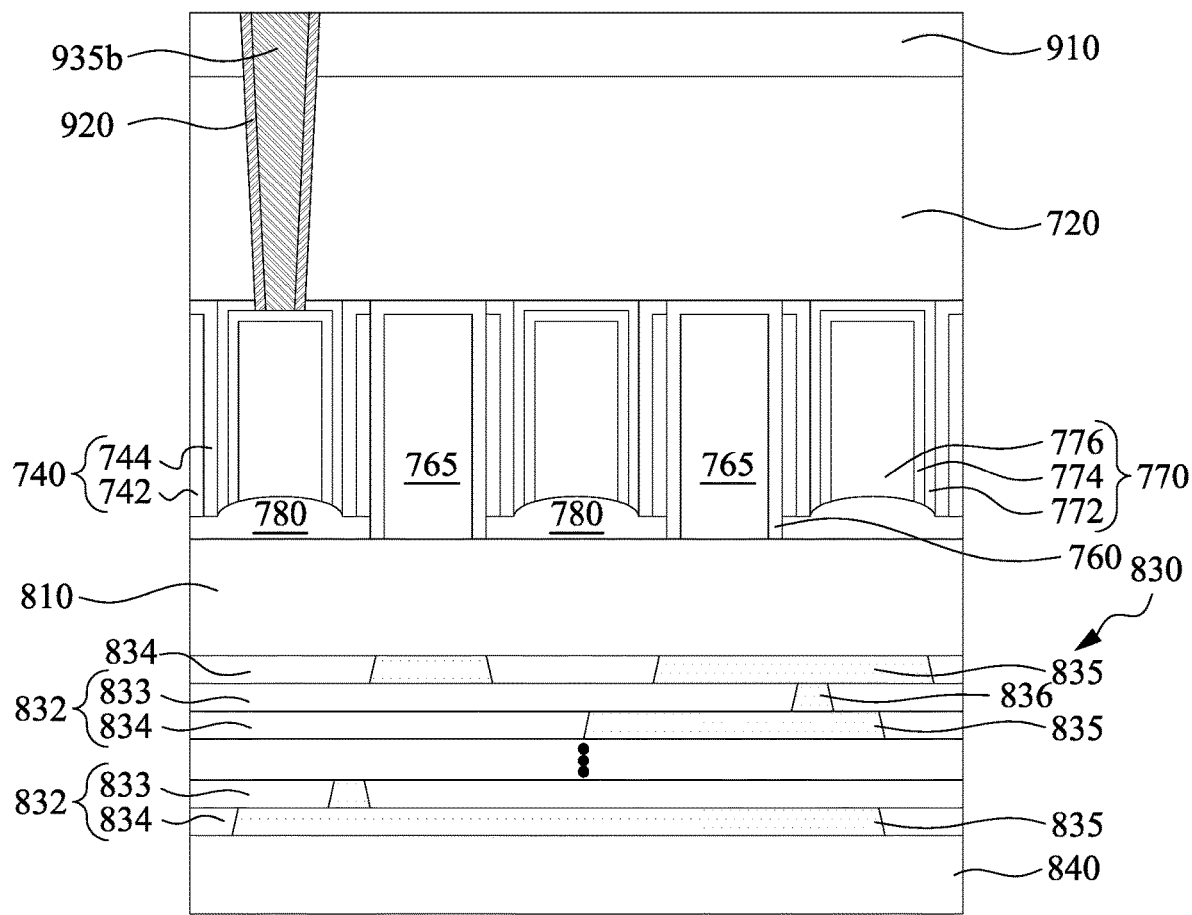

Reference is made to FIGS. 47A-47F, where FIG. 47B is a cross-sectional view taken along line I-I of FIG. 47A, FIG. 47C is a cross-sectional view taken along line II-II of FIG. 47A, FIG. 47D is a cross-sectional view taken along line III-III of FIG. 47A, FIG. 47E is a cross-sectional view taken along line IV-IV of FIG. 47A, and FIG. 47F is a cross-sectional view taken along line V-V of FIG. 47A. The structure of FIG. 46A undergoes the processes similar to the processes shown in FIGS. 17A-18F. That is, spacer structures 920 are formed on inner sidewalls of the gate via openings O8a and O8b and the source/drain via opening O9 (see FIG. 46A). Gate via contacts 935a, 935b and backside butted contact (or butted via) 930 are then formed in the openings O8a, O8b, and O9. Materials, configurations, dimensions, processes and/or operations regarding the spacer structures 920 are similar to or the same as the spacer structures 320 of FIG. 17A. Materials, configurations, dimensions, processes and/or operations regarding the gate via contacts 935a, 935b and backside butted contact 930 are similar to or the same as the gate via contacts 335a, 335b and backside butted contact 330 of FIG. 18A.

Figure 48A:
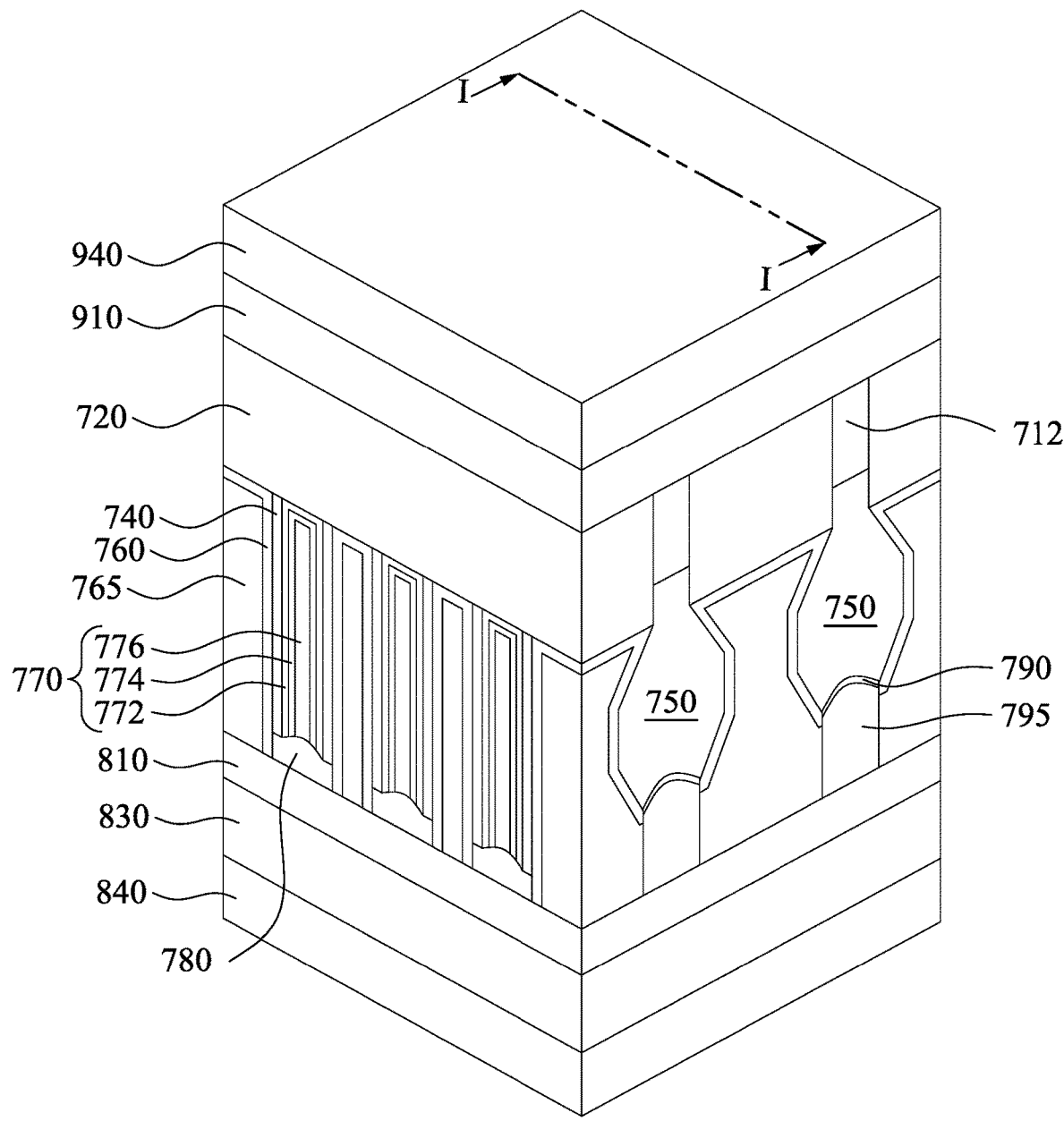
Figure 48B:
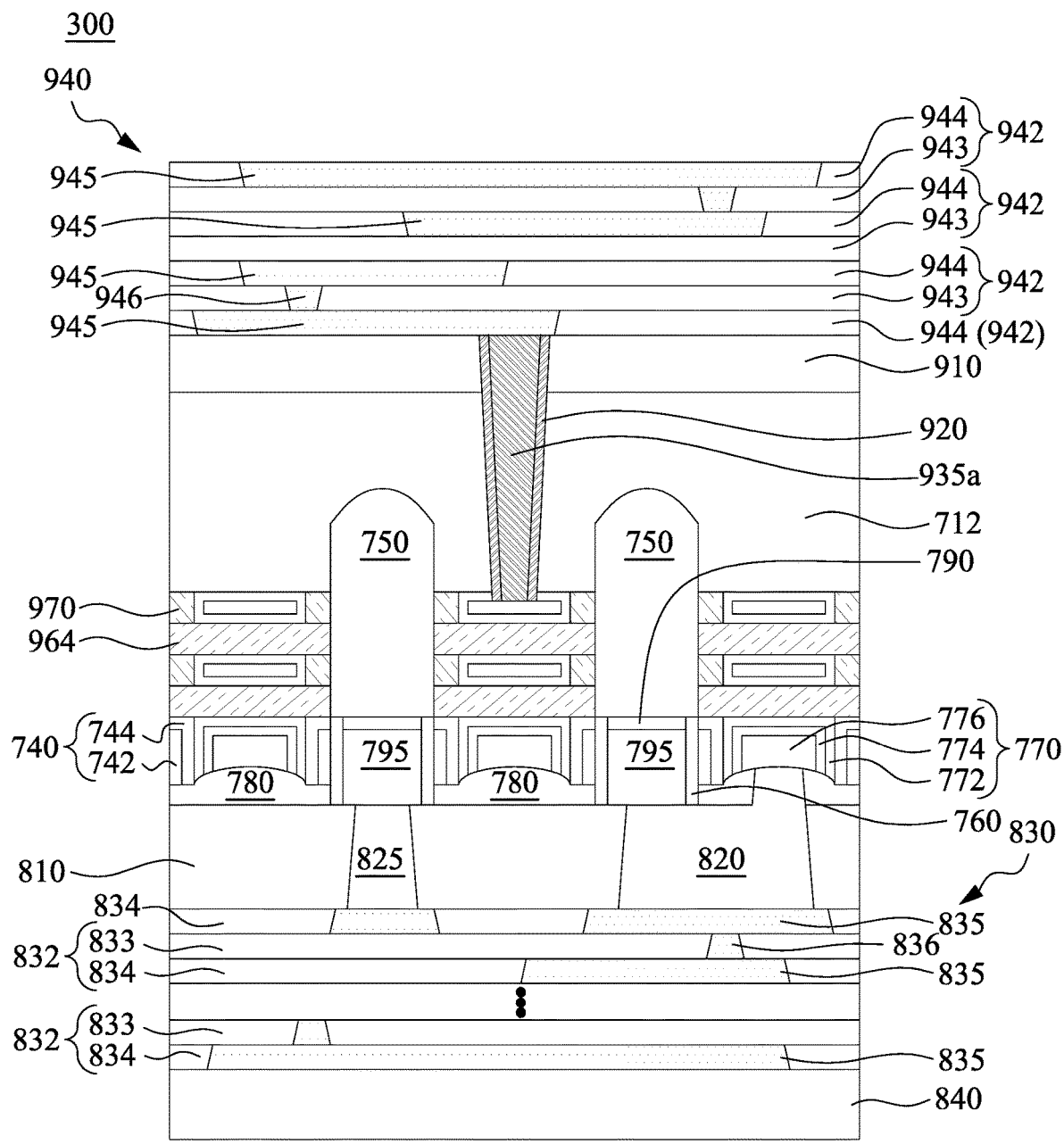

Reference is made to FIGS. 48A-48B, where FIG. 48B is a cross-sectional view taken along line I-I of FIG. 48A. A backside MLI structure 940 is formed over the third ILD layer 910. The backside MLI structure 940 may include a plurality of backside metallization layers 942. For clarity, the backside metallization layers 942 are shown in FIG. 48B and are omitted in FIG. 48A. The number of backside metallization layers 942 may vary according to design specifications of the integrated circuit structure. Only three backside metallization layers 942 are illustrated in FIG. 48B for the sake of simplicity. Except the bottommost backside metallization layers 942, the other backside metallization layers 942 each includes a first backside inter-metal dielectric (IMD) layer 943 and a second backside IMD layer 944. The second backside IMD layers 944 are formed over the corresponding first backside IMD layers 943. The backside metallization layers 942 include one or more horizontal interconnects, such as backside metal lines 945, respectively extending horizontally or laterally in the second backside IMD layers 944 and vertical interconnects, such as backside conductive vias 946, respectively extending vertically in the first backside IMD layers 943. Materials, configurations, dimensions, processes and/or operations regarding the backside MLI structure 940 are similar to or the same as the backside MLI structure 340 of FIG. 19B.

Figure 49A:
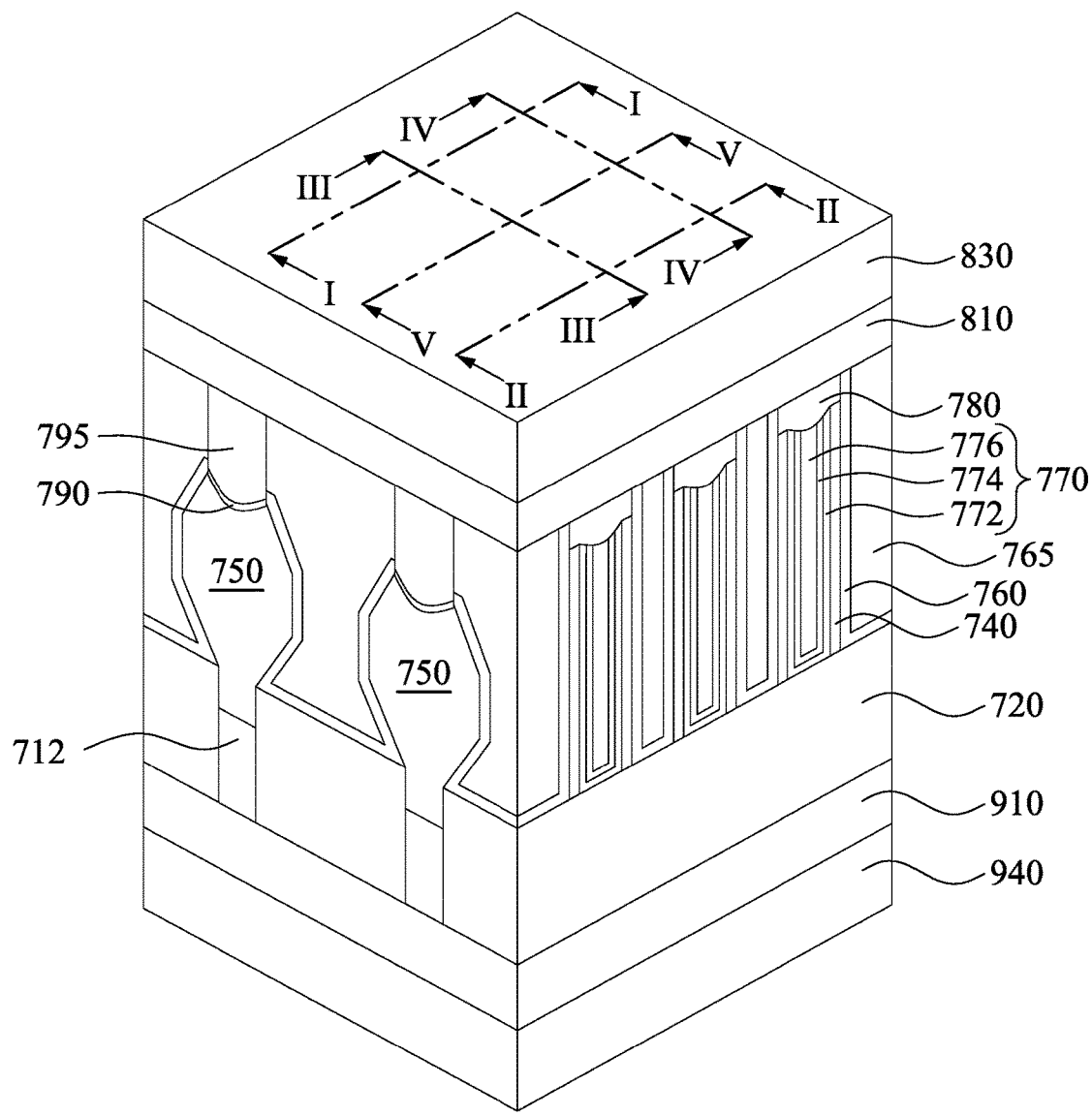
Figure 49B:
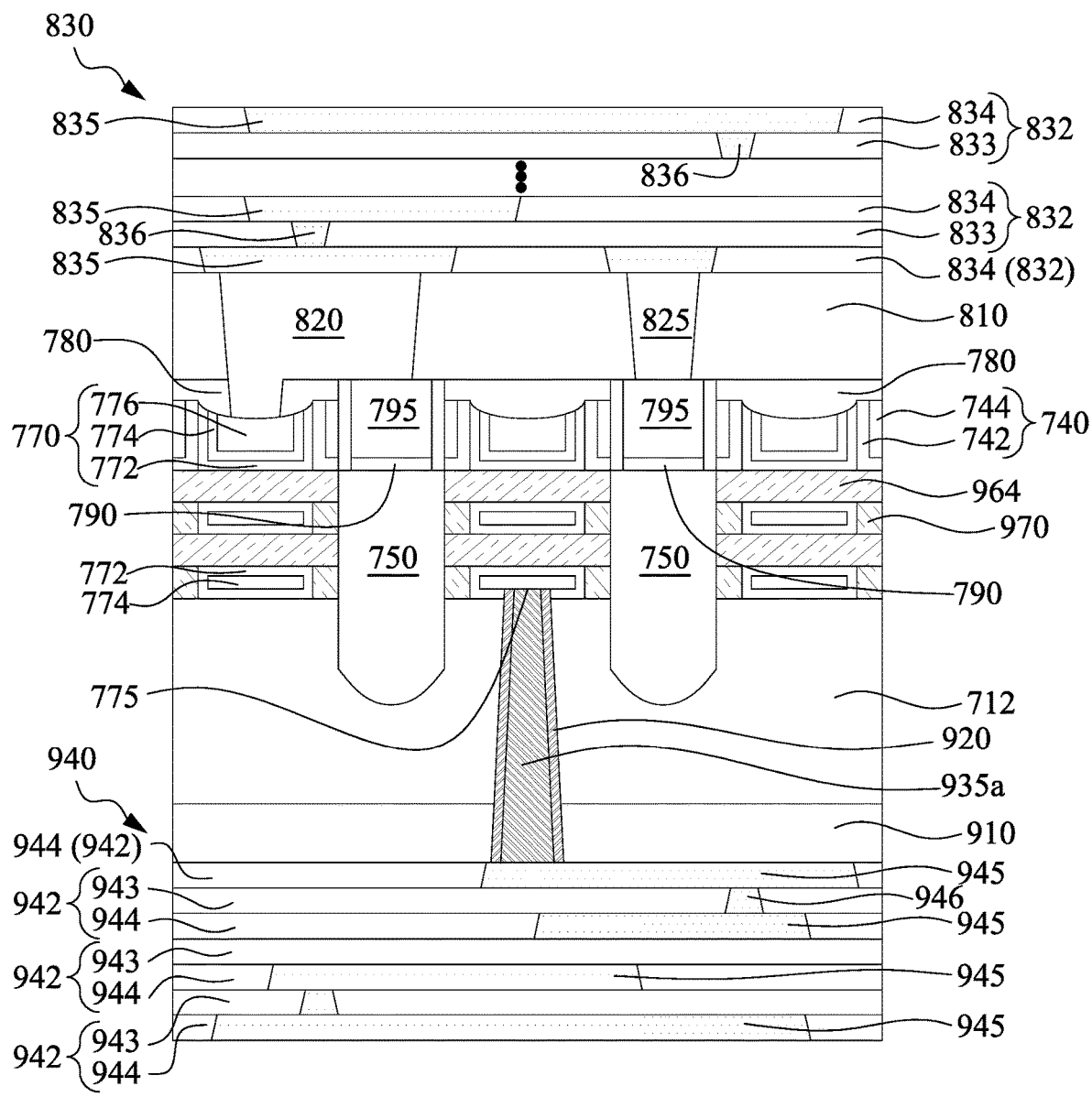
Figure 49C:
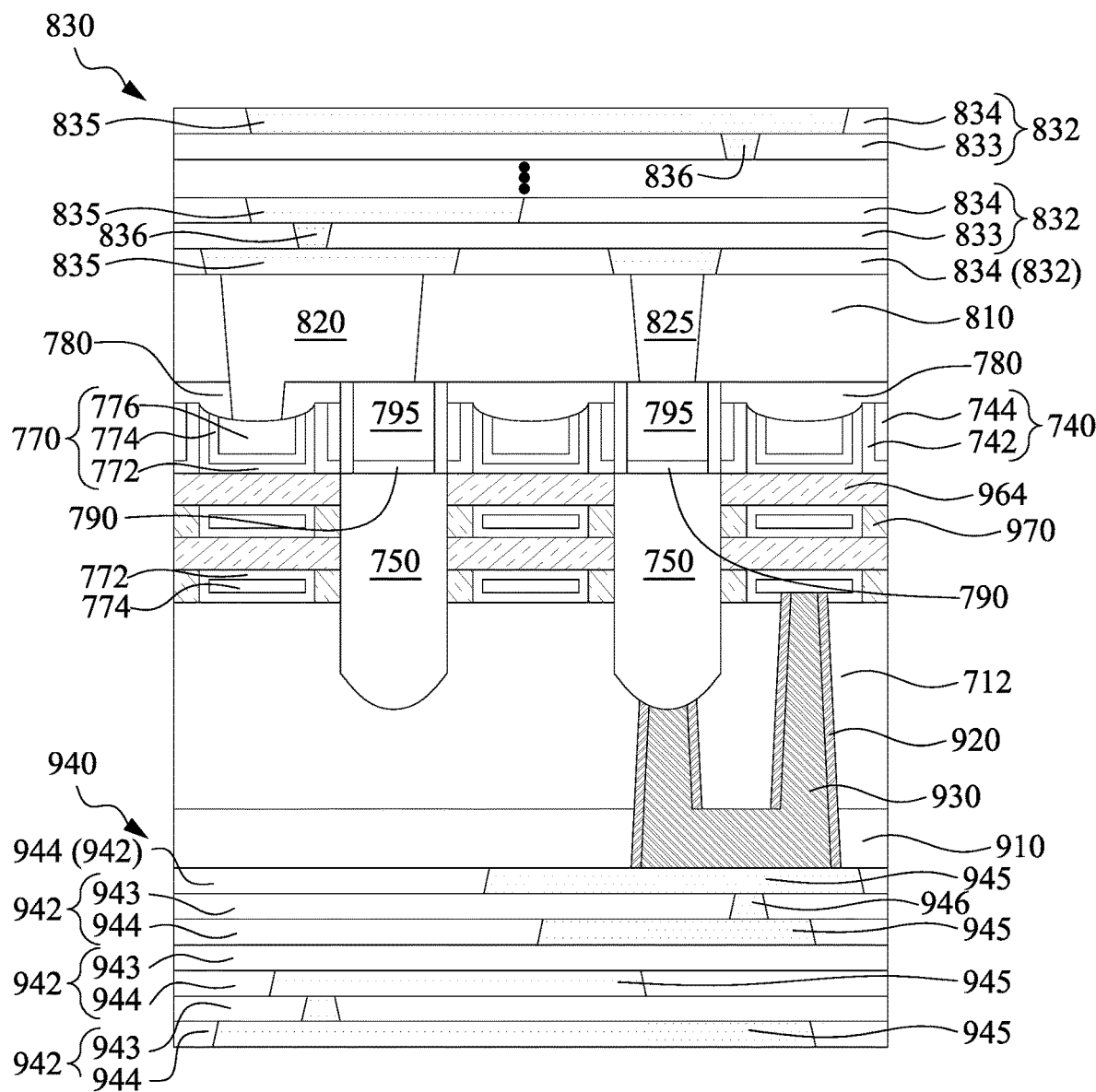
Figure 49D:
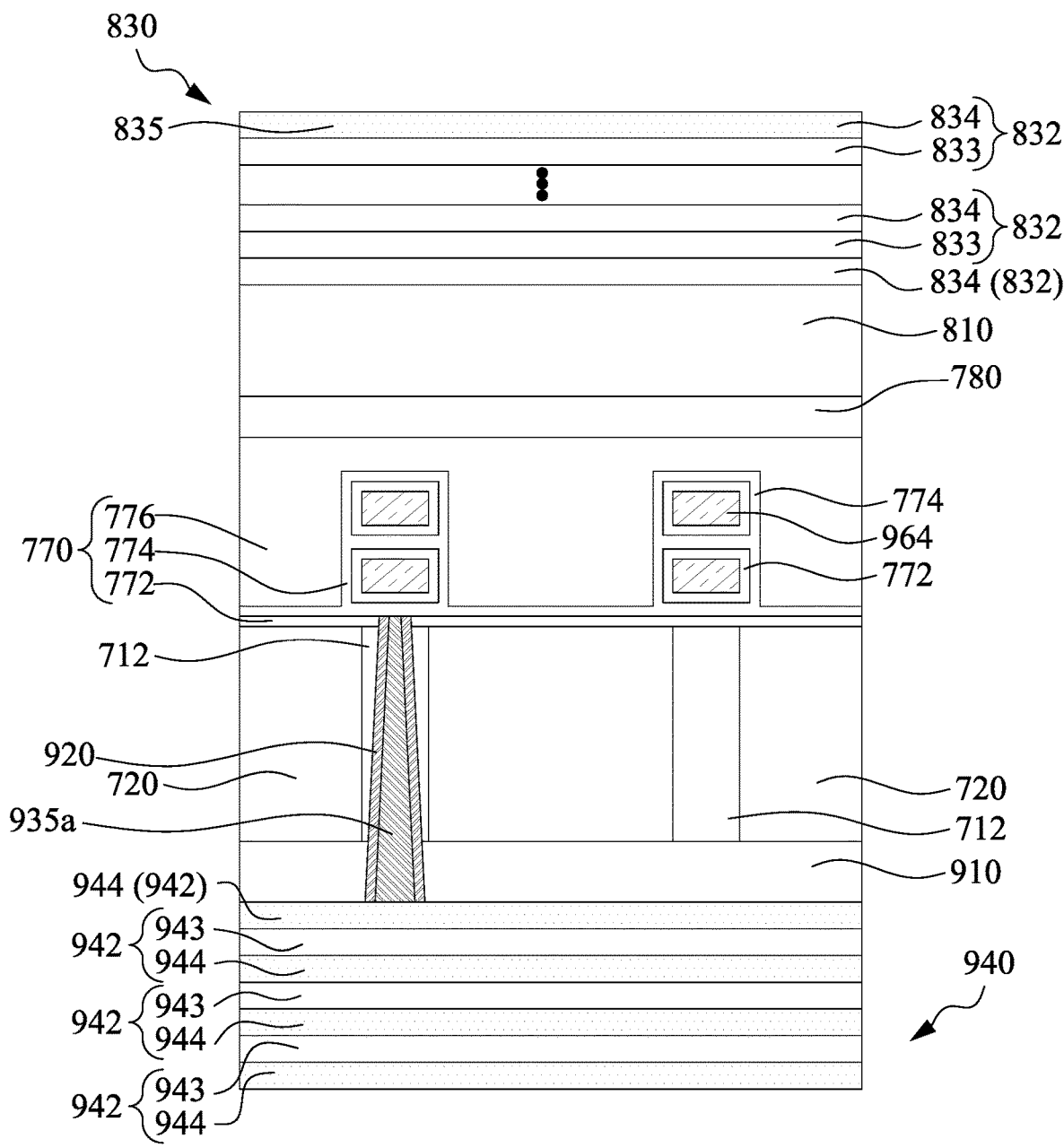
Figure 49E:
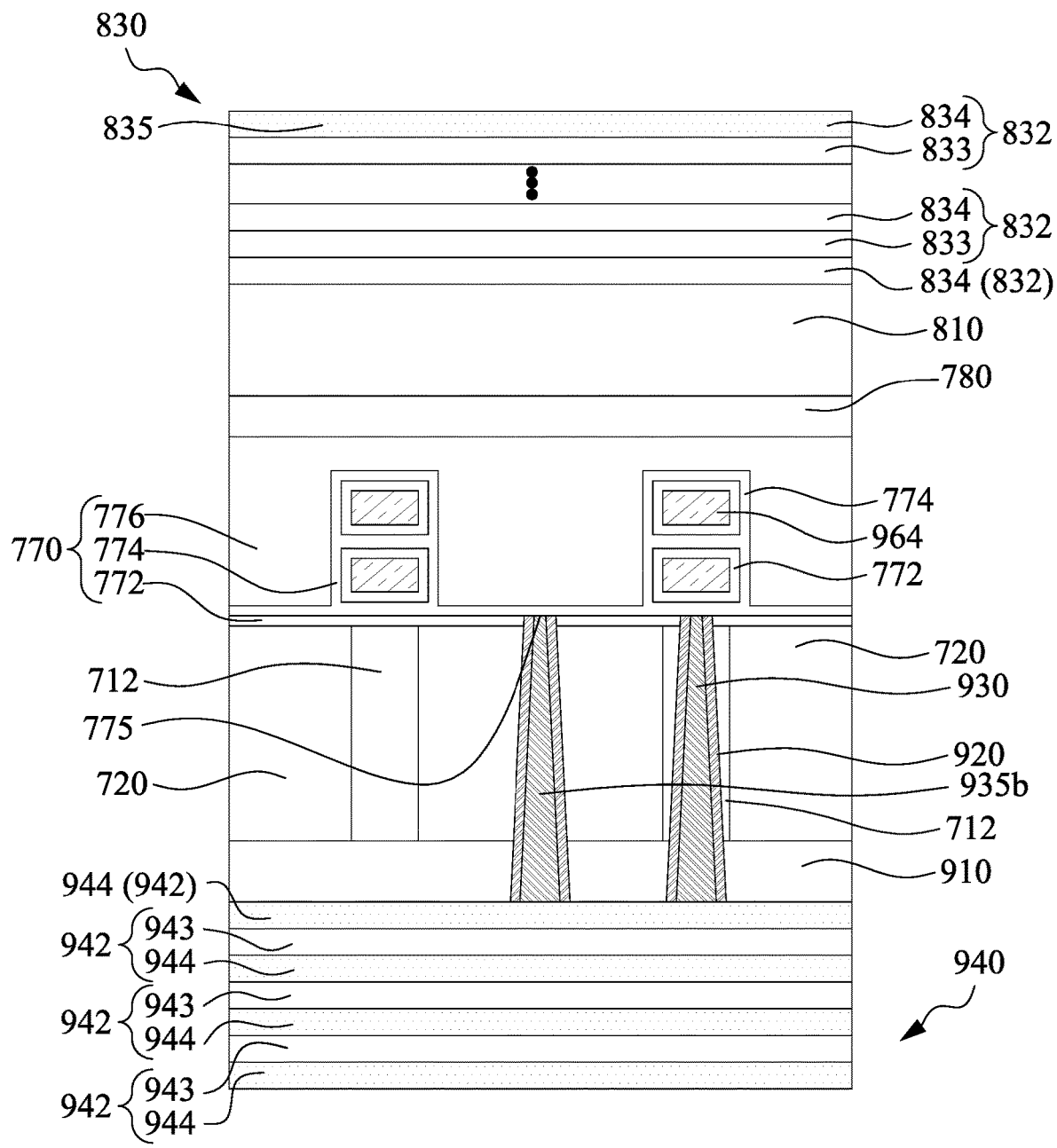
Figure 49F:
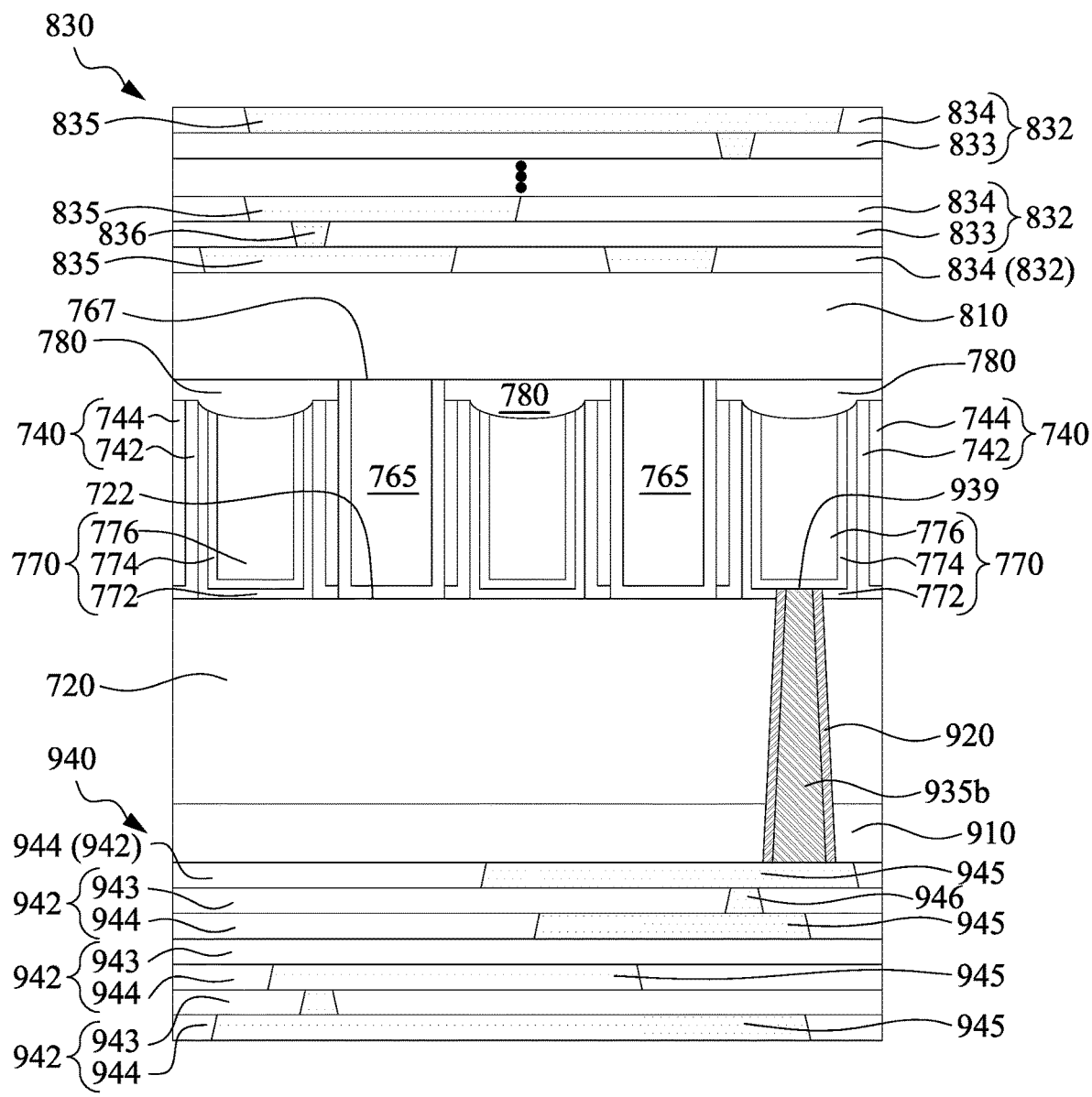

Reference is made to FIGS. 49A-49F, where FIG. 49B is a cross-sectional view taken along line I-I of FIG. 49A, FIG. 49C is a cross-sectional view taken along line II-II of FIG. 49A, FIG. 49D is a cross-sectional view taken along line III-III of FIG. 49A, FIG. 49E is a cross-sectional view taken along line IV-IV of FIG. 49A, and FIG. 49F is a cross-sectional view taken along line V-V of FIG. 49A. Optionally, the carrier substrate 840 (see FIGS. 48A and 48B) is removed, and the semiconductor device in FIGS. 48A and 48B is flipped upside down, such that the front-side MLI structure 830 faces upwards, as illustrated in FIGS. 49A-49F.

As shown in FIGS. 49A and 49B, the semiconductor device 300 includes the second semiconductor layers 964, the gate structures 770 wrapping around the second semiconductor layers 964, the source/drain epitaxial structures 750 electrically connected to the second semiconductor layers 964 and on opposite sides of the gate structures 770, and backside vias under the gate structures 770. For example, the semiconductor device 300 further includes a gate via contact 935a under the gate structure 770. As shown in FIGS. 49B and 49D, the gate via contact 935a passes through the base portion 712 and the gate dielectric layer 772 to the work function metal layer 774 (or to the fill metal 776 in some embodiments). As such, the gate via contact 935a is electrically connected to one of the gate structures 770. In some embodiments, the gate via contact 935a is in contact with a bottom surface 775 of the work function metal layer 774. As mentioned above, since the gate via contact 935a is formed from a backside of the semiconductor device 300, the gate via contact 935a tapers upward.

The semiconductor device 300 further includes the spacer structures 920. One of the spacer structures 920 laterally surrounds the gate via contact 935a to electrically isolate the gate via contact 935a from the base portion 712. Stated another way, the spacer structure 920 is in contact with the gate via contact 935a and the base portion 712. Further, the spacer structure 920 is in contact with the gate dielectric layer 772.

For example, the semiconductor device 300 further includes a gate via contact 935b under the gate structure 770. As shown in FIGS. 49E and 49F, the gate via contact 935b passes through (or is embedded in) the isolation structure 720 and the gate dielectric layer 772 to the work function metal layer 774 (or to the fill metal 776 in some embodiments). As such, the gate via contact 935b is electrically connected to one of the gate structures 770. In some embodiments, the gate via contact 335b is in contact with the bottom surface 775 of the work function metal layer 774. As mentioned above, since the gate via contact 935b is formed from a backside of the semiconductor device 300, the gate via contact 935b tapers upward.

Another one of the spacer structures 920 laterally surrounds the gate via contact 935b. Stated another way, the spacer structure 920 is in contact with the gate via contact 935b and isolation structure 720. Further, the spacer structure 920 is in contact with the gate dielectric layer 772.

For example, the semiconductor device 300 further includes a backside butted contact 930 under the gate structure 770 and the source/drain epitaxial structure 750. As shown in FIGS. 49C and 49E, the backside butted contact 930 passes through the base portion 712 and the gate dielectric layer 772 to the work function metal layer 774 (or to the fill metal 776 in some embodiments). As such, the backside butted contact 930 is electrically connected to one of the gate structures 770. In some embodiments, the backside butted contact 930 is in contact with the bottom surface 775 of the work function metal layer 774. As mentioned above, since the backside butted contact 930 is formed from a backside of the semiconductor device 300, the backside butted contact 930 tapers upward.

Some of the spacer structures 920 laterally surround the backside butted contact 930. Stated another way, the spacer structures 920 are in contact with the backside butted contact 930 and base portion 712. Further, the spacer structures 920 are in contact with the gate dielectric layer 772 and the source/drain epitaxial structure 750.

The semiconductor device 300 includes at least one of the gate via contact 935a, 935b and the backside butted contact 930. In some embodiments, the semiconductor device 300 further includes front-side vias, such as the front-side butted contact 820 and/or the source/drain via 825 as shown in FIG. 49B. Further, the semiconductor device 300 may include front-side gate via contacts formed in the second ILD layer 810 and connected to the gate structure 770. In some embodiments, each of the gate via contact 935a, 935b and the backside butted contact 930 has a width or length in a range of about 8 nm to about 30 nm, and has a height in a range of about 10 nm to about 50 nm.

The gate structure 770 is between the backside vias (e.g., the gate via contact 935a, 935b and the backside butted contact 930) and the dielectric cap 780. In some embodiments, a top surface 767 of the first ILD layer 765 is higher than a top surface 939 of the backside vias (e.g., the gate via contact 935a, 935b and the backside butted contact 930), and a top surface 722 of the isolation structure 720 is lower than the top surface 939 of the backside vias (e.g., the gate via contact 935a, 935b and the backside butted contact 930). The backside vias (e.g., the gate via contact 935a, 935b and the backside butted contact 930) are electrically isolated from the front-side MLI structure 830.

Figure 50:
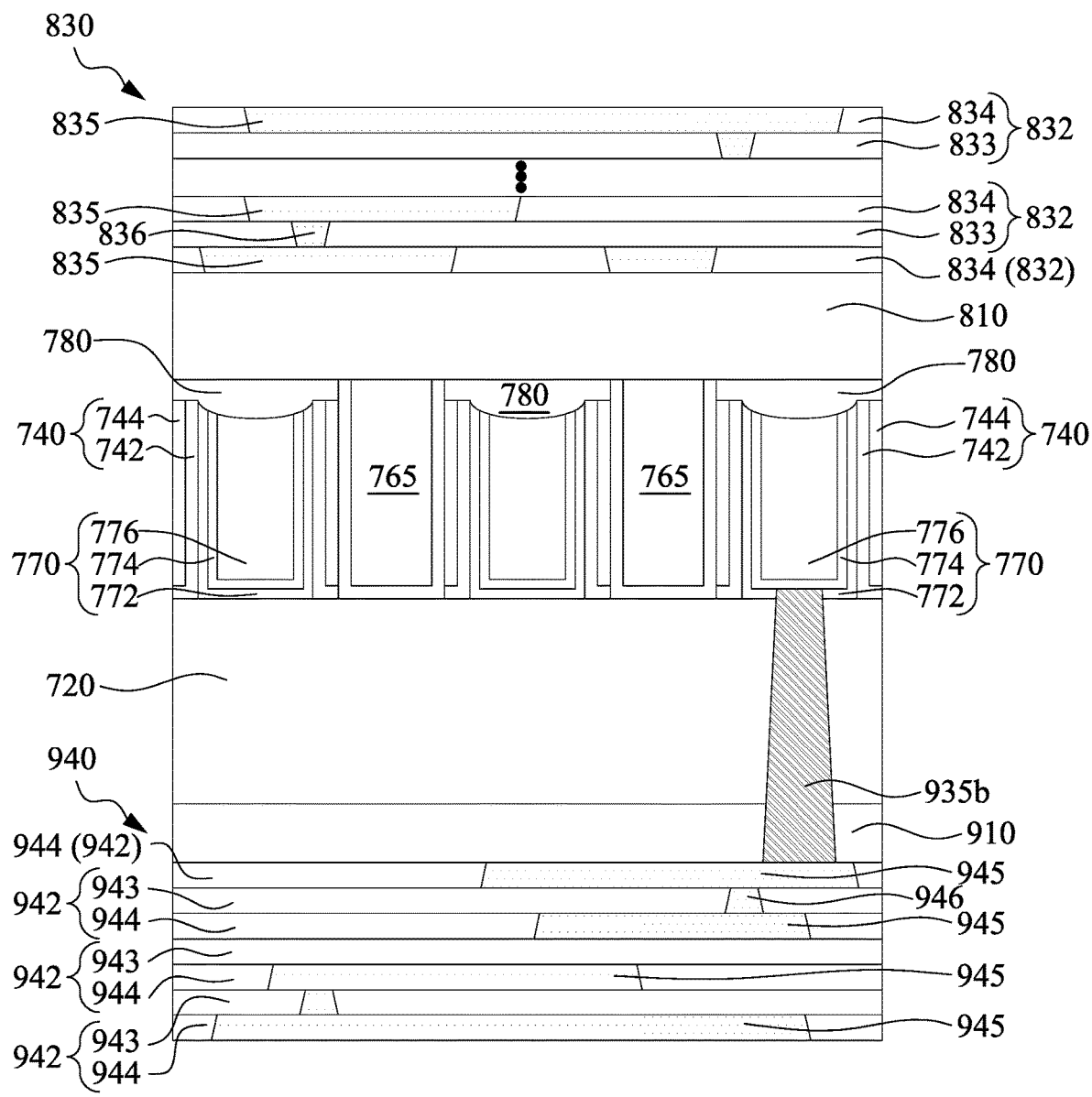
FIG. 50 is a cross-sectional view of a semiconductor device in accordance with some embodiments of the present disclosure.

FIG. 50 is a cross-sectional view of a semiconductor device (or an integrated circuit structure) 300a in accordance with some embodiments of the present disclosure. The difference between the semiconductor device 300a in FIG. 50 and the semiconductor device 300 in FIG. 49F is the present of the spacer structure. In FIG. 50, the spacer structure 920 (see FIG. 49F) is omitted. That is, the gate via contact 935b is in contact with the isolation structure 720 and the third ILD layer 910. Other relevant structural details of the semiconductor device 300a in FIG. 50 are the same as or similar to the semiconductor device 300 in FIG. 49F, and, therefore, a description in this regard will not be repeated hereinafter.

Figure 51:
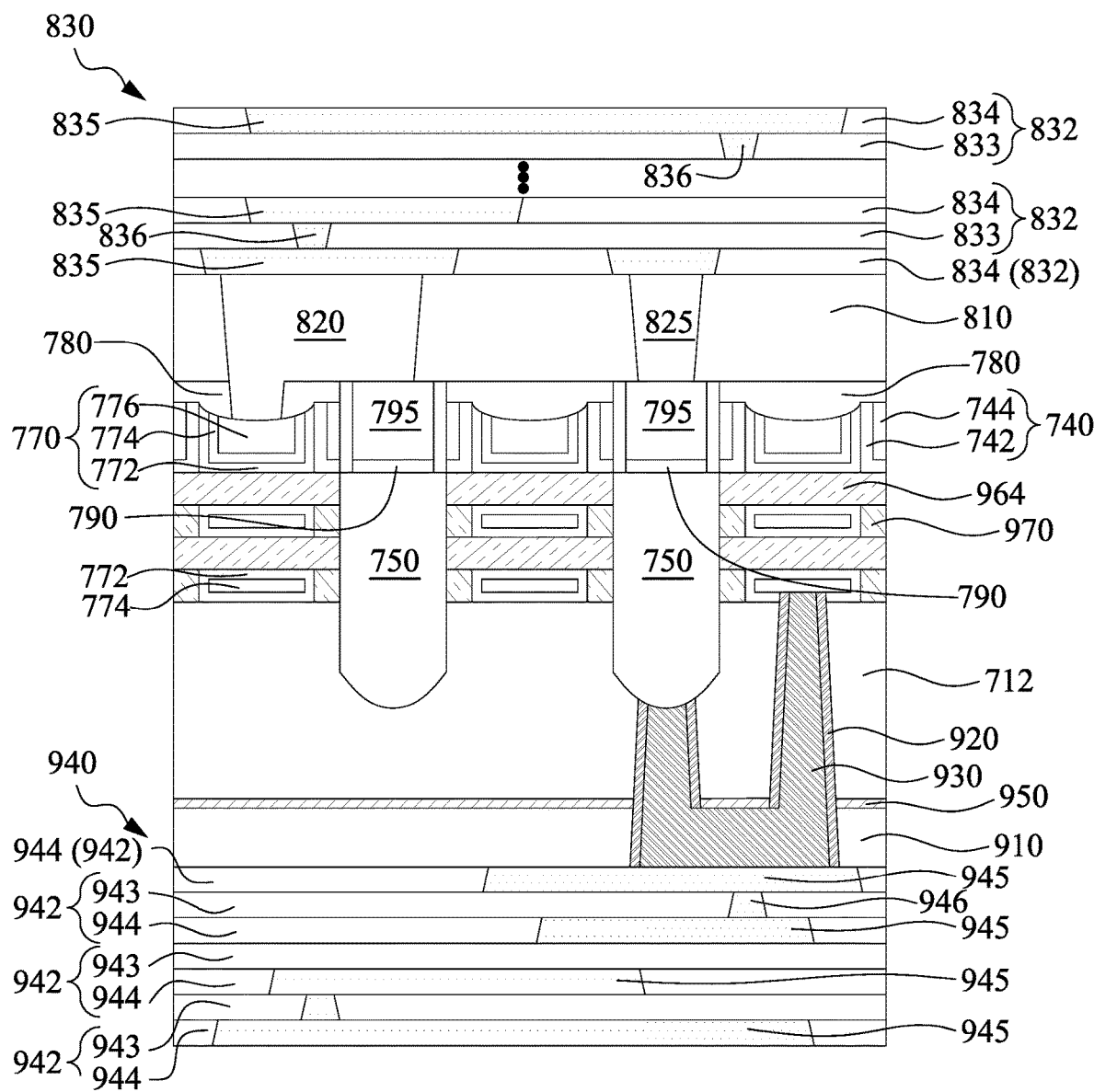
FIG. 51 is a cross-sectional view of a semiconductor device in accordance with some embodiments of the present disclosure.

FIG. 51 is a cross-sectional view of a semiconductor device (or an integrated circuit structure) 300b in accordance with some embodiments of the present disclosure. The difference between the semiconductor device 300b in FIG. 51 and the semiconductor device 300 in FIG. 49C is the present of an etch stop layer. In FIG. 51, an etch stop layer 950 is formed to cover the base portions 712 and the isolation structures 720 prior to the formation of the third ILD layer 910. As such, the etch stop layer 950 is between the third ILD layer 910 and the base portions 712 and/or between the third ILD layer 910 and the isolation structures 720. The etch stop layer 950 can be an etch stop layer for etching the recess R4 (see FIG. 46C). The etch stop layer 950 is made of a material different from the third ILD layer 910, such that the etching process for forming the recess R4 has an etching selectivity between the etch stop layer 950 and the third ILD layer 910. For example, the etch stop layer 950 is a nitride layer (e.g., silicon nitride) and the third ILD layer 910 is an oxide layer (e.g., silicon dioxide). Other relevant structural details of the semiconductor device 300b in FIG. 51 are the same as or similar to the semiconductor device 300 in FIG. 49C, and, therefore, a description in this regard will not be repeated hereinafter.

FIGS. 52A-59F illustrate a method for manufacturing a semiconductor device (or an integrated circuit structure) 400 at various stages in accordance with some embodiments of the present disclosure. In addition to the semiconductor device 400, FIGS. 52A, 53A, 54-58A, and 59A depict X-axis, Y-axis, and Z-axis directions. In some embodiments, the semiconductor device shown in FIGS. 52A-59F may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

FIGS. 52A, 53A, 54-57, 58A, and 59A are perspective views of some embodiments of the semiconductor device 400 at intermediate stages during fabrication. FIGS. 52B, 53B, 58B, and 59B are cross-sectional views of some embodiments of the semiconductor device 400 at intermediate stages during fabrication along a first cut (e.g., cut I-I), which is along a lengthwise direction of the channel (semiconductor fin). FIGS. 52C, 53C, 58C, and 59C are cross-sectional views of some embodiments of the semiconductor device 400 at intermediate stages during fabrication along a second cut (e.g., cut II-II), which is along a lengthwise direction of another channel (another semiconductor fin). FIGS. 53D, 58D, and 59D cross-sectional views of some embodiments of the semiconductor device 400 at intermediate stages during fabrication along a third cut (e.g., cut III-III), which is in one of the gate regions and perpendicular to the lengthwise direction of the channel. FIGS. 53E, 58E, and 59E cross-sectional views of some embodiments of the semiconductor device 400 at intermediate stages during fabrication along a fourth cut (e.g., cut IV-IV), which is in another of the gate regions and perpendicular to the lengthwise direction of the channel. FIGS. 53F, 58F, and 59F cross-sectional views of some embodiments of the semiconductor device 400 at intermediate stages during fabrication along a fifth cut (e.g., cut V-V), which is in the isolation region and is parallel to the lengthwise direction of the channel.

Figure 52A:
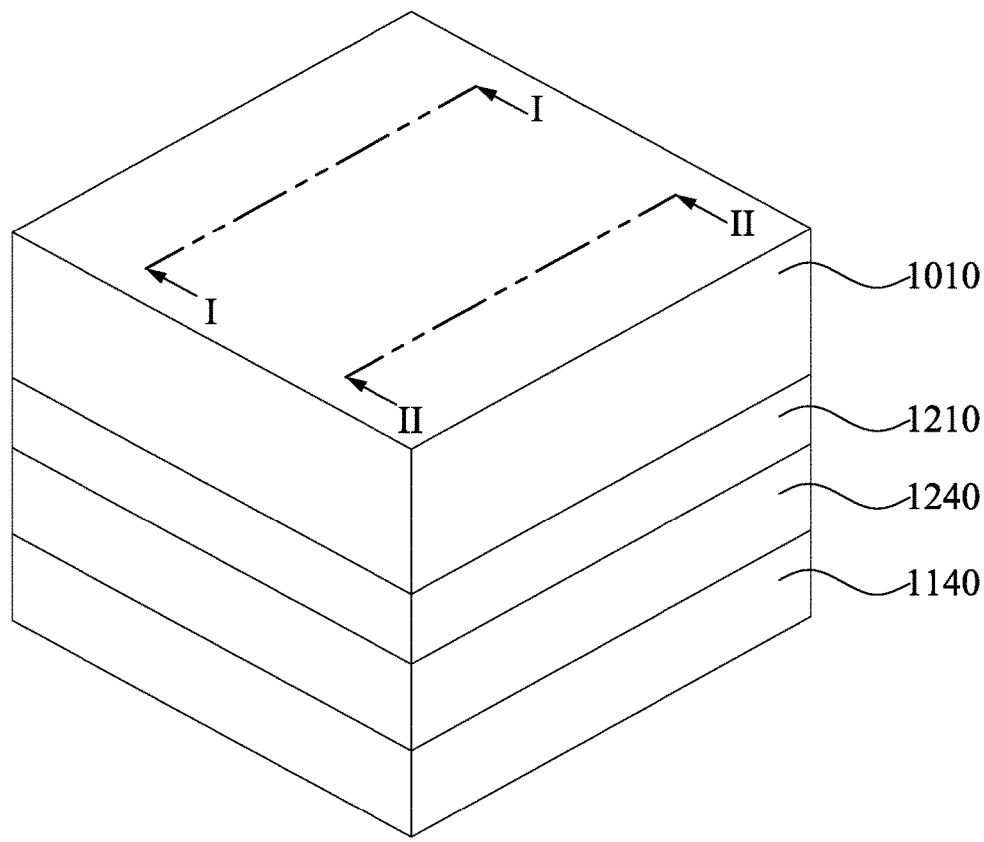
FIGS. 52A-59F illustrate a method for manufacturing a semiconductor device at various stages in accordance with some embodiments of the present disclosure.
Figure 52B:
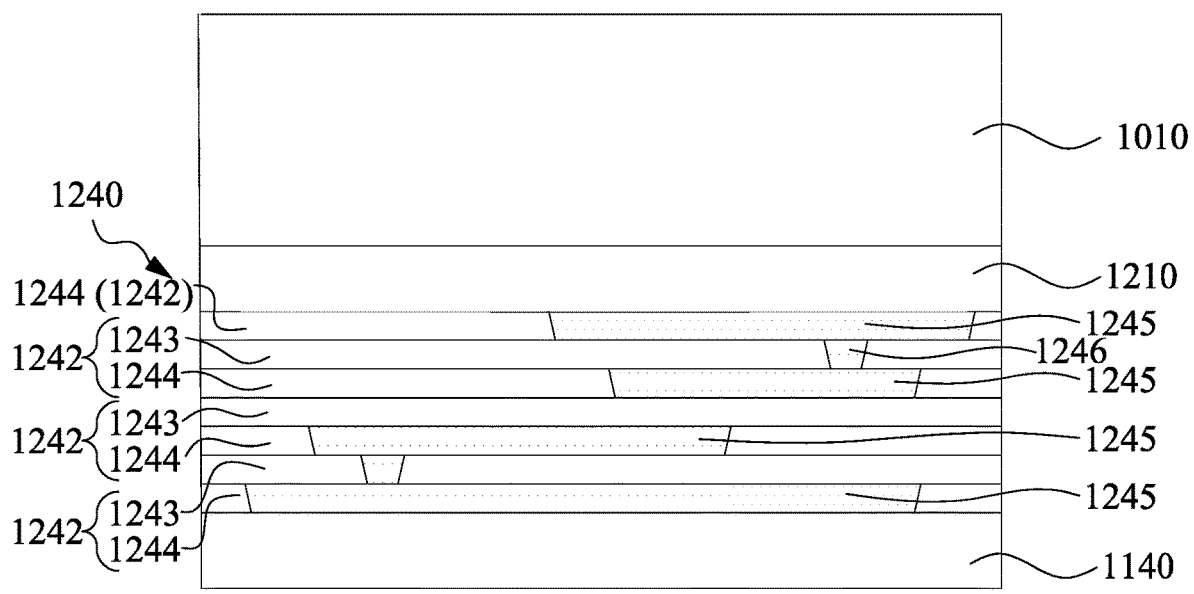
Figure 52C:
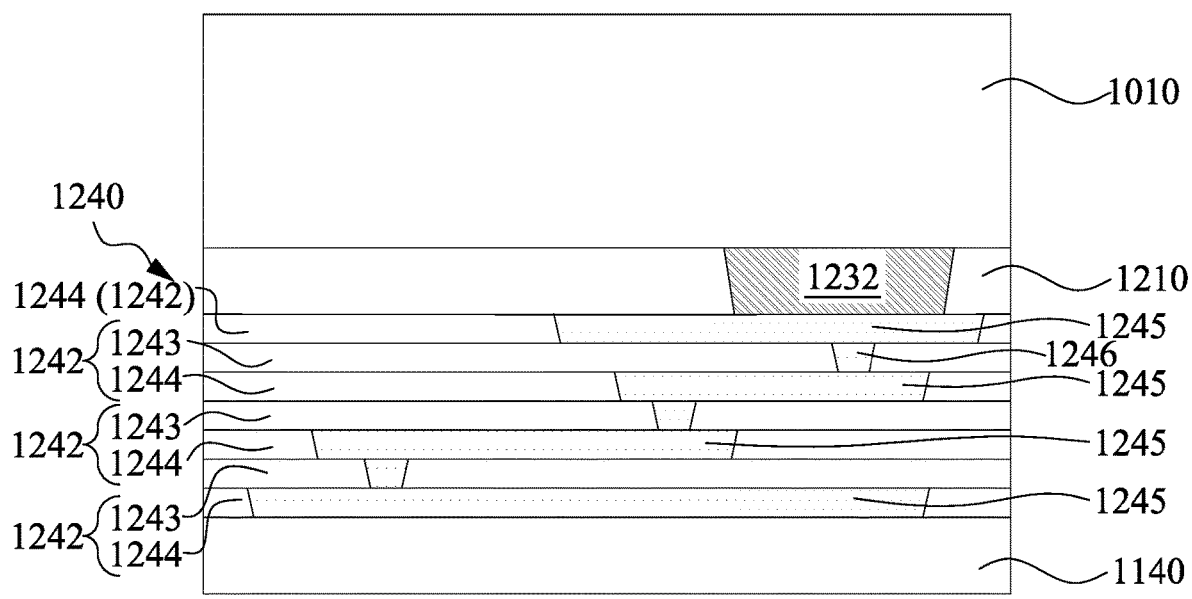

Reference is made to FIGS. 52A-52C, where FIG. 52B is a cross-sectional view taken along line I-I of FIG. 52A, and FIG. 52C is a cross-sectional view taken along line II-II of FIG. 52A. A carrier substrate 1140 is provided. Materials, configurations, dimensions, processes and/or operations regarding the carrier substrate 1140 are similar to or the same as the carrier substrate 540 of FIG. 23B.

Subsequently, a backside MLI structure 1240 is formed over the carrier substrate 1140. The backside MLI structure 1240 may include a plurality of backside metallization layers 1242. For clarity, the backside metallization layers 1242 are shown in FIGS. 52B-52C and are omitted in FIG. 52A. The number of backside metallization layers 1242 may vary according to design specifications of the integrated circuit structure. Only three backside metallization layers 1242 are illustrated in FIGS. 52B-52C for the sake of simplicity. Except the topmost backside metallization layers 1242, the other backside metallization layers 1242 each includes a first backside inter-metal dielectric (IMD) layer 1243 and a second backside IMD layer 1244. The first backside IMD layers 1243 are formed over the corresponding second backside IMD layers 1244. The backside metallization layers 1242 include one or more horizontal interconnects, such as backside metal lines 1245, respectively extending horizontally or laterally in the second backside IMD layers 1244 and vertical interconnects, such as backside conductive vias 1246, respectively extending vertically in the first backside IMD layers 1243. Materials, configurations, dimensions, processes and/or operations regarding the backside MLI structure 1240 are similar to or the same as the backside MLI structure 640 of FIG. 23B.

Subsequently, a third ILD layer 1210 is formed to cover the backside MLI structure 1240. Materials, configurations, dimensions, processes and/or operations regarding the third ILD layer 1210 are similar to or the same as the third ILD layer 310 of FIG. 20A.

A conductive structure 1232 is then formed in the third ILD layer 1210 as shown in FIG. 52C. For example, at least one opening is formed in the third ILD layer 1210, and conductive materials are filled in the opening to form the conductive structure 1232. The conductive structure 1232 is connected to one of the backside metal lines 1245.

Subsequently, a substrate 1010 is formed over the third ILD layer 1210. Materials, configurations, dimensions, processes and/or operations regarding the substrate 1010 are similar to or the same as the substrate 410 of FIG. 24A.

Figure 53A:
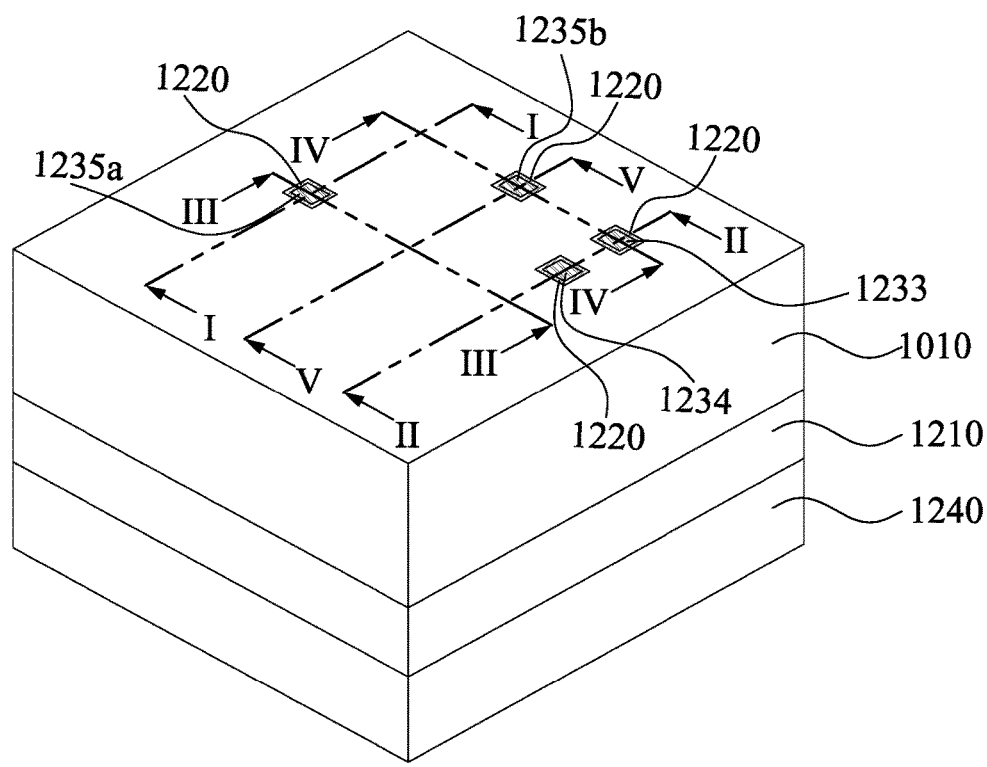
Figure 53B:
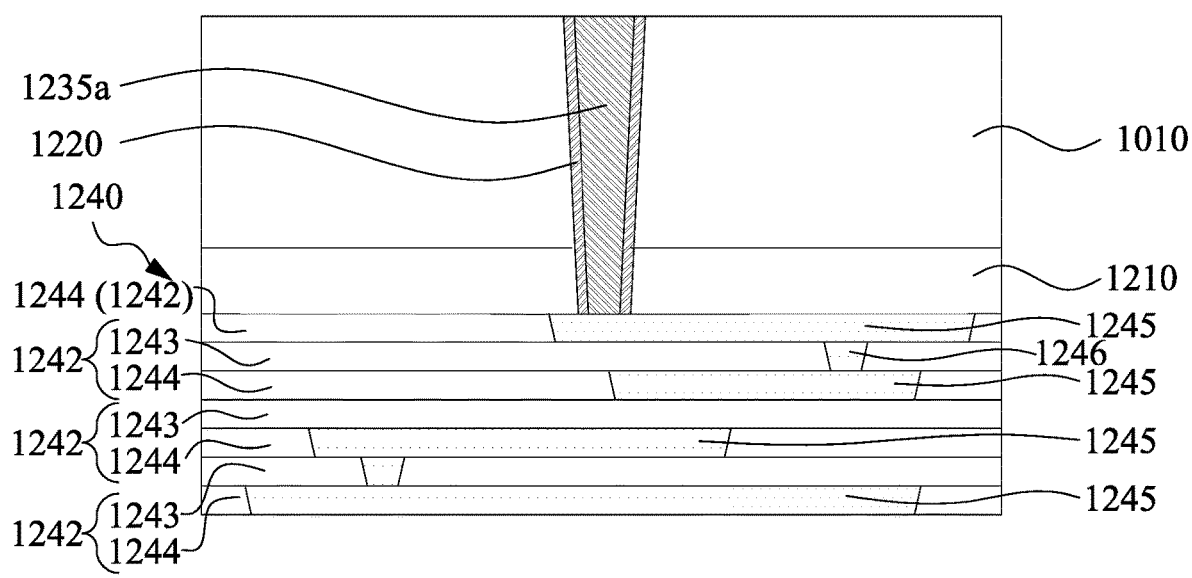
Figure 53C:
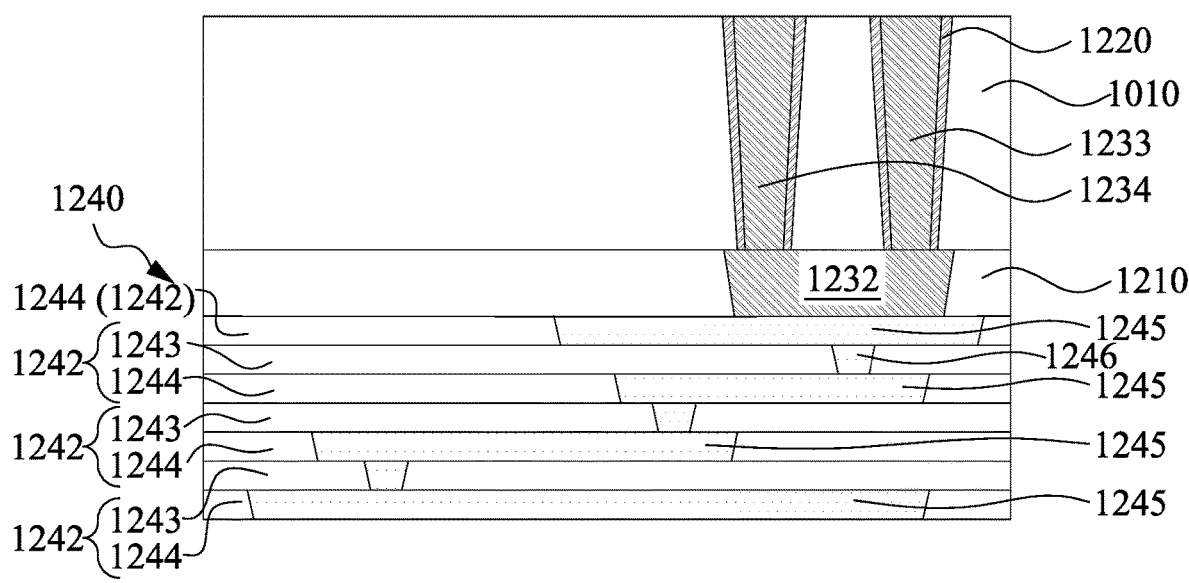
Figure 53D:
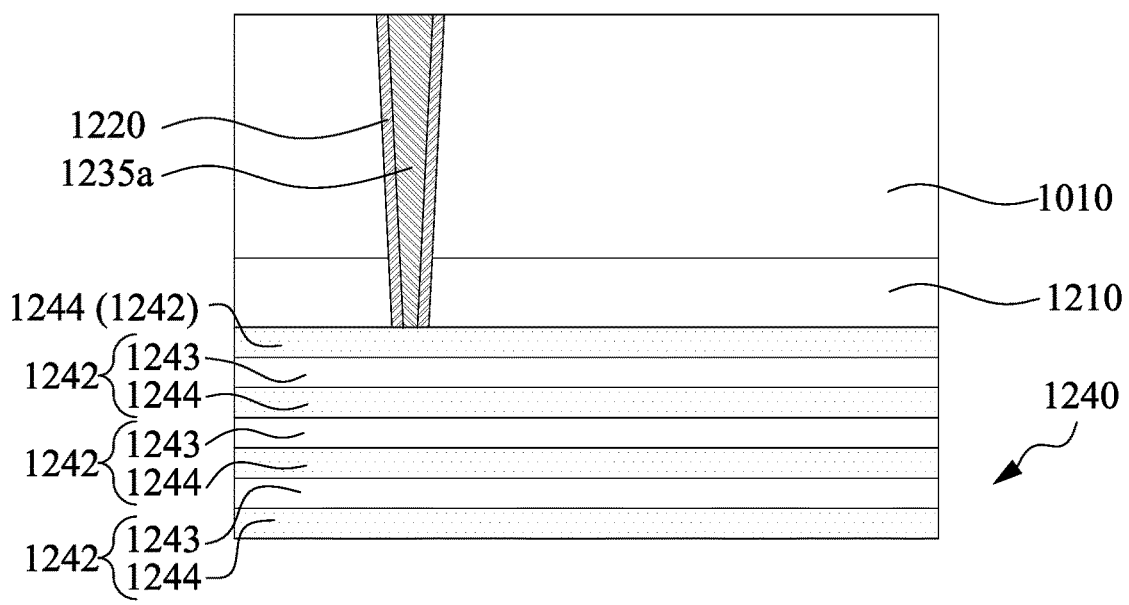
Figure 53E:
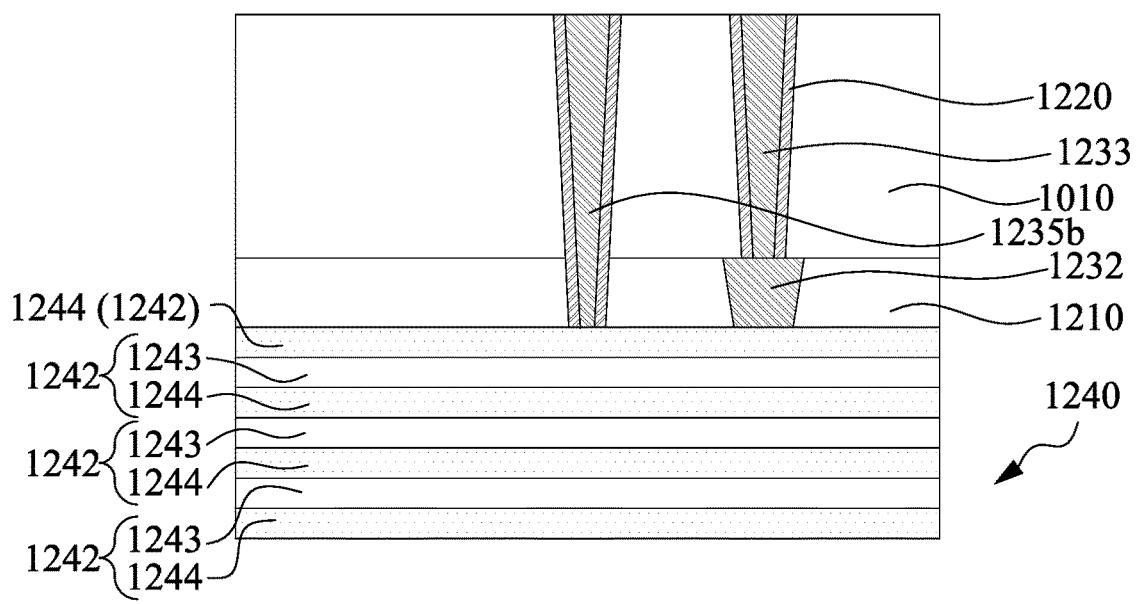
Figure 53F:
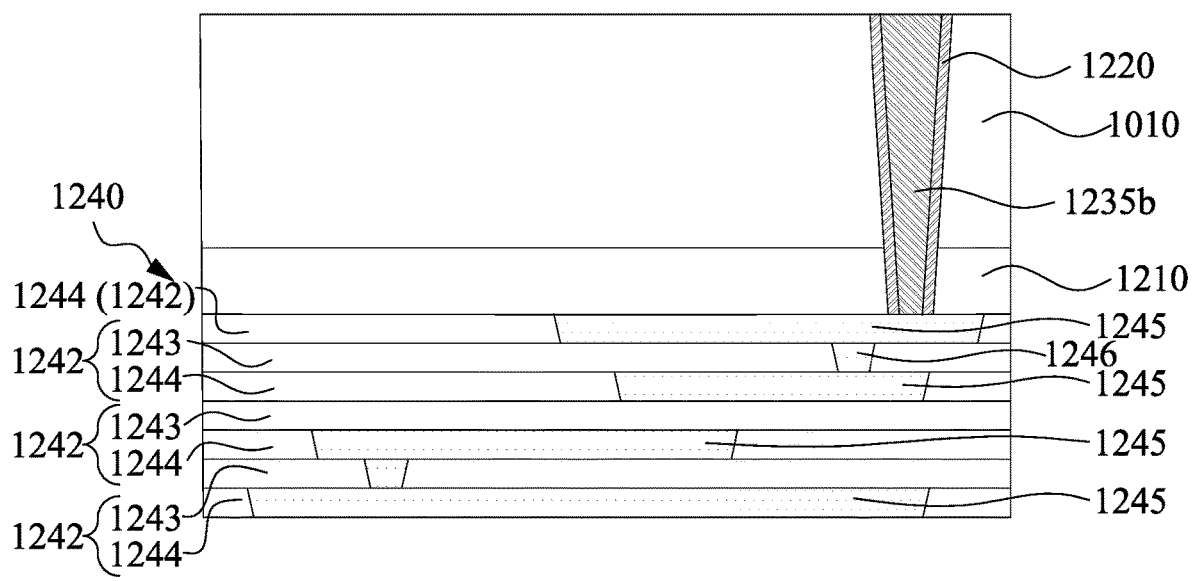

Reference is made to FIGS. 53A-53F, where FIG. 53B is a cross-sectional view taken along line I-I of FIG. 53A, FIG. 53C is a cross-sectional view taken along line II-II of FIG. 53A, FIG. 53D is a cross-sectional view taken along line III-III of FIG. 53A, FIG. 53E is a cross-sectional view taken along line IV-IV of FIG. 53A, and FIG. 53F is a cross-sectional view taken along line V-V of FIG. 53A. The structure of FIG. 52A undergoes the processes similar to the processes shown in FIGS. 25A-27F. That is, the carrier substrate 1140 (see FIG. 52A) is removed in some embodiments. The carrier substrate 1140 can be removed after the formation of the front-side MLI structure 1130 (see FIG. 59A) in some other embodiments. Gate via openings and source/drain via openings are then formed in the substrate 1010 and extend to the backside metal lines 1245 or the conductive structure 1232. Spacer structures 1220 are formed on inner sidewalls of the gate via openings and the source/drain via opening. Materials, configurations, dimensions, processes and/or operations regarding the spacer structures 1220 are similar to or the same as the spacer structures 320 of FIGS. 17A-17F. Gate via contacts 1235a, 1235b and backside butted contacts (or butted via) 1233, 1234 are formed in the gate via openings and the source/drain via opening. Materials, configurations, dimensions, processes and/or operations regarding the gate via contacts 1235a, 1235b and the backside butted contacts 1233, 1234 are similar to or the same as the gate via contacts 335a, 335b and the backside butted contacts 330 of FIG. 18A.

Figure 54:
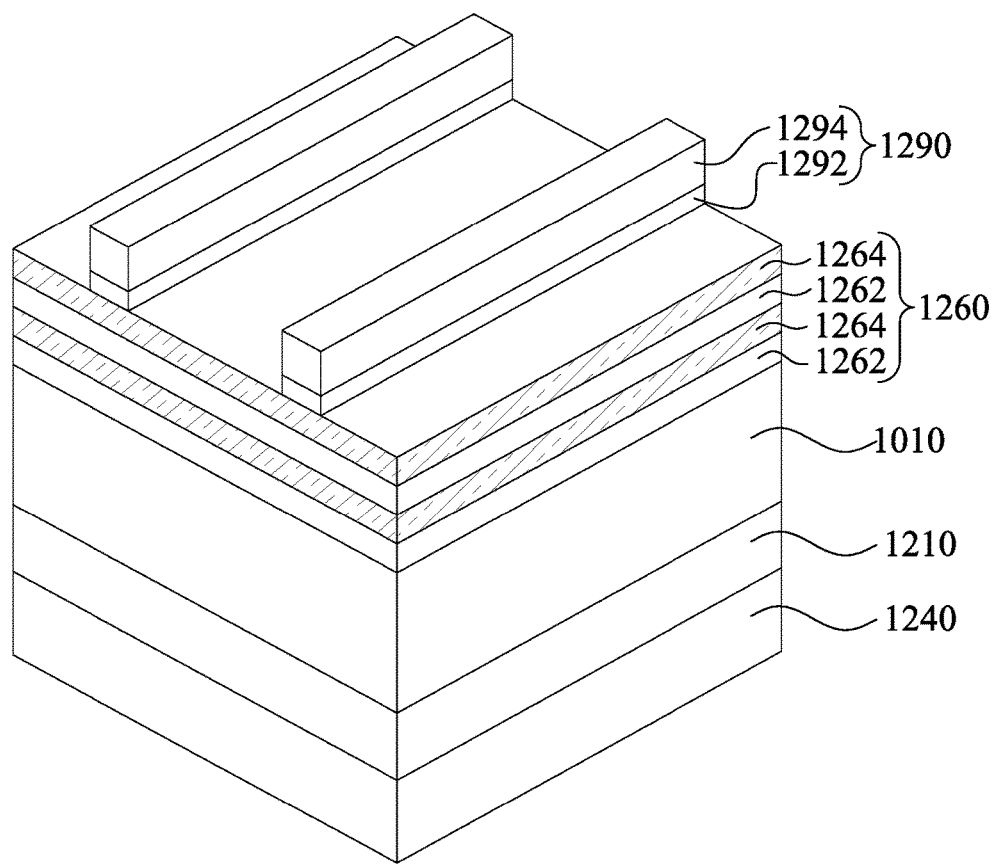

Reference is made to FIG. 54. A stacked structure 1260 is formed on the substrate 1010 through epitaxy, such that the stacked structure 1260 forms crystalline layers. The stacked structure 1260 includes first semiconductor layers 1262 and second semiconductor layers 1264 stacked alternately. In some embodiments, the first semiconductor layers 1262 are referred to as sacrificial layers, and the second semiconductor layers 1264 are referred to as channel layers. Materials, configurations, dimensions, processes and/or operations regarding the stacked structure 1260 are similar to or the same as the stacked structure 960 of FIG. 35.

Subsequently, a patterned mask layer 1290 is formed above the stacked structure 1260. In some embodiments, the patterned mask layer 1290 includes a first mask layer 1292 and a second mask layer 1294. Materials, configurations, dimensions, processes and/or operations regarding the patterned mask layer 1290 are similar to or the same as the patterned mask layer 990 of FIG. 35.

Figure 55:
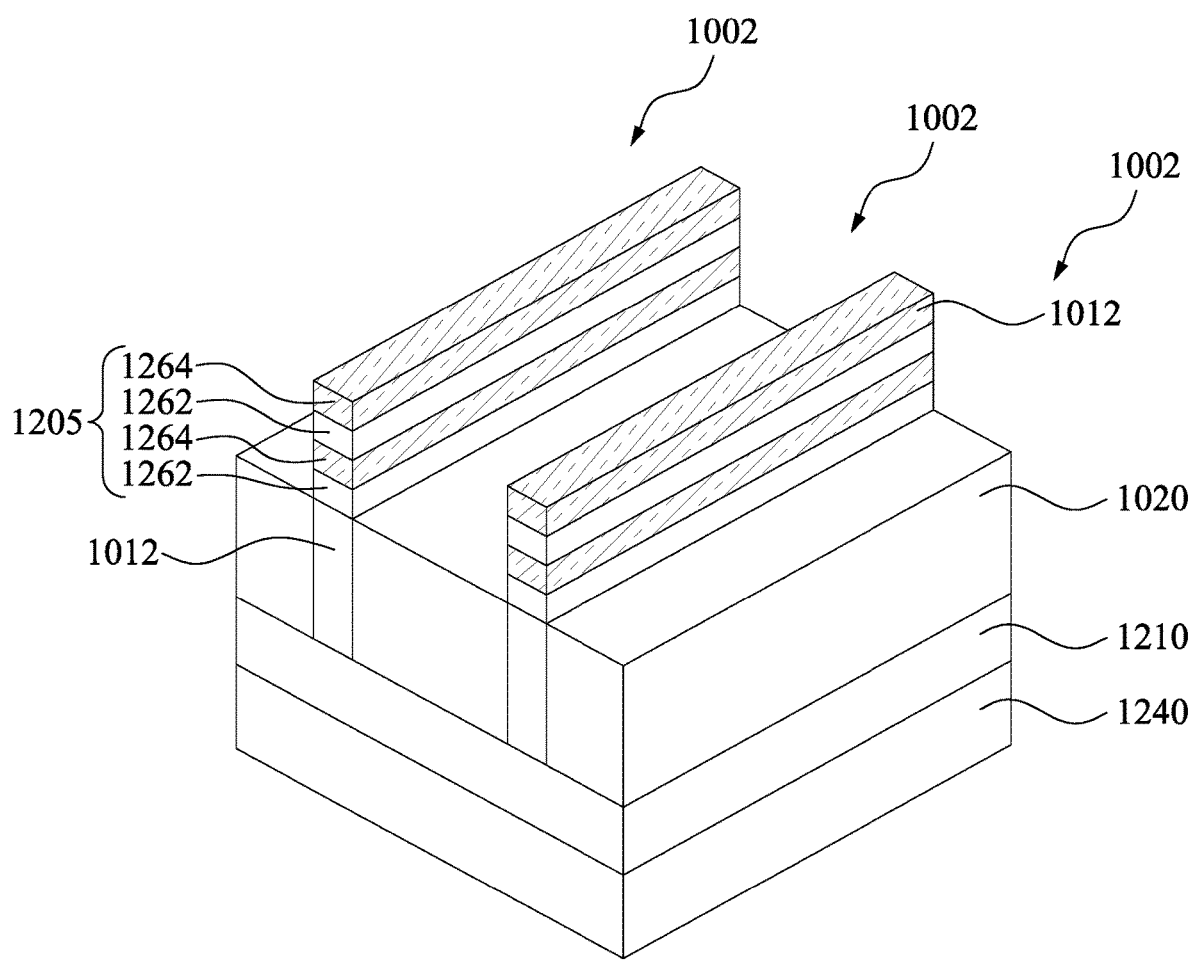

The structure of FIG. 54 undergoes the processes similar to the processes shown in FIGS. 36-44B. That is, as shown in FIG. 55, the stacked structure 1260 (see FIG. 54) is patterned by using the patterned mask layer 1290 as an etch mask, such that the stacked structure 1260 is patterned into fin structures 1205 and trenches 1202 extending in the X direction. After the fin structures 1205 are formed, isolation structures 1020 are formed above in the trenches 1202 so that the fin structures 1205 are exposed. Materials, configurations, dimensions, processes and/or operations regarding the isolation structures 1020 are similar to or the same as the isolation structures 120 of FIG. 2.

Figure 56:
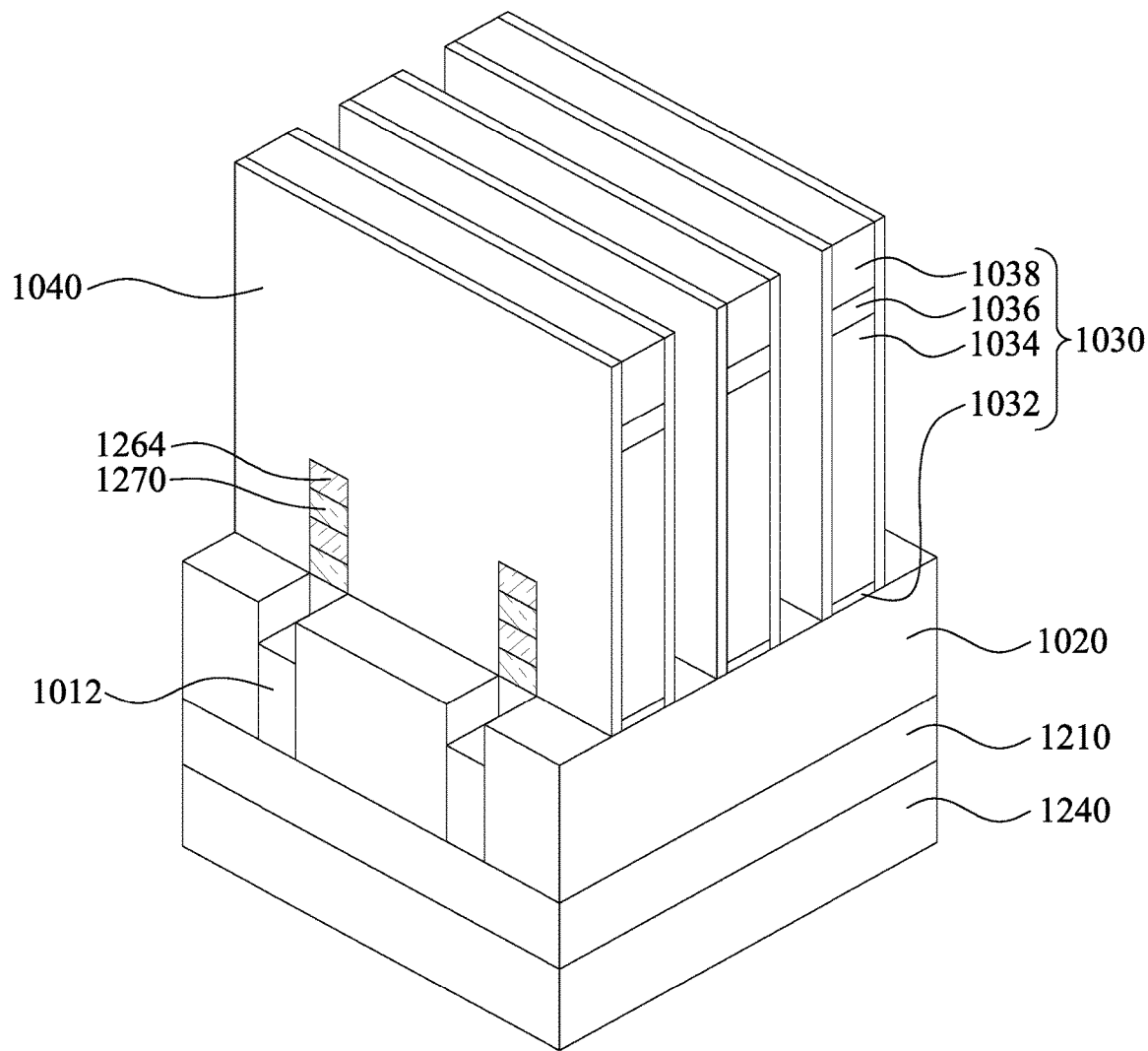

As shown in FIG. 56, dummy gate structures 1030 including dummy gate dielectric layers 1032, dummy gate electrodes 1034, oxide mask layers 1036, and nitride mask layers 1038 are at least partially disposed over the fin structures 1205. Materials, configurations, dimensions, processes and/or operations regarding the dummy gate structures 1030 are similar to or the same as the dummy gate structures 130 of FIG. 3.

Gate spacers 1040 including first spacer layers 1042 and second spacer layers 1044 (see FIG. 58B) are formed on sidewalls of the dummy gate structures 1030. Materials, configurations, dimensions, processes and/or operations regarding the gate spacers 1040 are similar to or the same as the gate spacers 140 of FIG. 3.

After the formation of the gate spacers 1040 is completed, the exposed portions of the fin structures 1205 are removed by using a strained source/drain (SSD) etching process. Subsequently, the first semiconductor layers 1262 are horizontally recessed (etched) to for recesses so that the second semiconductor layers 1264 laterally extend past opposite end surfaces of the first semiconductor layers 1262. Inner spacers 1270 are respectively formed on sidewalls of the semiconductor layers 1262. Materials, configurations, dimensions, processes and/or operations regarding the inner spacers 1270 are similar to or the same as the inner spacers 970 of FIG. 41.

Figure 57:
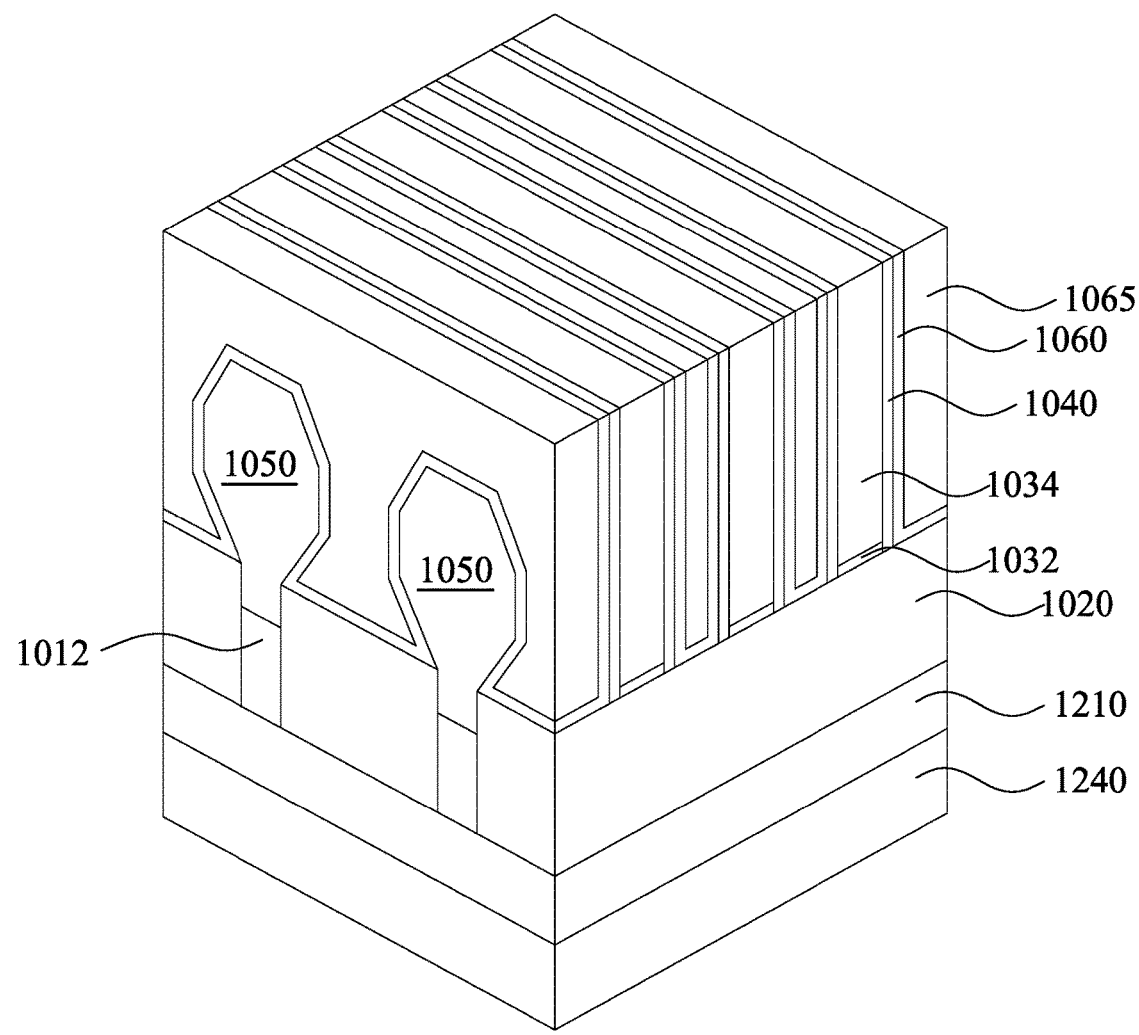

As shown in FIG. 57, after the formation of the inner spacers 1270 is completed, source/drain epitaxial structures 1050 are formed on the base portions 1012 that are not covered by the dummy gate structures 1030 and the gate spacers 1040. Materials, configurations, dimensions, processes and/or operations regarding the source/drain epitaxial structures 1050 are similar to or the same as the source/drain epitaxial structures 150 of FIG. 3.

A first interlayer dielectric (ILD) layer 1065 is formed on the source/drain epitaxial structures 1050 and the isolation structures 1020. In some embodiments, a contact etch stop layer (CESL) 1060 is also formed prior to forming the first ILD layer 1065. In some examples, after forming the first ILD layer 1065, a planarization process may be performed to remove excessive materials of the first ILD layer 1065. In some embodiments, the CMP process also removes the oxide mask layers 1036 and the nitride mask layers 1038 (as shown in FIG. 56) and exposes the dummy gate electrodes 1034. Materials, configurations, dimensions, processes and/or operations regarding the first ILD layer 1065 are similar to or the same as the first ILD layer 165 of FIG. 5. Materials, configurations, dimensions, processes and/or operations regarding the CESL 1060 are similar to or the same as the CESL 160 of FIG. 5.

Figure 58A:
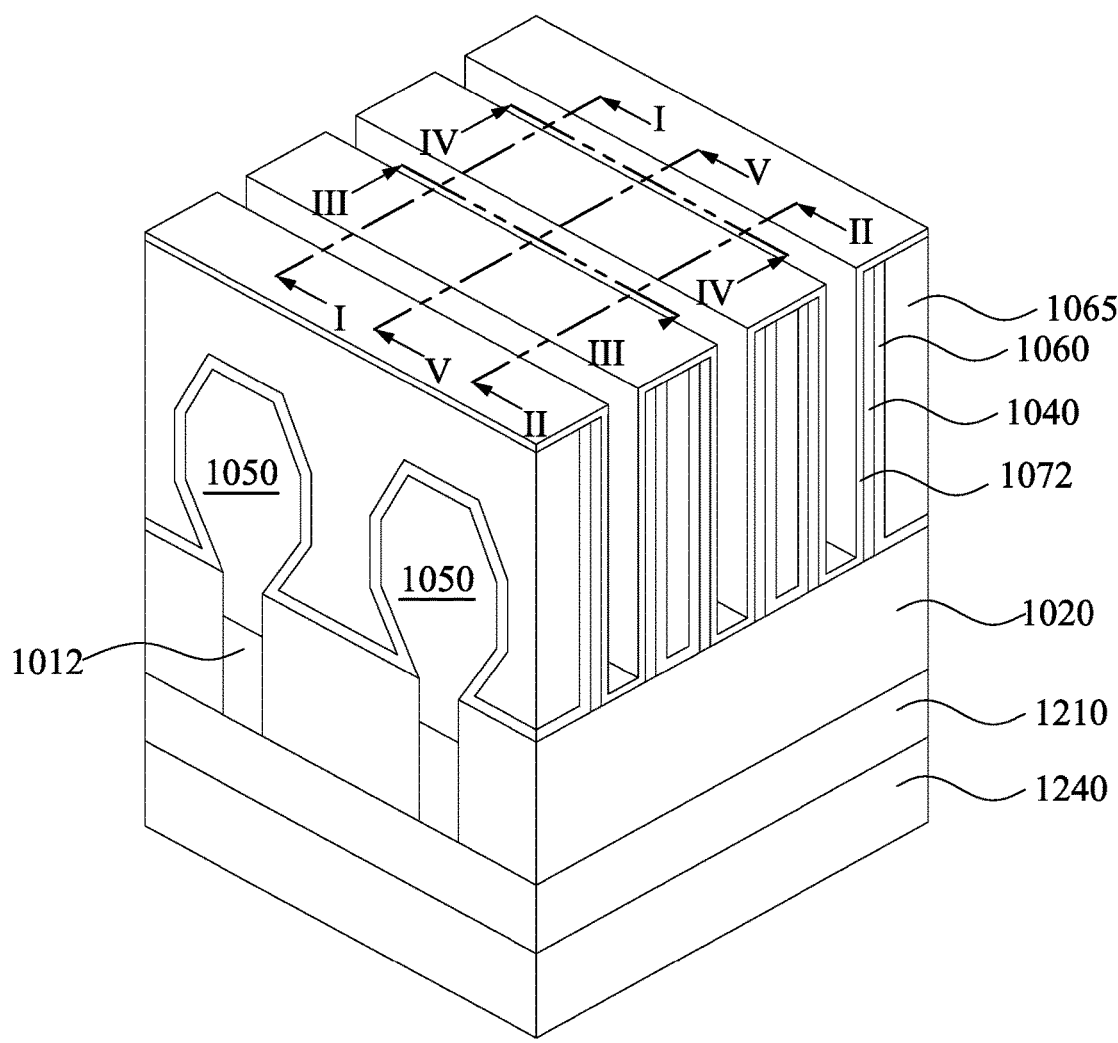
Figure 58B:
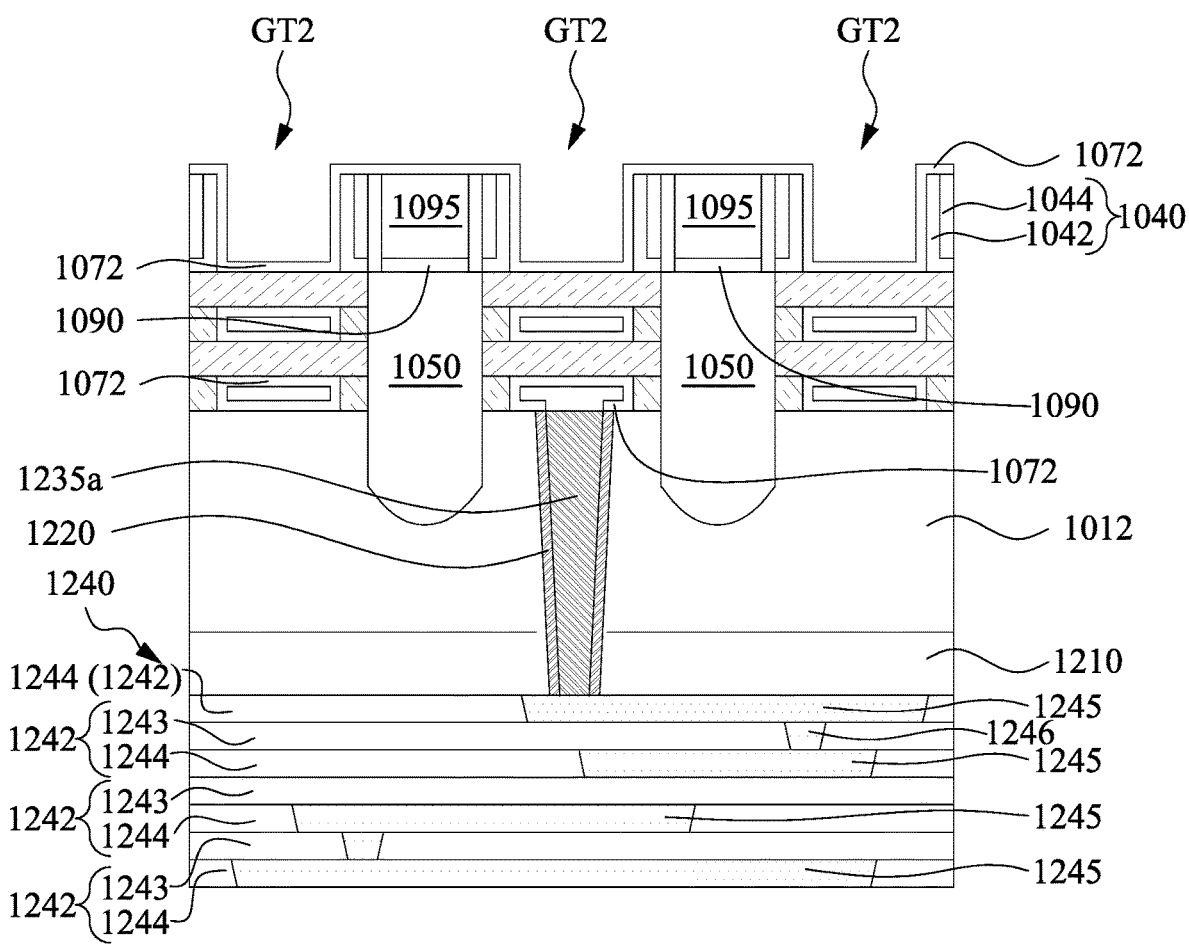
Figure 58C:
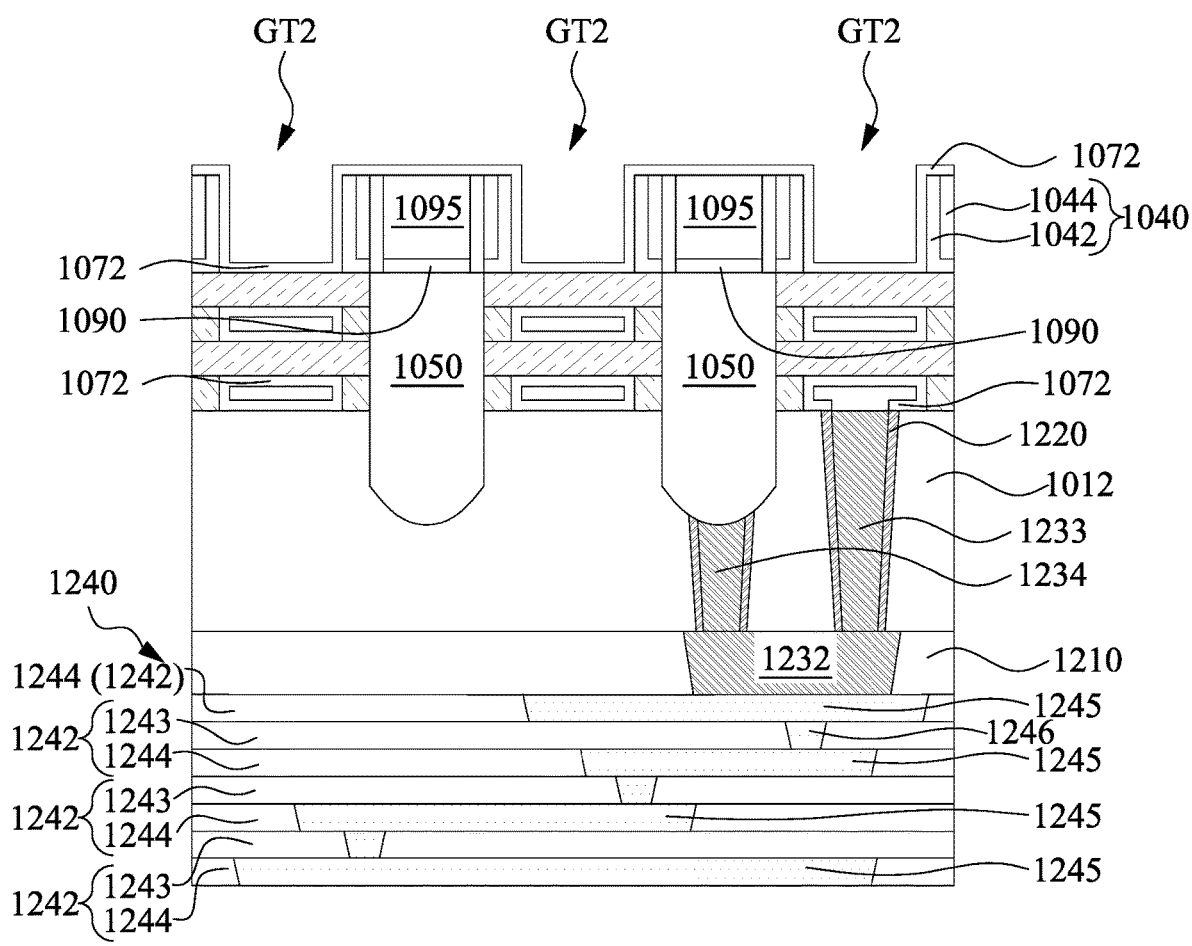
Figure 58D:
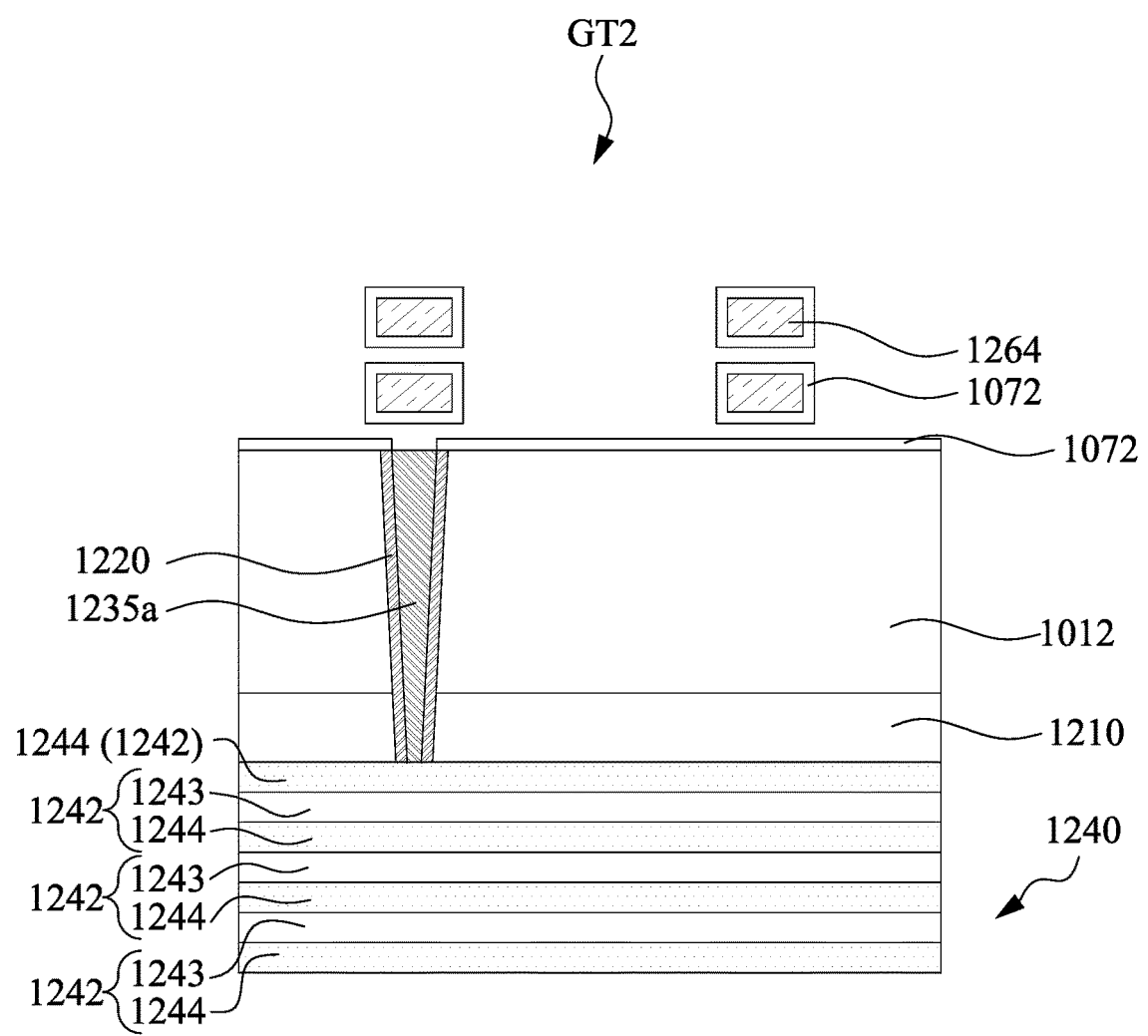
Figure 58E:
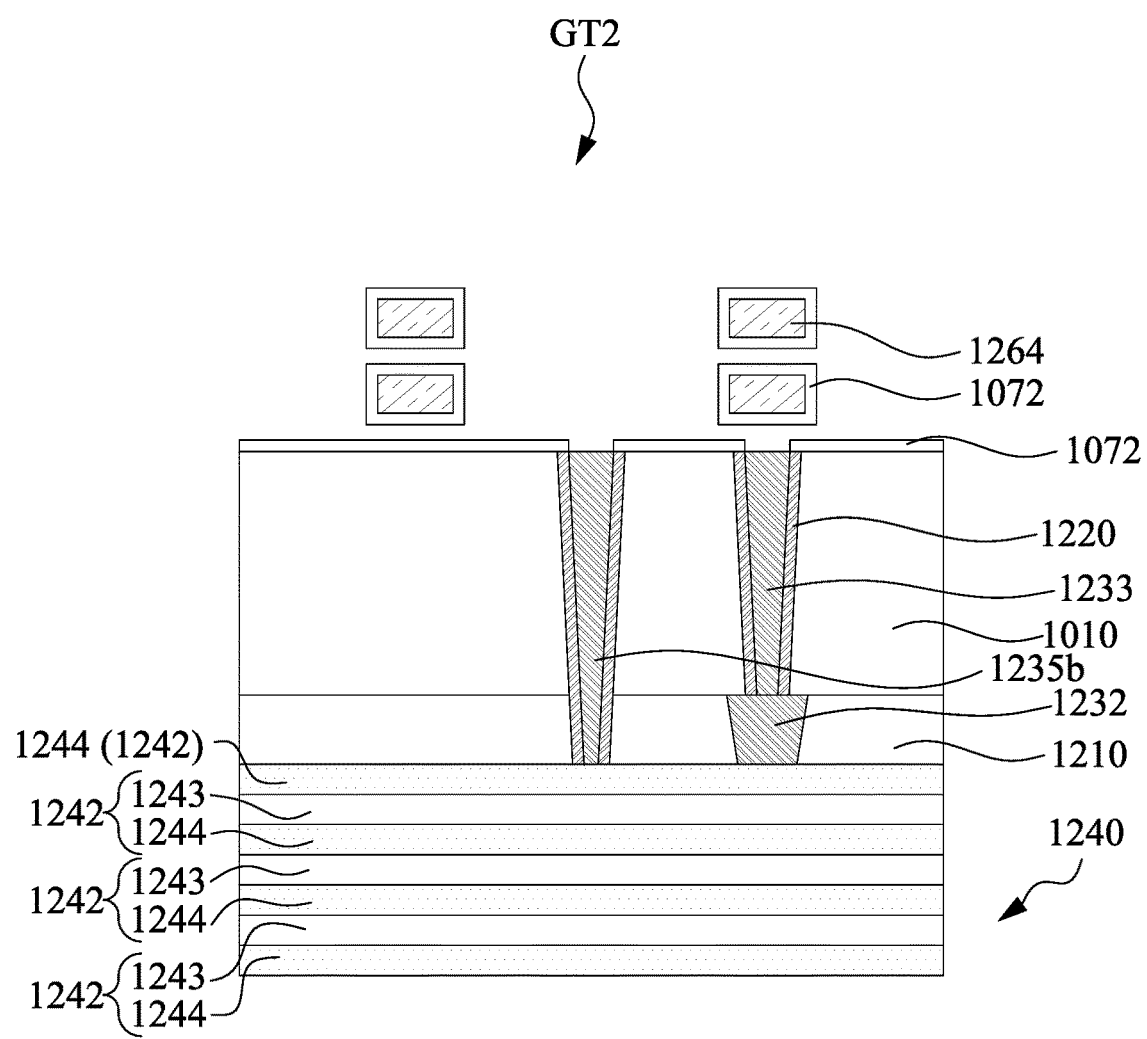
Figure 58F:
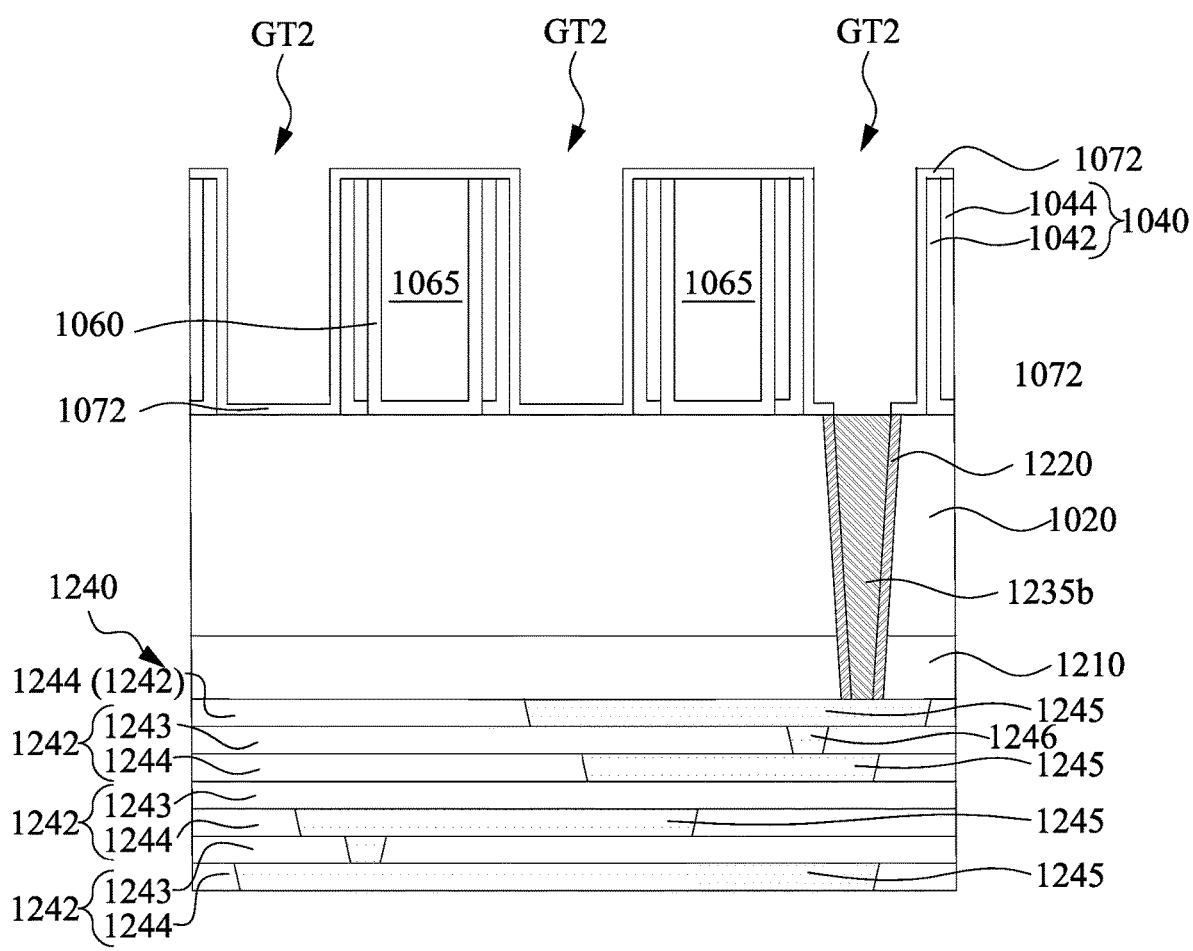

Reference is made to FIGS. 58A-58F, where FIG. 58B is a cross-sectional view taken along line I-I of FIG. 58A, FIG. 58C is a cross-sectional view taken along line II-II of FIG. 58A, FIG. 58D is a cross-sectional view taken along line III-III of FIG. 58A, FIG. 58E is a cross-sectional view taken along line IV-IV of FIG. 58A, and FIG. 58F is a cross-sectional view taken along line V-V of FIG. 58A. The dummy gate electrodes 1034 and the dummy gate dielectric layers 1032 (see FIG. 57) and the first semiconductor layers 1262 (see FIG. 55) are removed, resulting in gate trenches GT2 between corresponding gate spacers 1040. Thereafter, a gate dielectric layer 1072 is selectively formed in the gate trenches GT2 and exposes the gate via contacts 1235*a*, 1235*b* and the backside butted contact 1233, 1234. Materials, configurations, dimensions, processes and/or operations regarding the gate dielectric layer 1072 are similar to or the same as the gate dielectric layer 172 of FIG. 6.

Figure 59A:
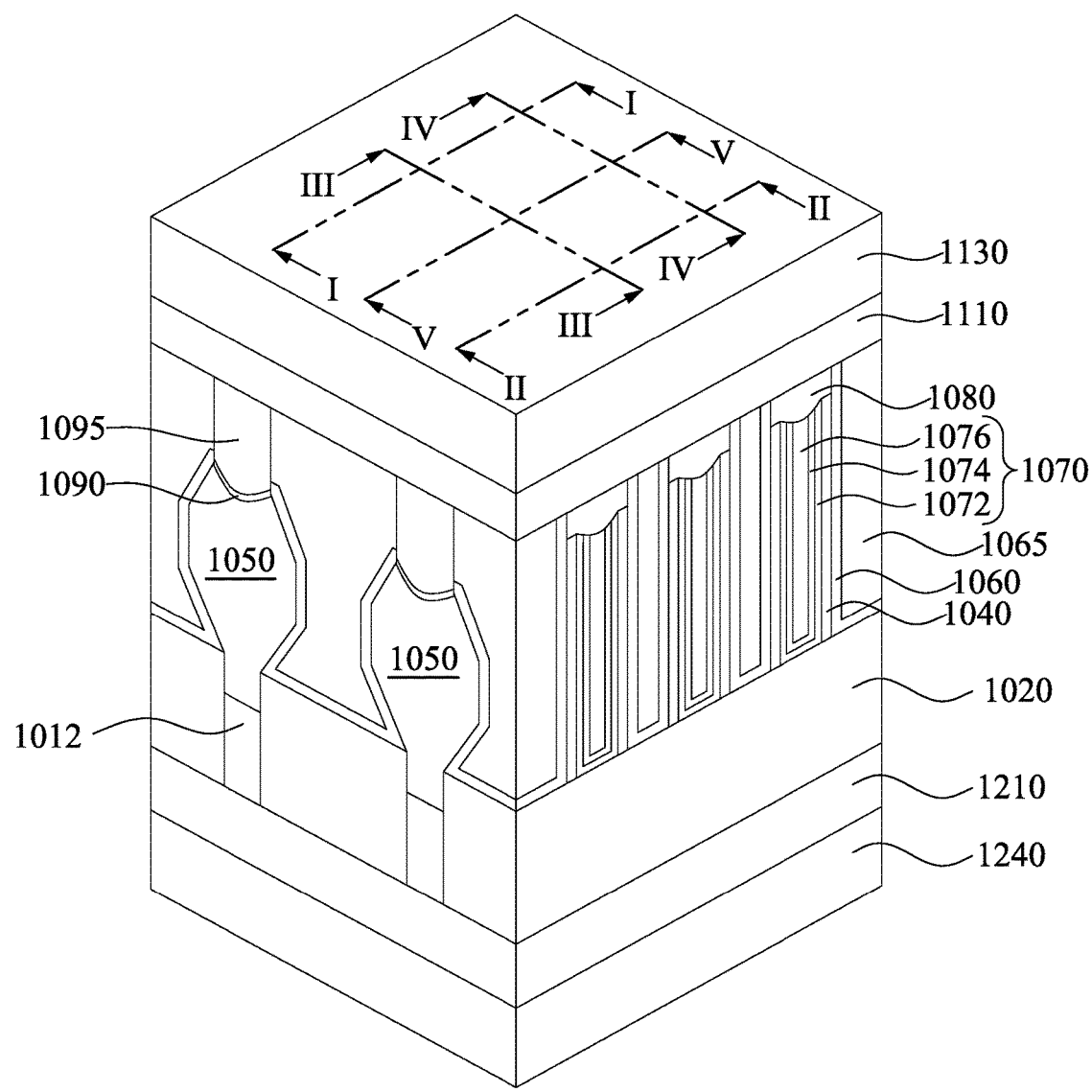
Figure 59B:
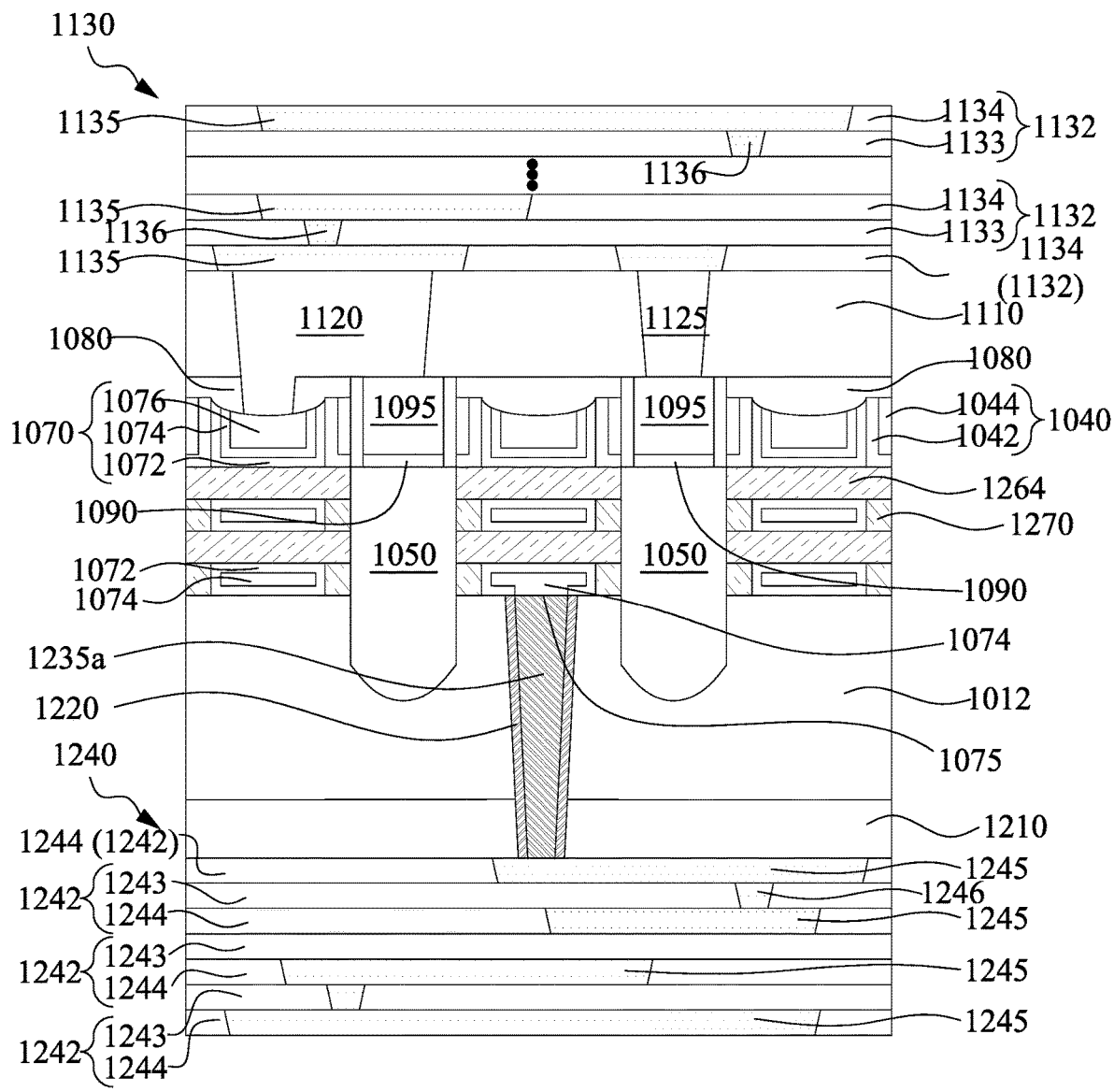
Figure 59C:
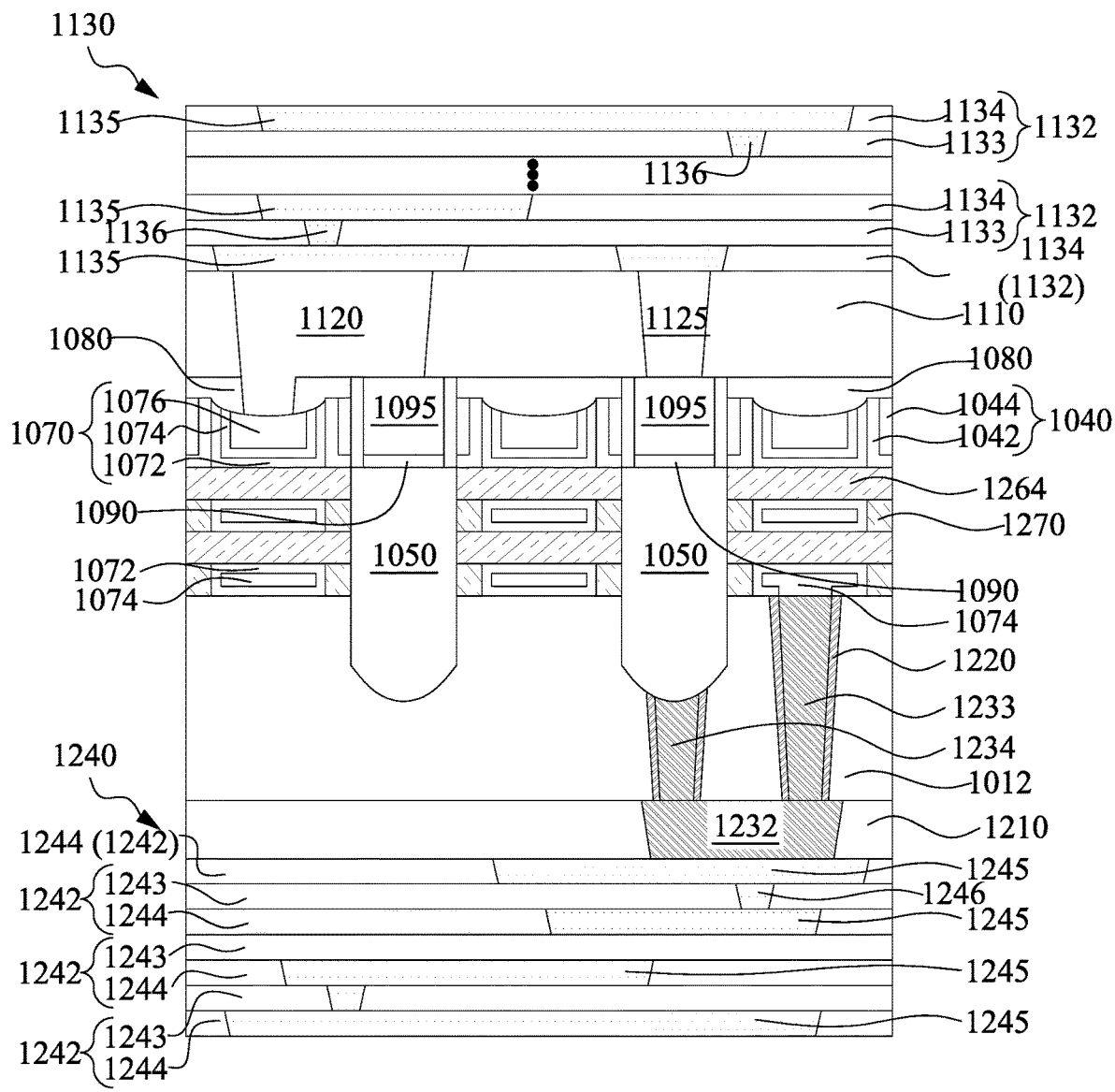
Figure 59D:
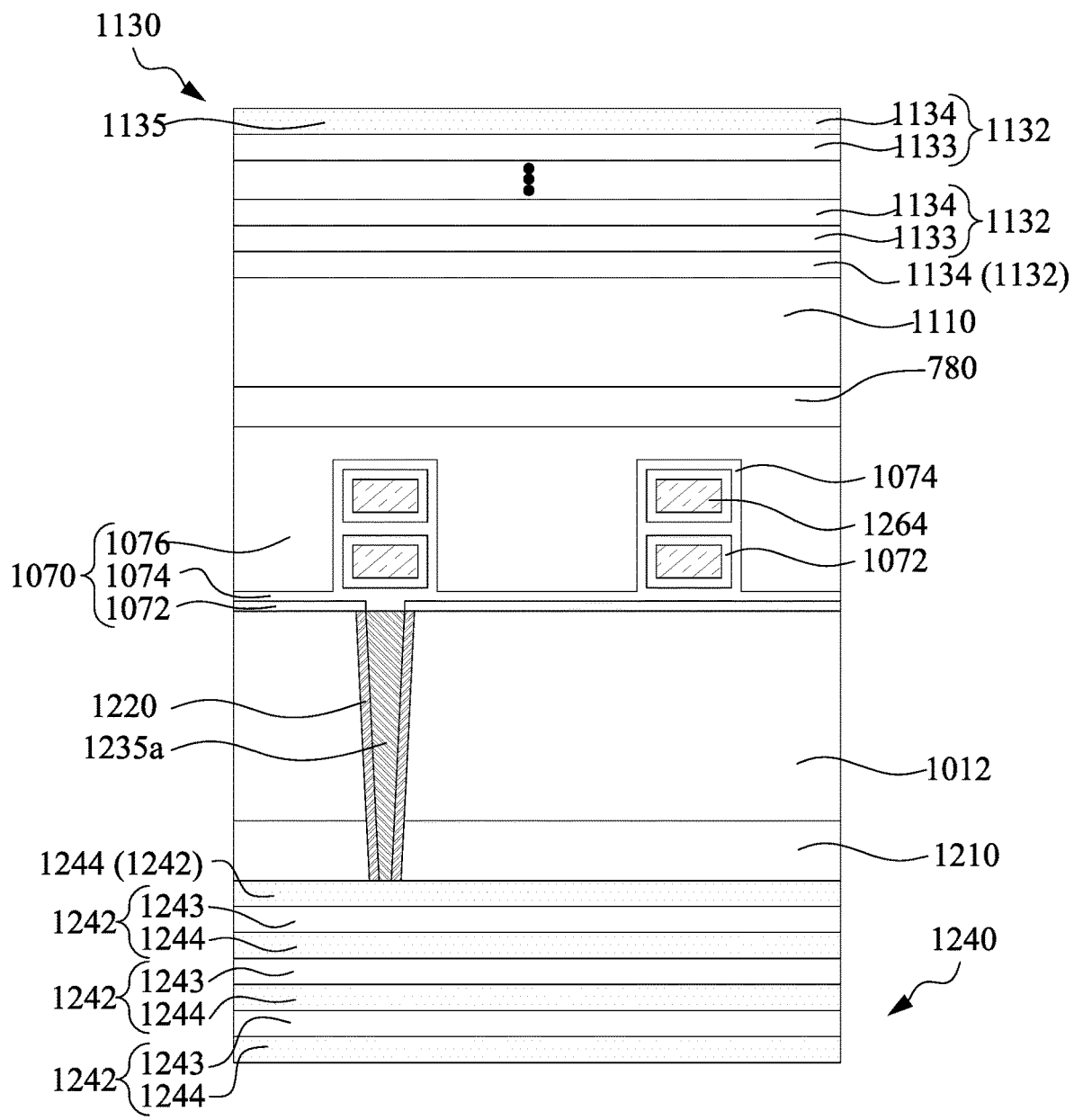
Figure 59E:
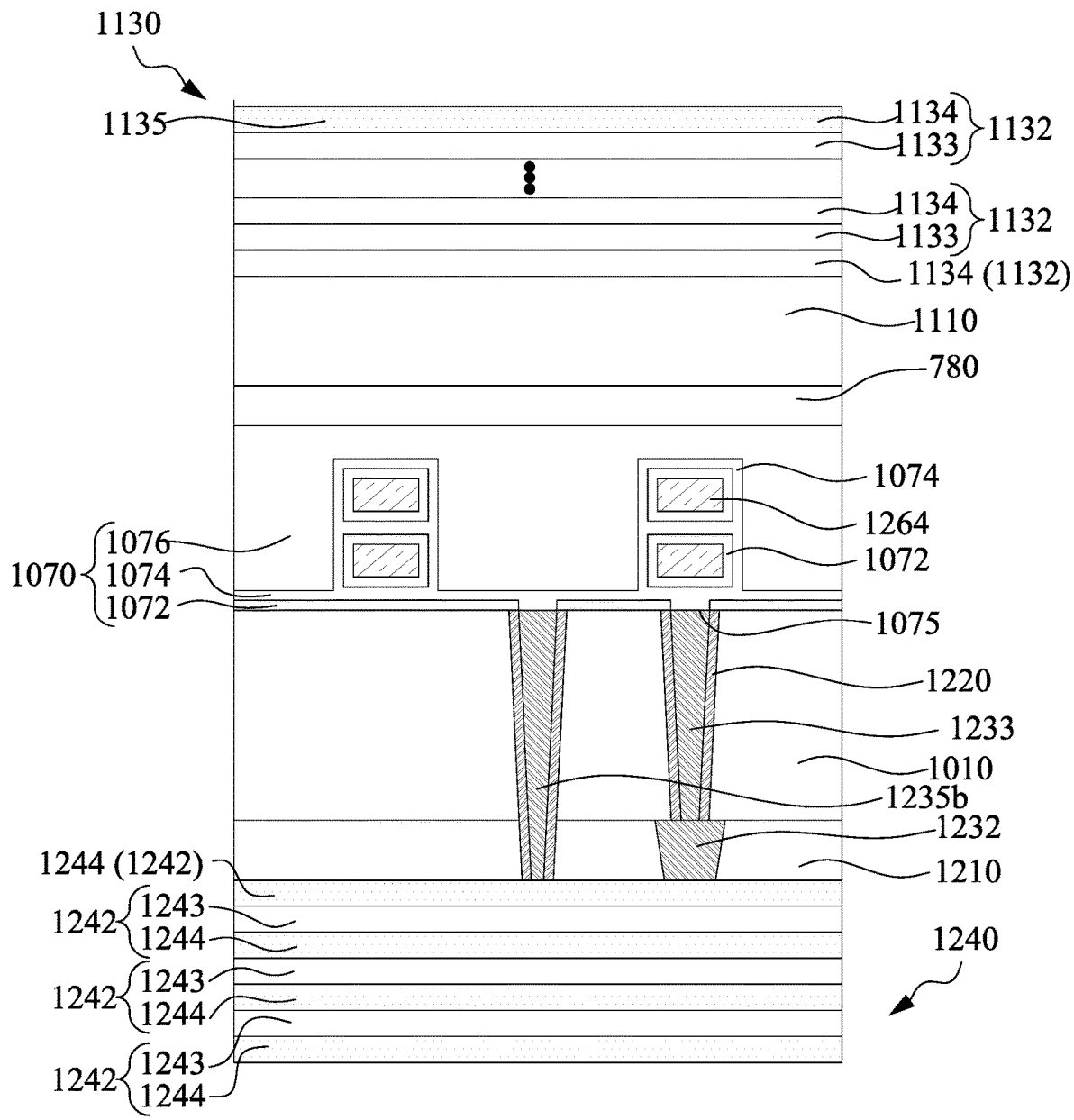
Figure 59F:
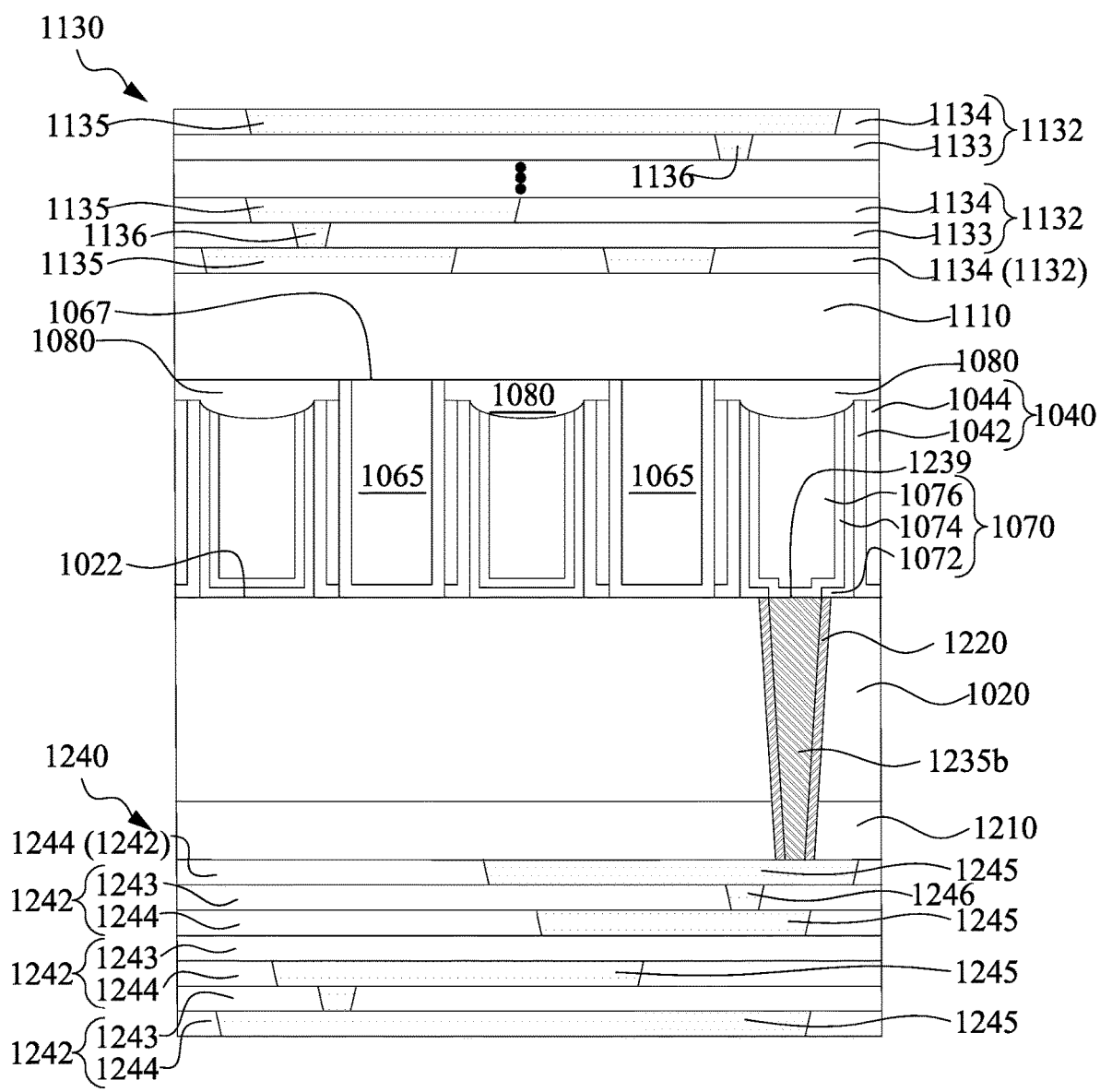

Reference is made to FIGS. 59A-59F, where FIG. 59B is a cross-sectional view taken along line I-I of FIG. 59A, FIG. 59C is a cross-sectional view taken along line II-II of FIG. 59A, FIG. 59D is a cross-sectional view taken along line III-III of FIG. 59A, FIG. 59E is a cross-sectional view taken along line IV-IV of FIG. 59A, and FIG. 59F is a cross-sectional view taken along line V-V of FIG. 59A. The structure of FIG. 58A undergoes the processes similar to the processes shown in FIGS. 43A-44B. That is, gate structures 1070 including the gate dielectric layers 1072 and gate electrodes (including work function metal layers 1074 and fill metals 1076) are formed in the gate trenches GT2. Materials, configurations, dimensions, processes and/or operations regarding the gate structures 1070 are similar to or the same as the gate structures 170 of FIG. 6.

Subsequently, an etching back process is performed to etch back the replacement gate structures 1070 and the gate spacers 1040, and dielectric caps 1080 are formed over the etched gate structures 1070. Materials, configurations, dimensions, processes and/or operations regarding the dielectric caps 1080 are similar to or the same as the dielectric caps 180 of FIG. 7A.

After the formation of the dielectric caps 1080 is completed, source/drain contacts 1095 are formed extending through the first ILD layer 1065. In some embodiments, metal alloy layers 1090 are respectively formed above the source/drain epitaxial structures 1050 prior to forming the source/drain contacts 1095. Materials, configurations, dimensions, processes and/or operations regarding the source/drain contacts 1095 are similar to or the same as the source/drain contacts 195 of FIG. 7A. Materials, configurations, dimensions, processes and/or operations regarding the metal alloy layers 1090 are similar to or the same as the metal alloy layers 190 of FIG. 7A.

A second ILD layer 1110 is formed over the base portions 1012 and the isolation structures 1020. At least one front-side butted contact (or butted via) 1120 and at least one source/drain via 1125 are formed in the second ILD layer 1110. Materials, configurations, dimensions, processes and/or operations regarding the second ILD layer 1110 are similar to or the same as the second ILD layer 210 of FIG. 8. Materials, configurations, dimensions, processes and/or operations regarding the front-side butted contact 1120 and the source/drain via 1125 are similar to or the same as the front-side butted contact 220 and the source/drain via 225 of FIG. 10.

Subsequently, a front-side MLI structure 1130 is formed over the second ILD layer 1110. The front-side MLI structure 1130 may include a plurality of front-side metallization layers 1132. The number of front-side metallization layers 1132 may vary according to design specifications of the integrated circuit structure. Only three front-side metallization layers 1132 are illustrated in FIGS. 59B-59F for the sake of simplicity. Except the bottommost front-side metallization layers 1132, the other front-side metallization layers 1132 each includes a first front-side inter-metal dielectric (IMD) layer 1133 and a second front-side IMD layer 1134. The second front-side IMD layers 1134 are formed over the corresponding first front-side IMD layers 1133. The front-side metallization layers 1132 include one or more horizontal interconnects, such as front-side metal lines 1135, respectively extending horizontally or laterally in the second front-side IMD layers 1134 and vertical interconnects, such as front-side conductive vias 1136, respectively extending vertically in the first front-side IMD layers 1133. Materials, configurations, dimensions, processes and/or operations regarding the front-side MLI structure 1130 are similar to or the same as the front-side MLI structure 230 of FIG. 11.

As shown in FIGS. 59A and 59B, the semiconductor device 400 includes the second semiconductor layers 1264, the gate structures 1070 wrapping around the second semiconductor layers 1264, the source/drain epitaxial structures 1050 electrically connected to the second semiconductor layers 1264 and on opposite sides of the gate structures 1070, and backside vias under the gate structures 1070. For example, the semiconductor device 400 further includes a gate via contact 1235*a* under the gate structure 1070. As shown in FIGS. 59B and 59D, the gate via contact 1235*a* passes through the base portions 1012 to the work function metal layer 1074. As such, the gate via contact 1235*a* is electrically connected to one of the gate structures 1270. In some embodiments, the gate via contact 1235*a* is in contact with a bottom surface 1075 of the work function metal layer 1074. As mentioned above, since the gate via contact 1235*a* is formed from a front-side of the semiconductor device 400, the gate via contact 1235*a* tapers downward. Further, as shown in FIG. 59B, a portion of the work function metal layer 1074 passes through the gate dielectric layer 1072 to the gate via contact 1235*a*.

The semiconductor device 400 further includes the spacer structures 1220. One of the spacer structures 1220 laterally surrounds the gate via contact 1235*a* to electrically isolate the gate via contact 1235*a* from the base portion 1012. Stated another way, the spacer structure 1220 is in contact with the gate via contact 1235*a* and the base portion 1012. Further, the spacer structure 1220 is in contact with the gate dielectric layer 1072.

For example, the semiconductor device 400 further includes a gate via contact 1235*b* under the gate structure 1070. As shown in FIGS. 59E and 59F, the gate via contact 1235*b* passes through (or is embedded in) the isolation structure 1020 to the work function metal layer 1074. As such, the gate via contact 1235*b* is electrically connected to one of the gate structures 1070. In some embodiments, the gate via contact 1235*b* is in contact with the bottom surface 1075 of the work function metal layer 1074. As mentioned above, since the gate via contact 1235*b* is formed from a front-side of the semiconductor device 400, the gate via contact 1235*b* tapers downward.

Another one of the spacer structures 1220 laterally surrounds the gate via contact 1235*b*. Stated another way, the spacer structure 1220 is in contact with the gate via contact 1235*b* and isolation structure 1020. Further, the spacer structure 1220 is in contact with the gate dielectric layer 1072.

For example, the semiconductor device 400 further includes backside butted contacts 1233 and 1234 under the gate structure 1070 and the source/drain epitaxial structure 1050. As shown in FIGS. 59C and 59E, the backside butted contacts 1233 and 1234 pass through the base portion 1012 to the work function metal layer 1074. As such, the backside butted contacts 1233 and 1234 are electrically connected to one of the gate structures 1070. In some embodiments, the backside butted contacts 1233 and 1234 are in contact with the bottom surface 1075 of the work function metal layer 1074. As mentioned above, since the backside butted contacts 1233 and 1234 are formed from a backside of the semiconductor device 400, the backside butted contacts 1233 and 1234 are tapered upward.

Some of the spacer structures 1220 laterally surround the backside butted contacts 1233 and 1234. Stated another way, the spacer structures 1220 are in contact with the backside butted contacts 1233 and 1234 and base portion 1012. Further, the spacer structures 1220 are in contact with the gate dielectric layer 1072 and the source/drain epitaxial structure 1050.

The semiconductor device 400 includes at least one of the gate via contact 1235*a*, 1235*b* and the backside butted contacts 1233 and 1234. In some embodiments, the semiconductor device 400 further includes front-side vias, such as the front-side butted contact 1120 and/or the source/drain via 1125 as shown in FIG. 59B. Further, the semiconductor device 400 may include front-side gate via contacts formed in the second ILD layer 1110 and connected to the gate structure 1070. In some embodiments, each of the gate via contact 1235*a*, 1235*b* and the backside butted contacts 1233, 1234 has a width or length in a range of about 8 nm to about 30 nm, and has a height in a range of about 10 nm to about 50 nm.

The gate structure 1070 is between the backside vias (e.g., the gate via contact 1235*a*, 1235*b* and the backside butted contacts 1233, 1234) and the dielectric cap 1080. In some embodiments, a top surface 1067 of the first ILD layer 1065 is higher than a top surface 1239 of the backside vias (e.g., the gate via contact 1235*a*, 1235*b* and the backside butted contacts 1233, 1234), and a top surface 1022 of the isolation structure 1020 is lower than the top surface 1239 of the backside vias (e.g., the gate via contact 1235*a*, 1235*b* and the backside butted contacts 1233, 1234). The backside vias (e.g., the gate via contact 1235*a*, 1235*b* and the backside butted contacts 1233, 1234) are electrically isolated from the front-side MLI structure 1130.

Figure 60A:
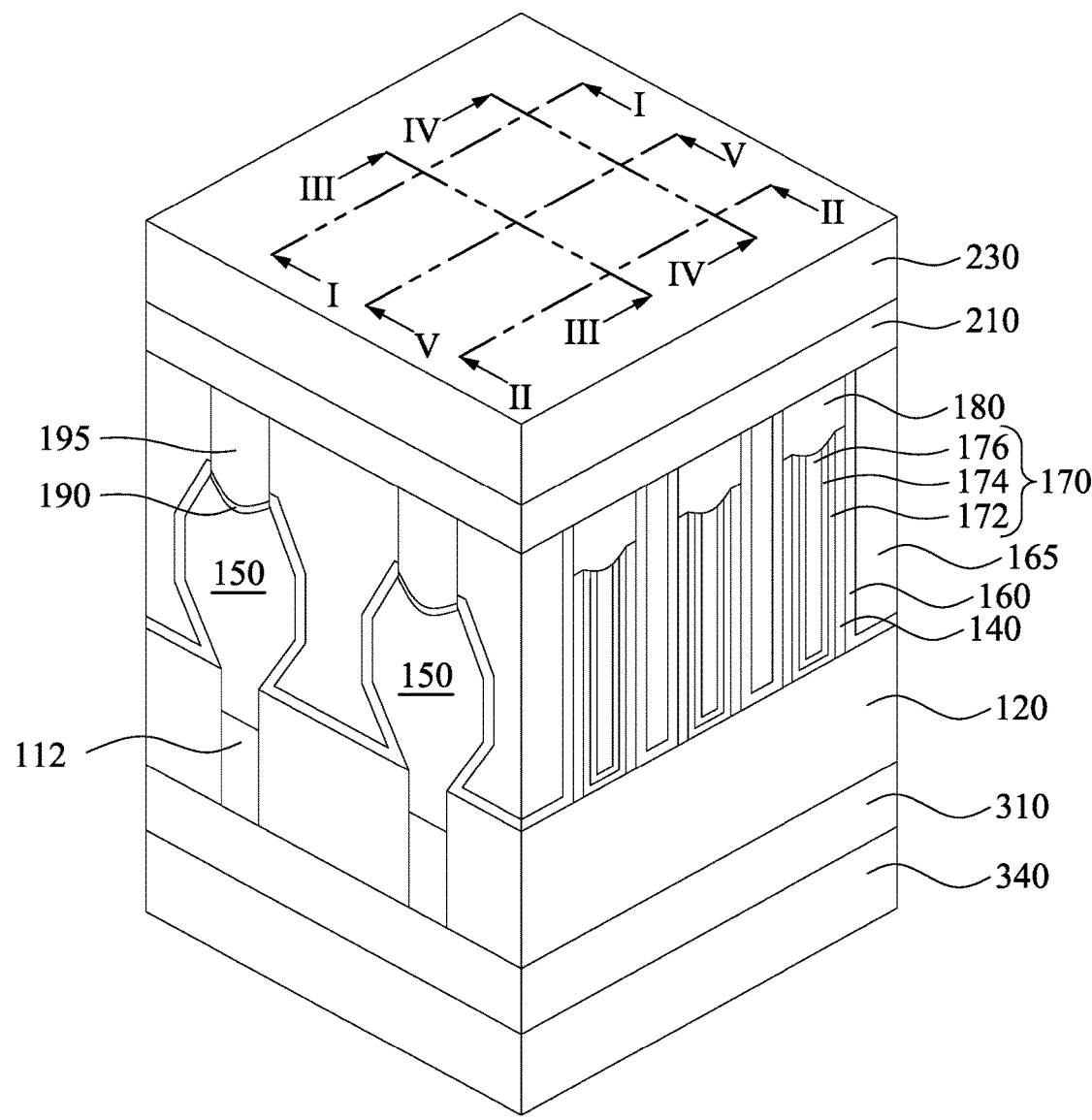
FIG. 60A is a perspective view of a semiconductor device in accordance with some embodiments of the present disclosure.
Figure 60B:
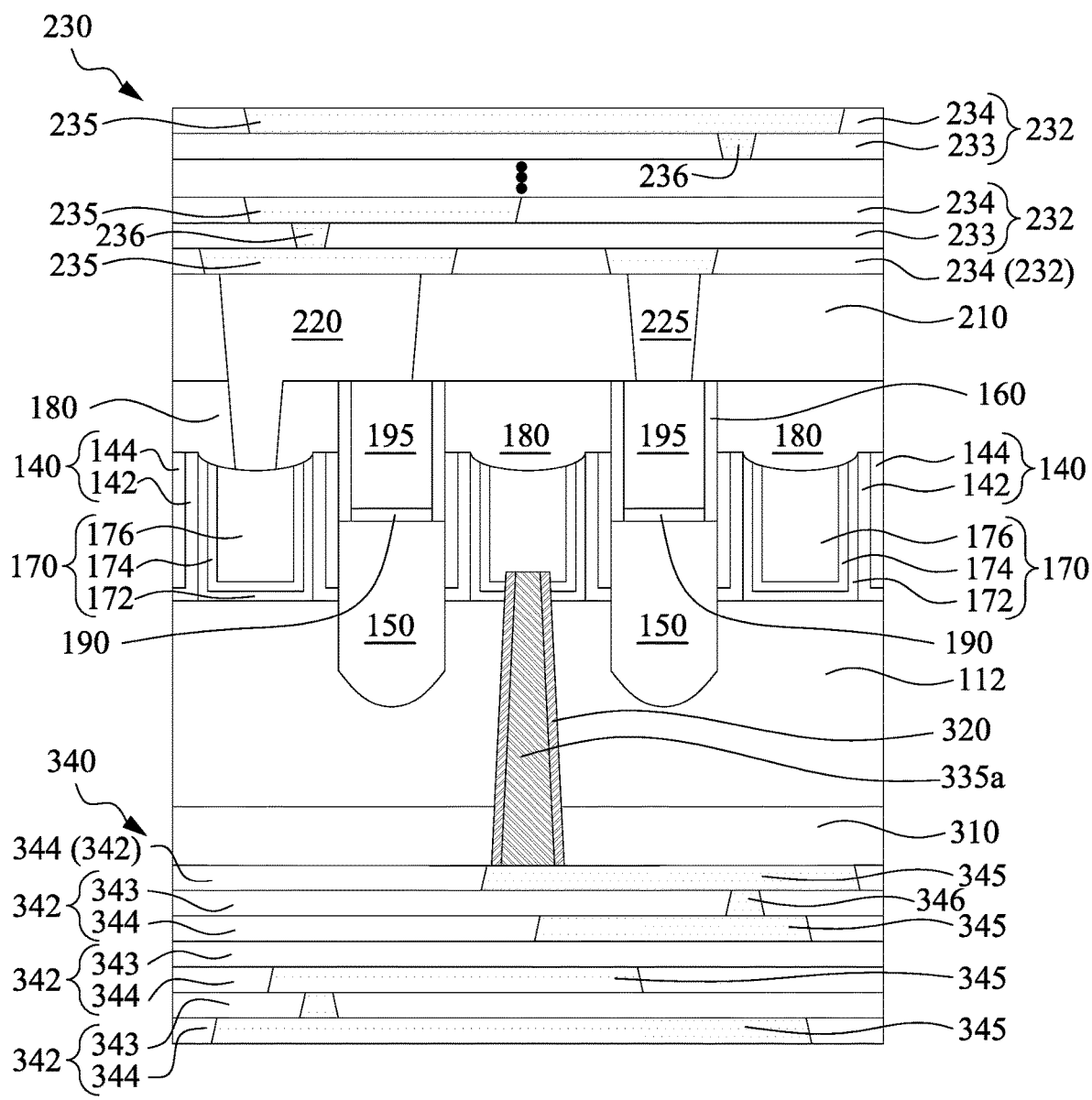
FIG. 60B is a cross-sectional view taken along line I-I of FIG. 60A.
Figure 60C:
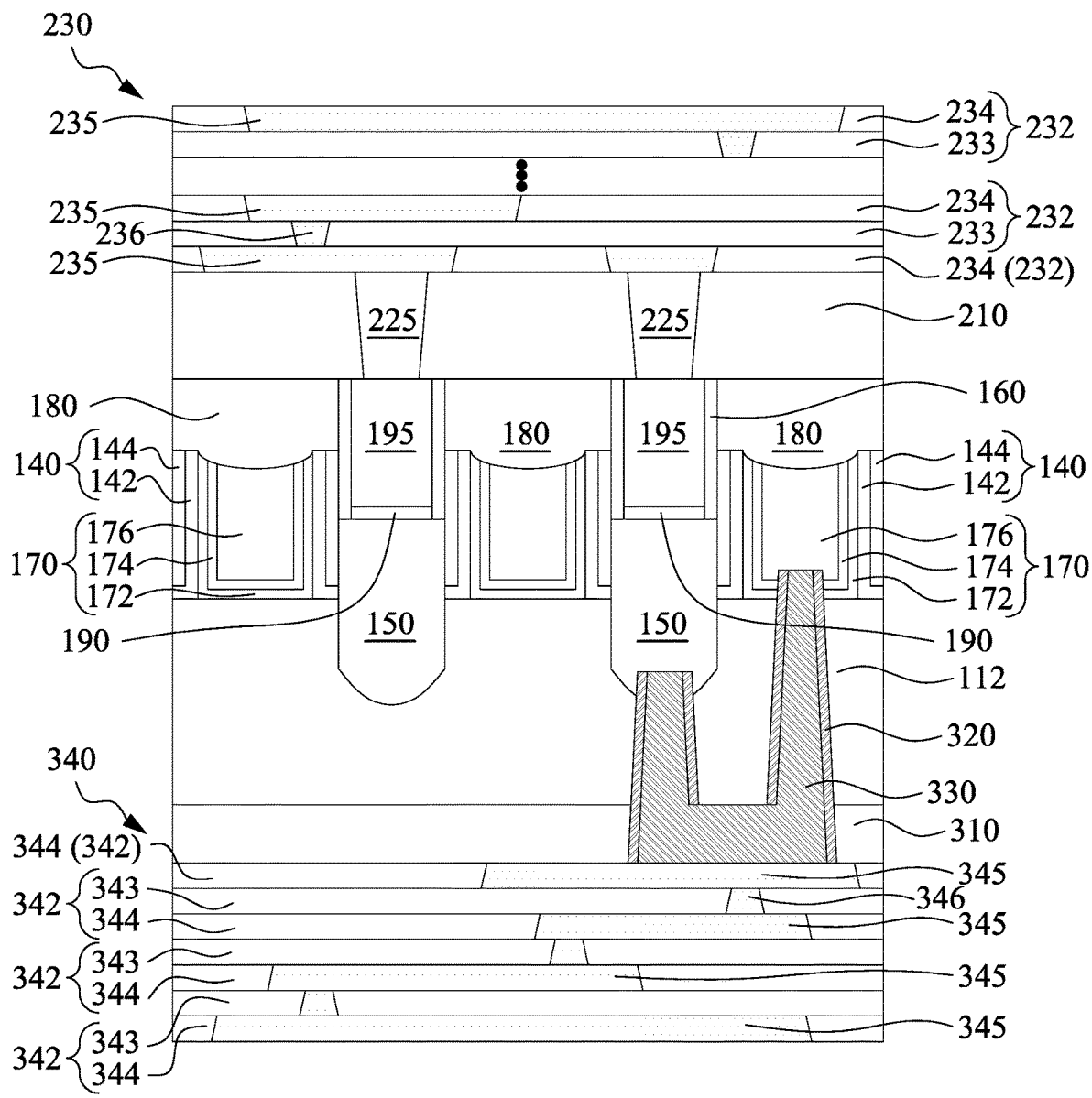
FIG. 60C is a cross-sectional view taken along line II-II of FIG. 60A.
Figure 60D:
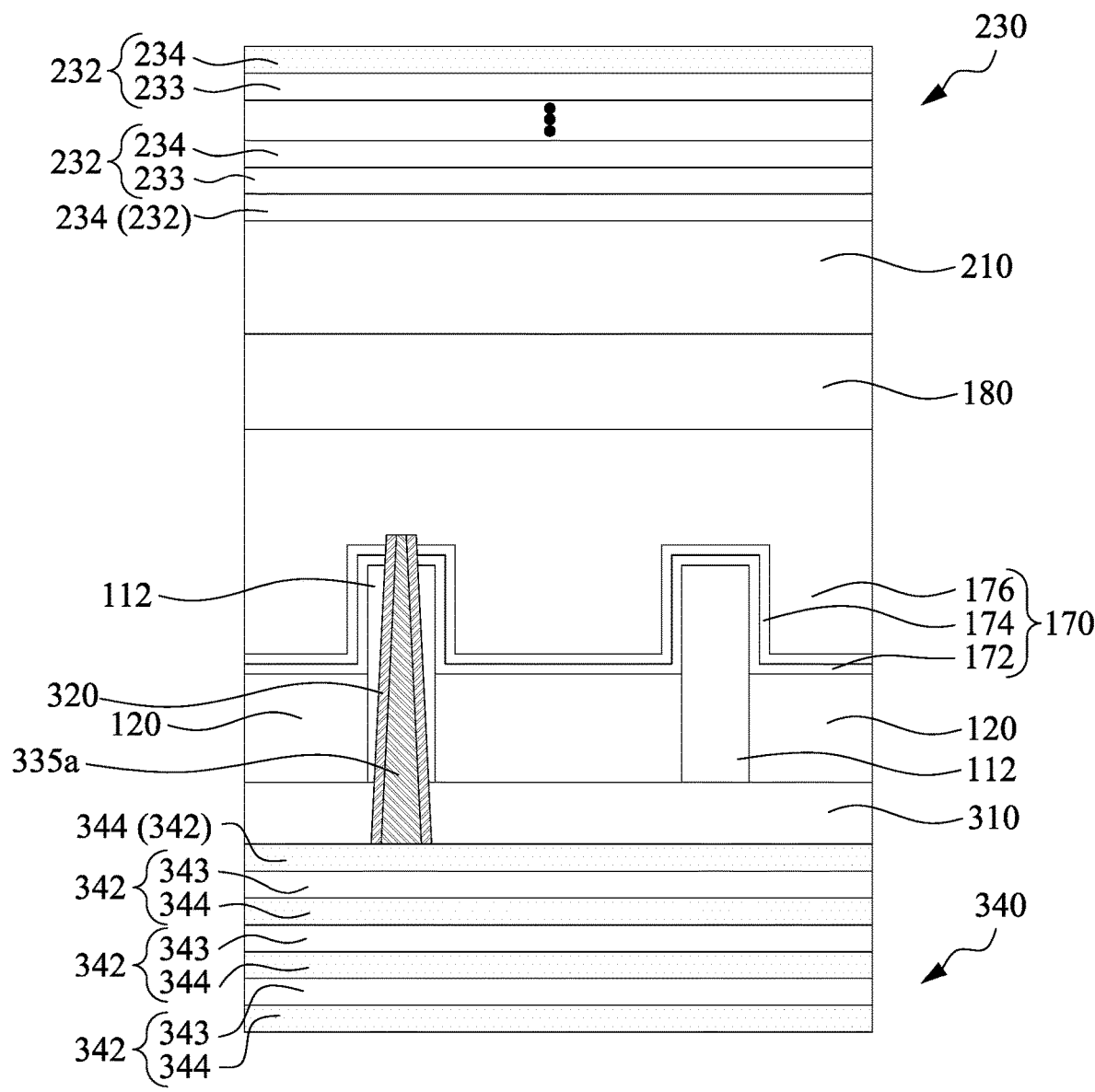
FIG. 60D is a cross-sectional view taken along line III-III of FIG. 60A.
Figure 60E:
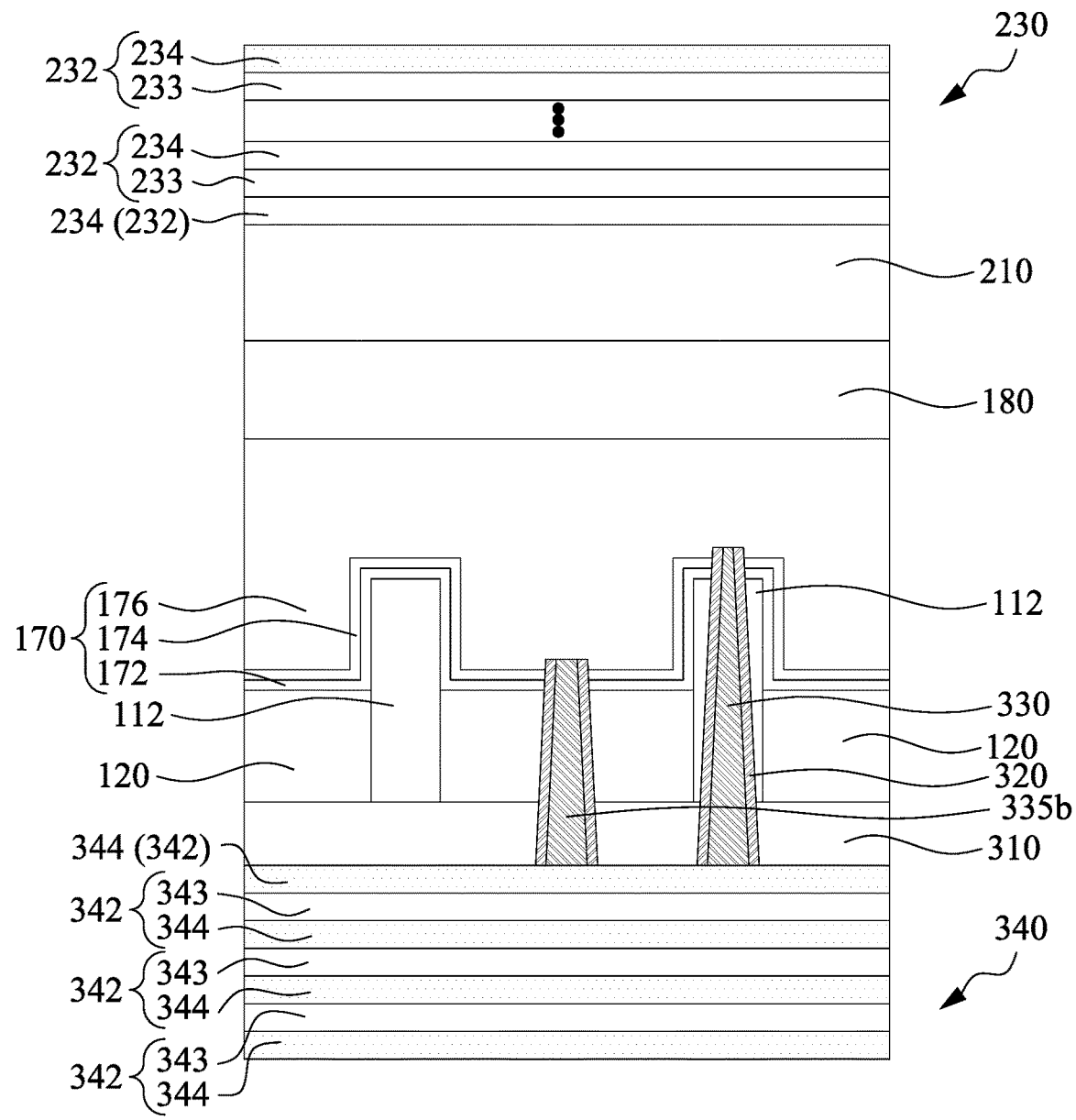
FIG. 60E is a cross-sectional view taken along line IV-IV of FIG. 60A.
Figure 60F:
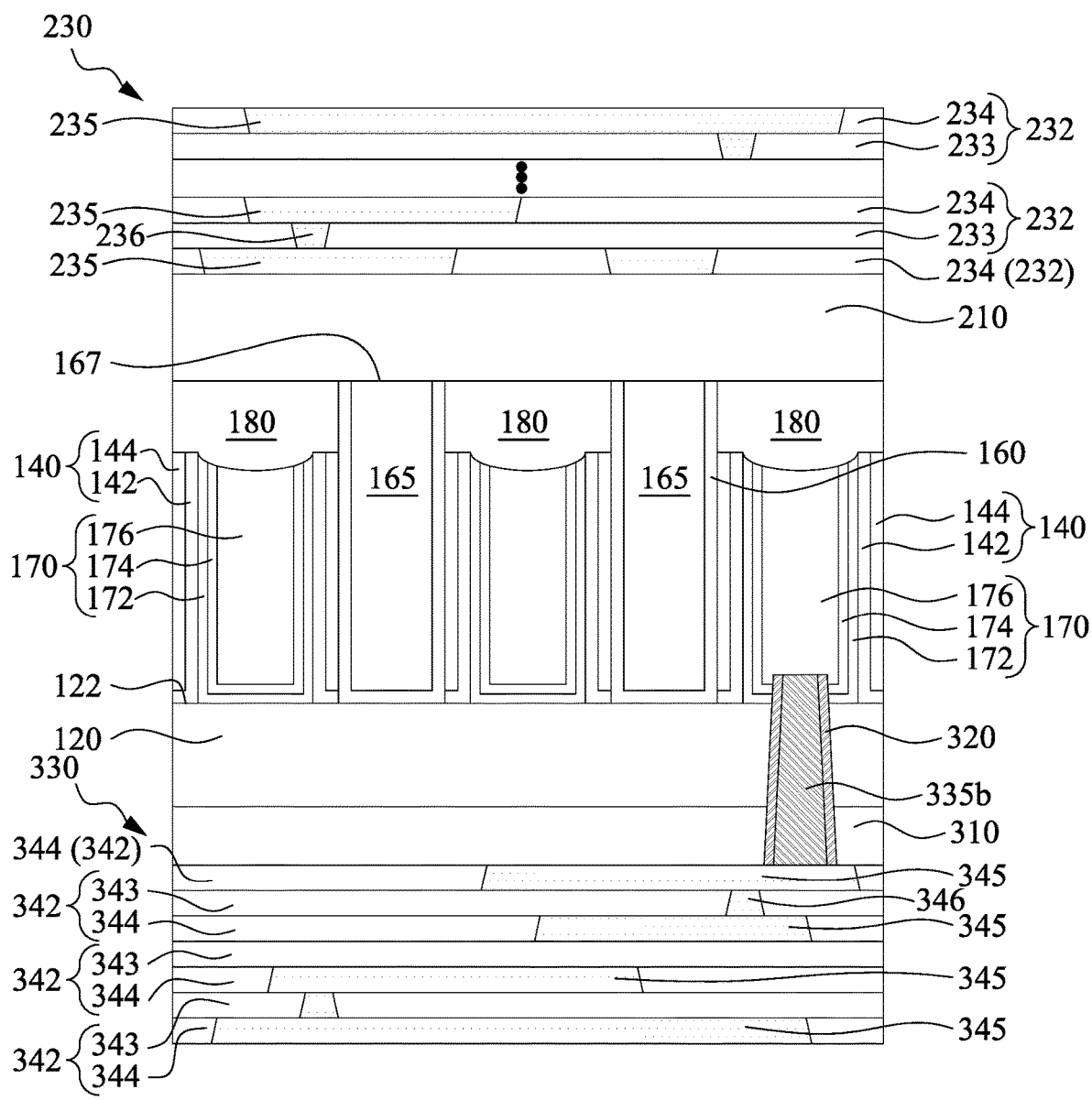
FIG. 60F is a cross-sectional view taken along line V-V of FIG. 60A.

FIG. 60A is a perspective view of a semiconductor device (or an integrated circuit structure) 100*c* in accordance with some embodiments of the present disclosure, FIG. 60B is a cross-sectional view taken along line I-I of FIG. 60A, FIG. 60C is a cross-sectional view taken along line II-II of FIG. 60A, FIG. 60D is a cross-sectional view taken along line III-III of FIG. 60A, FIG. 60E is a cross-sectional view taken along line IV-IV of FIG. 60A, and FIG. 60F is a cross-sectional view taken along line V-V of FIG. 60A. Reference is made to FIGS. 60A-60F. The difference between the semiconductor device 100*c* in FIGS. 60A-60F and the semiconductor device 100 in FIGS. 20A-20F is the depths of the backside butted contact 330 and the gate via contacts 335*a*, 335*b*. In FIGS. 60B-60F, the backside butted contact 330 and the gate via contacts 335*a*, 335*b* pass through the work function metal layer 174 and are in contact with the fill metal 176. Further, the spacer structures 320 also pass through the work function metal layer 174 and are in contact with the fill metal 176. Other relevant structural details of the semiconductor device 100*c* in FIGS. 60A-60F are the same as or similar to the semiconductor device 100 in FIGS. 20A-20F, and, therefore, a description in this regard will not be repeated hereinafter.

Figure 61:
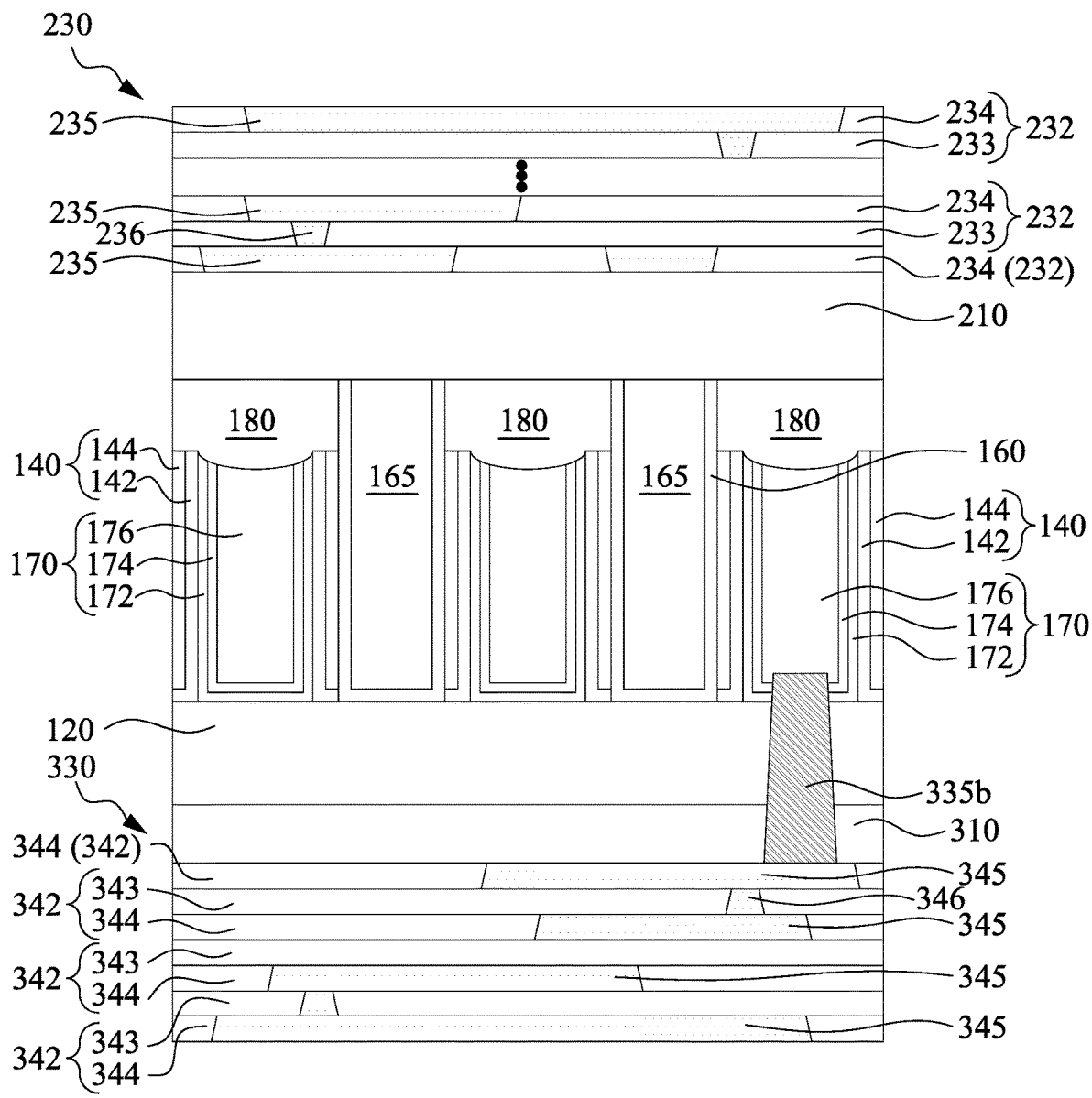
FIG. 61 is a cross-sectional view of a semiconductor device in accordance with some embodiments of the present disclosure.

FIG. 61 is a cross-sectional view of a semiconductor device (or an integrated circuit structure) 100*d* in accordance with some embodiments of the present disclosure. The difference between the semiconductor device 100*d* in FIG. 61 and the semiconductor device 100*c* in FIG. 60F is the present of the spacer structure. In FIG. 61, the spacer structure 320 (see FIG. 60F) is omitted. That is, the gate via contact 335*b* is in contact with the isolation structure 120 and the third ILD layer 310. Other relevant structural details of the semiconductor device 100*d* in FIG. 61 are the same as or similar to the semiconductor device 100*c* in FIG. 60F, and, therefore, a description in this regard will not be repeated hereinafter.

Figure 62:
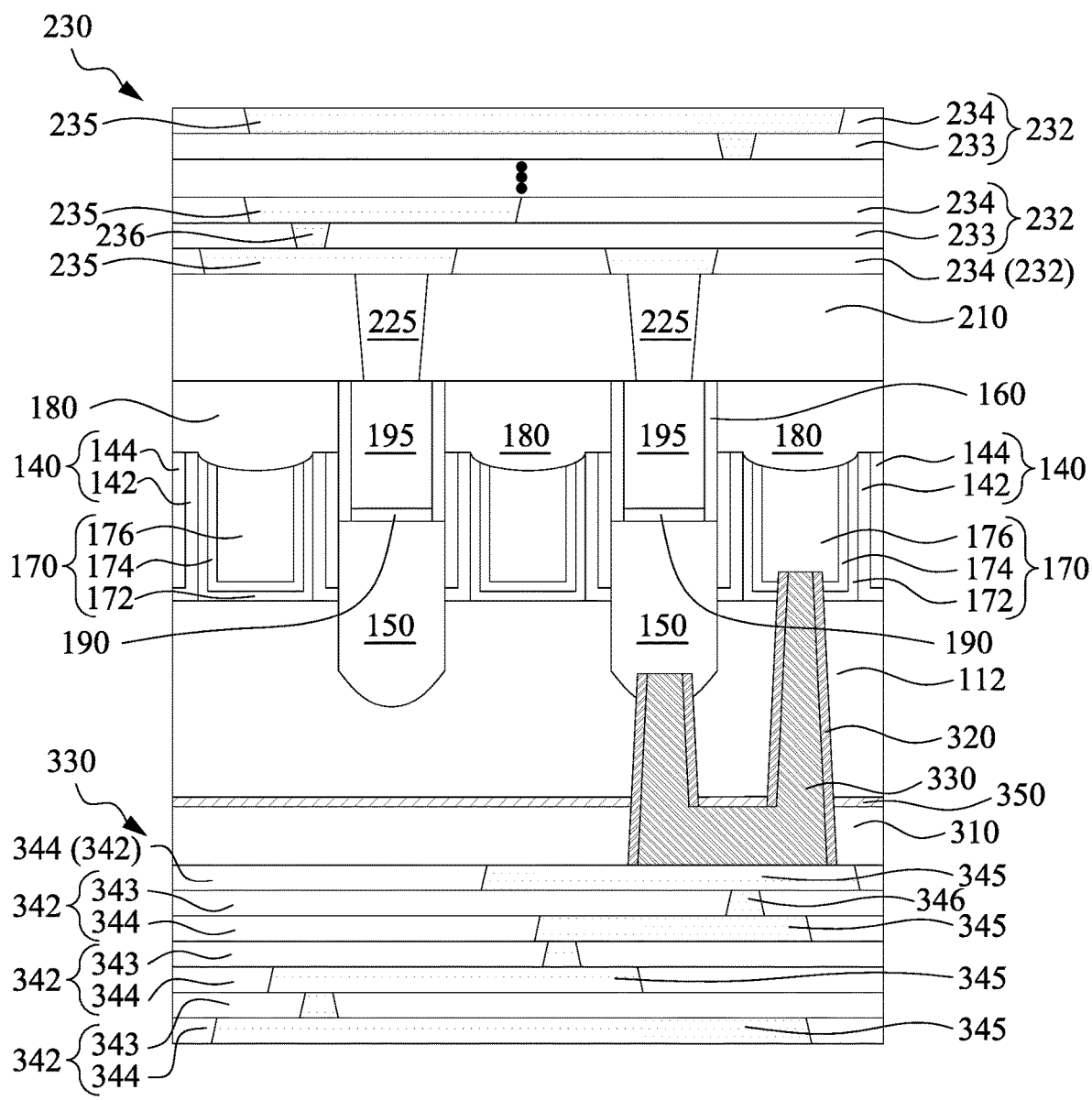
FIG. 62 is a cross-sectional view of a semiconductor device in accordance with some embodiments of the present disclosure.

FIG. 62 is a cross-sectional view of a semiconductor device (or an integrated circuit structure) 100*e* in accordance with some embodiments of the present disclosure. The difference between the semiconductor device 100*e* in FIG. 62 and the semiconductor device 100*c* in FIG. 60C is the present of an etch stop layer. In FIG. 62, an etch stop layer 350 is formed to cover the semiconductor fins 112 and the isolation structures 120 prior to the formation of the third ILD layer 310. As such, the etch stop layer 350 is between the third ILD layer 310 and the semiconductor fins 112 and/or between the third ILD layer 310 and the isolation structures 120. The etch stop layer 350 can be an etch stop layer for etching the recess R2 (see FIG. 16B). The etch stop layer 350 is made of a material different from the third ILD layer 310, such that the etching process for forming the recess R2 has an etching selectivity between the etch stop layer 350 and the third ILD layer 310. For example, the etch stop layer 350 is a nitride layer (e.g., silicon nitride) and the third ILD layer 310 is an oxide layer (e.g., silicon dioxide). Other relevant structural details of the semiconductor device 100*e* in FIG. 62 are the same as or similar to the semiconductor device 100*c* in FIG. 60C, and, therefore, a description in this regard will not be repeated hereinafter.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the cell size of the semiconductor device can be shrinkage due to the gate vias and/or backside butt vias formed at the backside of the semiconductor device. Another advantage is that the size of the gate vias and/or backside butt vias can be enlarged due to the large space at the backside of the semiconductor device. With such configuration, the electrical performance of small-scaled semiconductor device can be improved.

According to some embodiments, a device includes a channel layer, a gate structure, a source/drain epitaxial structure, and a gate via. The gate structure wraps around the channel layer. The gate structure includes a gate dielectric layer and a gate electrode over the gate dielectric layer. The source/drain epitaxial structure is adjacent the gate structure and is electrically connected to the channel layer. The gate via is under the gate structure and is in contact with a bottom surface of the gate electrode.

According to some embodiments, a method includes forming a fin structure over a substrate. The fin structure includes first semiconductor layers and second semiconductor layers alternately stacked. An isolation structure is deposited over the substrate. A dummy gate structure is formed over the fin structure. A portion of the fin structure uncovered by the dummy gate structure is removed. A source/drain epitaxial structure is grown on a side of remaining portions of the second semiconductor layers. The dummy gate structure and the first semiconductor layers are replaced with a metal gate structure. The substrate is removed to expose a bottom surface of the isolation structure. An opening is formed in the isolation structure and exposes a gate electrode of the gate structure. A gate via is formed in the opening such that the gate via is connected to the metal gate structure and embedded in the isolation structure.

According to some embodiments, a method includes forming a backside multilayer interconnection structure over a carrier substrate. A semiconductor layer is deposited over the backside multilayer interconnection structure. A first via is formed in the semiconductor layer and is electrically connected to the backside multilayer interconnection structure. The semiconductor layer is patterned to form a semiconductor fin over the backside multilayer interconnection structure. A gate structure is formed across the semiconductor fin and being electrically connected to the first via. A source/drain epitaxial structure is grown over the semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a fin structure over a substrate, wherein the fin structure comprises first semiconductor layers and second semiconductor layers alternately stacked;
    depositing an isolation structure over the substrate;
    forming a dummy gate structure over the fin structure;
    removing a portion of the fin structure uncovered by the dummy gate structure;
    growing a source/drain epitaxial structure on a side of remaining portions of the second semiconductor layers;
    replacing the dummy gate structure and the first semiconductor layers with a metal gate structure;
    removing the substrate to expose a bottom surface of the isolation structure;
    forming an opening in the isolation structure and exposing a gate electrode of the metal gate structure;
    forming a gate via in the opening such that the gate via is connected to the metal gate structure and embedded in the isolation structure; and
    forming a spacer structure in the opening prior to forming the gate via.

2. The method of claim 1, further comprising depositing an interlayer dielectric layer on a backside of the isolation structure prior to forming the opening in the isolation structure.

3. The method of claim 1, further comprising:
    forming a source/drain via over the source/drain epitaxial structure; and
    forming a front-side multilayer interconnection structure over the source/drain via prior to forming the gate via.

4. The method of claim 1, further comprising forming a backside multilayer interconnection structure under the isolation structure and in contact with the gate via.

5. The method of claim 1, further comprising:
    forming a source/drain via opening in the isolation structure and exposing the source/drain epitaxial structure; and
    forming a recess in the isolation structure and connecting the opening and the source/drain via opening, wherein the gate via is formed in the source/drain via opening such that the gate via is connected to the source/drain epitaxial structure.

6. A method comprising:
    forming a backside multilayer interconnection structure over a carrier substrate;
    depositing a semiconductor layer over the backside multilayer interconnection structure;
    forming a first via in the semiconductor layer and being electrically connected to the backside multilayer interconnection structure;
    patterning the semiconductor layer to form a semiconductor fin over the backside multilayer interconnection structure;
    forming a gate structure across the semiconductor fin and electrically connected to the first via; and
    growing a source/drain epitaxial structure over the semiconductor fin.

7. The method of claim 6, wherein patterning the semiconductor layer is such that the semiconductor fin wraps the first via.

8. The method of claim 6, further comprising:
    depositing an interlayer dielectric layer over the backside multilayer interconnection structure;
    forming a conductive structure in the interlayer dielectric layer; and
    forming a second via in the semiconductor layer, such that the first and second vias are in contact with the conductive structure.

9. The method of claim 8, wherein growing the source/drain epitaxial structure is such that the source/drain epitaxial structure is in contact with the second via.

10. The method of claim 6, further comprising forming a front-side multilayer interconnection structure over the source/drain epitaxial structure and the gate structure, such that the front-side multilayer interconnection structure is electrically isolated from the first via.

11. The method of claim 6, wherein forming the gate structure across the semiconductor fin and electrically connected to the first via comprises:
    depositing a gate dielectric layer over and in contact with a top surface of the first via; and
    removing a portion of the gate dielectric layer to expose the top surface of the first via;
    forming a gate electrode over the gate dielectric layer and in contact with the top surface of the first via.

12. The method of claim 6, further comprising forming an isolation structure to surround a bottom of the semiconductor fin, wherein a bottom of the first via is embedded in the isolation structure.

13. The method of claim 6, further comprising forming a dielectric spacer in the semiconductor layer prior to forming the first via, wherein after forming the first via, the first via is surrounded by the dielectric spacer.

14. A method comprising:
forming a transistor over a substrate;
forming a front-side multilayer interconnection structure over the transistor;
after forming the front-side multilayer interconnection structure, thinning the substrate to form a semiconductor fin under the transistor;
forming a dielectric spacer in the semiconductor fin;
forming a first gate via in the semiconductor fin and in contact with a gate structure of the transistor, wherein the dielectric spacer surrounds the first gate via; and
forming a backside multilayer interconnection structure under the transistor and the first gate via, wherein the first gate via is electrically connected to the backside multilayer interconnection structure.

15. The method of claim 14, wherein the transistor is a finFET or a GAA FET.

16. The method of claim 14, further comprising forming an isolation structure over the substrate prior to forming the transistor, wherein after thinning the substrate, a backside of the isolation structure is exposed.

17. The method of claim 16, further comprising forming a second gate via in the isolation structure after thinning the substrate.

18. The method of claim 14, further comprising:
forming a source/drain via in the semiconductor fin to be electrically connected to a source/drain epitaxial structure of the transistor; and
forming a conductor to interconnect the first gate via and the source/drain via.

19. The method of claim 14, further comprising forming a dielectric layer to cover a backside of the semiconductor fin prior to forming the first gate via.

20. The method of claim 14, wherein forming the dielectric spacer comprises:
forming an opening in the semiconductor fin and exposes a gate dielectric layer of the gate structure;
patterning the gate dielectric layer to expose a gate electrode in the opening;
blanket depositing a spacer layer in the opening, wherein a horizontal portion of the spacer layer is in contact with the gate electrode; and
etching the horizontal portion of the spacer layer to form the dielectric spacer.

* * * * *